(12) United States Patent
Takahashi et al.

(10) Patent No.: US 9,217,919 B2
(45) Date of Patent: Dec. 22, 2015

(54) PHOTOSENSITIVE COMPOSITION, PATTERN-FORMING METHOD USING THE COMPOSITION, AND RESIN USED IN THE COMPOSITION

(75) Inventors: Hidenori Takahashi, Shizuoka (JP); Tomotaka Tsuchimura, Shizuoka (JP); Toru Tsuchihashi, Shizuoka (JP); Katsuhiro Yamashita, Shizuoka (JP); Naoyuki Nishikawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 70 days.

(21) Appl. No.: 13/062,285

(22) PCT Filed: Aug. 26, 2009

(86) PCT No.: PCT/JP2009/065286
§ 371 (c)(1),
(2), (4) Date: Mar. 10, 2011

(87) PCT Pub. No.: WO2010/026973
PCT Pub. Date: Mar. 11, 2010

(65) Prior Publication Data
US 2011/0159433 A1    Jun. 30, 2011

Related U.S. Application Data

(60) Provisional application No. 61/096,586, filed on Sep. 12, 2008.

(30) Foreign Application Priority Data

Sep. 5, 2008  (JP) .................................. 2008-228994
Jun. 18, 2009 (JP) .................................. 2009-145677

(51) Int. Cl.
*G03F 7/004*    (2006.01)
*C08F 12/20*   (2006.01)
(Continued)

(52) U.S. Cl.
CPC .............. *G03F 7/0392* (2013.01); *C08F 12/20* (2013.01); *C08F 12/22* (2013.01); *C08F 12/30* (2013.01); *C08F 12/32* (2013.01); *C09D 125/18* (2013.01); *G03F 7/0045* (2013.01); *G03F 7/0046* (2013.01)

(58) Field of Classification Search
None
See application file for complete search history.

(56) References Cited

U.S. PATENT DOCUMENTS 5,260,410 A    11/1993 Schwalm
5,945,250 A *  8/1999 Aoai et al. ................. 430/270.1
(Continued)

FOREIGN PATENT DOCUMENTS

EP    0 380 007 A2    8/1990
EP    2 090 931 A1    8/2009
(Continued)

OTHER PUBLICATIONS

Machine translation JP 2006-178317. Jul. 6, 2006.*
(Continued)

*Primary Examiner* — Cynthia H Kelly
*Assistant Examiner* — Alyssa L Cepluch
(74) *Attorney, Agent, or Firm* — Sughrue Mion, PLLC

(57) ABSTRACT

A radiation-sensitive composition including a compound (P) having a partial structure (A) having an ionic structural site and capable of decomposing upon irradiation with an actinic ray or radiation to generate an acid and a partial structure (B) having at least one phenolic hydroxyl group, a part or all of hydrogen atoms of the hydroxyl group or groups each being protected by a group capable of leaving by the action of an acid, wherein the ionic structural site of the partial structure (A) contained in the compound (P) is a structure capable of generating an acid anion in the compound (P) upon irradiation with an actinic ray or radiation; a pattern-forming method using the same; and a resin which is used in the composition.

26 Claims, 1 Drawing Sheet

(51) Int. Cl.
*C08F 12/22* (2006.01)
*C08F 12/30* (2006.01)
*C08F 12/32* (2006.01)
*G03F 7/039* (2006.01)
*C09D 125/18* (2006.01)

(56) References Cited

U.S. PATENT DOCUMENTS

| | | | |
|---|---|---|---|
| 2003/0134225 A1* | 7/2003 | Fujimori et al. | 430/270.1 |
| 2005/0221224 A1* | 10/2005 | Mizutani | 430/270.1 |
| 2007/0117043 A1* | 5/2007 | Gonsalves | 430/270.1 |
| 2007/0149702 A1* | 6/2007 | Ando et al. | 524/556 |
| 2008/0102407 A1* | 5/2008 | Ohsawa et al. | 430/286.1 |
| 2009/0069521 A1* | 3/2009 | Nagai et al. | 526/243 |
| 2009/0202940 A1 | 8/2009 | Hatakeyama et al. | |
| 2009/0202947 A1 | 8/2009 | Hatakeyama et al. | |
| 2010/0055608 A1 | 3/2010 | Ohashi et al. | |

FOREIGN PATENT DOCUMENTS

| | | |
|---|---|---|
| EP | 2 112 554 A2 | 10/2009 |
| JP | 2-302758 A | 12/1990 |
| JP | 4-230645 A | 8/1992 |
| JP | 9-325497 A | 12/1997 |
| JP | 10-221852 A | 8/1998 |
| JP | 2006-178317 A | 7/2006 |
| JP | 2006-259509 A | 9/2006 |
| JP | 2008-133448 A | 6/2008 |
| JP | 2009-145714 A | 7/2009 |
| JP | 2009-155304 A | 7/2009 |
| JP | 2009-169406 A | 7/2009 |
| JP | 2009-211050 A | 9/2009 |
| JP | 2009-211051 A | 9/2009 |
| JP | 2010-77404 A | 4/2010 |
| WO | WO 2006121096 A1 * | 11/2006 |

OTHER PUBLICATIONS

Wang, et al. New Anionic Photoacid Generator Bound Polymer Resists for EUV Lithography, Oct. 18, 2007, ACS Macromolecules 2007, 40, 8220-8224.*
Lee et al. "Photosensitivity and line-edge roughness of novel polymer-bound PAG photoresist" Feb. 25, 2007. Proc. of Spie. vol. 6519, p. 65191E-1.*
Machine translation JP 10-221852. Aug. 21, 1998.*
Wang, Mingxing et al., "Synthesis and Properties of New Anionic Photoacid Generators Bound Polymer Resists for e-beam and EUV lithography", Proc. of SPIE vol. 6923, 692312, 2008, 7 pages.
Written Opinion (PCT/ISA/237) dated Oct. 6, 2009, in PCT/JP2009/065286.
International Search Report (PCT/ISA/210) dated Oct. 6, 2009, in PCT/JP2009/065286.
Extended European Search Report dated Oct. 12, 2012 in European Application No. 09811498.6.
Wang, Mingxing et al, "Novel Anionic Photoacid Generator (PAGs) and Photoresist for sub-50 nm Patterning by EUVL and EBL", Proc. of SPIE, vol. 6519, Jan. 1, 2007, pp. 65191F-1 to 65191F-6.
Office Action dated Feb. 5, 2013 in Japanese Application No. 2009-145677.
Office Action dated Sep. 3, 2013, issued by the Japanese Patent Office in corresponding JP Application No. 2009-145677.
Office Action dated Apr. 22, 2014, issued by the Japanese Patent Office in counterpart Japanese Application No. 2009-145677.
Office Action dated Nov. 11, 2014 issued by the Japanese Patent Office in counterpart Japanese Patent Application No. 2009-145677.

* cited by examiner

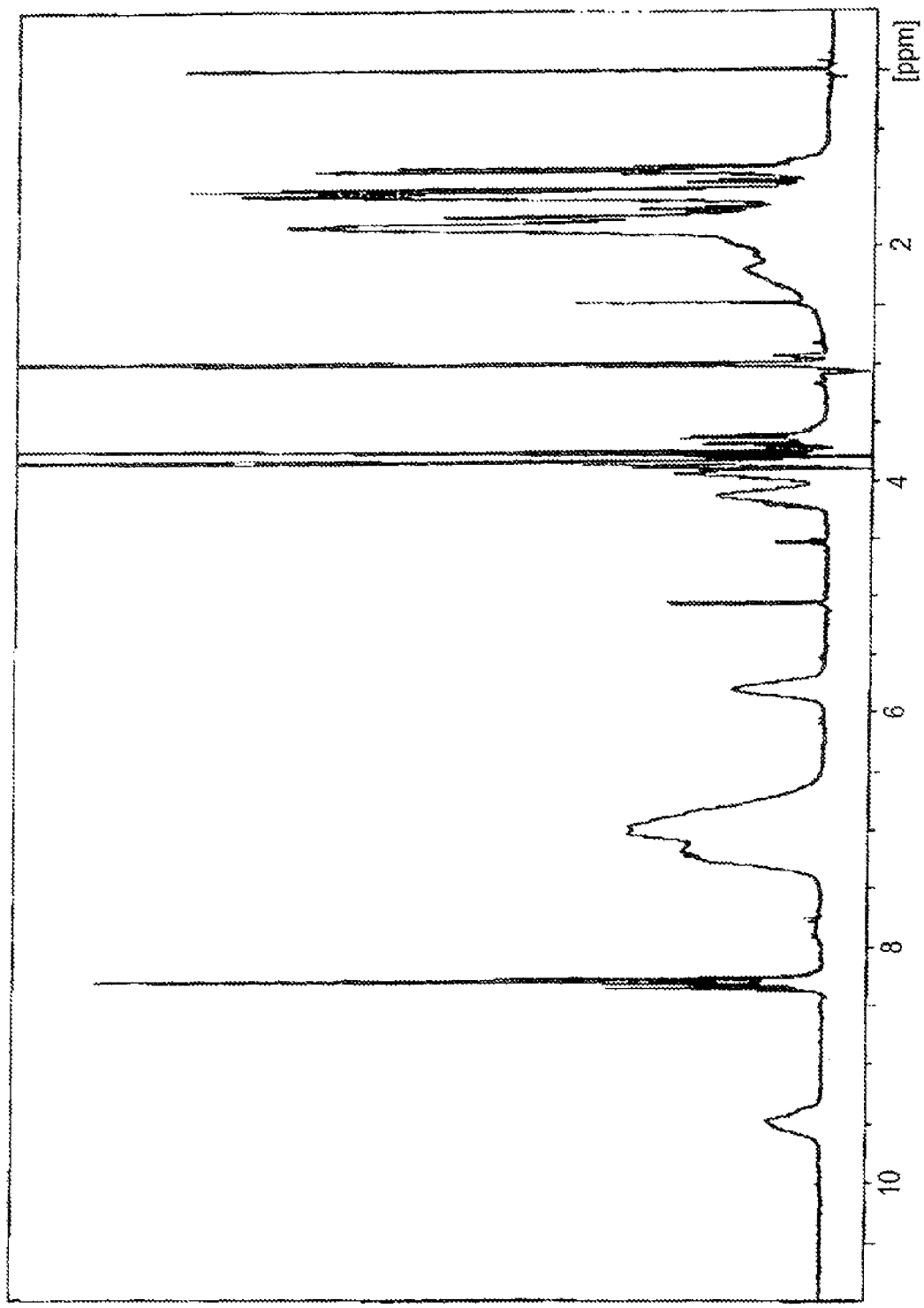

PHOTOSENSITIVE COMPOSITION, PATTERN-FORMING METHOD USING THE COMPOSITION, AND RESIN USED IN THE COMPOSITION

TECHNICAL FIELD

The present invention relates to a radiation-sensitive composition which is applicable to a variety of photo-fabrication and photolithography, in particular a positive working resist composition which is suitably useful for an ultra-micro lithography process for the manufacture of VLSI, high-capacity micro chips, etc. and other fabrication processes, a pattern-forming method using the same and a resin used in a positive working resist composition. In more detail, the invention relates to a positive working resist composition useful for electron beam, X-ray or EUV beam, a pattern-forming method using the same and a resin used in the composition.

BACKGROUND ART

Hitherto, in processes for the production of semiconductor devices, for example, IC and LSI, microfabrication has been conducted by means of lithography using a photoresist composition. In recent years, as the degree of integration in integrated circuits increases, it has been requested to form an ultra fine pattern in the submicron region or the quarter micron region. With such a trend, an exposure wavelength tends to become shorter, for instance, from g-line to i-line and further to a KrF excimer laser beam. Moreover, the development of lithography using an electron beam, an X-ray or an EUV beam also proceeds at present in addition to the use of an excimer laser beam.

In particular, the electron beam lithography is regarded as the promising pattern-forming technique of next generation or after the next generation, and positive working resists having high sensitivity and high resolution are being desired. In particular, for the purpose of shortening a wafer processing time, realization of high sensitivity is an important problem. However, in a positive working resist useful for electron beam, when it is intended to pursue high sensitivity, not only a lowering of resolution but deterioration of line edge roughness is caused, and therefore, it is eagerly desired to develop a resist capable of satisfying these performances at the same time. The term "line edge roughness" as referred to herein means a phenomenon wherein an edge between a pattern of resist and an interface surface of substrate irregularly fluctuates in the direction vertical to the line direction due to the characteristics of resist, and therefore, the edge looks uneven when the pattern is observed from just above. Since this unevenness is transferred in an etching step using the resist as a mask and causes deterioration in electric properties, the yield is reduced. In particular, in the ultra fine region of not more than 0.25 μm, the line edge roughness is an extremely important problem to be improved. There is a trade off relation of high sensitivity with high resolution, good pattern profile and good line edge roughness, and therefore, it is very important how these performances are satisfied at the same time.

Also, in the lithography using an X-ray or an EUV beam, it is similarly an important problem to satisfy high sensitivity simultaneously with high resolution, good pattern profile and good line edge roughness, and it is required to solve these performances.

As one of methods for solving such a problem, it is investigated to use a resin having a photo-acid generator (sulfonium group) in a polymer principal chain or side chain (see, for example, JP-A-2-302758, JP-A-4-230645 and U.S. Pat. No. 5,260,410). However, in the investigations in JP-A-2-302758, JP-A-4-230645 and U.S. Pat. No. 5,260,410, since an acid itself generated by the action of exposure is a low molecular weight monomer, there is involved a problem in diffusibility of the acid in a resist film. Thus, it was difficult to attain high resolution and good line edge roughness. On the other hand, it is also investigated to bond an acid generated by the action of exposure to a polymer (see, for example, JP-A-9-325497, JP-A-10-221852, JP-A-2006-178317 and Proc. of SPIE, Vol. 6923, 692312, 2008). However, it is the present state that high sensitivity, high resolution, good pattern profile and good line edge roughness cannot be satisfied at the same time in an ultra fine region.

SUMMARY OF INVENTION

An object of the invention is to provide a radiation-sensitive composition capable of solving the foregoing problems, in particular a positive working resist composition capable of satisfying high sensitivity, high resolution, good pattern profile and good line edge roughness at the same time in an ultra fine region, in particular in electron beam, X-ray or EUV beam lithography, a pattern-forming method using the same and a resin which is used in a positive working resist composition.

(1) A radiation-sensitive composition comprising a compound (P) having
  a partial structure (A) having an ionic structural site and capable of decomposing upon irradiation with an actinic ray or radiation to generate an acid; and
  a partial structure (B) having at least one phenolic hydroxyl group, a part or all of hydrogen atoms of the hydroxyl group or groups each being protected by a group capable of leaving by the action of an acid,
  wherein
  the ionic structural site of the partial structure (A) contained in the compound (P) is a structure capable of generating an acid anion in the compound (P) upon irradiation with an actinic ray or radiation.

(2) The radiation-sensitive composition as set forth in (1), comprising a resin (P) having
  a repeating unit (A) having an ionic structural site and capable of decomposing upon irradiation with an actinic ray or radiation to generate an acid; and
  a repeating unit (B) having at least one phenolic hydroxyl group, a part or all of hydrogen atoms of the hydroxyl group or groups each being protected by a group capable of leaving by the action of an acid,
  wherein
  the ionic structural site of the repeating unit (A) contained in the resin (P) is a structure capable of generating an acid anion in a side chain of the resin upon irradiation with an actinic ray or radiation.

(3) The radiation-sensitive composition as set forth in (2), wherein
  the repeating unit (B) is a repeating unit represented by the following general formula (I):

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group;

each of n Ys independently represents a hydrogen atom or a group capable of leaving by the action of an acid, provided that at least one of Ys represents a group capable of leaving by the action of an acid; and n represents an integer of from 1 to 4.

(4) The radiation-sensitive composition as set forth in (3), wherein

Y in the general formula (I) is represented by the following general formula (II):

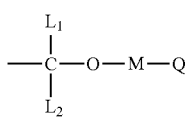

(II)

wherein
each of $L_1$ and $L_2$ independently represents a hydrogen atom, an alkyl group, a cycloalkyl group, an aryl group or an aralkyl group;

M represents a single bond or a divalent linking group;

Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group; and at least two of Q, M and $L_1$ may be bonded to each other to form a 5-membered ring or a 6-membered ring.

(5) The radiation-sensitive composition as set forth in any one of (2) to (4), wherein the repeating unit (A) is at least one repeating unit selected from repeating units represented by any one of the following general formulae alp to (V):

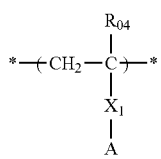

(III)

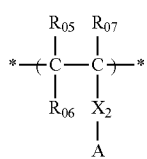

(IV)

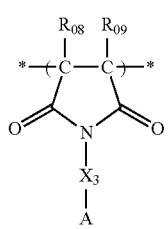

(V)

wherein
each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, and $R_{26}$ and $R_{27}$ may be bonded to each other to form a ring together with a nitrogen atom;

each of $X_1$ to $X_3$ independently represents a single bond, an arylene group, an alkylene group, a cycloalkylene group, —O—, —$SO_2$—, —CO—, —$N(R_{33})$— or a divalent linking group composed of a combination thereof;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents an ionic structural site capable of decomposing upon irradiation with an actinic ray or radiation to generate an acid anion in a side chain of the resin.

(6) The radiation-sensitive composition as set forth in (5), wherein

A in the general formulae (III) to (V) is a structural site containing a sulfonium salt or an iodonium salt.

(7) The radiation-sensitive composition as set forth in any one of (2) to (6), wherein the resin (P) further has a repeating unit (C) represented by the following general formula (VI):

(VI)

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group; and n represents an integer of from 1 to 4.

(8) The radiation-sensitive composition as set forth in any one of (2) to (7), wherein the resin (P) has a weight average molecular weight in a range of from 1,000 to 100,000.

(9) The radiation-sensitive composition as set forth in (7) or (8), wherein the resin (P) has from 0.5 to 80% by mole of the repeating unit (A), from 3 to 90% by mole of the repeating unit (B) and from 3 to 90% by mole of the repeating unit (C).

(10) The radiation-sensitive composition as set forth in any one of (1) to (9), further comprising a basic compound.

(11) The radiation-sensitive composition as set forth in any one of (1) to (10), wherein an electron beam, an X-ray or en EUV beam is used as an exposure light source.

(12) A pattern-forming method comprising steps of forming a resist film using the radiation-sensitive composition as set forth in any one of (1) to (11), exposing and developing.

(13) A resin comprising:
at least one repeating unit (A) selected from repeating units represented by any one of the following general formulae (III) to (V);
a repeating unit (B) represented by the following general formula (I); and
a repeating unit (C) represented by the following general formula (VI):

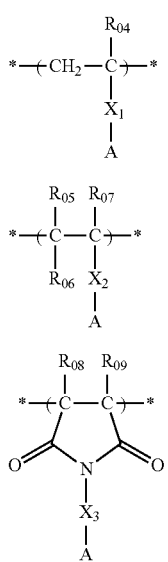

wherein
each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;
$R_{06}$ represents a cyano group, a carboxyl group, —CO—OR$_{25}$ or —CO—N(R$_{26}$)(R$_{27}$), and $R_{26}$ and $R_{27}$ may be bonded to each other to form a ring together with a nitrogen atom;
each of $X_1$ to $X_3$ independently represents a single bond, an arylene group, an alkylene group, a cycloalkylene group, —O—, —SO$_2$—, —CO—, —N(R$_{33}$)— or a divalent linking group composed of a combination thereof;
$R_{25}$ represents an alkyl group, a cycloalkyl group, an alkenyl group, an aryl group or an aralkyl group;
each of $R_{26}$, $R_{27}$ and $R_{33}$ independently represents a hydrogen atom, an alkyl group, a cycloalkyl group, an alkenyl group, an aryl group or an aralkyl group; and
A represents an ionic structural site capable of decomposing upon irradiation with an actinic ray or radiation to generate an acid anion in a side chain of the resin,

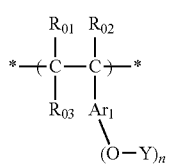

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to Ar$_1$ to form a 5-membered ring or a 6-membered ring;
Ar$_1$ represents an aromatic ring group;
each of n Ys independently represents a hydrogen atom or a group capable of leaving by the action of an acid, provided that at least one of Ys represents a group capable of leaving by the action of an acid; and
n represents an integer of from 1 to 4, and

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to Ar$_1$ to form a 5-membered ring or a 6-membered ring;
Ar$_1$ represents an aromatic ring group; and
n represents an integer of from 1 to 4.
(14) A method for producing the compound (P) as set forth in (1).
(15) A method for producing the resin (P) as set forth in (2).
(16) A method for producing the resin as set forth in (13).

BRIEF DESCRIPTION OF DRAWINGS

FIG. 1 is a graph showing an NMR data of the resin (P-1) synthesized in Synthetic Example 10.

DESCRIPTION OF EMBODIMENTS

The invention is hereunder described in detail.
As to the expression of a group (atomic group) in the specification, the term "group" which does not express whether it is substituted or unsubstituted includes both one not having a substituent and one having a substituent. For example, the term "alkyl group" includes not only an alkyl group not having a substituent (an unsubstituted alkyl group) but an alkyl group having a substituent (a substituted alkyl group).
<Compound (P)>
The compound (P) contained in the radiation-sensitive composition is a compound having a partial structure (A) having an ionic structural site and capable of decomposing upon irradiation with an actinic ray or radiation to generate an acid; and a partial structure (B) having at least one phenolic hydroxyl group, a part or all of hydrogen atoms of the hydroxyl group or groups each being protected by a group capable of leaving by the action of an acid, wherein the ionic structural site of the partial structure (A) is a structure capable of generating an acid anion in the compound (P) upon irradiation with an actinic ray or radiation.
Examples of a skeleton of the compound (P) include structures having plural benzene rings and structures having a cycloalkane structure. More specific examples of the skeleton include structures disclosed in JP-A-2001-312055, US-A-

2008/0081281, etc., oligomers such as calixarene and resin structures as described below in detail.

<Resin (P)>

The resin (P) contained in the radiation-sensitive composition, in particular the positive working resist composition is a resin having a repeating unit (A) having an ionic structural site and capable of decomposing upon irradiation with an actinic ray or radiation to generate an acid; and a repeating unit (B) having at least one phenolic hydroxyl group, a part or all of hydrogen atoms of the hydroxyl group or groups each being protected by a group capable of leaving by the action of an acid, wherein the ionic structural site of the repeating unit (A) is a structure capable of generating an acid anion in a side chain of the resin (P) upon irradiation with an actinic ray or radiation.

(1) Repeating Unit (A):

As the repeating unit (A), any repeating unit is useful so far as it is a repeating unit having an ionic structural site and capable of decomposing upon irradiation with an actinic ray or radiation to generate acid, wherein the ionic structural site is a structure capable of generating an acid anion in a side chain of the resin upon irradiation with an actinic ray or radiation.

As the repeating unit (A), for example, repeating units represented by any one of the following general formulae (III) to (V) are preferable.

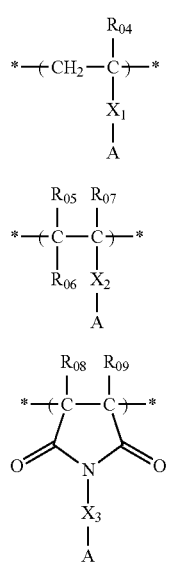

In the foregoing general formulae (III) to (V), each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, and $R_{26}$ and $R_{27}$ may be bonded to each other to form a ring together with a nitrogen atom;

each of $X_1$ to $X_3$ independently represents a single bond, an arylene group, an alkylene group, a cycloalkylene group, —O—, —$SO_2$—, —CO—, —$N(R_{33})$— or a divalent linking group composed of a combination thereof;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents an ionic structural site capable of decomposing upon irradiation with an actinic ray or radiation to generate an acid anion in a side chain of the resin.

In the foregoing general formulae (III) to (V), examples of the alkyl group represented by $R_{04}$ to $R_{05}$ and $R_{07}$ to $R_{09}$ which is preferable include an optionally substituted alkyl group having not more than 20 carbon atoms, for example, a methyl group, an ethyl group, a propyl group, an isopropyl group, an n-butyl group, a sec-butyl group, a hexyl group, a 2-ethylhexyl group, an octyl group and a dodecyl group. Of these, an alkyl groups having not more than 8 carbon atoms is more preferable.

Examples of the cycloalkyl group include a cycloalkyl group which may be of a monocyclic type or a polycyclic type. Of these, an optionally substituted cycloalkyl group of a monocyclic type having from 3 to 8 carbon atoms, for example, a cyclopropyl group, a cyclopentyl group and a cyclohexyl group, is preferable.

Examples of the halogen atom include a fluorine atom, a chlorine atom, a bromine atom and an iodine atom. Of these, a fluorine atom is more preferable.

As the alkyl group contained in the alkoxycarbonyl group, the same alkyl groups as those in the foregoing $R_{04}$ to $R_{05}$ and $R_{07}$ to $R_{09}$ are preferable.

Examples of the alkyl group represented by $R_{25}$ to $R_{27}$ and $R_{33}$ which is preferable include an optionally substituted alkyl group having not more than 20 carbon atoms, for example, a methyl group, an ethyl group, a propyl group, an isopropyl group, an n-butyl group, a sec-butyl group, a hexyl group, a 2-ethylhexyl group, an octyl group and a dodecyl group. Of these, an alkyl groups having not more than 8 carbon atoms is more preferable.

Examples of the cycloalkyl group include a cycloalkyl group which may be of a monocyclic type or a polycyclic type. Of these, an optionally substituted cycloalkyl group of a monocyclic type having from 3 to 8 carbon atoms, for example, a cyclopropyl group, a cyclopentyl group and a cyclohexyl group, is preferable.

Examples of the alkenyl group which is preferable include an optionally substituted alkenyl group having from 2 to 6 carbon atoms, for example, a vinyl group, a propenyl group, an allyl group, a butenyl group, a pentenyl group, a hexenyl group and a cyclohexenyl group.

Examples of the aryl group which is preferable include an optionally monocyclic or polycyclic aromatic group having from 6 to 14 carbon atoms. Specific examples thereof include a phenyl group, a tolyl group, a chlorophenyl group, a methoxyphenyl group and a naphthyl group. Also, aryl groups may be bonded to each other to form a multi-ring.

Examples of the aralkyl group include an optionally substituted aralkyl group having from 7 to 15 carbon atoms, for example, a benzyl group, a phenethyl group and a cumyl group.

As the ring formed through bonding of $R_{26}$ and $R_{27}$ to each other together with a nitrogen atom, those of forming a 5-membered to 8-membered ring are preferable. Specific examples thereof include pyrrolidine, piperidine and piperazine.

As the arylene group represented by $X_1$ to $X_3$, optionally substituted arylene groups having from 6 to 14 carbon atoms are preferable. Specific examples thereof include a phenylene group, a tolylene group and a naphthylene group.

Examples of the alkylene group which is preferable include an alkylene group having from 1 to 8 carbon atoms, for example, a methylene group, an ethylene group, a propylene group, a butylene group, a hexylene group and an octylene group.

Examples of the cycloalkylene group which is preferable include an optionally substituted cycloalkylene group having from 5 to 8 carbon atoms, for example, a cyclopentylene group and a cyclohexylene group.

Examples of the substituent in each of the groups in the foregoing general formulae (III) to (IV) which is preferable include a hydroxyl group, a halogen atom (for example, fluorine, chlorine, bromine and iodine), a nitro group, a cyano group, an amide group, a sulfonamide group, the alkyl groups exemplified above for $R_{04}$ to $R_{00}$, $R_{25}$ to $R_{27}$ and $R_{33}$, an alkoxy group (for example, a methoxy group, an ethoxy group, a hydroxyethoxy group, a propoxy group, a hydroxypropoxy group and a butoxy group), an alkoxycarbonyl group (for example, a methoxycarbonyl group and an ethoxycarbonyl group), an acyl group (for example, a formyl group, an acetyl group and a benzoyl group), an acyloxy group (for example, an acetoxy group and a butyryloxy group) and a carboxy group. A carbon atom number of the substituent is preferably not more than 8 carbon atoms.

A represents an ionic structural site capable of decomposing upon irradiation with an actinic ray or radiation to generate an acid anion in a side chain of the resin. Specific examples thereof include ionic structural sites possessed by known compounds capable of generating an acid by the action of light, which are used in photo-initiators for cationic photopolymerization, photo-initiators for radical photopolymerization, photodecoloring agents for dyes, photodiscoloring agents and micro resists.

Examples of the ionic structural site capable of generating an acid upon irradiation with an actinic ray or radiation include ionic structural sites which the following photo-acid generators have.

Examples include onium salts such as:

Diazonium salts disclosed in S. I. Schlesinger, *Photogr. Sci. Eng.*, 18, 387 (1974), T. S. Bal, et al., *Polymer*, 21, 423 (1980), etc.;

Ammonium salts disclosed in U.S. Pat. Nos. 4,069,055 and 4,069,056, U.S. Reissue Pat. No. 27,992, Japanese Patent Application No. 3-140, 140, etc.;

Phosphonium salts disclosed in D. C. Necker, et al., *Macromolecules*, 17, 2468 (1984), C. S. Wen, et al., *Teh. Proc. Conf. Rad Curing ASIA*, page 478, Tokyo, October (1988), U.S. Pat. Nos. 4,069,055 and 4,069,056, etc.;

Iodonium salts disclosed in J. V. Crivello, et al., *Macromolecules*, 10(6), 1307 (1977), *Chem. & Eng. News*, November 28, page 31 (1988), European Patent No. 104,143, U.S. Pat. Nos. 339,049 and 410,201, JP-A-2-150848, JP-A-2-296514, etc.;

Sulfonium salts disclosed in J. V. Crivello, et al., *Polymer J.*, 17, 73 (1985), J. V. Crivello, et al., *J. Org. Chem.*, 43, 3055 (1978), W. R. Watt, et al., *J. Polymer Sci., Polymer Chem. Ed.*, 22, 1789 (1984), J. V. Crivello, et al., *Polymer Bull.*, 14, 279 (1985), J. V. Crivello, et al., *Macromolecules*, 14(5), 1141 (1981), J. V. Crivello, et al., *J. Polymer Sci.*, Polymer Chem. Ed., 17, 2877 (1979), European Patents Nos. 370,693, 3,902, 114, 233,567, 297,443 and 297,442, U.S. Pat. Nos. 4,933, 377, 161,811, 410,201, 339,049, 4,760,013, 4,734,444 and 2,833,827, German Patents Nos. 2,904,626, 3,604,580 and 3,604,581, etc.;

Sclenonium salts disclosed in J. V. Crivello, et al., *Macromolecules*, 10(6), 1307 (1977), J. V. Crivello, et al., *J. Polymer Sci.*, Polymer Chem. Ed., 17, 1047 (1979), etc.; and Arsonium salts disclosed in C. S. Wen, et al., *Teh. Proc. Conf. Rad. Curing ASIA*, page 478, Tokyo, October (1988), etc.

As A, ionic structural sites containing a sulfonium salt or iodonium salt are more preferable. More specifically; groups represented by the following general formula (ZI) or (ZII) are preferable as A.

In the foregoing general formula (ZI), each of $R_{201}$, $R_{202}$ and $R_{203}$ independently represents an organic group.

A carbon atom number of the organic group represented by $R_{201}$, $R_{202}$ and $R_{203}$ is generally from 1 to 30, and preferably from 1 to 20.

Also, two of $R_{201}$ to $R_{203}$ may be bonded to each other to form a ring structure, and the ring may contain an oxygen atom, a sulfur atom, an ester bond, an amide bond or a carbonyl group therein. Examples of the ring formed through bonding of two of $R_{201}$ to $R_{203}$ include an alkylene group (for example, a butylene group and a pentylene group).

$Z^-$ represents an acid anion generated through decomposition upon irradiation with an actinic ray or radiation, and preferably a non-nucleophilic anion. Examples of the non-nucleophilic anion include a sulfonic acid anion, a carboxylic acid anion, a sulfonylimide anion, a bis(alkylsulfonyl)imide anion and a tris(alkylsulfonyl)methide anion. Of these, a sulfonic acid anion, a bis(alkylsulfonyl)imide anion and a tris (alkylsulfonyl)methide anion are preferable, and a sulfonic acid anion is more preferable.

The "non-nucleophilic anion" as referred to herein means an anion having an extremely low ability for causing a nucleophilic reaction and an anion capable of restraining decomposition with a lapse of time by an intramolecular nucleophilic reaction. According to this, stability of the resin with a lapse of time is enhanced, and stability of the resist with a lapse of time is also enhanced.

Examples of the organic group represented by $R_{201}$, $R_{202}$ and $R_{203}$ include corresponding groups in groups represented by (ZI-1), (ZI-2) and (ZI-3) as described later.

Furthermore, examples of the group represented by (ZI) which is preferable include a (ZI-1) group, a (ZI-2) group and a (ZI-3) group as described below.

The (ZI-1) group is a group having, as a cation, an arylsulfonium wherein at least one of $R_{201}$ to $R_{203}$ in the foregoing general formula (ZI) is an aryl group.

All of $R_{201}$ to $R_{203}$ may be an aryl group, or a part of $R_{201}$ to $R_{203}$ may be an aryl group, with the remainder being an alkyl group or a cycloalkyl group.

Examples thereof include groups corresponding to triarylsulfoniums, diarylalkylsulfoniums, aryldialkylsulfoniums, diarylcycloalkylsulfoniums and aryldicycloalkylsulfoniums.

As the aryl group in the arylsulfonium, a phenyl group and a naphthyl group are preferable, and a phenyl group is more preferable. The aryl group may be an aryl group having a heterocyclic structure containing an oxygen atom, a nitrogen atom, a sulfur atom, etc. Examples of the aryl group having a heterocyclic structure include a pyrrole residue (a group formed though loss of one hydrogen atom from pyrrole), a furan residue (a group formed though loss of one hydrogen atom from furan), a thiophene residue (a group formed though loss of one hydrogen atom from thiophene), an indole residue (a group formed though loss of one hydrogen atom from indole), a benzofuran residue (a group formed though loss a one hydrogen atom from benzofuran) and a benzothiophene residue (a group formed though loss of one hydrogen atom from benzothiophene). In the case where the arylsulfonium has two or more aryl groups, the two or more aryl groups may be the same or different.

The alkyl group or cycloalkyl group which the arylsulfonium group has, if desired is preferably a linear or branched alkyl group having from 1 to 15 carbon atoms or a cycloalkyl group having from 3 to 15 carbon atoms. Examples thereof include a methyl group, an ethyl group, a propyl group, an n-butyl group, a sec-butyl group, a t-butyl group, a cyclopropyl group, a cyclobutyl group and a cyclohexyl group.

Each of the aryl group, the alkyl group and the cycloalkyl group represented by $R_{201}$ to $R_{203}$ may have an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxyl group or a phenylthio group as a substituent. Examples of the substituent which is preferable include a linear or branched alkyl group having from 1 to 12 carbon atoms, a cycloalkyl group having from 3 to 12 carbon atoms and a linear, branched or cyclic alkoxy group having from 1 to 12 carbon atoms. Of these, an alkyl group having from 1 to 4 carbon atoms and an alkoxy group having from 1 to 4 carbon atoms are more preferable. The substituent may be substituted on any one or all three of $R_{201}$ to $R_{203}$. Also, in the case where all of $R_{201}$ to $R_{203}$ are an aryl group, it is preferable that the substituent is substituted at the para-position of the aryl group.

Next, the (ZI-2) group is described.

The (ZI-2) group is a group wherein each of $R_{201}$ to $R_{203}$ in the general formula (ZI) independently represents an organic group which does not have an aromatic ring. The "aromatic ring" as referred to herein also includes a hetero atom-containing aromatic ring.

A carbon atom number of the organic group which does not have an aromatic ring as $R_{201}$ to $R_{203}$ is generally from 1 to 30, and preferably from 1 to 20.

Each of $R_{201}$ to $R_{203}$ is independently preferably an alkyl group, a cycloalkyl group, an allyl group or a vinyl group, more preferably a linear or branched 2-oxoalkyl group, a 2-oxocycloalkyl group or an alkoxycarbonylmethyl group, and especially preferably a linear or branched 2-oxoalkyl group.

Examples of the alkyl group or cycloalkyl group represented by $R_{201}$ to $R_{203}$ which is preferable include a linear or branched alkyl group having from 1 to 10 carbon atoms (for example, a methyl group, an ethyl group, a propyl group, a butyl group and a pentyl group) and a cycloalkyl group having from 3 to 10 carbon atoms (for example, a cyclopentyl group, a cyclohexyl group and a norbornyl group). Examples of the alkyl group which is more preferable include a 2-oxoalkyl group and an alkoxycarbonylmethyl group. Examples of the cycloalkyl group which is more preferable include a 2-oxocycloalkyl group.

The 2-oxoalkyl group may be either linear or branched. Examples of the 2-oxoalkyl group which is preferable include a group having >C=O at the 2-position of the foregoing alkyl group.

Examples of the 2-oxocycloalkyl group which is preferable include a group having >C=O at the 2-position of the foregoing cycloalkyl group.

Examples of the alkoxy group in the alkoxycarbonylmethyl group which is preferable include an alkoxy group having from 1 to 5 carbon atoms (for example, a methoxy group, an ethoxy group, a propoxy group, a butoxy group and a pentoxy group).

Each of $R_{201}$ to $R_{203}$ may be further substituted with a halogen atom, an alkoxy group (for example, an alkoxy group having from 1 to 5 carbon atoms), a hydroxyl group, a cyano group or a nitro group.

The (ZI-3) group is a group represented by the following general formula (ZI-3) and is a group having a phenacyl sulfonium salt structure.

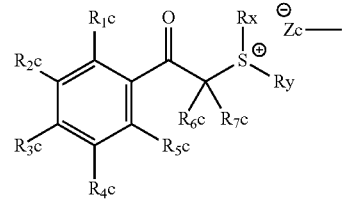

ZI-3

In the general formula (ZI-3):

Each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$, $R_{6c}$ and $R_{7c}$, and $R_x$ and $R_y$ may be each bonded to each other to form a ring structure, and this ring structure may contain an oxygen atom, a sulfur atom, an ester bond or an amide bond. Examples of the group which is formed through bonding of any two or more of $R_{1c}$ to $R_{5c}$, $R_{6c}$ and $R_{7c}$, and $R_x$ and $R_y$ include a butylene group and a pentylene group.

$Zc^-$ represents a non-nucleophilic anion, and examples thereof include the same non-nucleophilic anions as those in $Z^-$ in the general formula (ZI).

The alkyl group represented by $R_{1c}$ to $R_{7c}$ may be either linear or branched, and examples thereof include an alkyl group having from 1 to 20 carbon atoms, and preferably a linear or branched alkyl group having from 1 to 12 carbon atoms (for example, a methyl group, an ethyl group, a linear or branched propyl group, a linear or branched butyl group and a linear or branched pentyl group). Examples of the cycloalkyl group represented by $R_{1c}$ to $R_{7c}$ include a cycloalkyl group having from 3 to 8 carbon atoms (for example, a cyclopentyl group and a cyclohexyl group).

The alkoxy group represented by $R_{1c}$ to $R_{5c}$ may be any of linear, branched or cyclic, and examples thereof include an alkoxy group having from 1 to 10 carbon atoms, and preferably a linear or branched alkoxy group having from 1 to 5 carbon atoms (for example, a methoxy group, an ethoxy group, a linear or branched propoxy group, a linear or branched butoxy group and a linear or branched pentoxy group) and a cyclic alkoxy group having from 3 to 8 carbon atoms (for example, a cyclopentyloxy group and a cyclohexyloxy group).

It is preferable that any one of $R_{1c}$ to $R_{5c}$ is a linear or branched alkyl group, a cycloalkyl group or a linear, branched or cyclic alkoxy group; and it is more preferable that the sum of a carbon atom number of $R_{1c}$ to $R_{5c}$ is from 2 to 15. According to this, solvent solubility is more enhanced, and the generation of a particle at the time of storage is restrained.

Examples of the alkyl group and cycloalkyl group represented by $R_x$ and $R_y$ include the same alkyl groups and cycloalkyl groups as those in $R_{1c}$ to $R_{7c}$. Of these, a 2-oxoalkyl group, a 2-oxocycloalkyl group and an alkoxycarbonylmethyl group are more preferable.

Examples of the 2-oxoalkyl group and 2-oxocycloalkyl group include a group having >C=O at the 2-position of the alkyl group or cycloalkyl group represented by $R_{1c}$ to $R_{7c}$.

Examples of the alkoxy group in the alkoxycarbonylmethyl group include the same alkoxy groups as those in $R_{1c}$ to $R_{5c}$.

$R_x$ and $R_y$ are each preferably an alkyl group or cycloalkyl group having 4 or more carbon atoms, more preferably an alkyl group or cycloalkyl group having 6 or more carbon atoms, and further preferably an alkyl group or cycloalkyl group having 8 or more carbon atoms.

In the foregoing general formula (ZII), each of $R_{204}$ to $R_{205}$ independently represents an aryl group, an alkyl group or a cycloalkyl group.

The aryl group represented by $R_{204}$ to $R_{205}$ is preferably a phenyl group or a naphthyl group, and more preferably a phenyl group. The aryl group represented by $R_{204}$ to $R_{205}$ may be an aryl group having a heterocyclic structure containing an oxygen atom, a nitrogen atom, a sulfur atom, etc. Examples of the aryl group having a heterocyclic structure include a pyrrole residue (a group formed though loss of one hydrogen atom from pyrrole), a furan residue (a group formed though loss of one hydrogen atom from furan), a thiophene residue (a group formed though loss of one hydrogen atom from thiophene), an indole residue (a group formed though loss of one hydrogen atom from indole), a benzofuran residue (a group formed though loss of one hydrogen atom from benzofuran) and a benzothiophene residue (a group formed though loss of one hydrogen atom from benzothiophene).

Examples of the alkyl group or cycloalkyl group represented by $R_{204}$ to $R_{205}$ which is preferable include a linear or branched alkyl group having from 1 to 10 carbon atoms (for example, a methyl group, an ethyl group, a propyl group, a butyl group and a pentyl group) and a cycloalkyl group having from 3 to 10 carbon atoms (for example, a cyclopentyl group, a cyclohexyl group and a norbornyl group).

Each of the aryl group, the alkyl group and the cycloalkyl group represented by $R_{204}$ to $R_{205}$ may have a substituent. Examples of the substituent which each of the aryl group, the alkyl group and the cycloalkyl group represented by $R_{204}$ to $R_{205}$ may have include an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxyl group and a phenylthio group.

$Z^-$ represents an acid anion generated through decomposition upon irradiation with an actinic ray or radiation, and preferably a non-nucleophilic anion. Examples of the non-nucleophilic anion include the same non-nucleophilic anions as those in $Z^-$ in the general formula (ZI).

Preferred specific examples of A are given below, but it should not be construed that the invention is limited thereto.

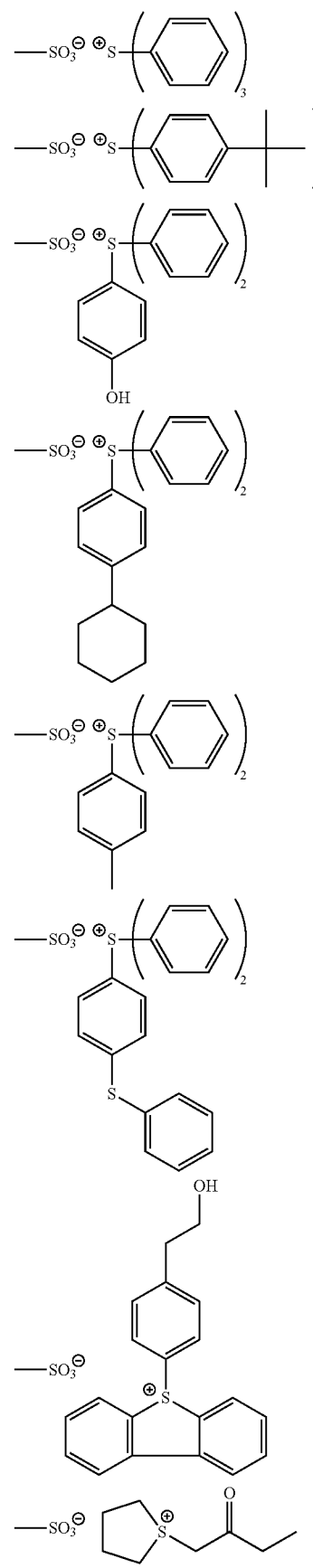

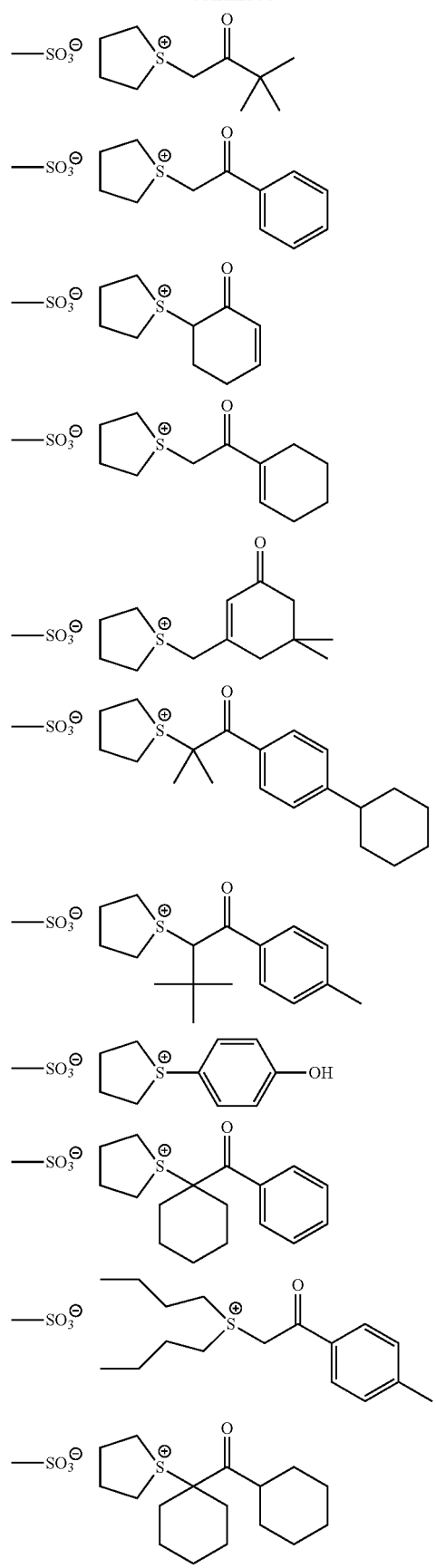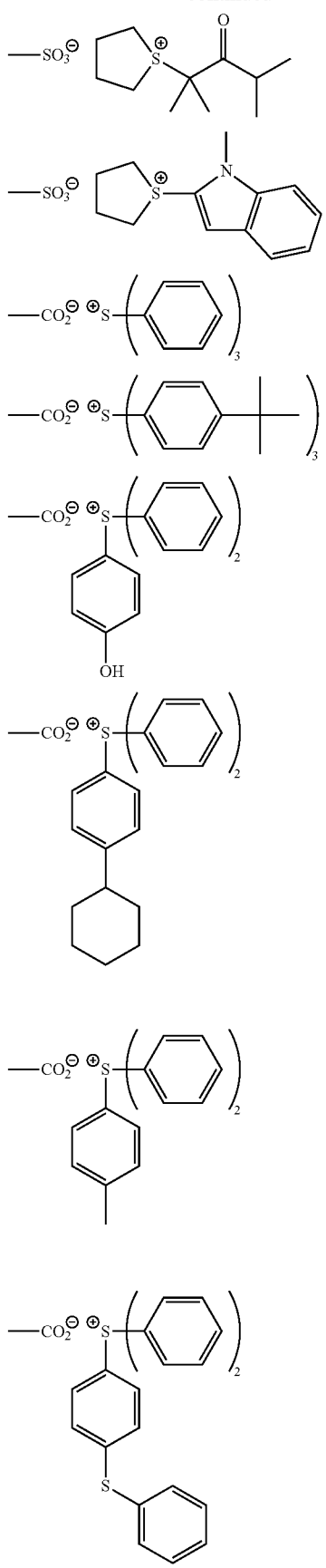

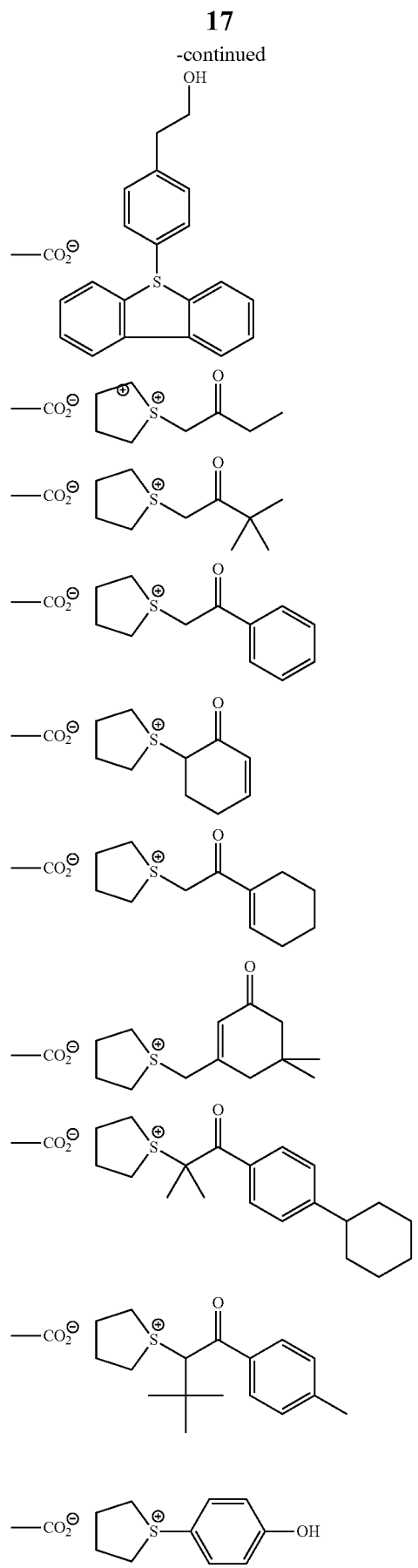
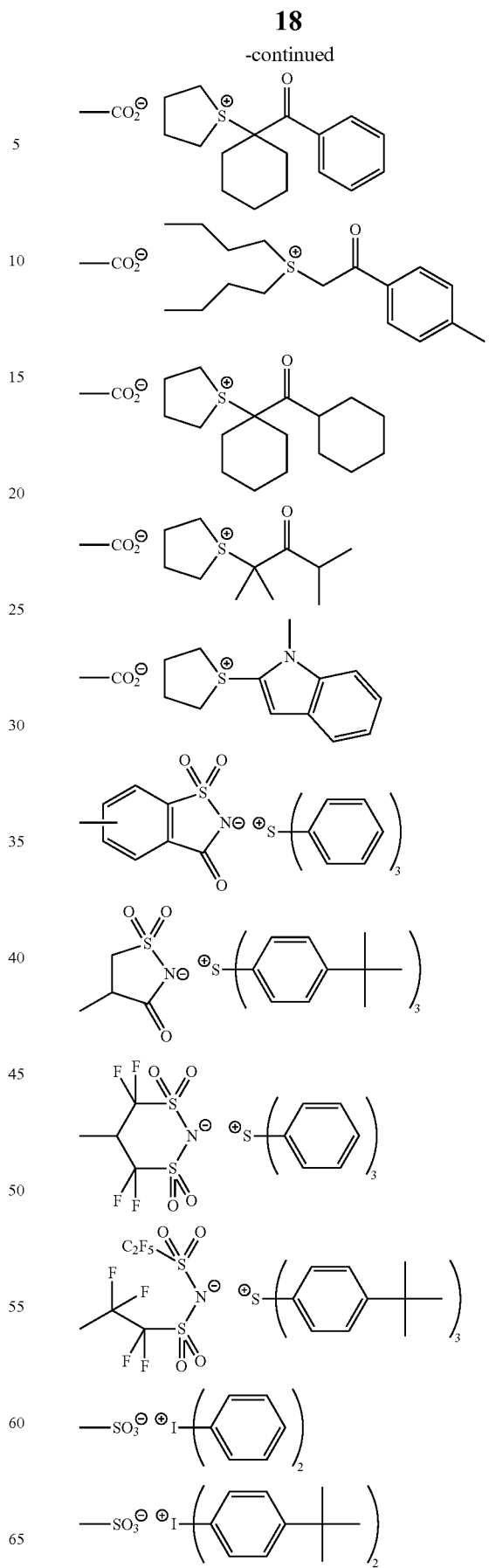

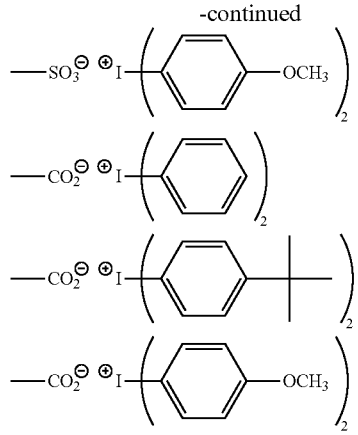
Examples of the repeating unit represented by any one of the general formulae (III) to (V), which is effectively used in the invention, include those represented by any one of the following general formulae (III-1) to (III-6), general formulae (IV-1) to (IV-4) and general formulae (V-1) to (V-2), respectively.
(III-1)
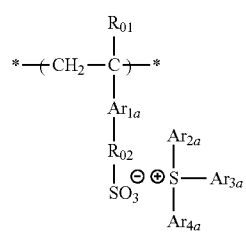
(III-2)
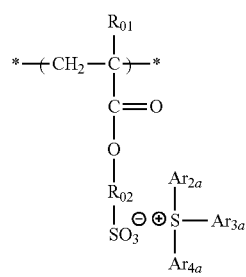
(III-3)
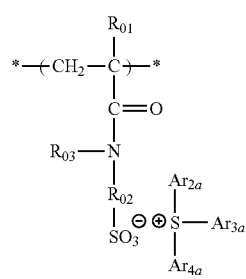
(III-4)
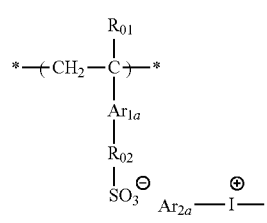
(III-5)
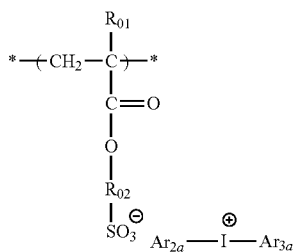
(III-6)
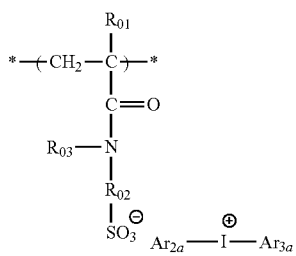
(IV-1)
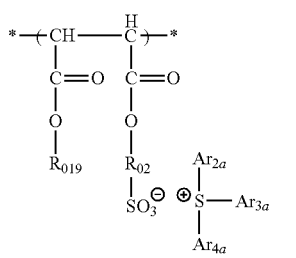
(IV-2)
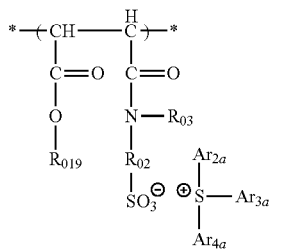
(IV-3)
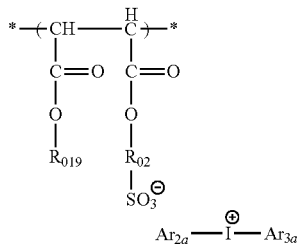
(IV-4)
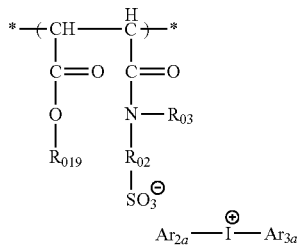

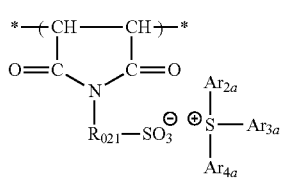

(V-1)

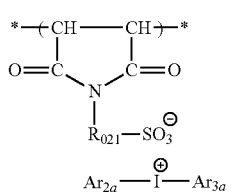

(V-2)

In the foregoing general formulae, $Ar_{1a}$ represents an optionally substituted arylene group the same as the arylene group represented by the foregoing $X_1$ to $X_3$.

Each of $Ar_{2a}$ to $Ar_{4a}$ represents an optionally substituted aryl group the same as the aryl group represented by $R_{201}$ to $R_{203}$ and $R_{204}$ to $R_{205}$ in the foregoing general formulae (ZI) and (ZII).

$R_{01}$ represents a hydrogen atom, a methyl group, a chloromethyl group, a trifluoromethyl group or a cyano group.

Each of $R_{02}$ and $R_{021}$ represents a single bond, an arylene group, an alkylene group, a cycloalkylene group, —O—, —$SO_2$—, —CO—, —$N(R_{33})$— or a divalent linking group composed of a combination thereof the same as those in $X_1$ to $X_3$.

Each of $R_{03}$ and $R_{019}$ independently represents a hydrogen atom, an alkyl group, a cycloalkyl group, an aryl group or an aralkyl group. Examples of the alkyl group and cycloalkyl group include the same alkyl groups or cycloalkyl groups as those represented by $R_{01}$ to $R_{03}$ in the general formula (I) as described later. Examples of the aryl group or aralkyl group include the same aryl groups or aralkyl groups as those represented by $L_1$ to $L_2$ in the general formula (II) as described later.

A content of the repeating unit (A) in the resin of the invention is preferably in the range of from 0.5 to 80% by mole, more preferably in the range of from 1 to 60% by mole, and especially preferably in the range of from 3 to 40% by mole relative to the whole of repeating units.

A method for synthesizing a monomer corresponding to the repeating unit (A) is not particularly limited. For example, there is exemplified a method of exchanging an acid anion having a polymerizable unsaturated bond corresponding to the foregoing repeating unit with a halide of a known onium salt to synthesize the monomer.

More specifically, the monomer corresponding to the targeted repeating unit (A) can be synthesized by stirring a metal ion salt (for example, a sodium ion and a potassium ion) or ammonium salt (for example, an ammonium salt and a triethylammonium salt) of an acid having a polymerizable unsaturated bond corresponding to the foregoing repeating unit and an onium salt having a halogen ion (for example, a chloride ion, a bromide ion and an iodide ion) in the presence of water or methanol to achieve an anion exchange reaction and then subjecting the reaction mixture to liquid separation and cleaning operations with an organic solvent (for example, dichloromethane, chloroform, ethyl acetate, methyl isobutyl ketone and tetrahydrofuran) and water.

The monomer can also be synthesized by stirring the foregoing materials in the presence of an organic solvent which is separable from water (for example, dichloromethane, chloroform, ethyl acetate, methyl isobutyl ketone and tetrahydrofuran) and water to achieve an anion exchange reaction and then subjecting the reaction mixture to liquid separation and cleaning operations with water.

Specific examples of the repeating unit represented by any one of the general formulae (III) to (V) are given below, but it should not be construed that the invention is limited thereto.

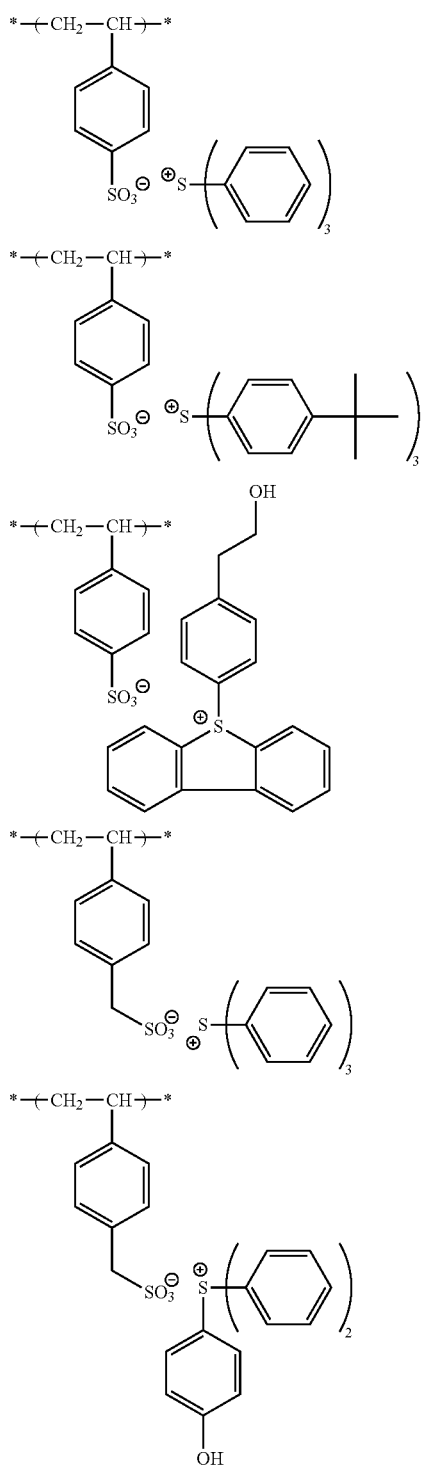

23
-continued
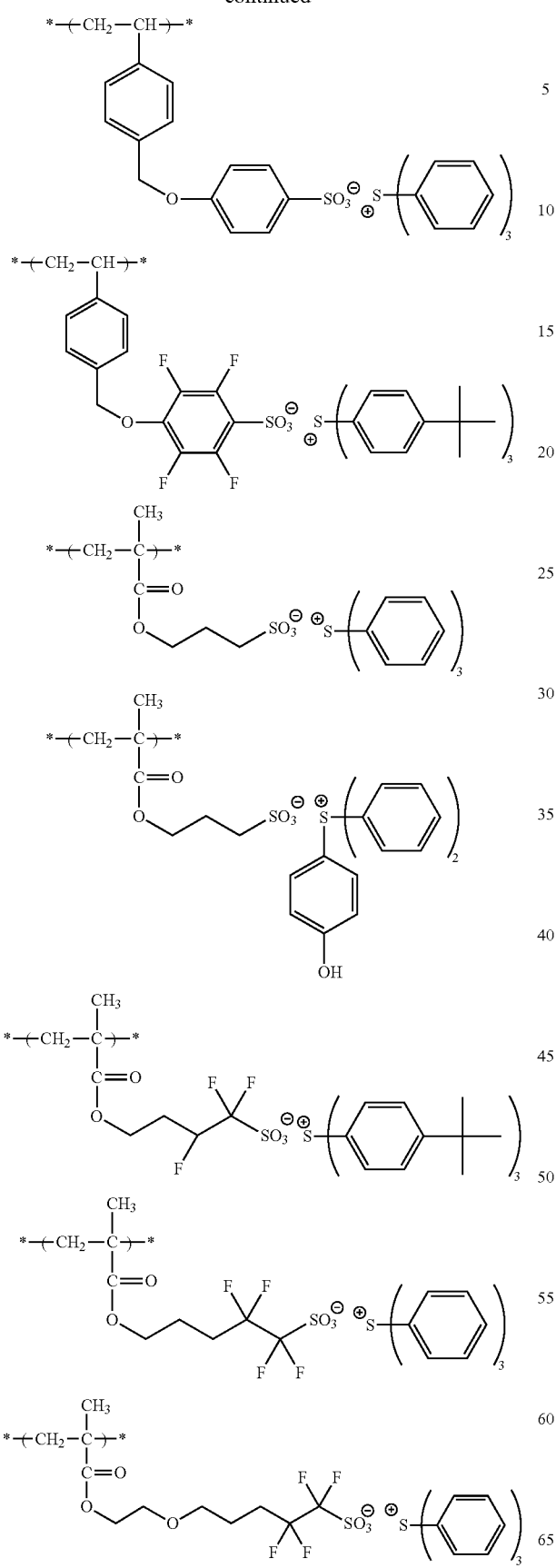
24
-continued
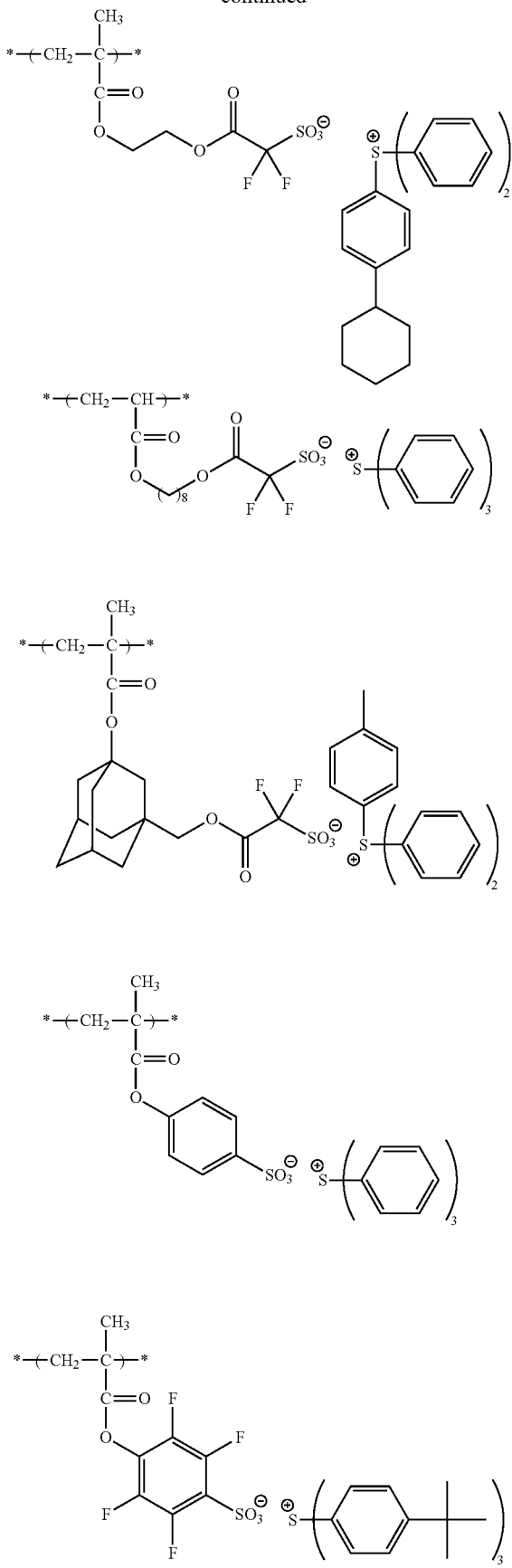

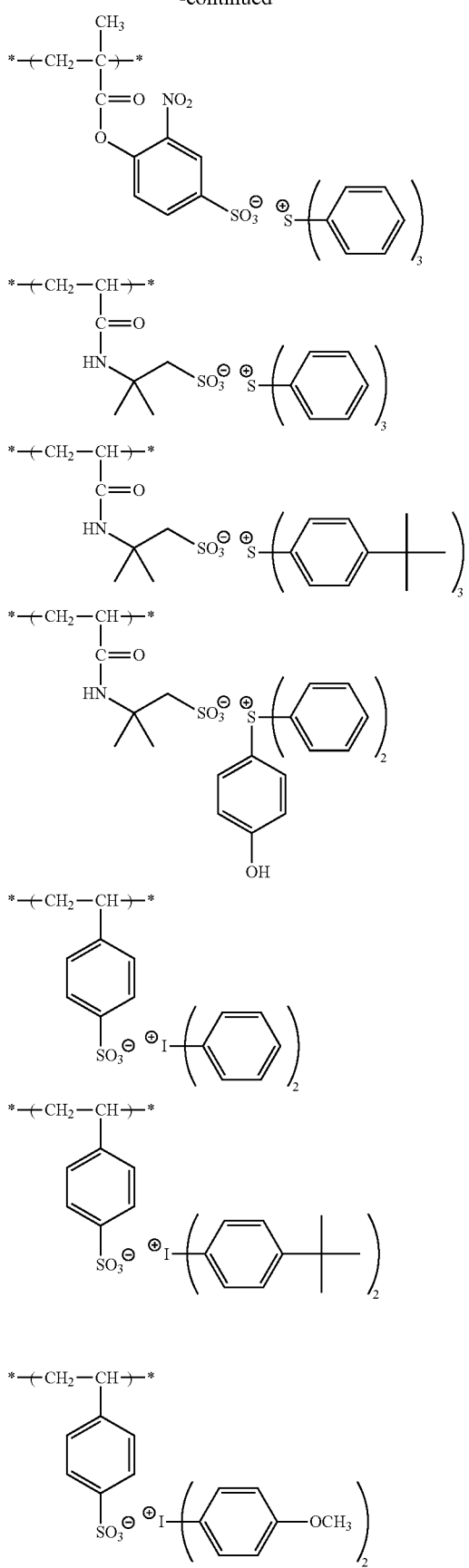

27
-continued
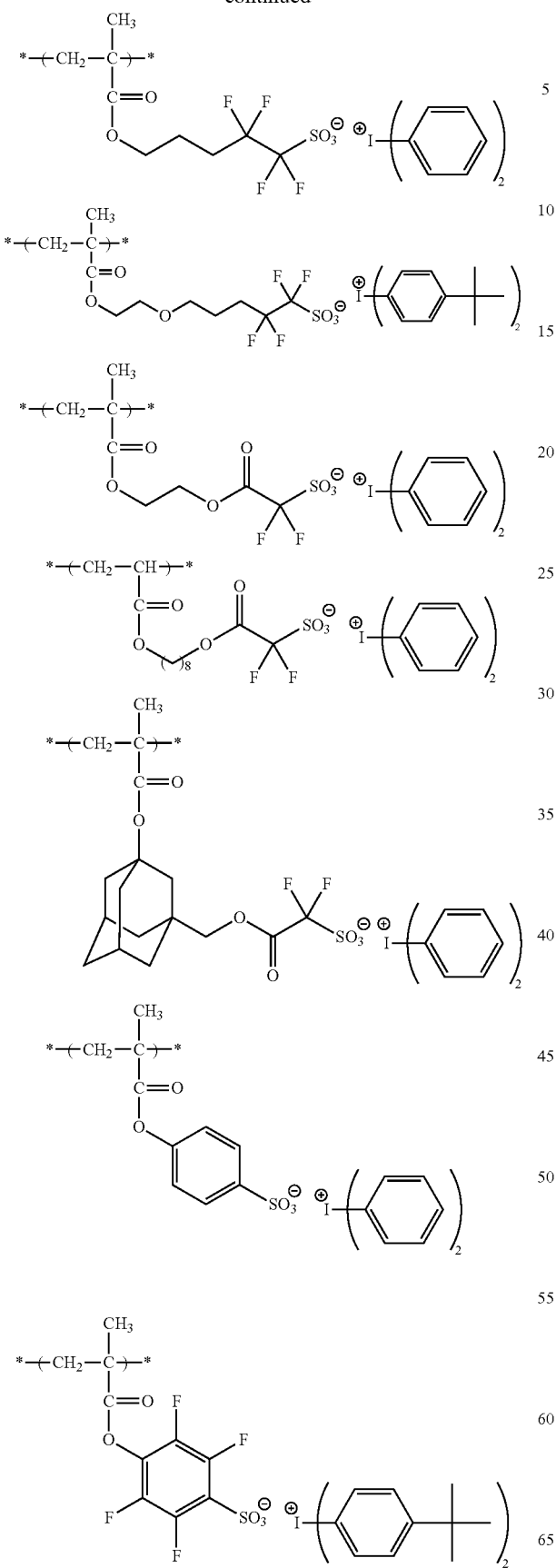
28
-continued
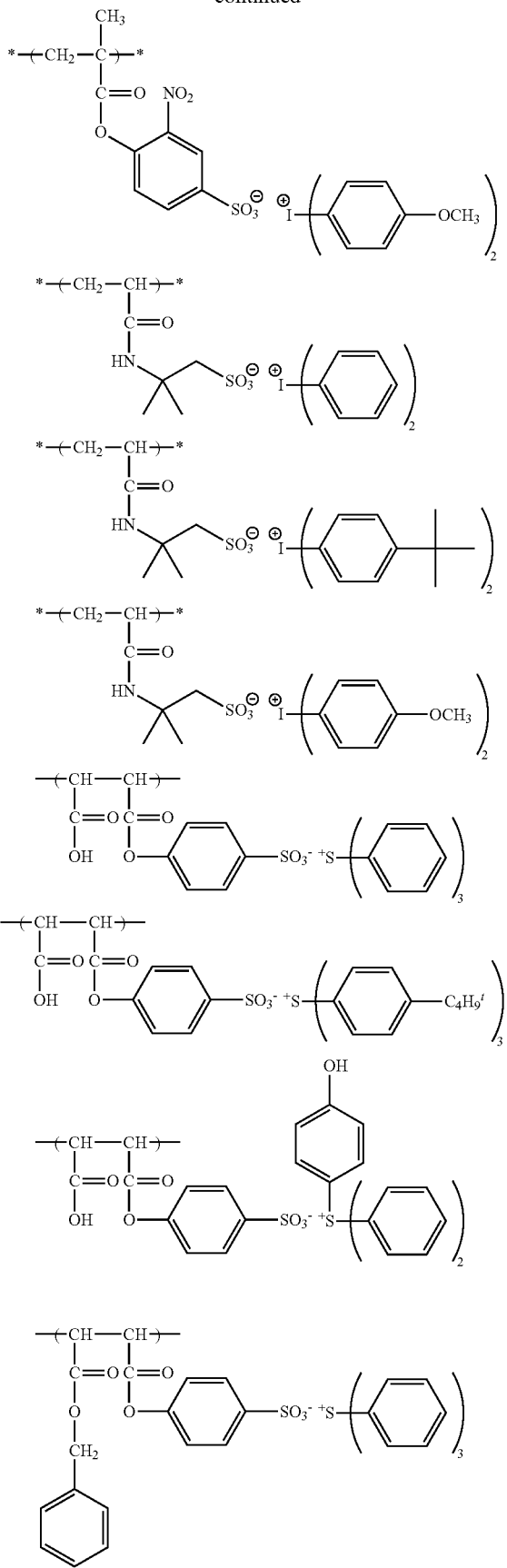

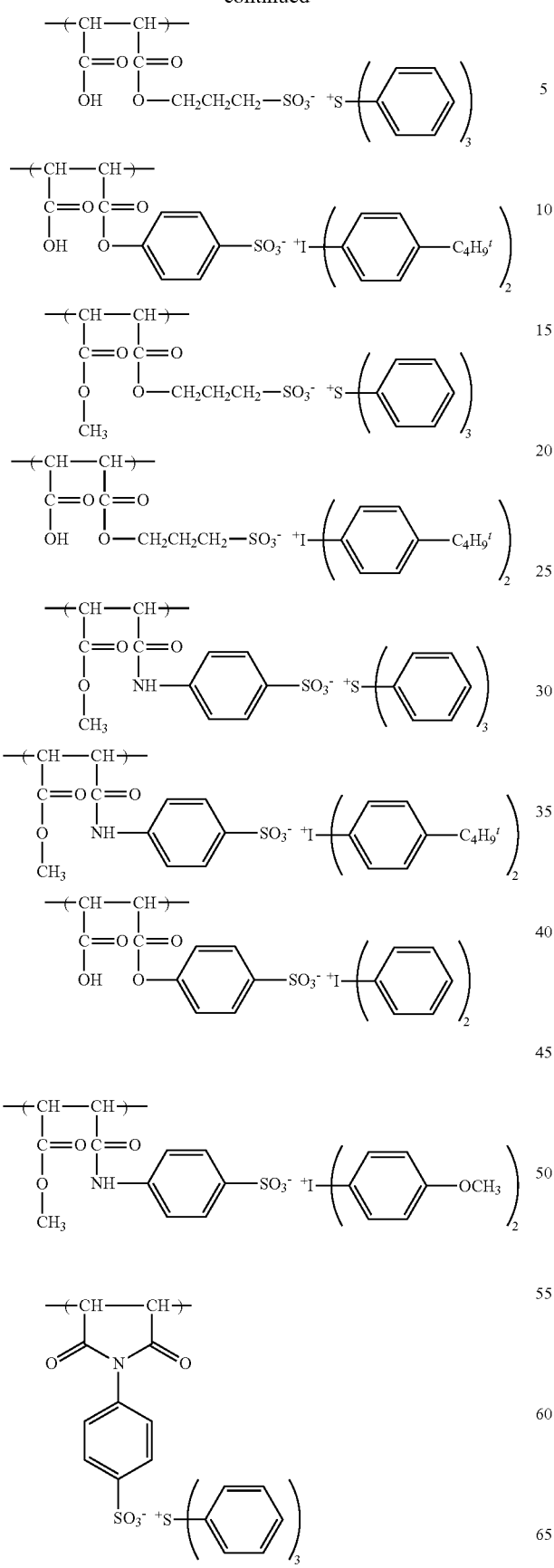
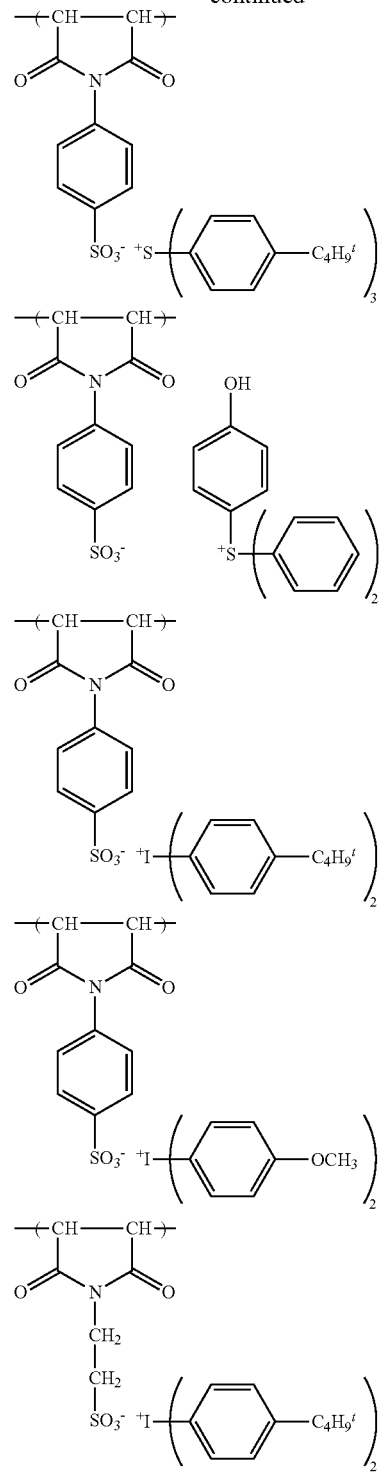

(2) Repeating Unit (B):

The repeating unit (B) contained in the resin (P) is a repeating unit having at least one phenolic hydroxyl group, a part or all of hydrogen atoms of the hydroxyl group or groups each being protected by a group capable of leaving by the action of an acid.

As the repeating unit (B), any repeating unit is useful so far as it is a repeating unit having at least one phenolic hydroxyl group, a part or all of hydrogen atoms of the hydroxyl group or groups each being protected by a group capable of leaving by the action of an acid.

As the repeating unit (B), for example, a repeating structural unit represented by the following general formula (I) is preferable.

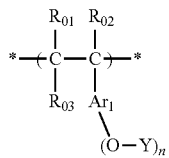

(I)

In the foregoing general formula (I), each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group;

each of n Ys independently represents a hydrogen atom or a group capable of leaving by the action of an acid, provided that at least one of Ys represents a group capable of leaving by the action of an acid; and n represents an integer of from 1 to 4, preferably from 1 to 2, and more preferably 1.

In the foregoing general formula (I), examples of the alkyl group represented by $R_{01}$ to $R_{03}$ which is preferable include an optionally substituted alkyl group having not more than 20 carbon atoms, for example, a methyl group, an ethyl group, a propyl group, an isopropyl group, an n-butyl group, a sec-butyl group, a hexyl group, a 2-ethylhexyl group, an octyl group and a dodecyl group. Of these, an alkyl group having not more than 8 carbon atoms is more preferable.

As the alkyl group contained in the alkoxycarbonyl group, the same alkyl groups in the foregoing $R_{01}$ to $R_{03}$ are preferable.

Examples of the cycloalkyl group include a cycloalkyl group which may be of a monocyclic type or a polycyclic type. Of these, an optionally substituted cycloalkyl group of a monocyclic type having from 3 to 8 carbon atoms, for example, a cyclopropyl group, a cyclopentyl group and a cyclohexyl group, is preferable.

Examples of the halogen atom include a fluorine atom, a chlorine atom, a bromine atom and an iodine atom. Of these, a fluorine atom is more preferable.

In the case where $R_{03}$ represents an alkylene group, examples of the alkylene group which is preferable include an alkylene group having from 1 to 8 carbon atoms, for example, a methylene group, an ethylene group, a propylene group, a butylene group, a hexylene group and an octylene group.

The aromatic ring group represented by $Ar_1$ is preferably an optionally substituted aromatic ring group having from 6 to 14 carbon atoms, and specific examples thereof include a benzene ring and a naphthalene ring.

Each of n Ys independently represents a hydrogen atom or a group capable of leaving by the action of an acid, provided that at least one of n Ys represents a group capable of leaving by the action of an acid.

Examples of the group Y capable of leaving by the action of an acid include —$C(R_{36})(R_{37})(R_{38})$, —$C(=O)$—O—$C(R_{36})(R_{37})(R_{38})$, —$C(R_{01})(R_{02})(OR_{39})$, —$C(R_{01})(R_{02})$—C(=O)—O—$C(R_{36})(R_{37})(R_{38})$ and —$CH(R_{36})(Ar)$.

In the foregoing formulae, each of $R_{36}$ to $R_{39}$ independently represents an alkyl group, a cycloalkyl group, an aryl group, an aralkyl group or an alkenyl group, and $R_{36}$ and $R_{37}$ may be bonded to each other to form a ring.

Each of $R_{01}$ to $R_{02}$ independently represents a hydrogen atom, an alkyl group, a cycloalkyl group, an aryl group, an aralkyl group or an alkenyl group.

Ar represents an aryl group.

The alkyl group represented by $R_{36}$ to $R_{39}$, $R_{01}$ and $R_{02}$ is preferably an alkyl group having from 1 to 8 carbon atoms, and examples thereof include a methyl group, an ethyl group, a propyl group, an n-butyl group, a sec-butyl group, a hexyl group and an octyl group.

The cycloalkyl group represented by $R_{36}$ to $R_{39}$, $R_{01}$ and $R_{02}$ may be of a monocyclic type or a polycyclic type. As the cycloalkyl group of a monocyclic type, a cycloalkyl group having from 3 to 8 carbon atoms is preferable, and examples thereof include a cyclopropyl group, a cyclobutyl group, a cyclopentyl group, a cyclohexyl group and a cyclooctyl group. As the cycloalkyl group of a polycyclic type, a cycloalkyl group having from 6 to 20 carbon atoms is preferable, and examples thereof include an adamantyl group, a norbornyl group, an isoboronyl group, a camphornyl group, a dicyclopentyl group, an α-pinel group, a tricyclodecanyl group, a tetracyclododecyl group and an androstanyl group. A part of carbon atoms in the cycloalkyl group may be substituted with a hetero atom such as an oxygen atom.

The aryl group represented by $R_{36}$ to $R_{39}$, $R_{01}$, $R_{02}$ and Ar is preferably an aryl group having from 6 to 10 carbon atoms, and examples thereof include a phenyl group, a naphthyl group and an anthryl group.

The aralkyl group represented by $R_{36}$ to $R_{39}$, $R_{01}$ and $R_{02}$ is preferably an aralkyl group having from 7 to 12 carbon atoms, and examples thereof include a benzyl group, a phenethyl group and a naphthylmethyl group.

The alkenyl group represented by $R_{36}$ to $R_{39}$, $R_{01}$ and $R_{02}$ is preferably an alkenyl group having from 2 to 8 carbon atoms, and examples thereof include a vinyl group, an allyl group, a butenyl group and a cyclohexenyl group.

The ring formed through bonding of $R_{36}$ and $R_{37}$ to each other may be of a monocyclic type or a polycyclic type. The ring of a monocyclic type is preferably a cycloalkane structure having from 3 to 8 carbon atoms, and examples thereof include a cyclopropane structure, a cyclobutane structure, a cyclopentane structure, a cyclohexane structure, a cycloheptane structure and a cyclooctane structure. The ring of a polycyclic type is preferably a cycloalkane structure having from 6 to 20 carbon atoms, and examples thereof include an adamantane structure, a norbornane structure, a dicyclopentane structure, a tricyclodecane structure and a tetracyclododecane structure. A part of carbon atoms in the cycloalkane structure may be substituted with a hetero atom such as an oxygen atom.

Each of the groups represented by $R_{36}$ to $R_{39}$, $R_{01}$, $R_{02}$, $R_{03}$, Ar and $Ar_1$ may have a substituent. Examples of the substituent include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. A carbon atom number of the substituent is preferably not more than 8.

As the group Y capable of leaving by the action of an acid, a structure represented by the following general formula (II) is more preferable.

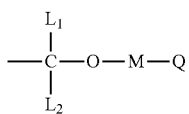

(II)

In the foregoing general formula (II), each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group.

At least two of Q, M and $L_1$ may be bonded to each other to form a 5-membered or 6-membered ring.

Examples of the alkyl group represented by $L_1$ and $L_2$ include an alkyl group having from 1 to 8 carbon atoms. Specific examples of the alkyl group which is preferable include a methyl group, an ethyl group, a propyl group, an n-butyl group, a sec-butyl group, a hexyl group and an octyl group.

Examples of the cycloalkyl group represented by $L_1$ and $L_2$ include a cycloalkyl group having from 3 to 15 carbon atoms. Specific examples of the cycloalkyl group which is preferable include a cyclopentyl group, a cyclohexyl group, a norbornyl group and an adamantyl group.

Examples of the aryl group represented by $L_1$ and $L_2$ include an aryl group having from 6 to 15 carbon atoms. Specific examples of the aryl group which is preferable include a phenyl group, a tolyl group, a naphthyl group and an anthryl group.

Examples of the aralkyl group represented by $L_1$ and $L_2$ include an aralkyl group having from 6 to 20 carbon atoms, for example, a benzyl group and a phenethyl group.

At least one of $L_1$ and $L_2$ is preferably a hydrogen atom.

Examples of the divalent linking group represented by M include an alkylene group (for example, a methylene group, an ethylene group, a propylene group, a butylene group, a hexylene group and an octylene group), a cycloalkylene group (for example, a cyclopentylene group and a cyclohexylene group), an alkenylene group (for example, an ethylene group, a propenylene group and a butenylene group), an arylene group (for example, a phenylene group, a tolylene group and a naphthylene group), —S—, —O—, —CO—, —SO$_2$—, —N(R$_0$)— and a divalent linking group obtained by combining a plurality of the foregoing groups. $R_0$ represents a hydrogen atom or an alkyl group (for example, an alkyl group having from 1 to 8 carbon atoms, specific examples of which include a methyl group, an ethyl group, a propyl group, an n-butyl group, a sec-butyl group, a hexyl group and an octyl group).

Examples of the alkyl group or cycloalkyl group represented by Q include the same groups as those in the foregoing $L_1$ and $L_2$.

Examples of the alicyclic group in the aliphatic group which may contain a hetero atom and the aromatic ring group in the aromatic ring group which may contain a hetero atom include the same cycloalkyl groups and aryl groups as those in the foregoing $L_1$ and $L_2$. Of these, alicyclic groups and aromatic ring groups each having from 3 to 15 carbon atoms are preferable.

Examples of the hetero atom-containing alicyclic group and the hetero atom-containing aromatic ring group include groups having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone. However, the hetero atom-containing alicyclic group and the hetero atom-containing aromatic ring group are not limited thereto so far as they have a structure which is generally called a hetero ring (a ring formed by carbon and a hetero atom or a ring formed by a hetero atom).

Examples of the 5-membered or 6-membered ring which at least two of Q, M and $L_1$ may be bonded to each other to form include the case where at least two of Q, M and $L_1$ are bonded to each other to form, for example, a propylene group or a butylene group, thereby forming an oxygen atom-containing 5-membered or 6-membered ring.

Each of the groups represented by $L_1$, $L_2$, M and Q in the general formula (II) may have a substituent, and examples thereof include the same substituents as those which each of the foregoing $R_{36}$ to $R_{39}$, $R_{01}$, $R_{02}$, $R_{03}$, Ar and $Ar_1$ may have. A carbon atom number of the substituent is preferably not more than 8.

The group represented by -M-Q is preferably a group constituted of from 1 to 30 carbon atoms, and more preferably a group constituted of from 5 to 20 carbon atoms.

Specific examples of the repeating unit represented by the general formula (I) are given below, but it should not be construed that the invention is limited thereto.

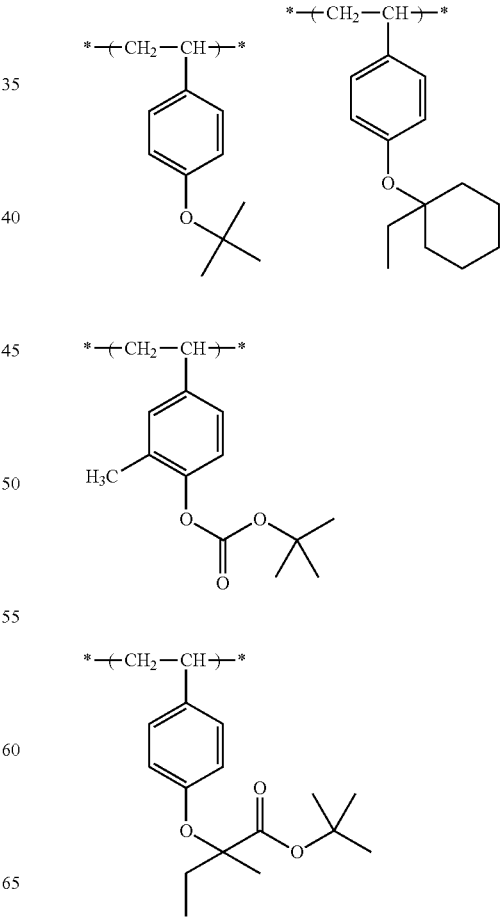

-continued
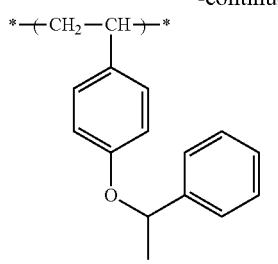 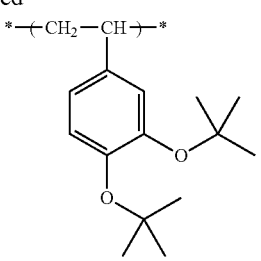
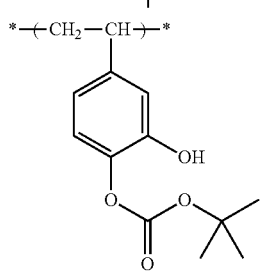 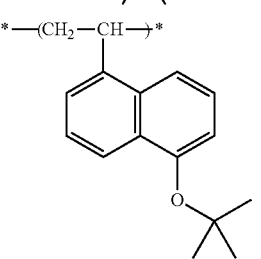
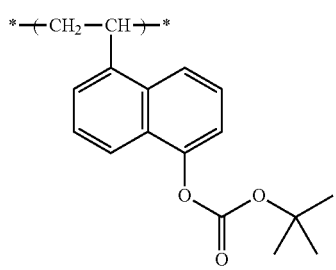
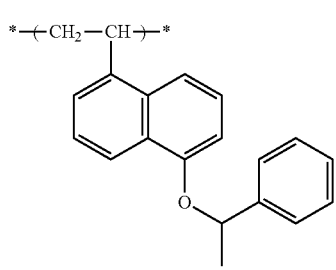
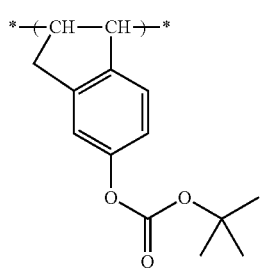
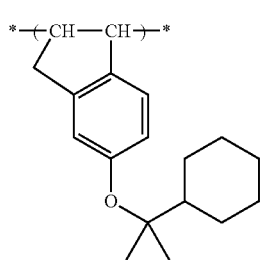 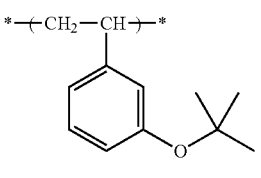
-continued
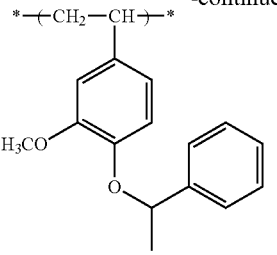
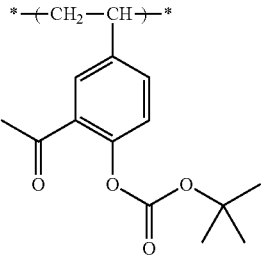
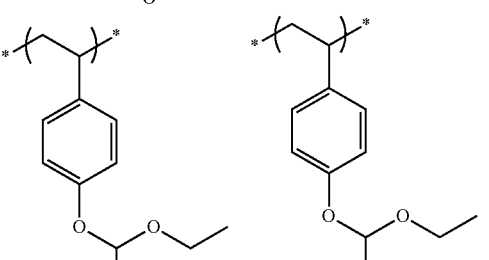
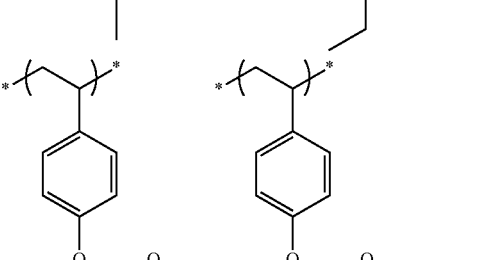
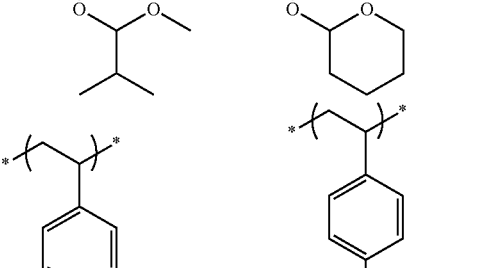
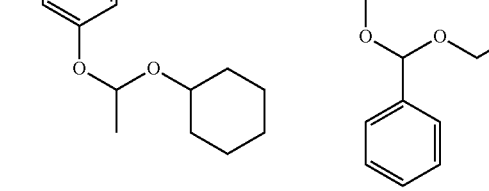
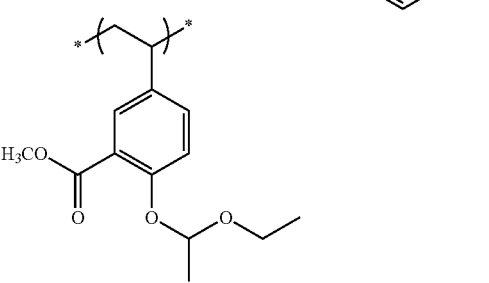

37
-continued
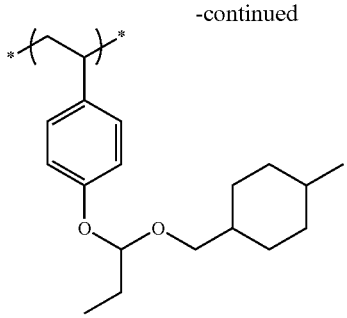
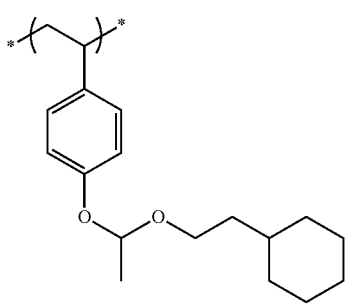
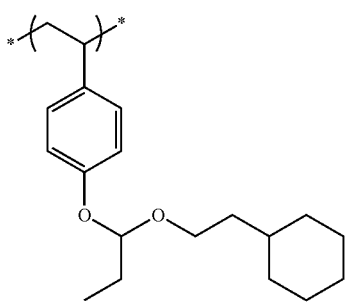
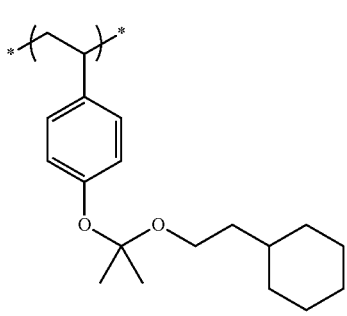
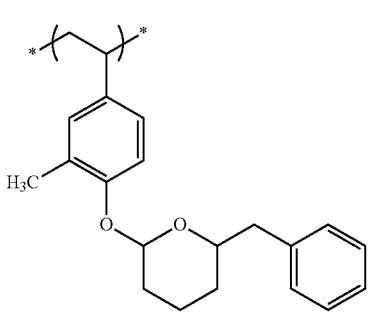
38
-continued
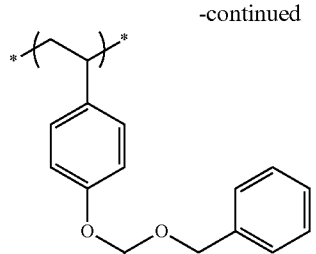
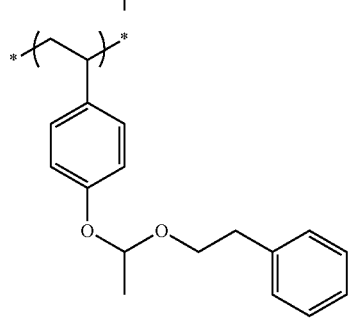
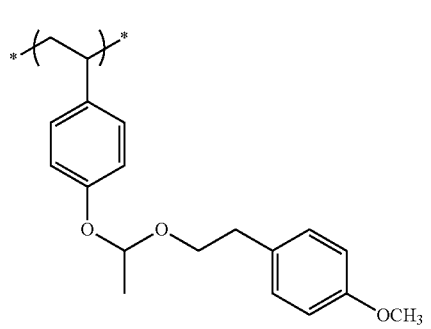
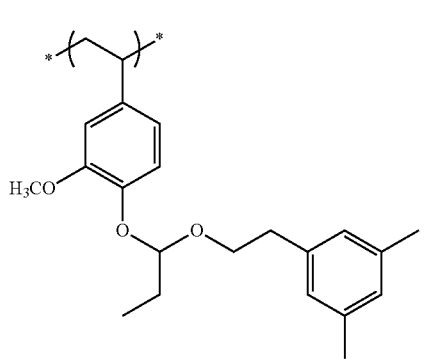
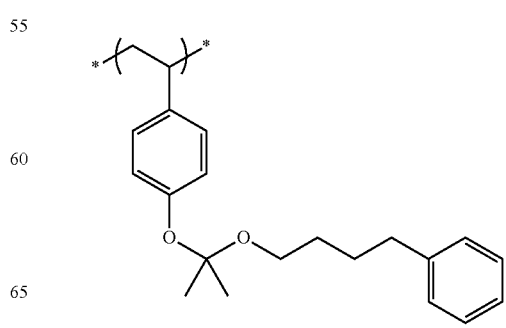

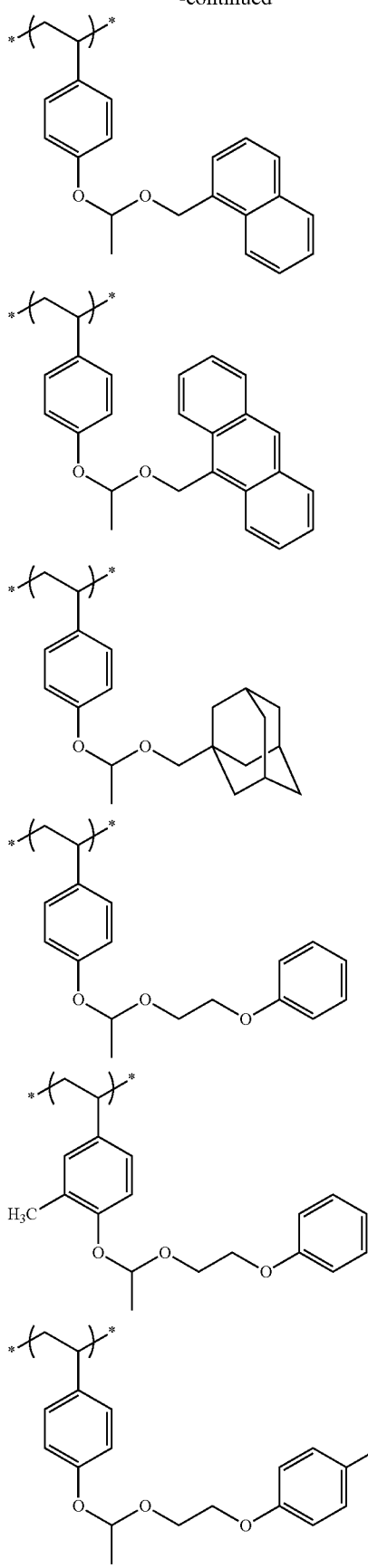
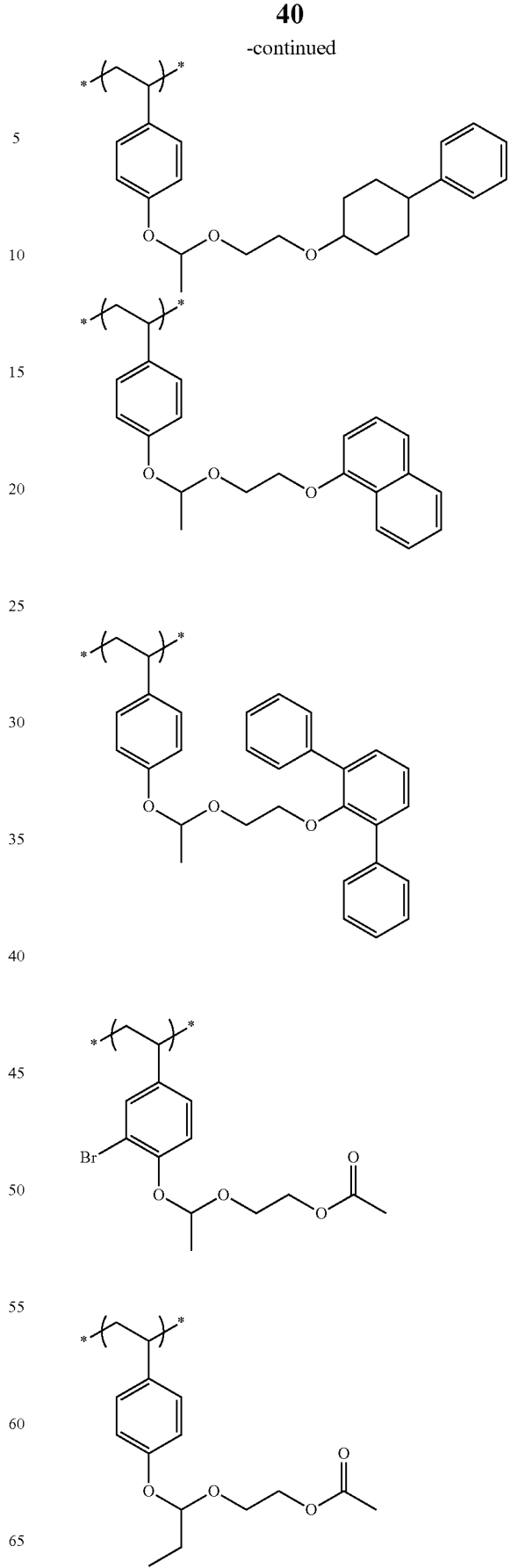

41
-continued
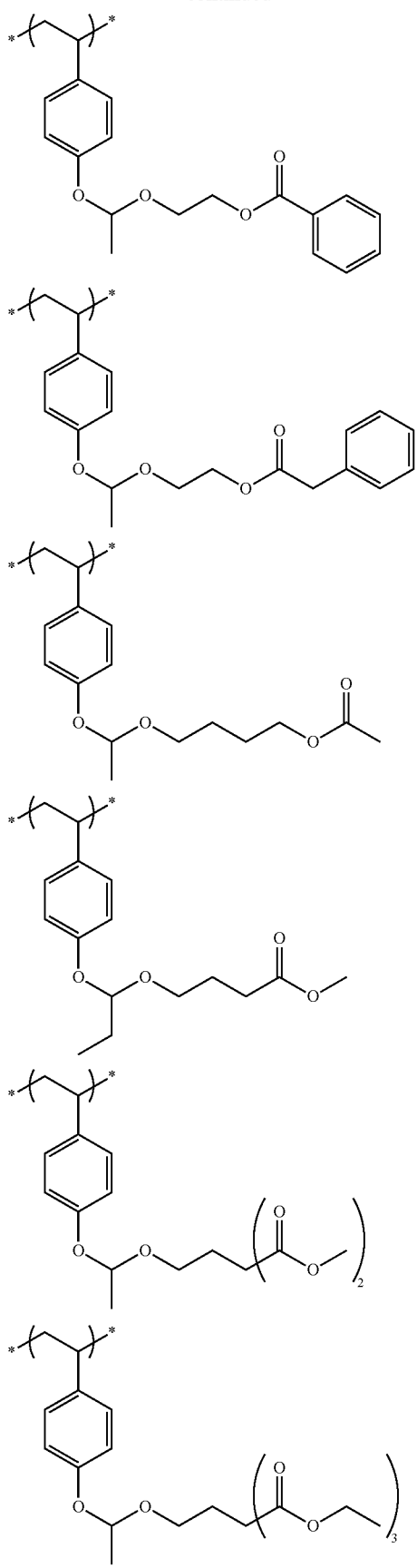
42
-continued
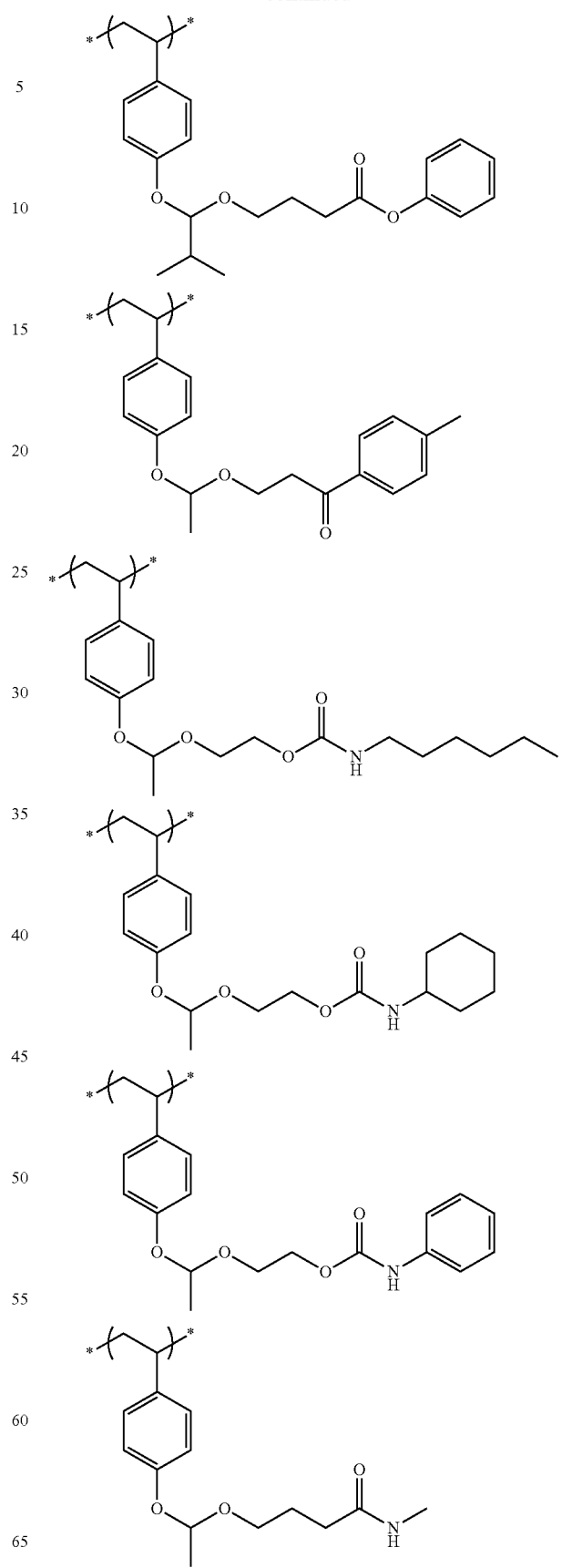

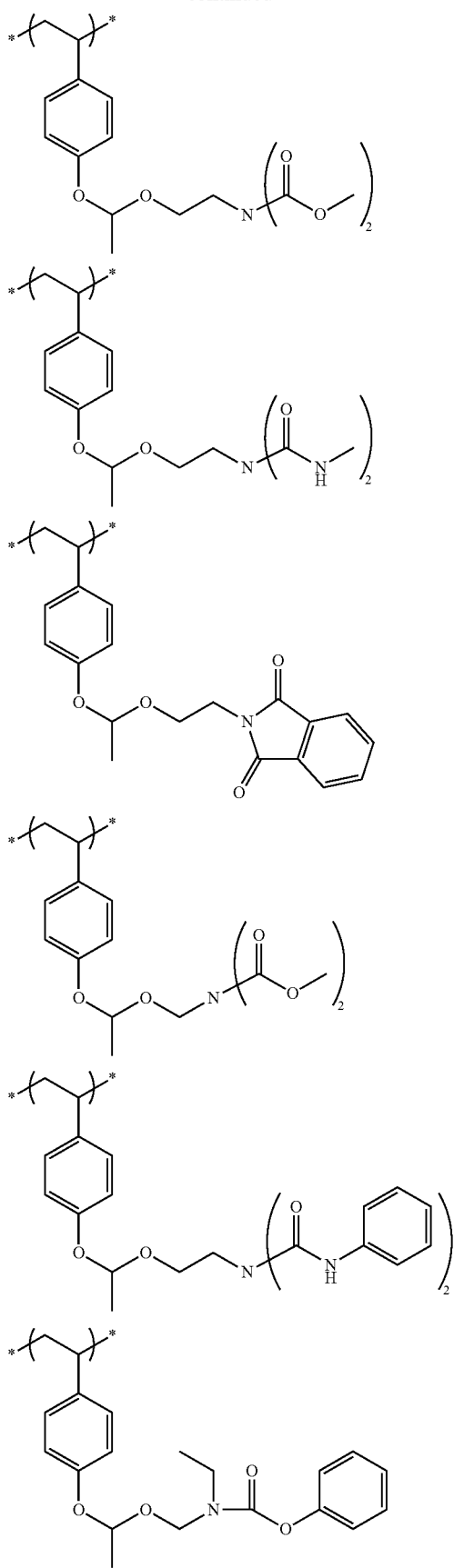
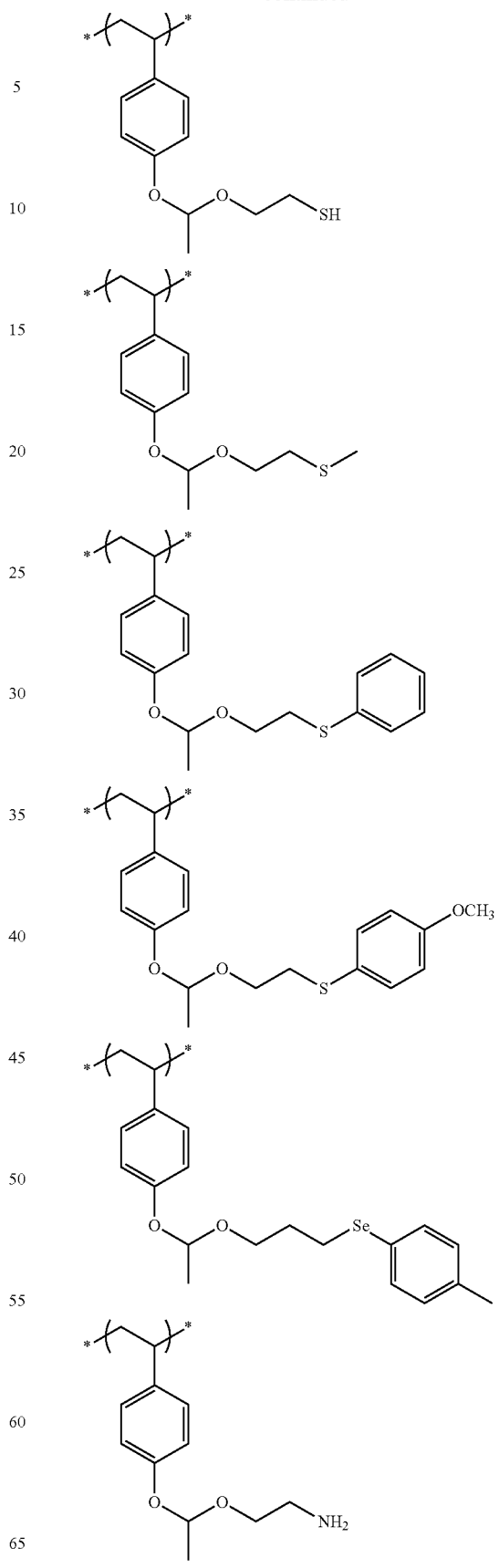

45
-continued
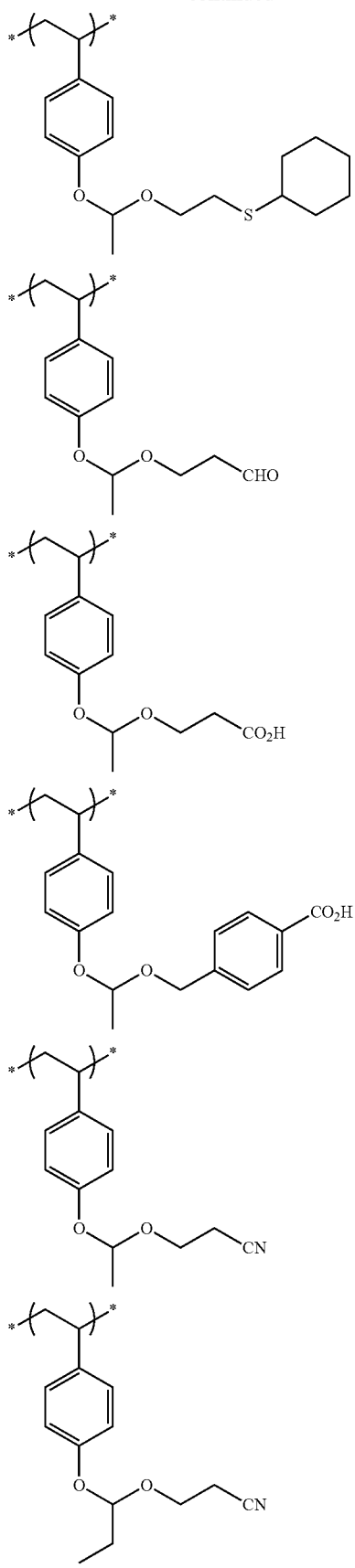
46
-continued
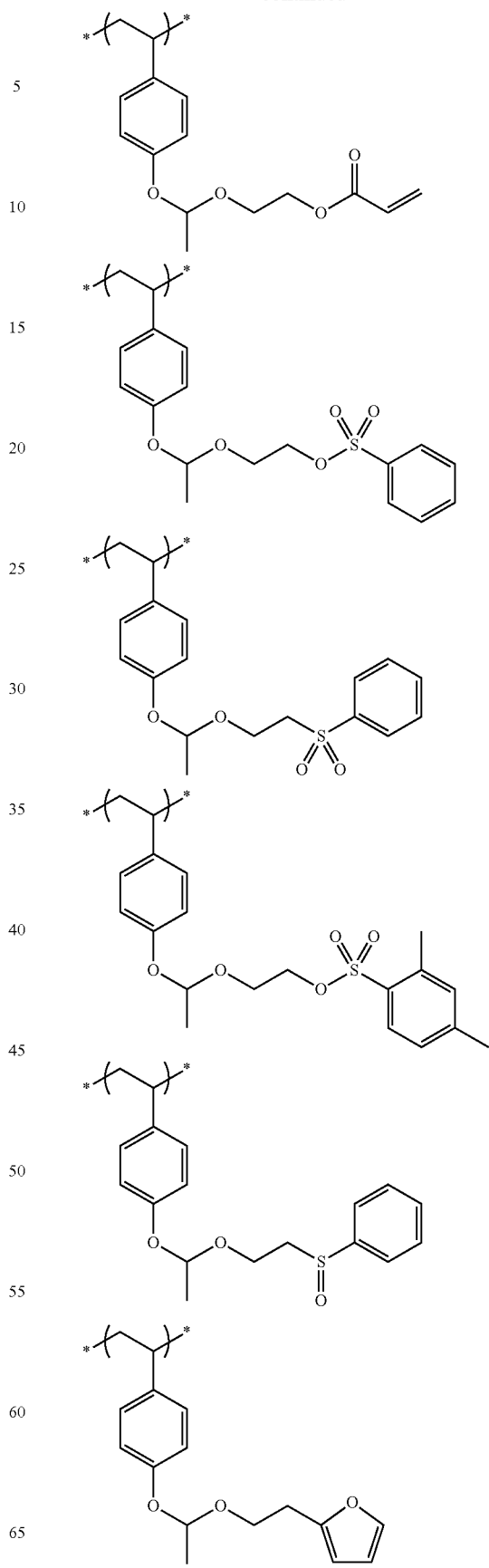

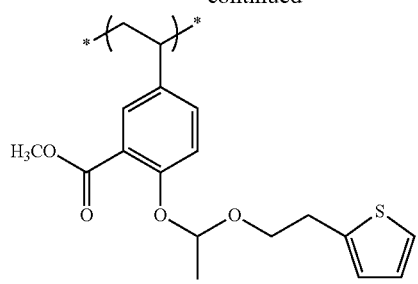
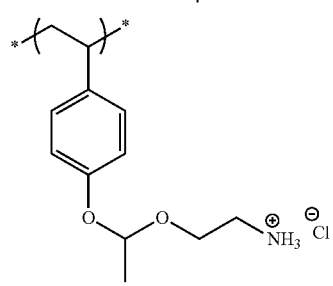
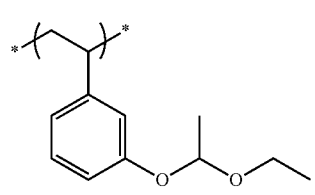
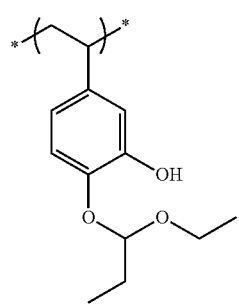
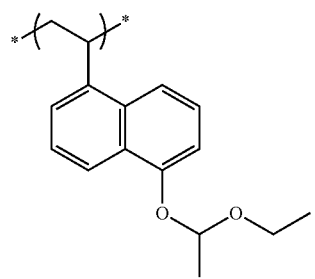
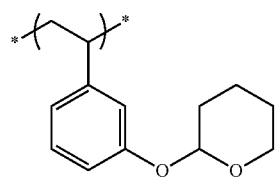
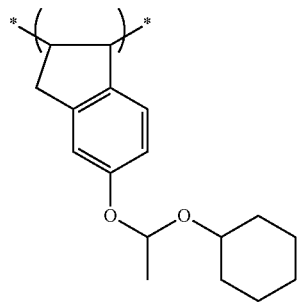
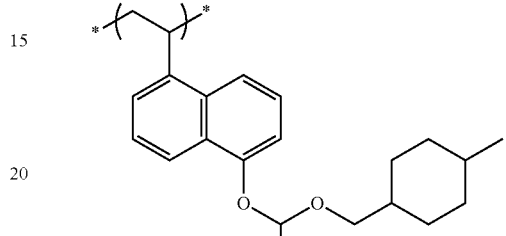
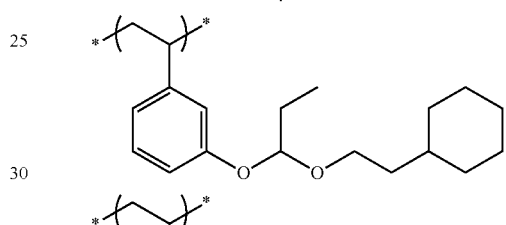
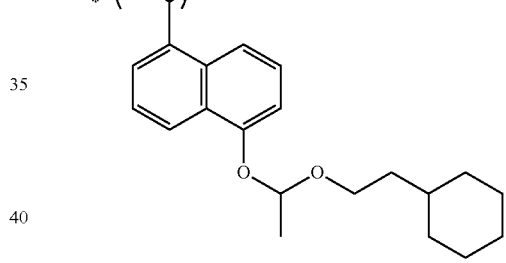
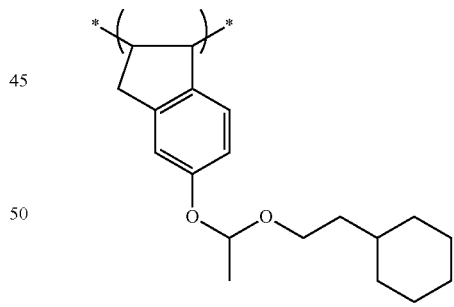
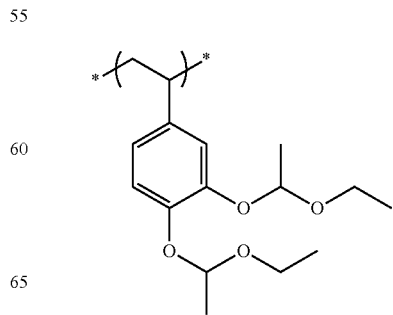

-continued
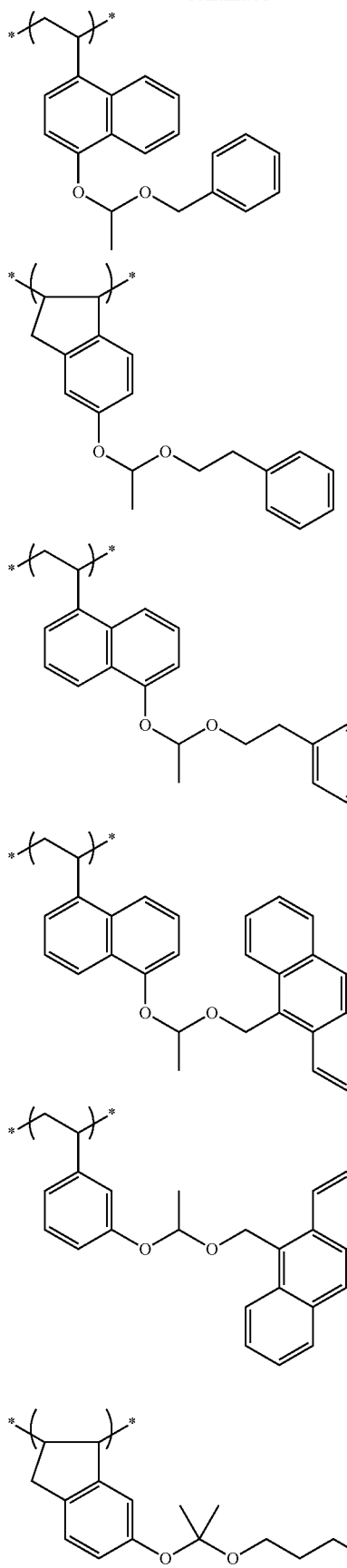
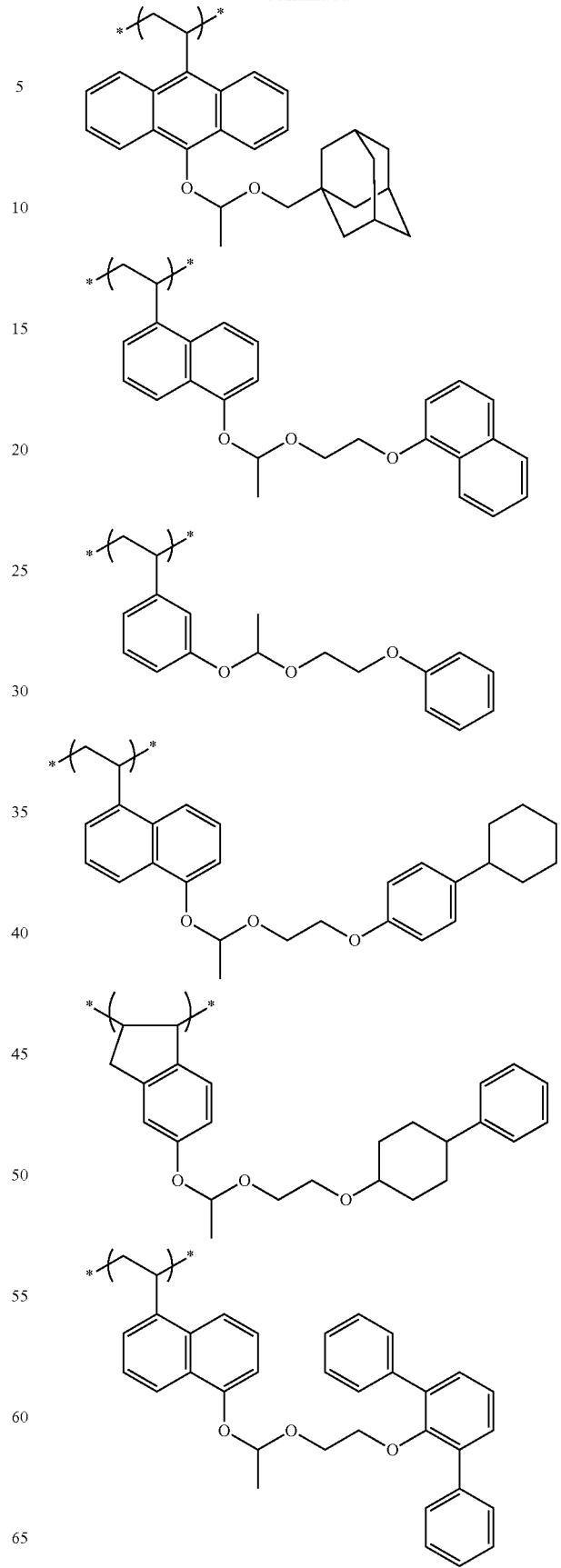

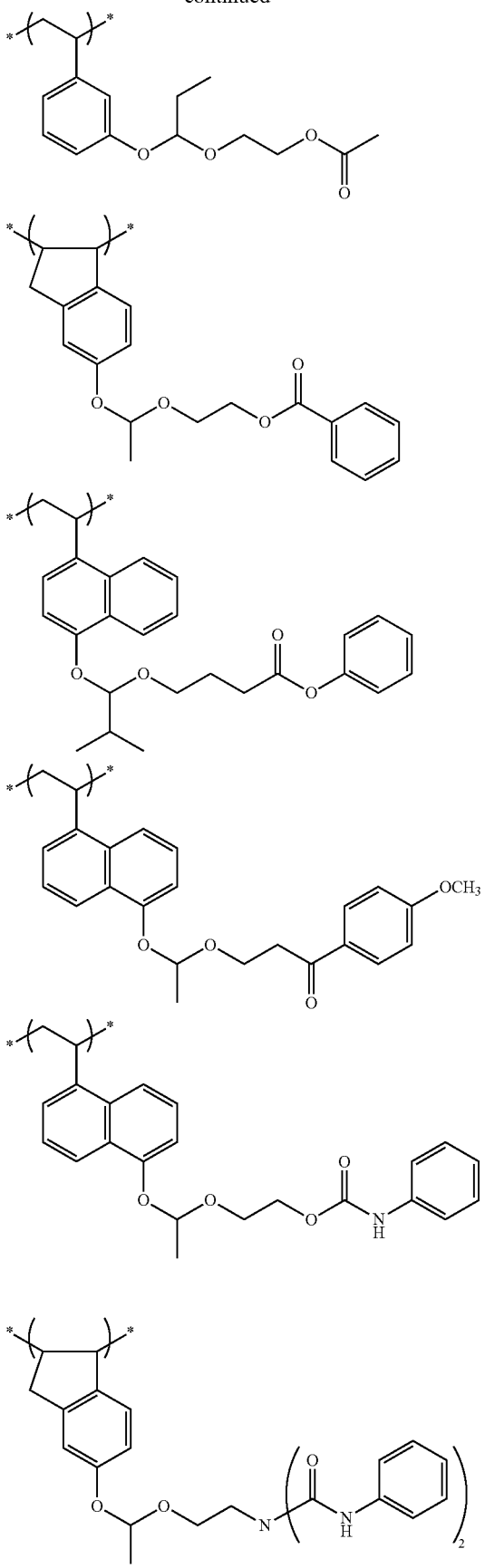

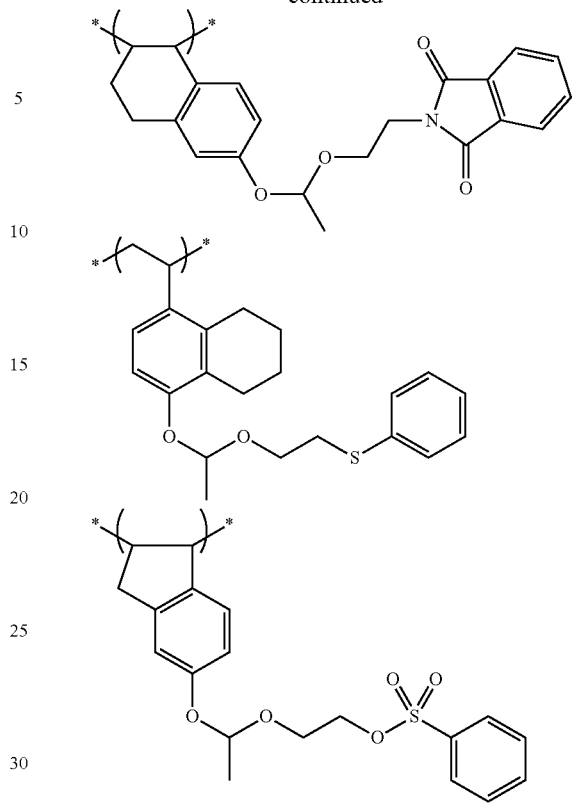

A content of the repeating unit (B) in the resin of the invention is preferably in the range of from 3 to 90% by mole, more preferably in the range of from 5 to 80% by mole, and especially preferably in the range of from 7 to 70% by mole relative to the whole of repeating units.

A ratio of the repeating unit (A) to the repeating unit (B) ((molar number of A)/(molar number of B)) in the resin is preferably from 0.04 to 1.0, more preferably from 0.05 to 0.9, and especially preferably from 0.06 to 0.8.

(3) Repeating Unit (C):

It is preferable that the resin in the invention further has a repeating unit (C) represented by the following general formula (VI).

(VI)

In the general formula (VI), each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group; and n represents an integer of from 1 to 4.

Specific examples of $R_{01}$, $R_{02}$, $R_{03}$ and $Ar_1$ in the generation formula (VI) include the same groups as those in $R_{01}$, $R_{02}$, $R_{03}$ and $Ar_1$ in the generation formula (I).

Specific examples of the repeating unit represented by the general formula (VI) are given below, but it should not be construed that the invention is limited thereto.

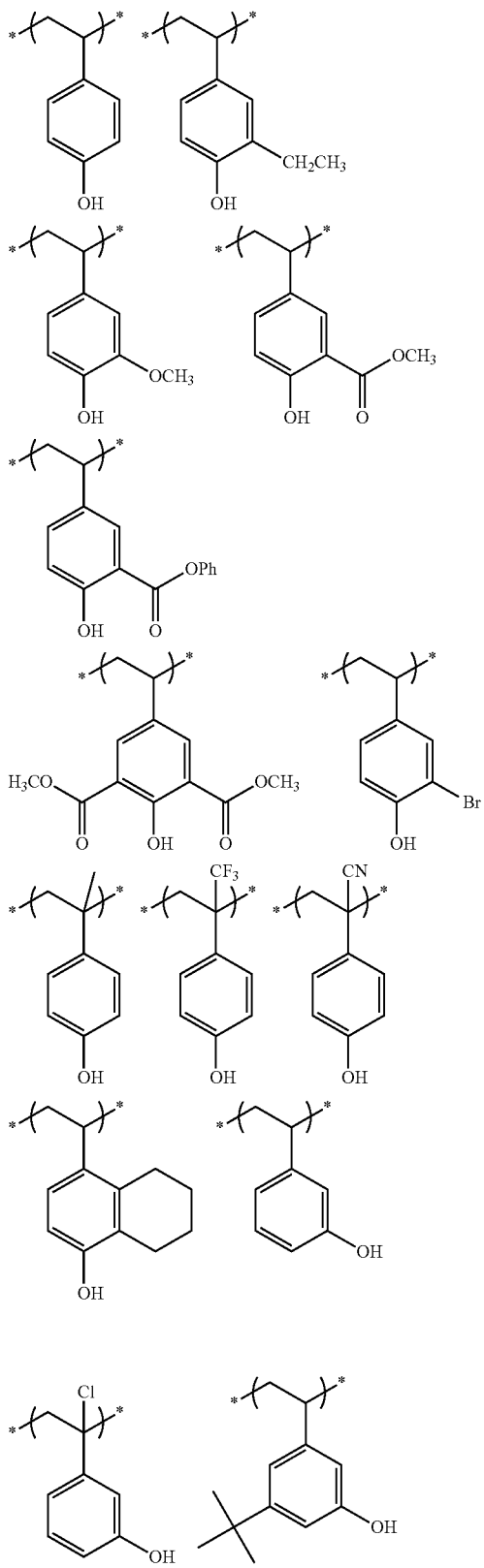

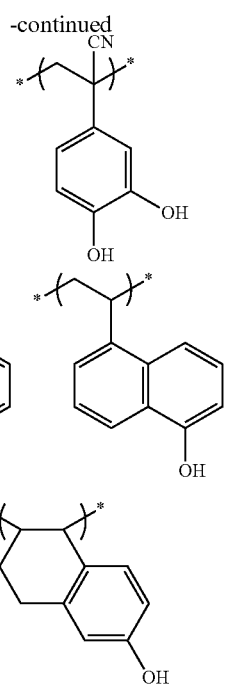

A content of the repeating unit (C) in the resin of the invention is preferably in the range of from 3 to 90% by mole, more preferably in the range of from 5 to 80% by mole, and especially preferably in the range of from 7 to 70% by mole relative to the whole of repeating units.

(4) Form, polymerization method, molecular weight and the like of the resin (P) of the invention:

The form of the resin (P) may be any form of a random type, a block type, a comb type or a star type.

The resin (P) containing the foregoing repeating units (A) and (B) according to the invention, or the resin (P) containing the repeating units (A), (B) and (C) according to the invention, can be synthesized by, for example, radical, cationic or anionic polymerization of an unsaturated monomer corresponding to each of the structures. Also, it is possible to obtain the desired resin by polymerizing an unsaturated monomer corresponding to a precursor of each of the structures and then subjecting it to a polymer reaction.

It is preferable that the resin according to the invention has from 0.5 to 80% by mole of the repeating unit (A), from 3 to 90% by mole of the repeating unit (B) and from 3 to 90% by mole of the repeating unit (C).

Though a molecular weight of the resin (P) according to the invention is not particularly limited, it is preferably in the range of from 1,000 to 100,000, more preferably from 1,500 to 70,000, and especially preferably in the range of from 2,000 to 50,000 in terms of a weight average molecular weight. Here, the weight average molecular weight of the resin refers to a molecular weight as converted into polystyrene by means of GPC (carrier: THF or N-methyl-2-pyrrolidone (NMP)).

Also, a polydispersity (Mw/Mn) is preferably from 1.00 to 5.00, more preferably from 1.03 to 3.50, and further preferably from 1.05 to 2.50.

Also, for the purpose of enhancing the performances of the resin according to the invention, the resin may further have a repeating unit derived from other polymerizable monomer so far as the resistance to dry etching is not noticeably impaired.

A content of the repeating unit derived from other polymerizable monomer in the resin is generally not more than 50% by mole, and preferably not more than 30% by mole relative to the whole of repeating units. Examples of other polymerizable monomer which can be used include a compound having one addition polymerizable unsaturated bond, which is selected from (meth)acrylic acid esters, (meth)acrylamides, allyl compounds, vinyl ethers, vinyl esters, styrenes, crotonic acid esters and the like.

Specifically, examples of (meth)acrylic acid esters include methyl (meth)acrylate, ethyl (meth)acrylate, propyl (meth)acrylate, t-butyl (meth)acrylate, amyl (meth)acrylate, cyclohexyl (meth)acrylate, ethylhexyl (meth)acrylate, octyl (meth)acrylate, t-octyl (meth)acrylate, 2-chloroethyl (meth)acrylate, 2-hydroxyethyl (meth)acrylate, glycidyl (meth)acrylate, benzyl (meth)acrylate and phenyl (meth)acrylate.

Examples of (meth)acrylamides include (meth)acrylamide, N-alkyl (meth)acrylamides (the alkyl group is an alkyl group having from 1 to 10 carbon atoms, for example, a methyl group, an ethyl group, a propyl group, a butyl group, a t-butyl group, a heptyl group, an octyl group, a cyclohexyl group, a benzyl group, a hydroxyethyl group and a benzyl group), N-aryl (meth)acrylamides (examples of the aryl group include a phenyl group, a tolyl group, a nitrophenyl group, a naphthyl group, a cyanophenyl group, a hydroxyphenyl group and a carboxyphenyl group), N,N-dialkyl (meth)acrylamides (the alkyl group is an alkyl group having from 1 to 10 carbon atoms, for example, a methyl group, an ethyl group, a butyl group, an isobutyl group, an ethylhexyl group and a cyclohexyl group), N,N-aryl (meth)acrylamides (examples of the aryl group include a phenyl group), N-methyl-N-phenyl acrylamide, N-hydroxyethyl-N-methyl acrylamide and N-2-acetamidoethyl-N-acetyl acrylamide.

Examples of allyl compounds include allyl esters (for example, allyl acetate, allyl caproate, allyl caprylate, allyl laurate, ally palmitate, allyl stearate, allyl benzoate, allyl acetoacetate and allyl lactate) and allyl oxyethanol.

Examples of vinyl ethers include alkyl vinyl ethers (for example, hexyl vinyl ether, octyl vinyl ether, decyl vinyl ether, ethylhexyl vinyl ether, methoxyethyl vinyl ether, ethoxyethyl vinyl ether, chloromethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether) and vinyl aryl ethers (for example, vinyl phenyl ether, vinyl tolyl ether, vinyl chlorophenyl ether, vinyl 2,4-dichlorophenyl ether, vinyl naphthyl ether and vinyl anthranyl ether).

Examples of vinyl esters include vinyl butyrate, vinyl isobutyrate, vinyl trimethyl acetate, vinyl diethyl acetate, vinyl valeate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl cyclohexylcarboxylate, vinyl benzoate, vinyl salicylate, vinyl chlorobenzoate, vinyl tetrachlorobenzoate and vinyl naphthoate.

Examples of styrenes include styrene, alkystyrenes (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (for example, methexystyrene, 4-methoxy-3-methylstyrene and dimethoxystyrene), alkylcarbonyloxystyrenes (for example, 4-acetoxystyrene and 4-cyclohexylcarbonyloxystyrene), arylcarbonyloxystyrenes (for example, 4-phenylcarbonyloxystyrene), halogen styrenes (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene), cyanostyrene and carboxystyrene.

Examples of crotonic acid esters include alkyl crotonates (for example, butyl crotonate, hexyl crotonate and glycerin monocrotonate).

Examples of dialkyl itaconates include dimethyl itaconate, diethyl itaconate and dibutyl itaconate.

Examples of dialkyl esters of maleic acid or fumaric acid include dimethyl maleate and dibutyl fumarate.

Besides, there can be exemplified maleic anhydride, maleimide, acetonitrile, methacrylonitrile, maleilonitrile and the like. Also, in general, any addition polymerizable unsaturated compound is useful without particular limitations so far as it is copolymerizable with the foregoing repeating units according to the invention.

The resin (P) of the invention can be used singly or in combinations of two or more kinds thereof. A content of the resin (P) is preferably from 30 to 100% by mass, more preferably from 50 to 100% by mass, and especially preferably from 70 to 100% by mass on the basis of the total solids content in the positive working resist composition of the invention.

Specific examples of the resin (P) are given below, but it should not be construed that the invention is limited thereto.

Specific examples of the resin (P) include a resin having at least one repeating unit selected from the specific examples of the foregoing general formulae (III) to (V)/at least one repeating unit selected from the specific examples of the foregoing general formula (I); and a resin having at least one repeating unit selected from the specific examples of the foregoing general formulae (III) to (V)/at least one repeating unit selected from the specific examples of the foregoing general formula (I)/at least one repeating unit selected from the specific examples of the foregoing general formula (VI).

Specific examples of the resin which is more preferable include resins having the following structures.

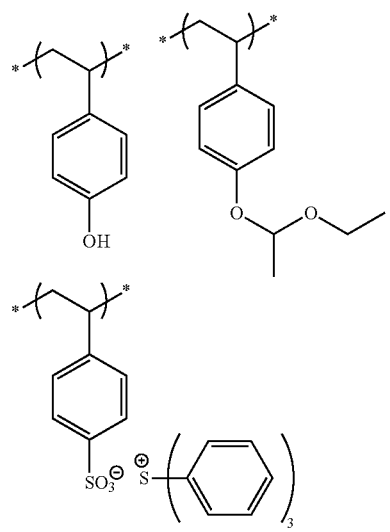

57
-continued
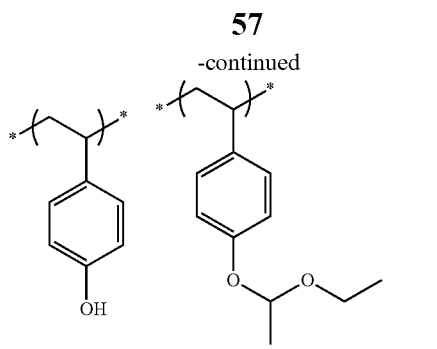
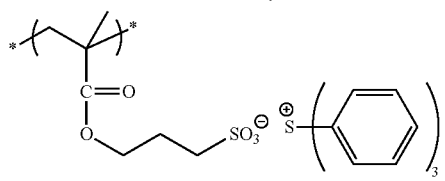
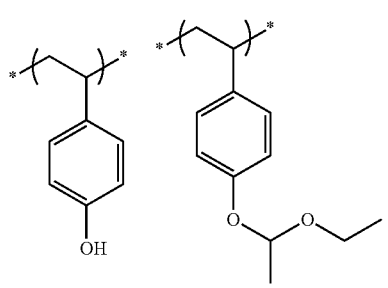
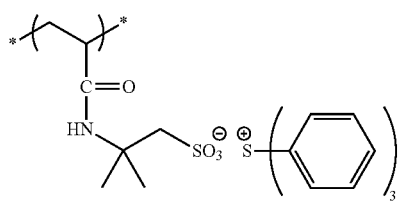
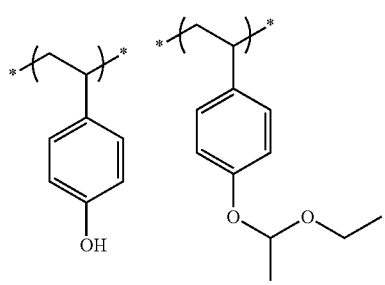
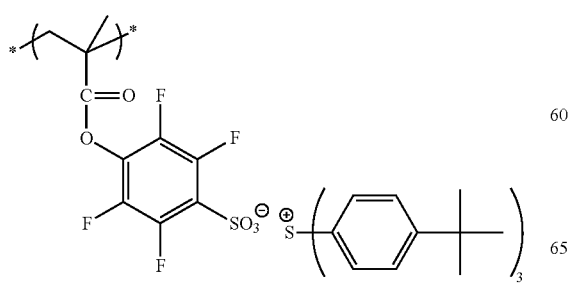
58
-continued
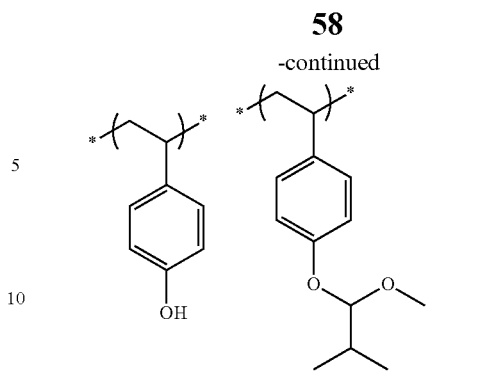
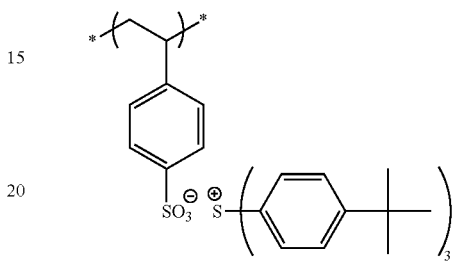
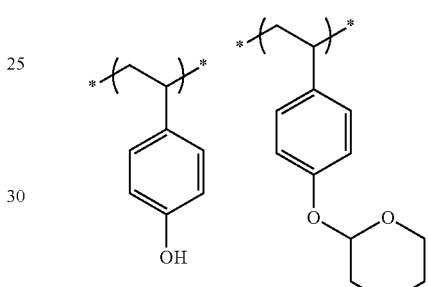
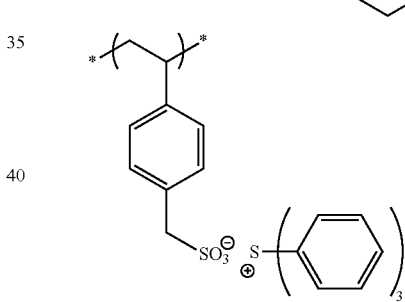
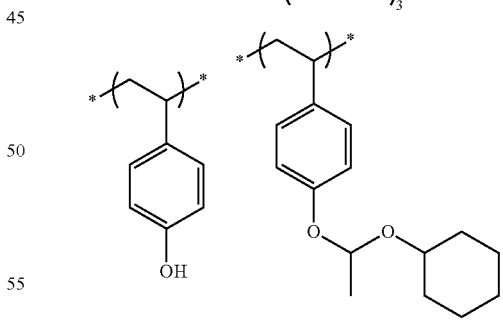
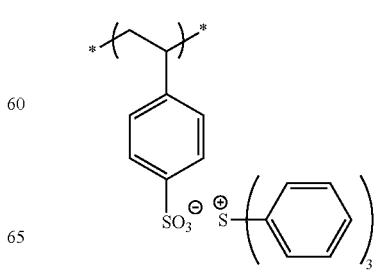

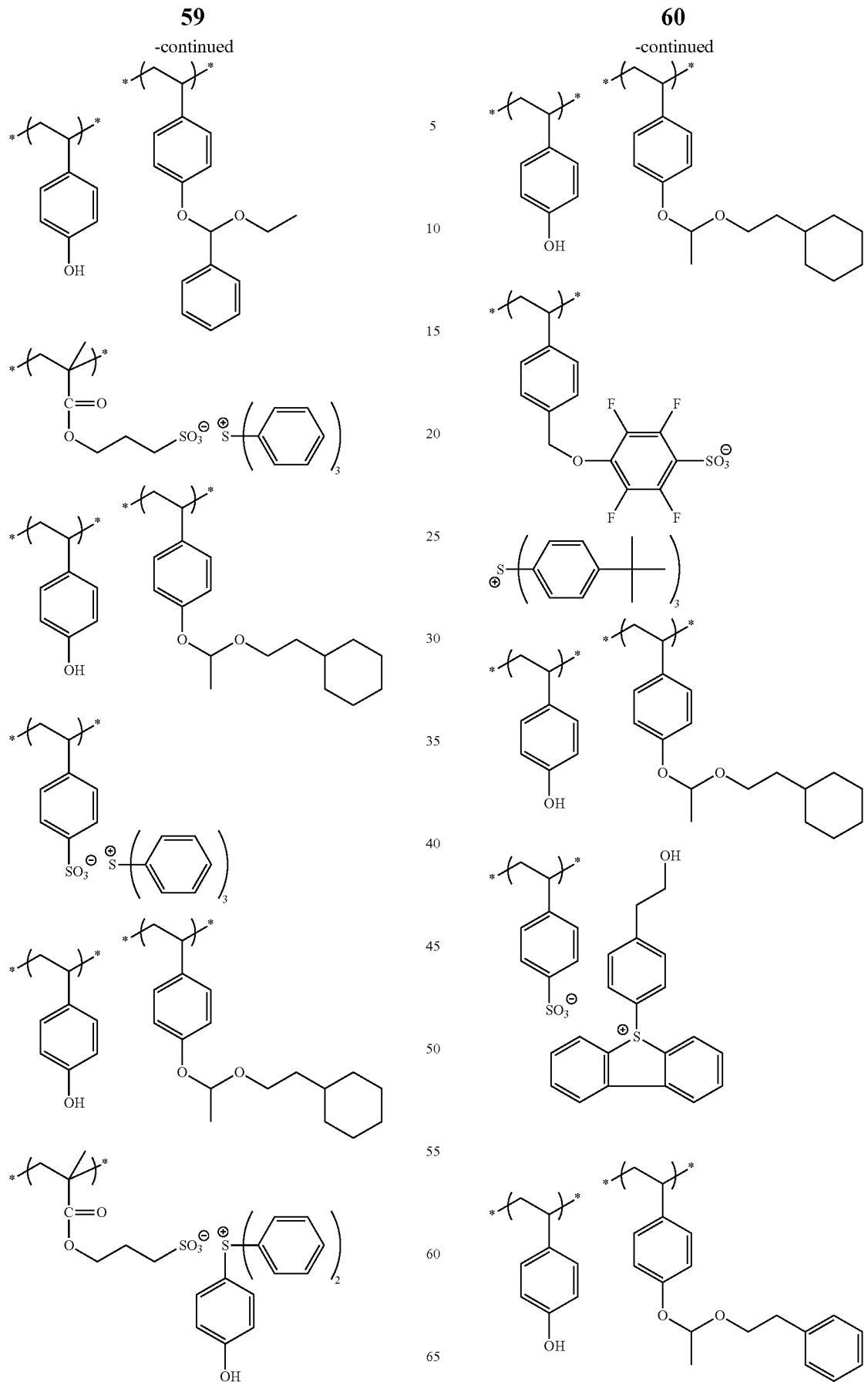

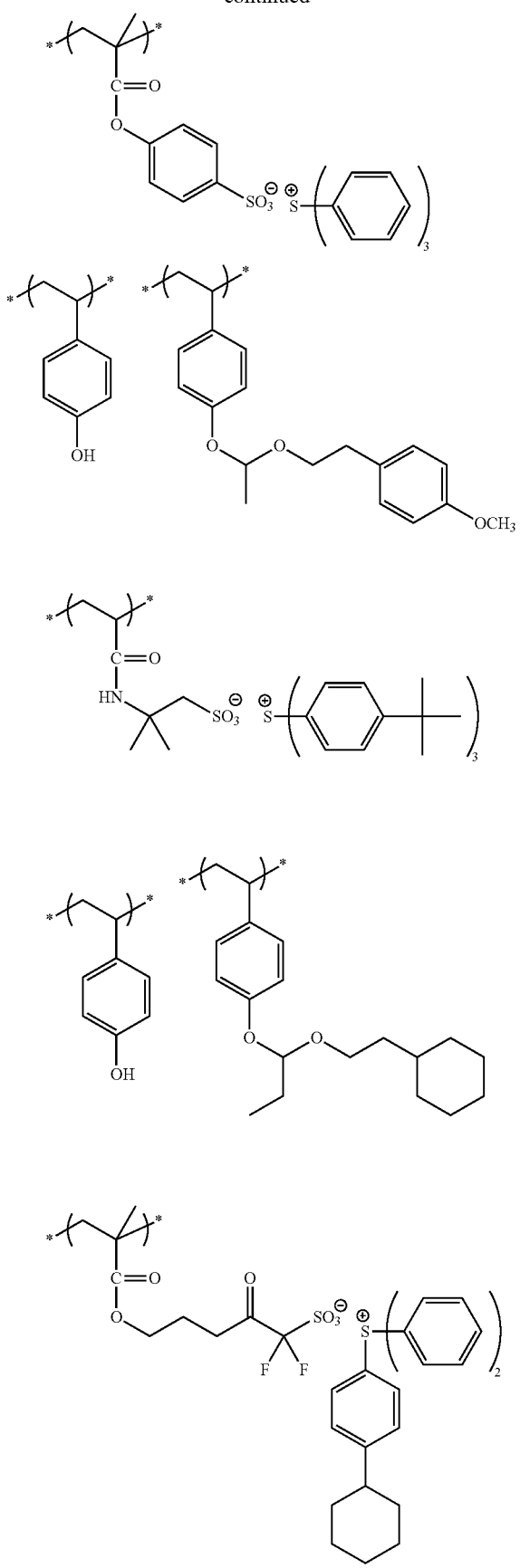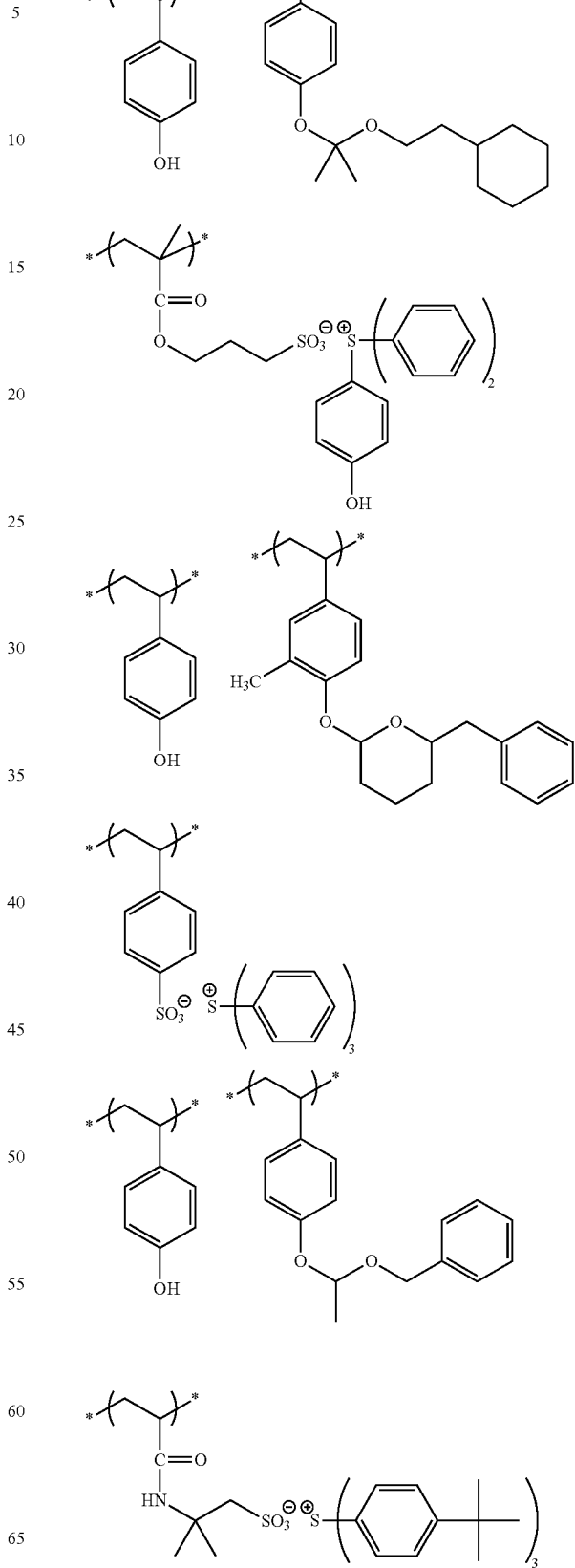

63
-continued
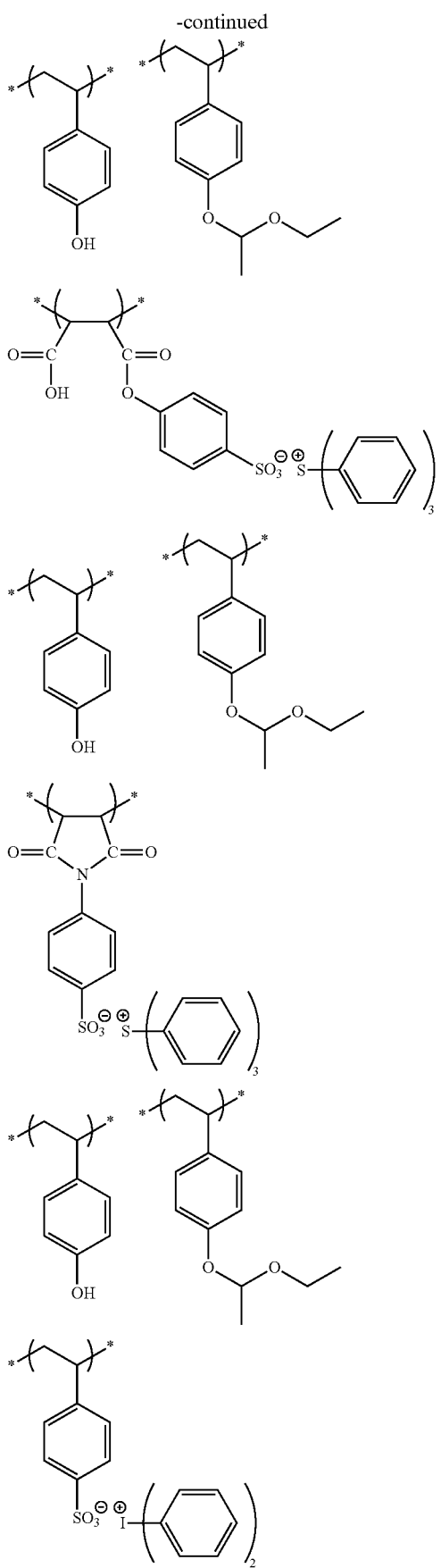
64
-continued
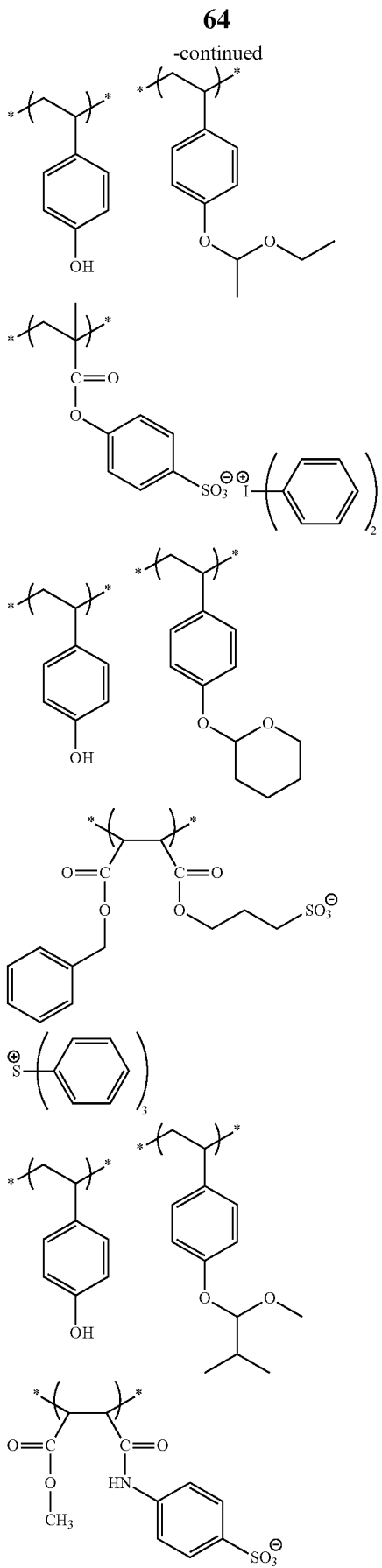

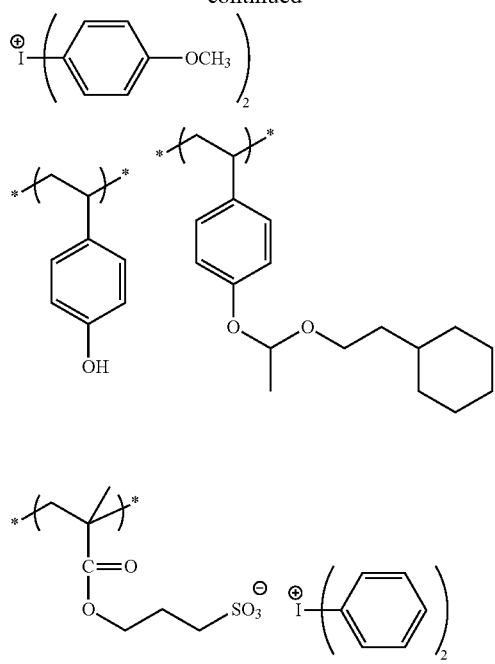
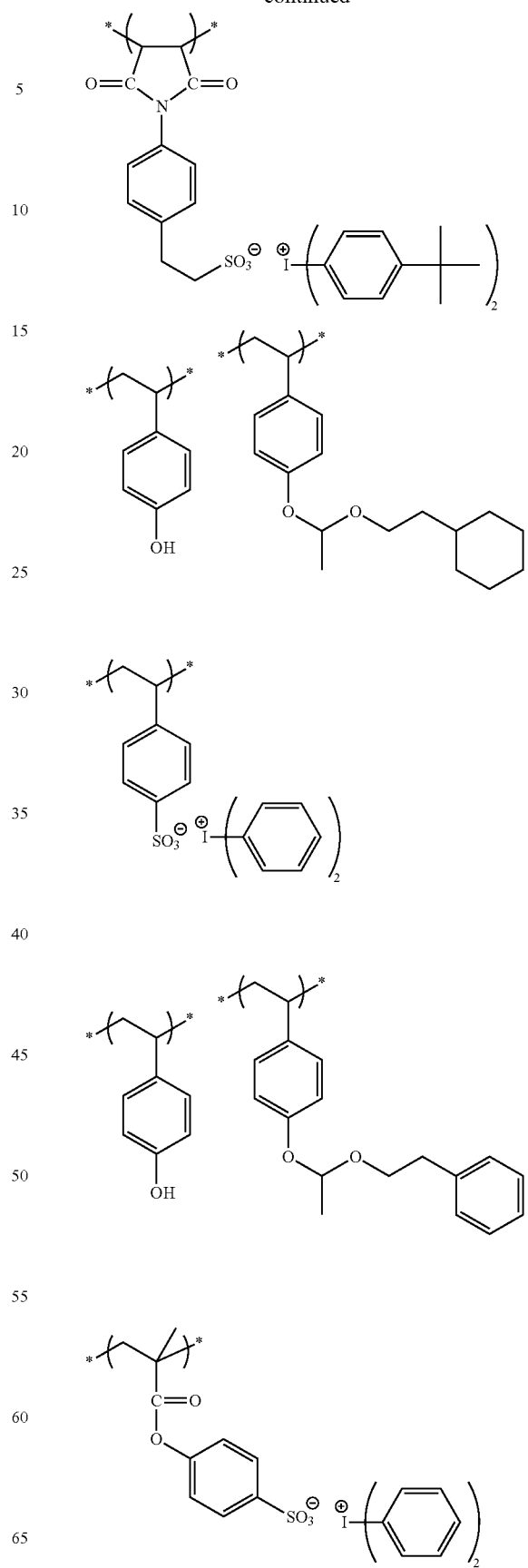

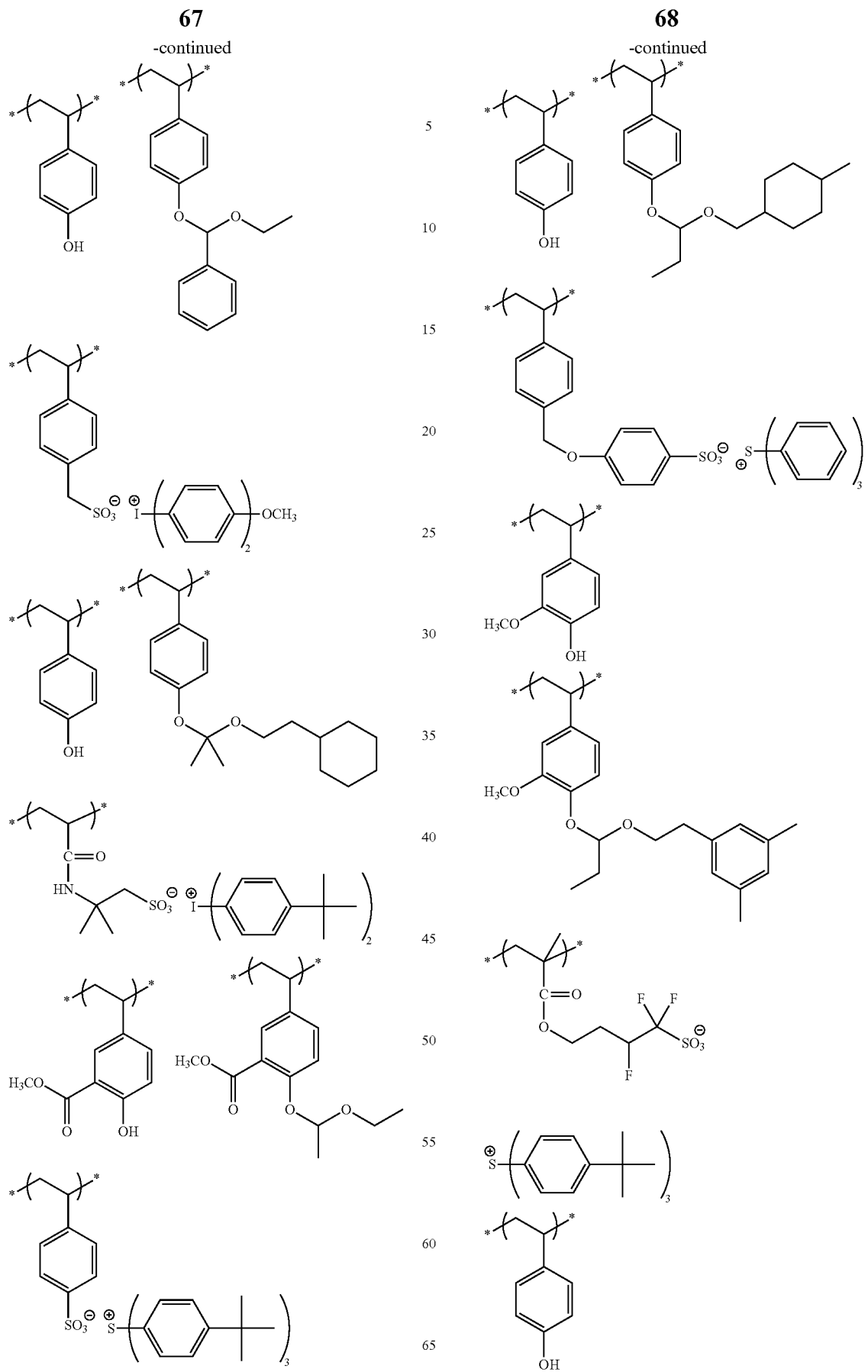

69
-continued
70
-continued
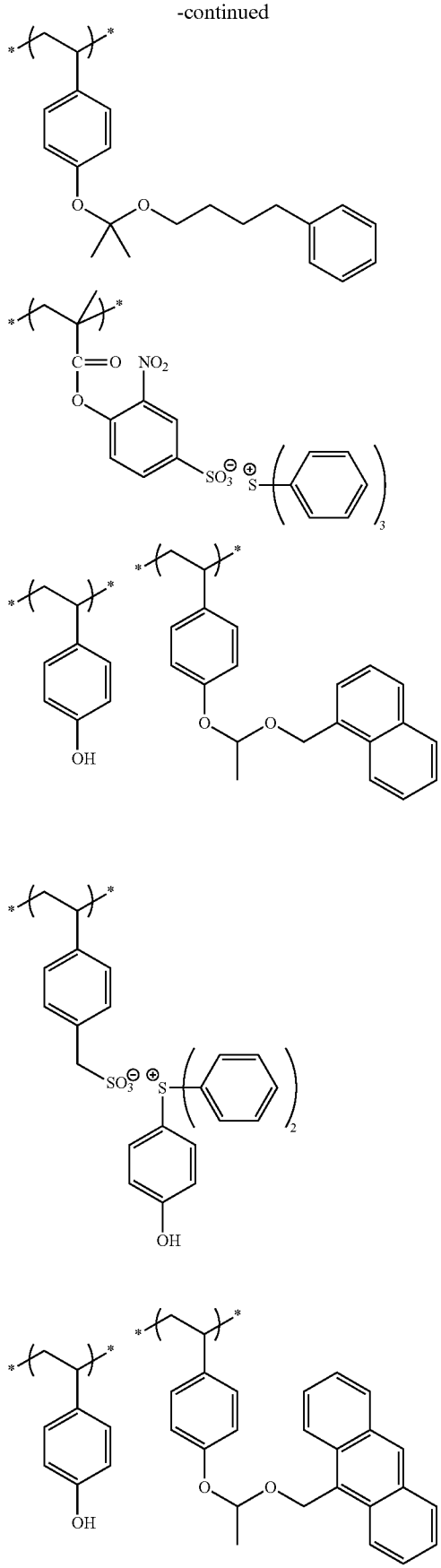
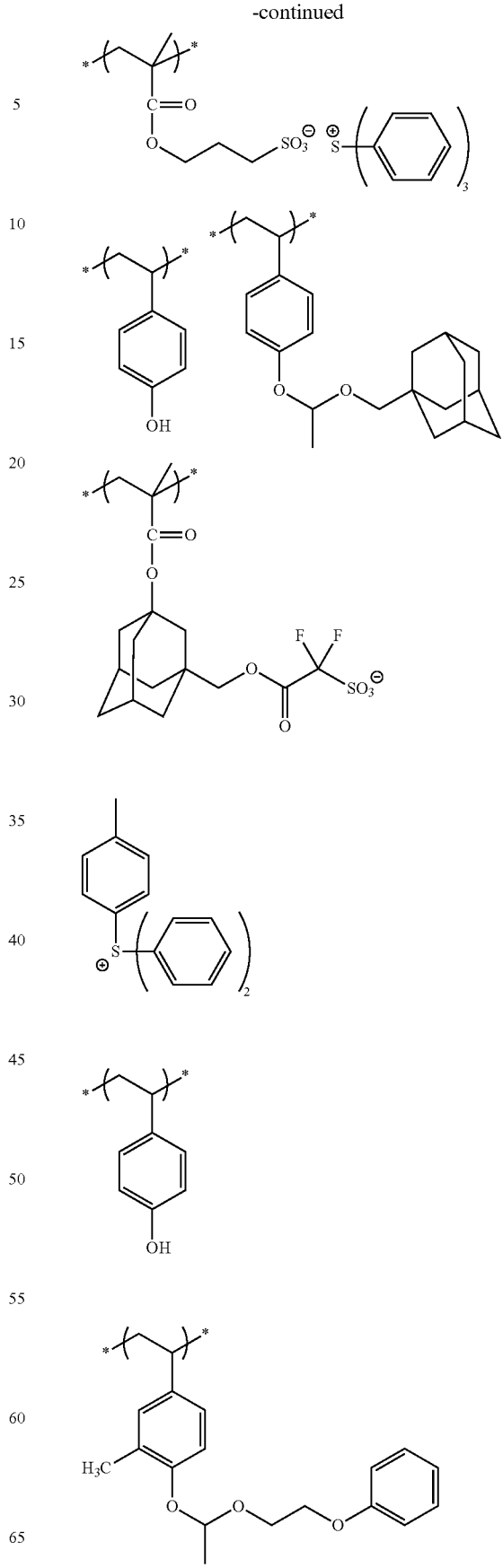

71
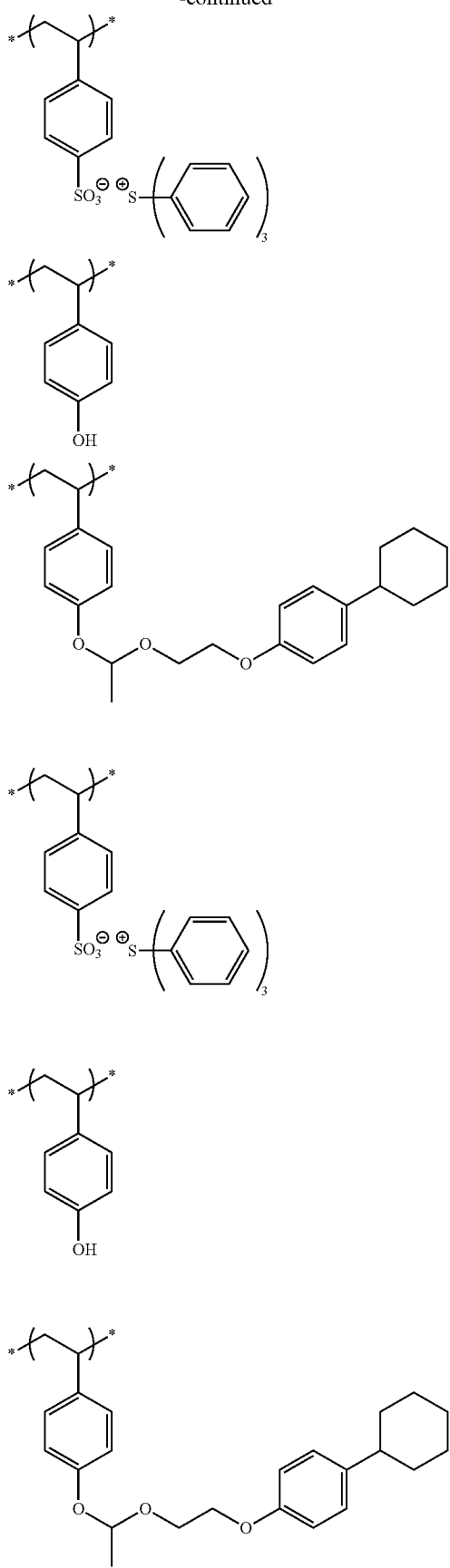
72
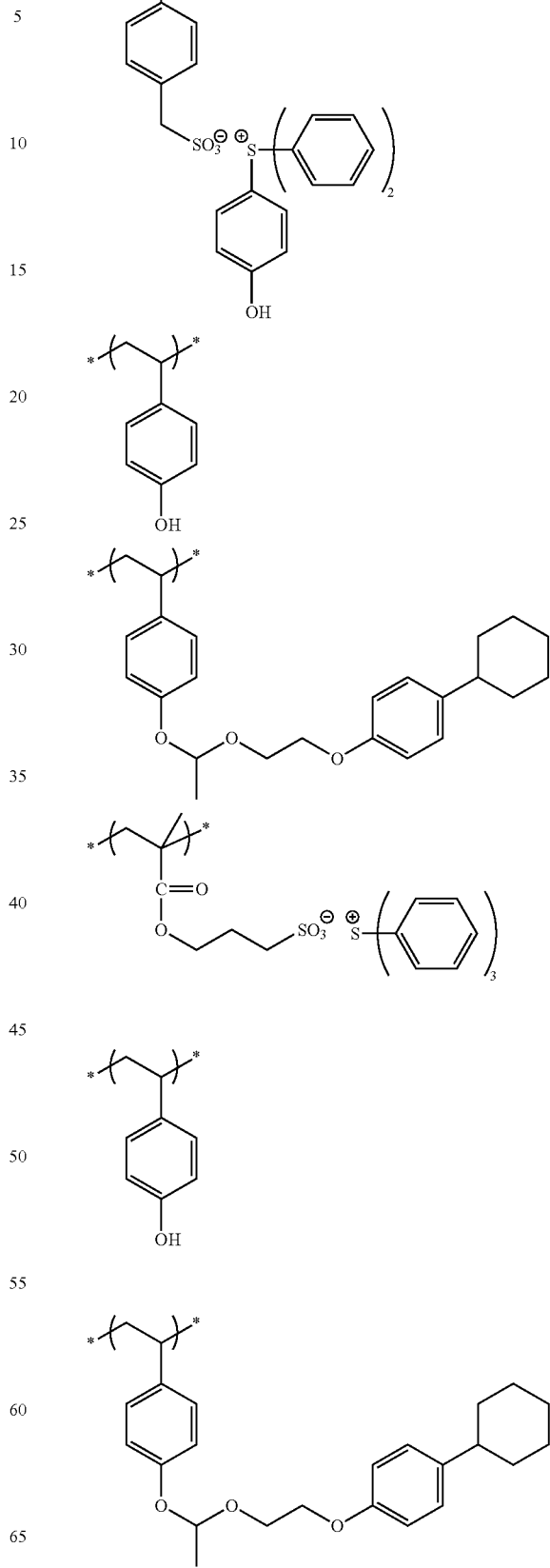

73
-continued
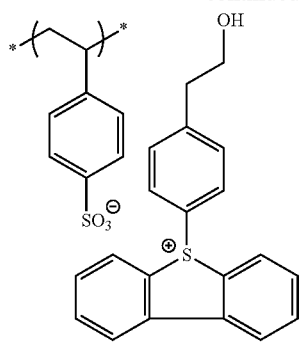
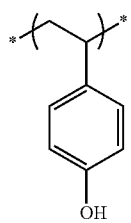
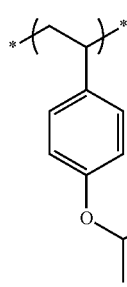
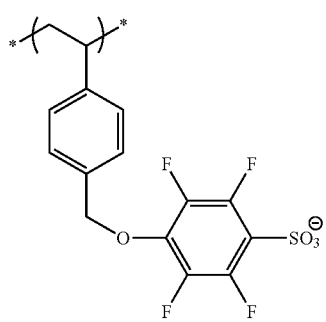
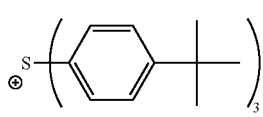
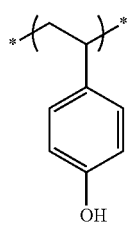
74
-continued
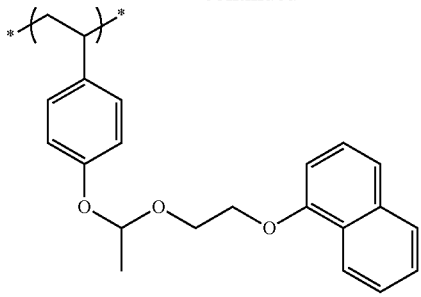
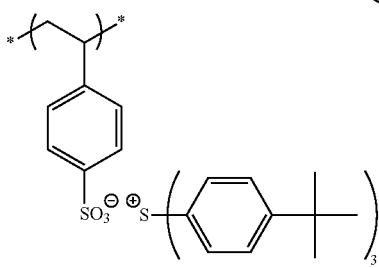
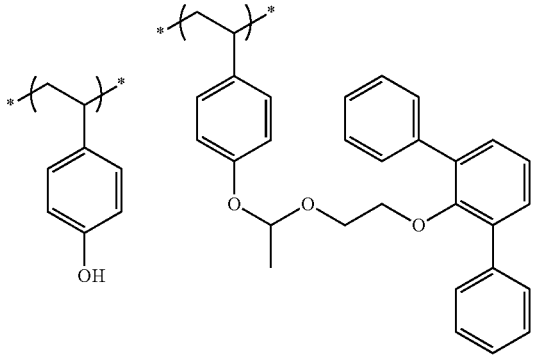
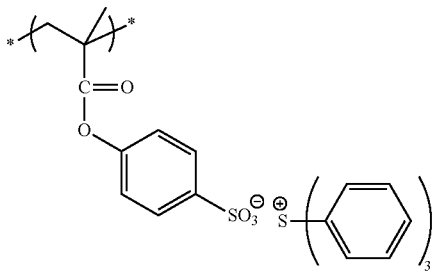
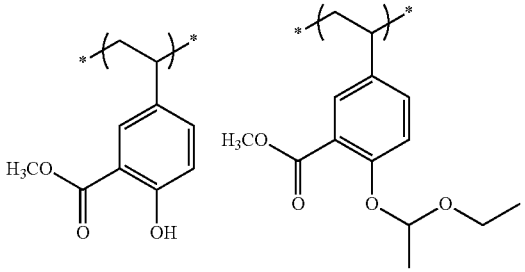
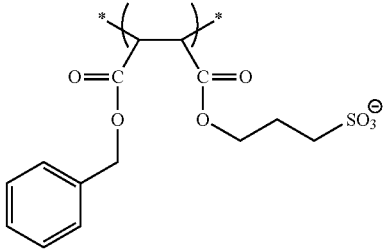

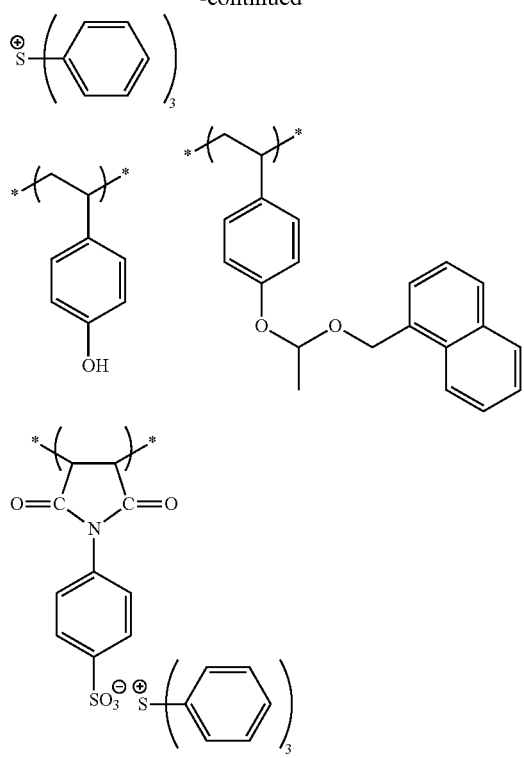
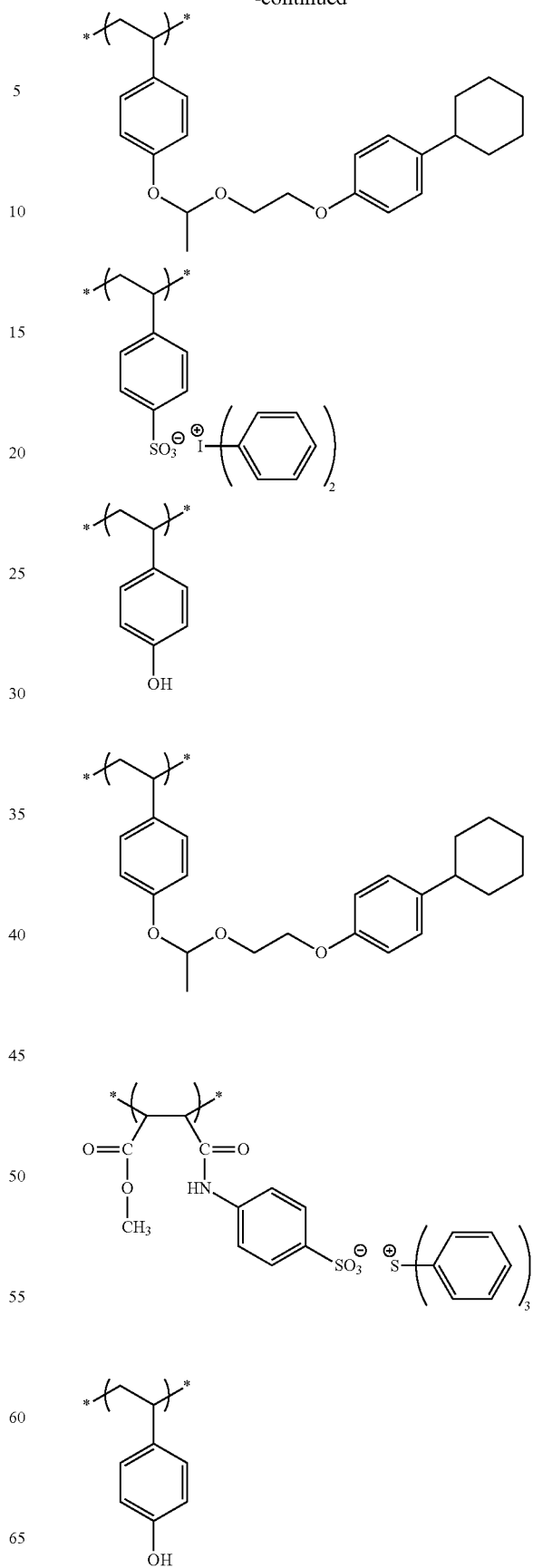

77
-continued
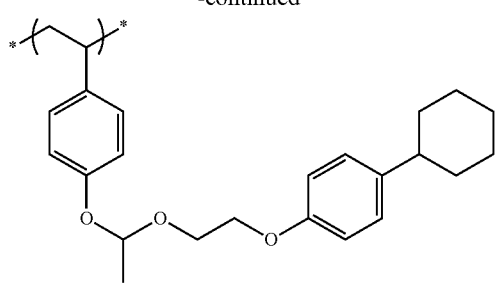
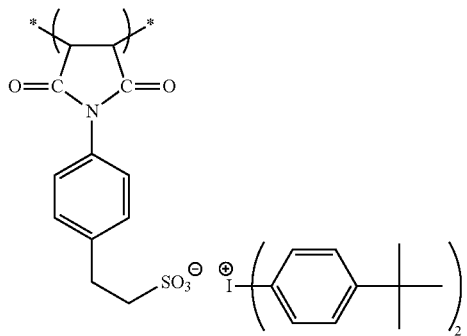
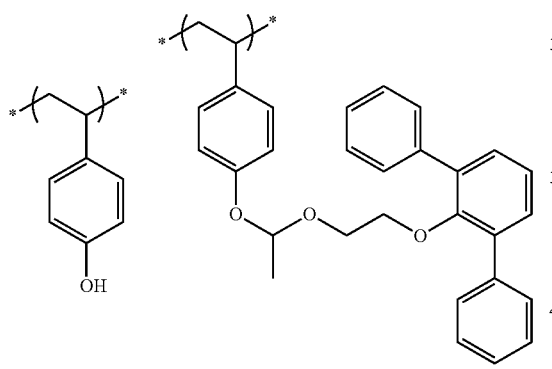
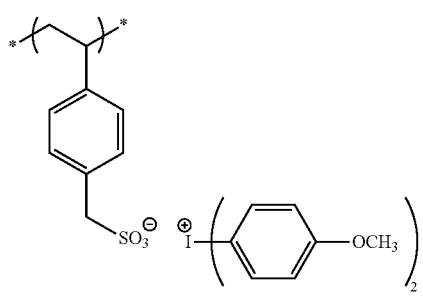
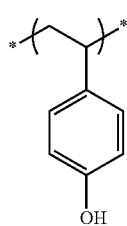
78
-continued
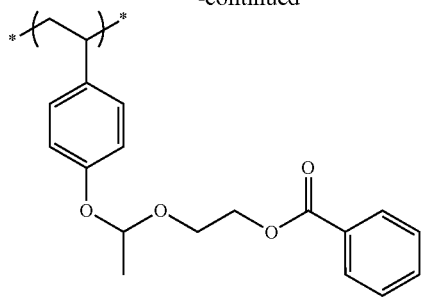
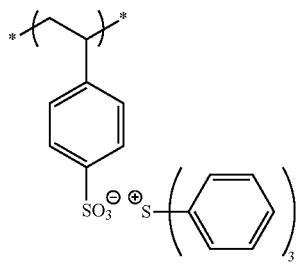
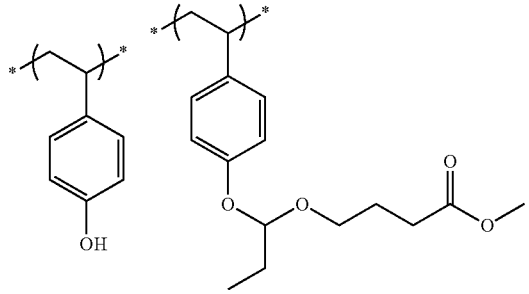
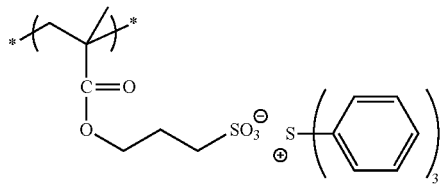
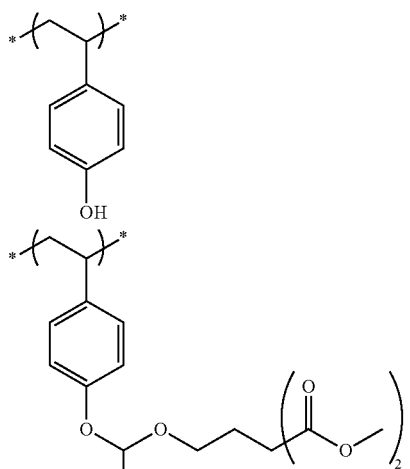
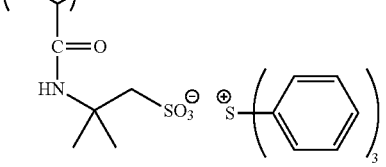

79
-continued
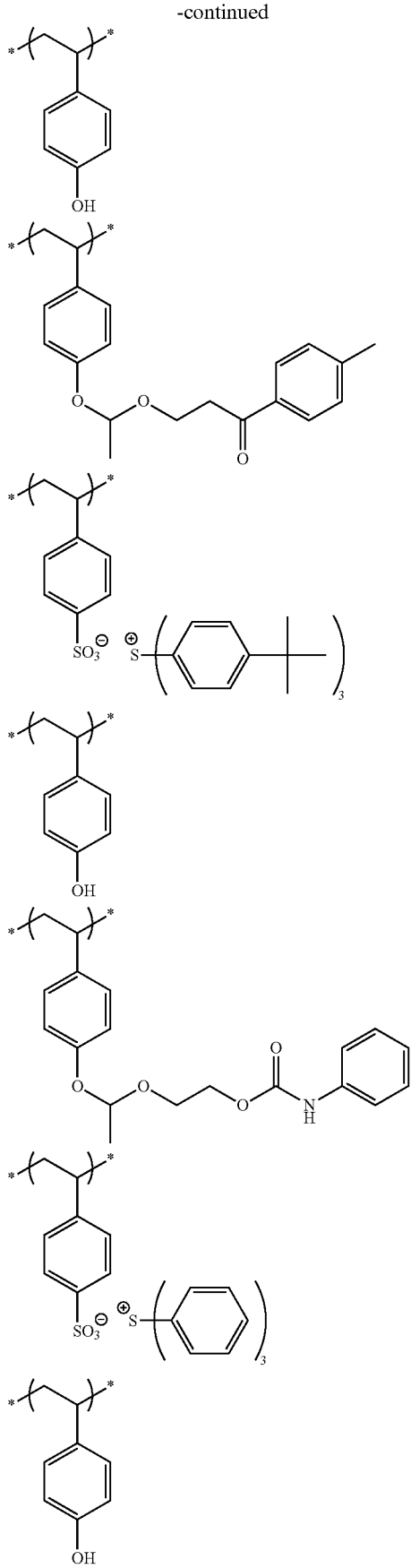
80
-continued
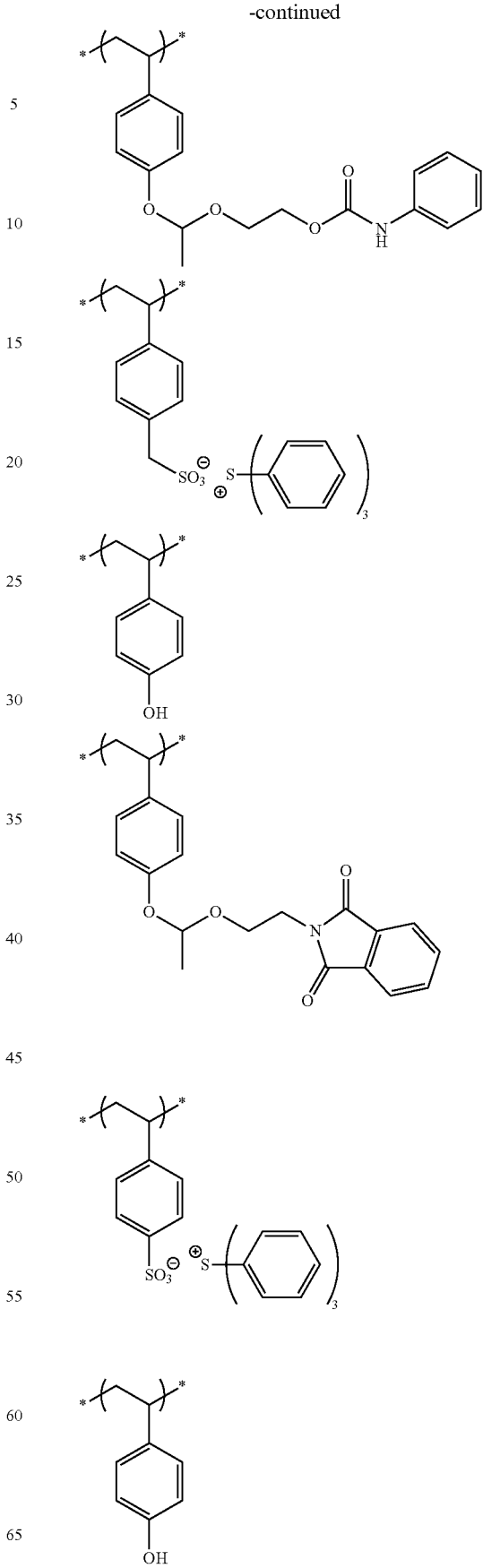

81
-continued
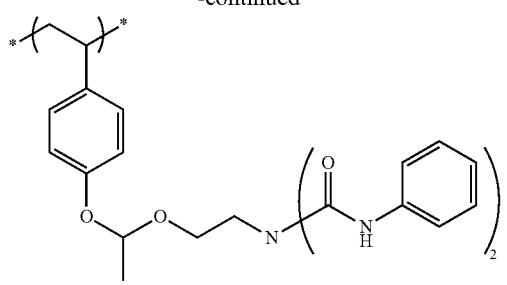
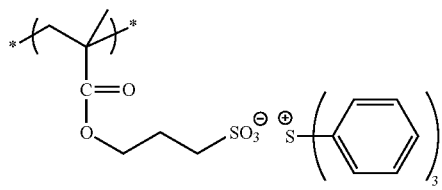
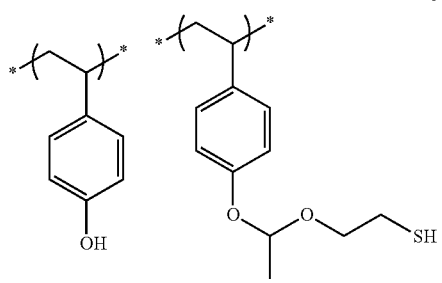
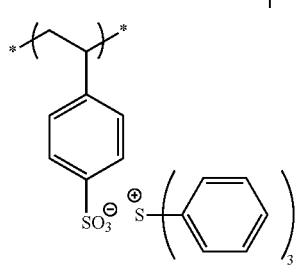
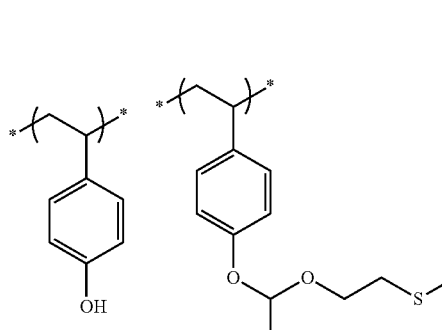
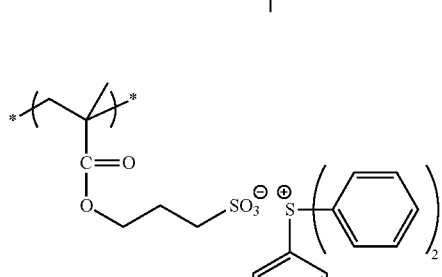
82
-continued
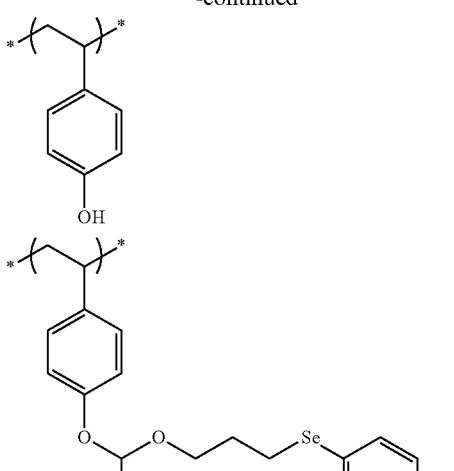
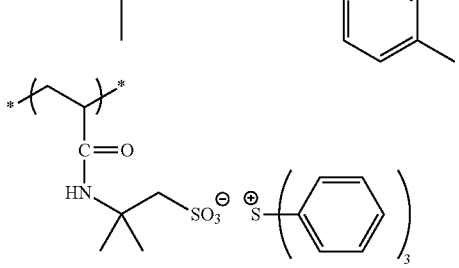
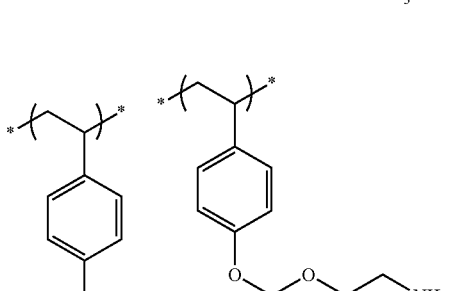
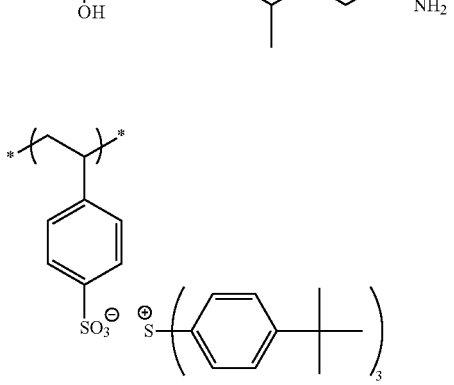
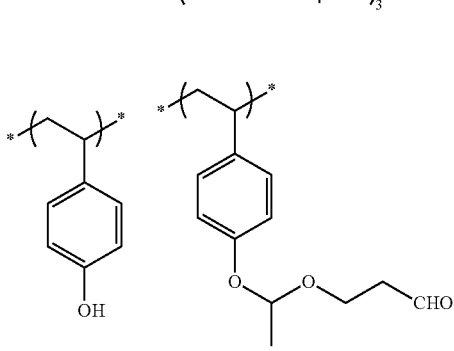

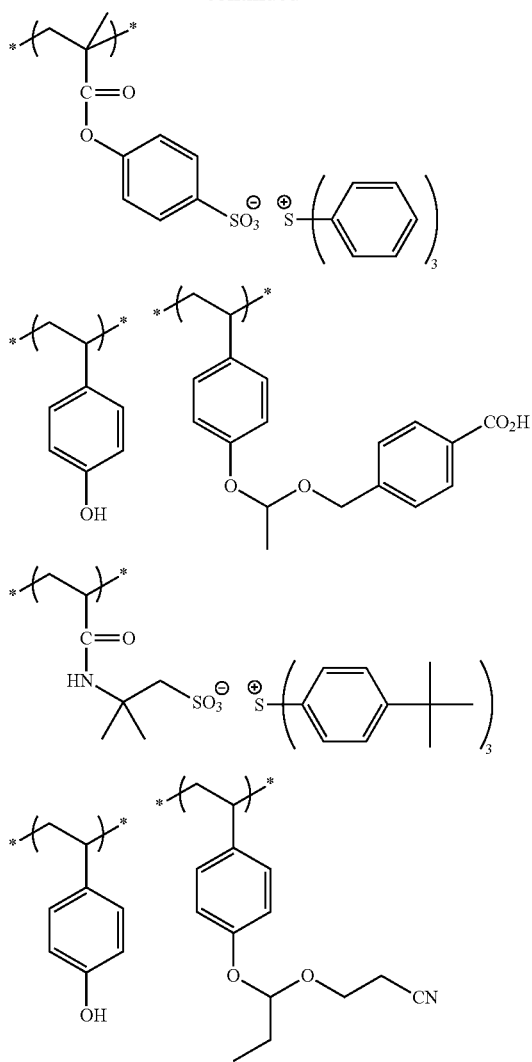
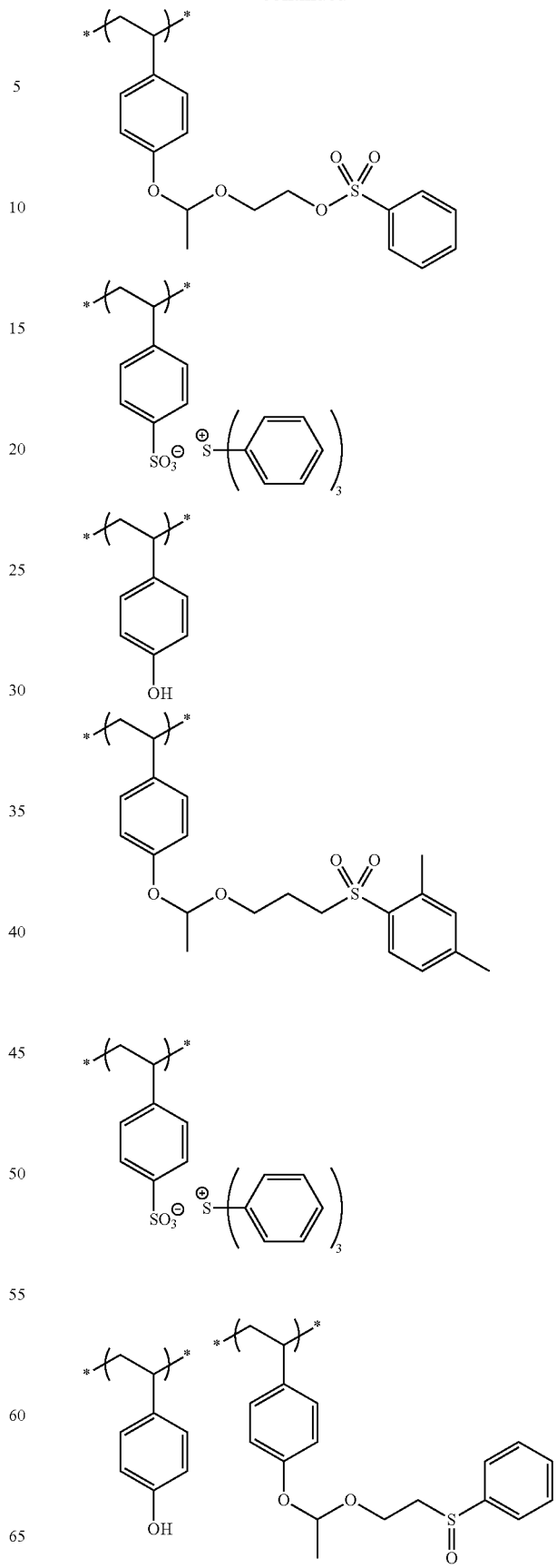

85
-continued
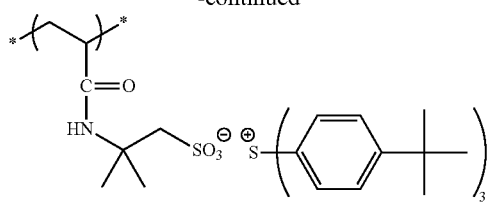
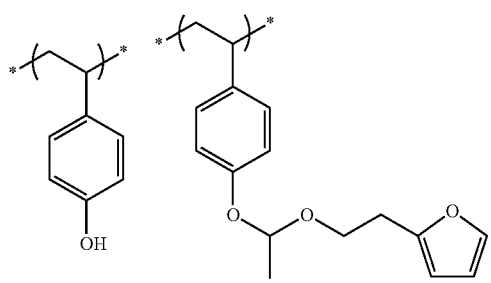
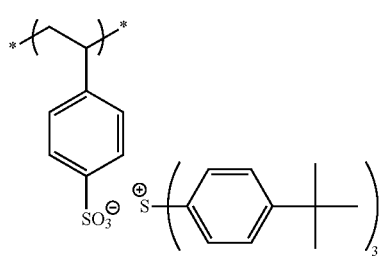
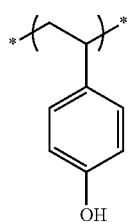
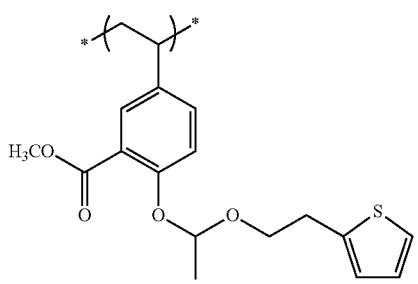
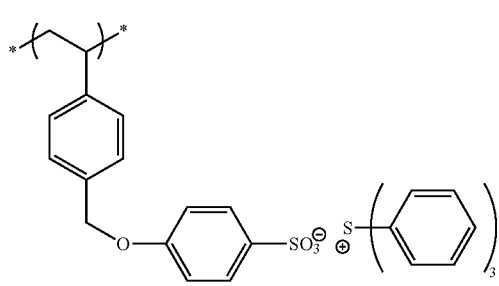
86
-continued
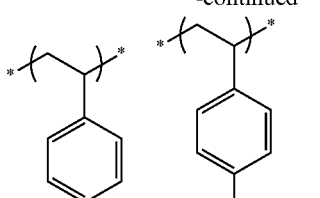
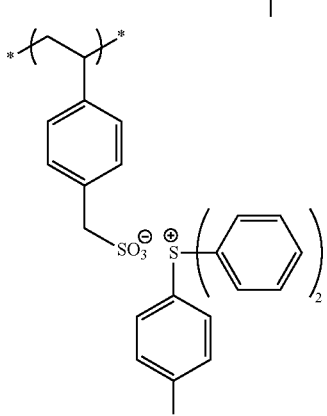
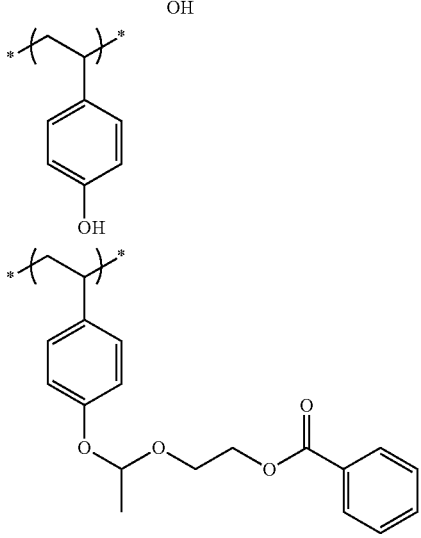
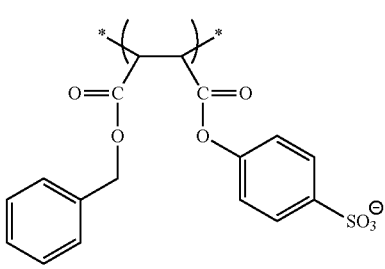
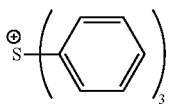

87
-continued
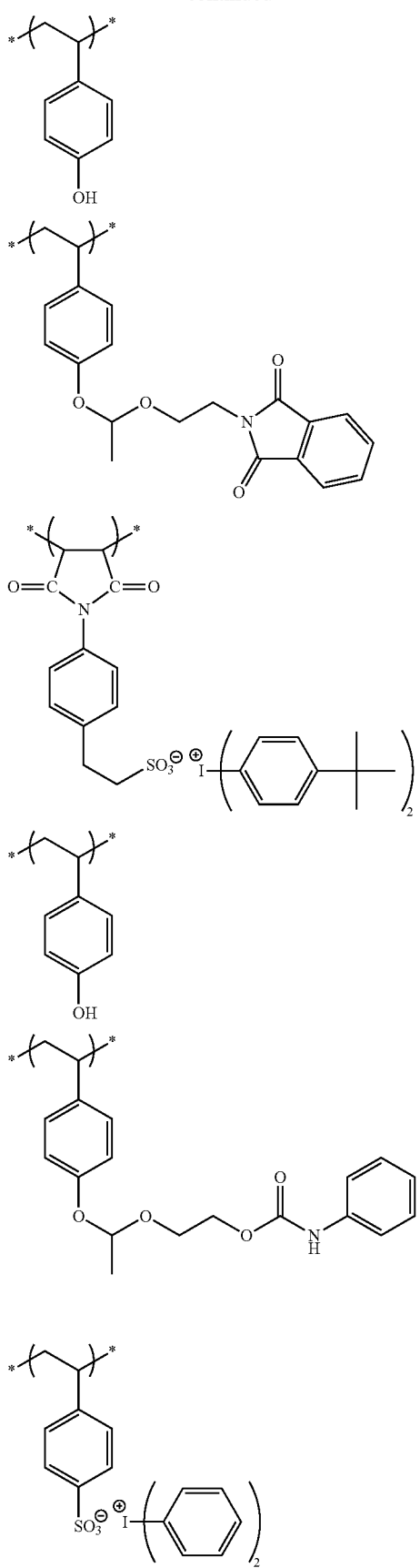
88
-continued
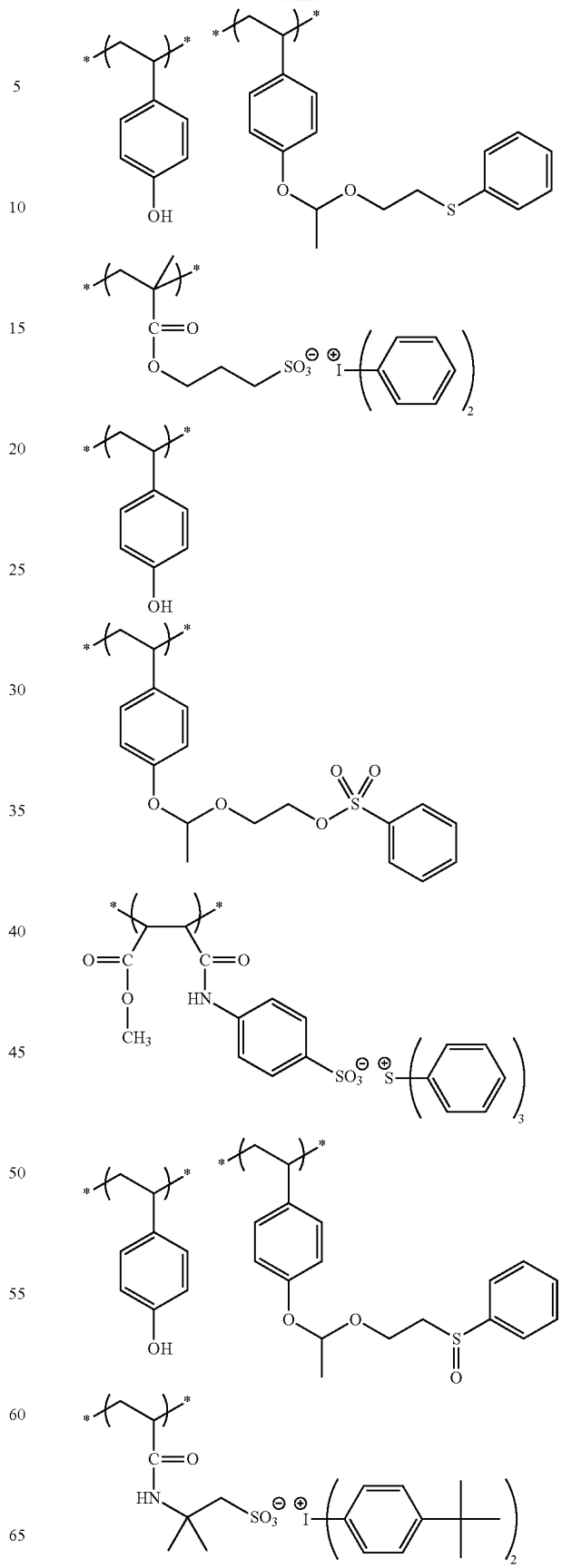

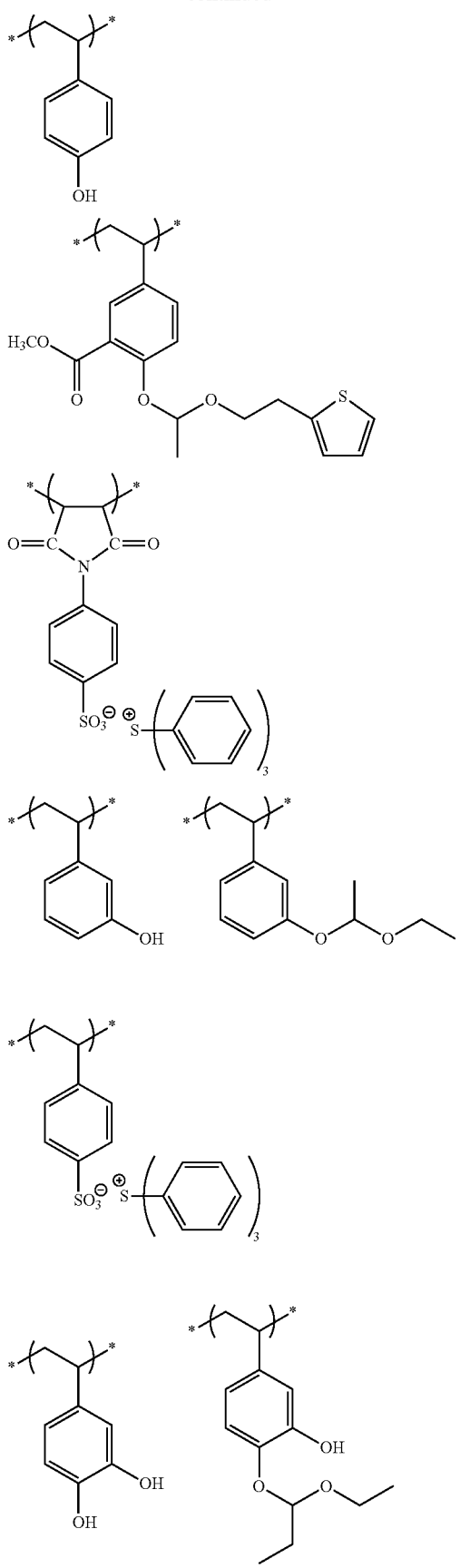
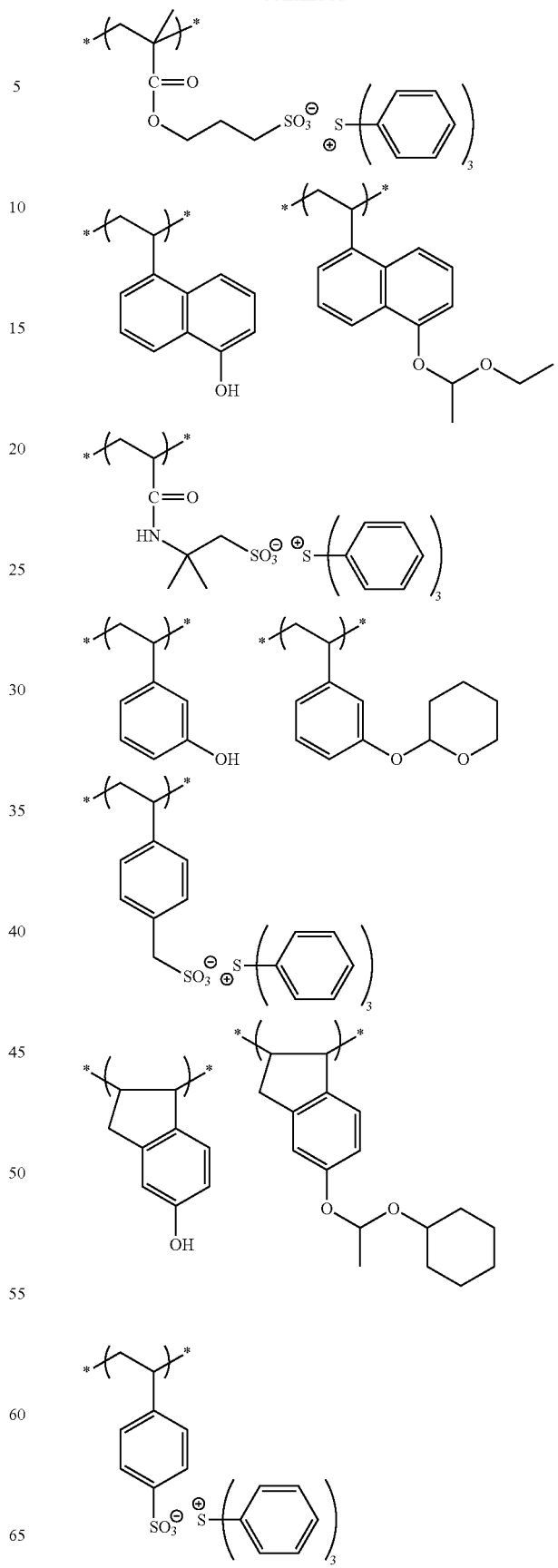

91
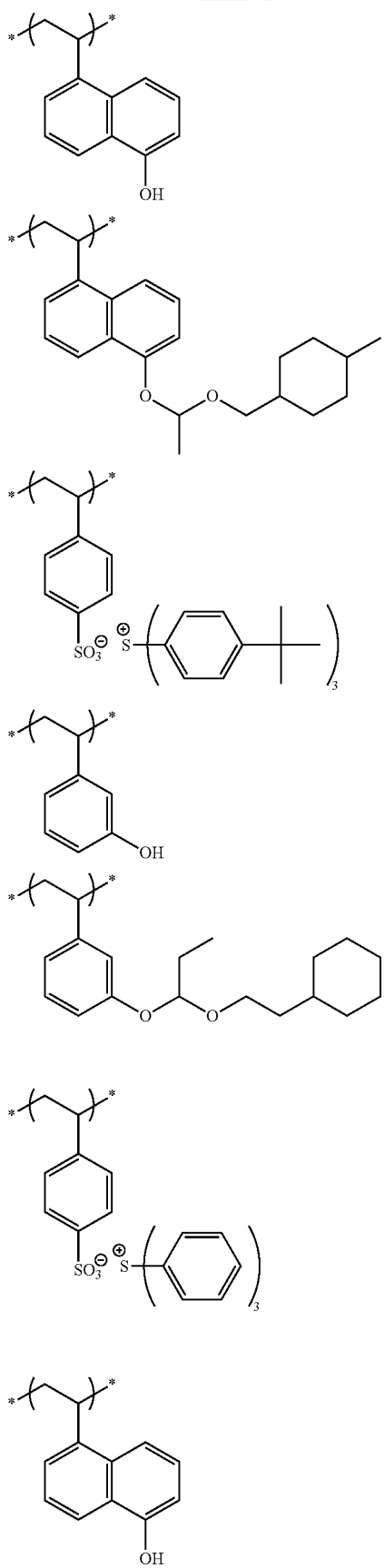
92
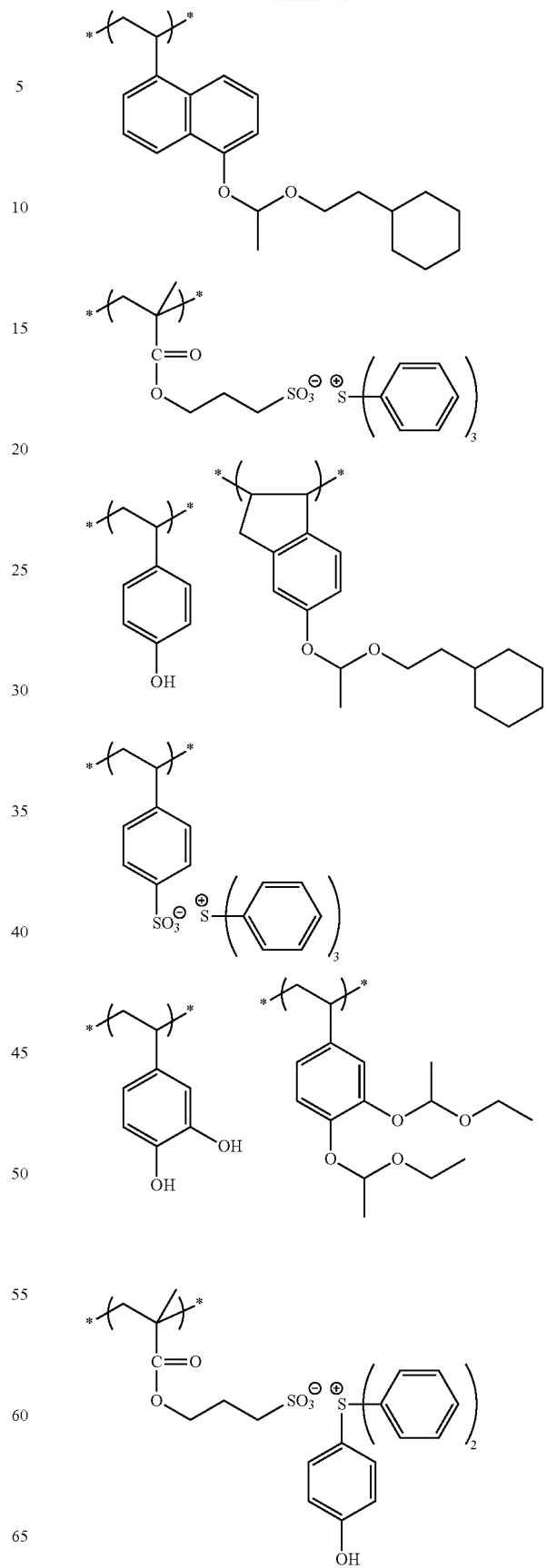

93
-continued
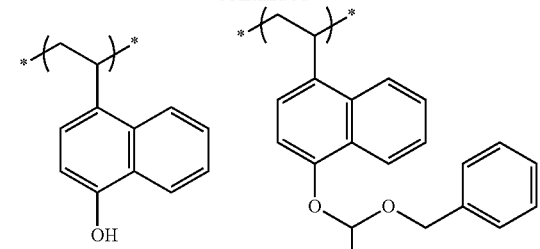
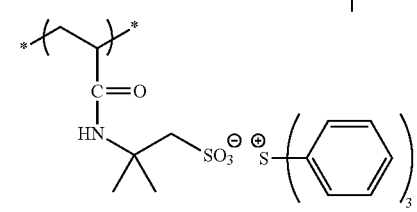
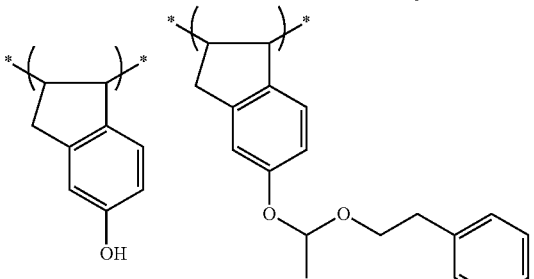
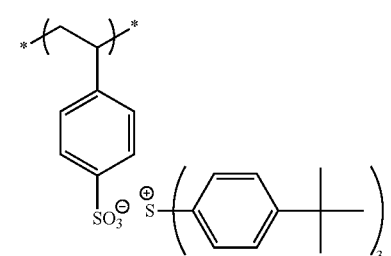
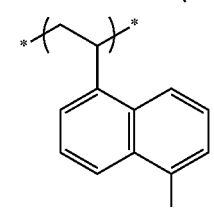
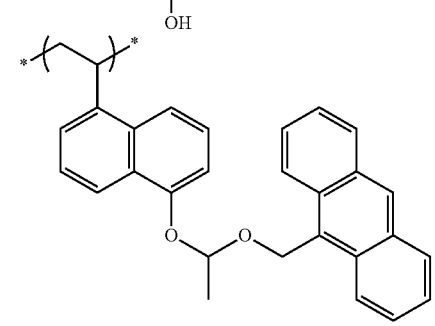
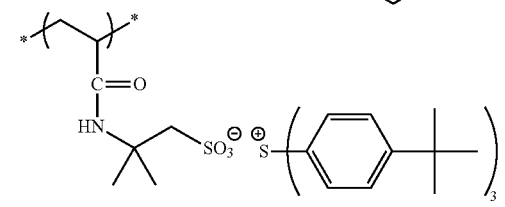
94
-continued
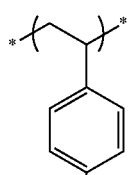
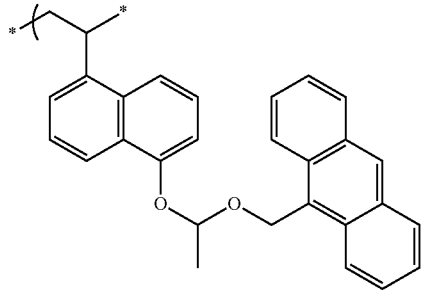
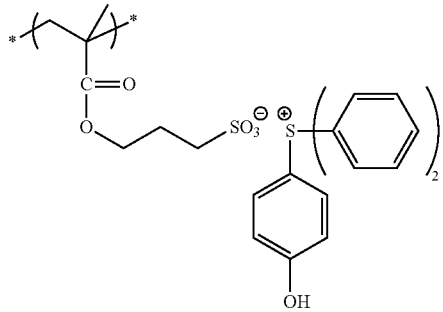
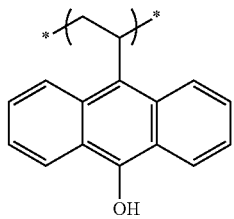
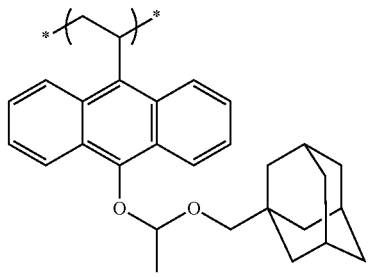
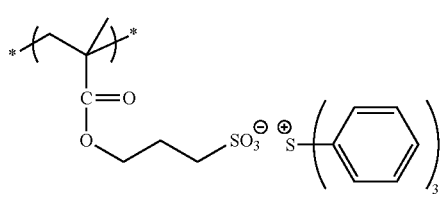

95
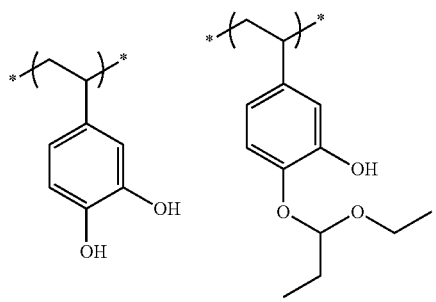
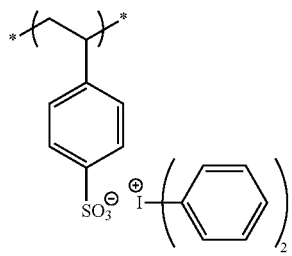
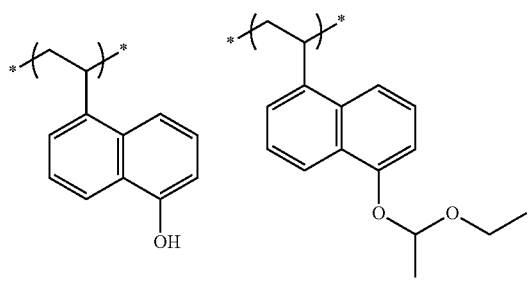
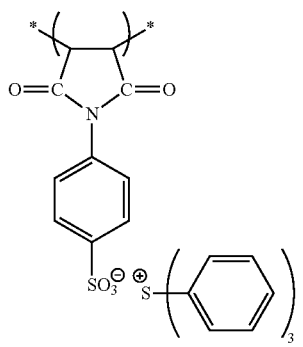
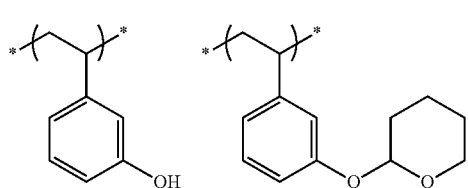
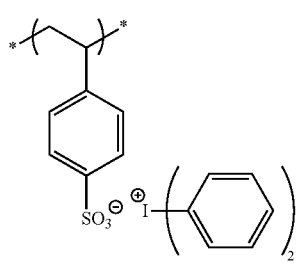
96
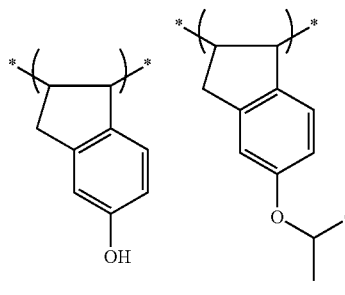
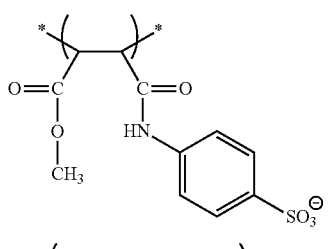
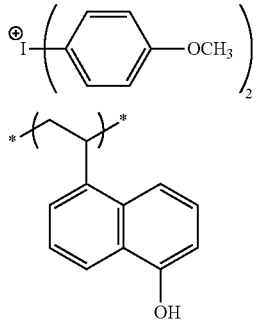
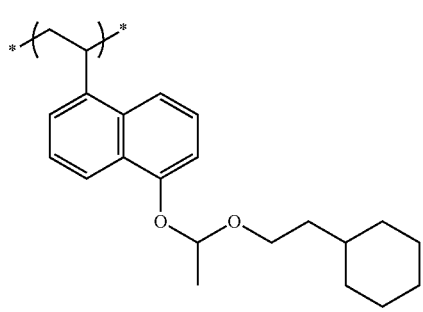
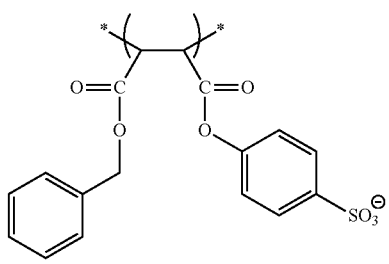
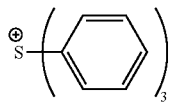

97
-continued
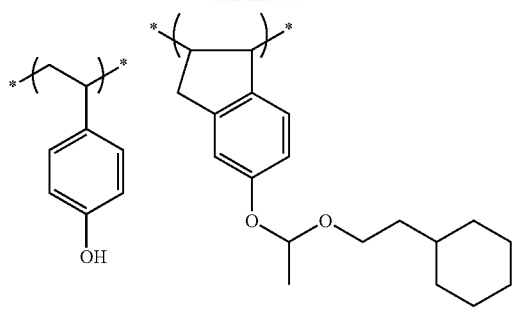
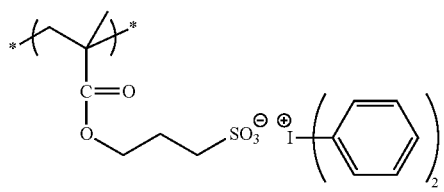
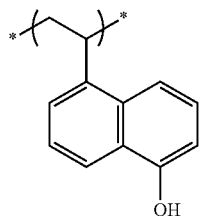
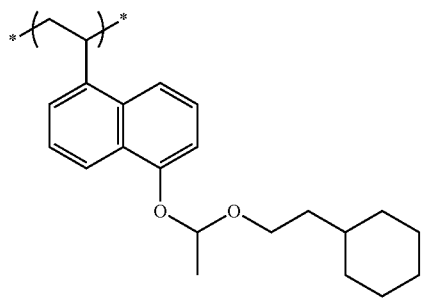
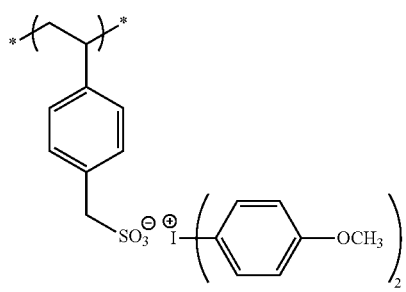
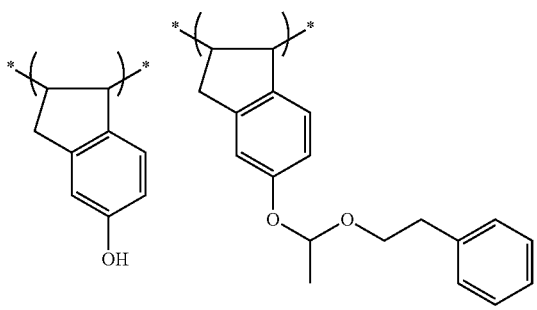
98
-continued
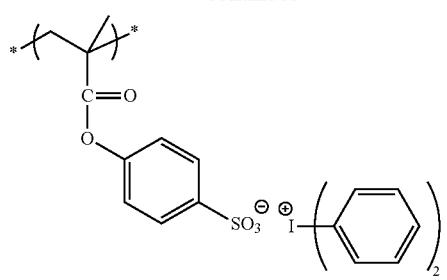
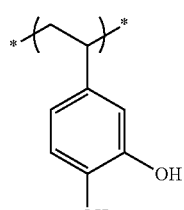
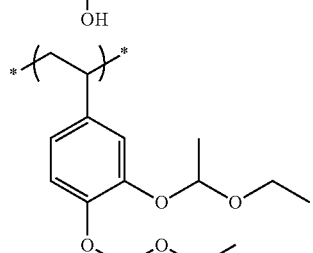
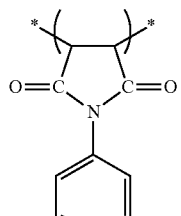
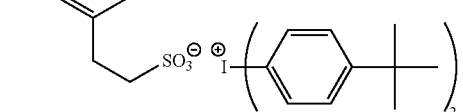
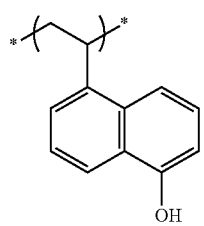
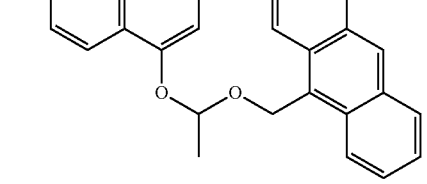

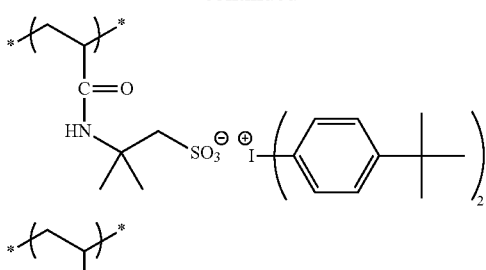
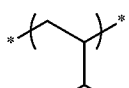
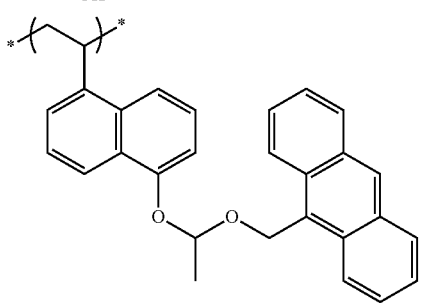
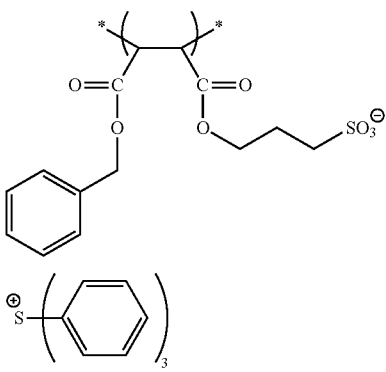
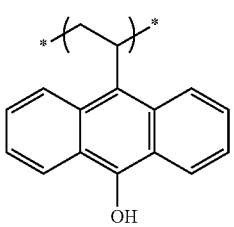
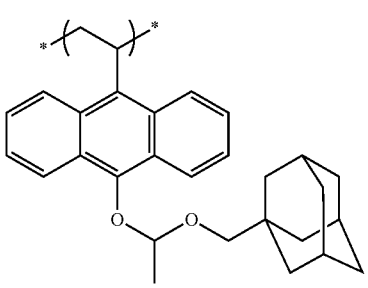

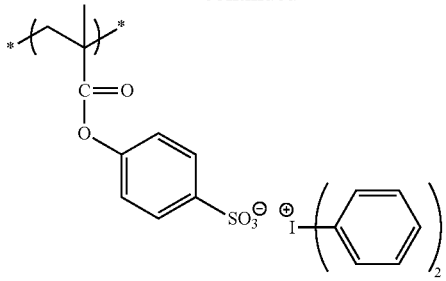

<Other Components>

If desired, the positive working resist composition of the invention may further contain a basic compound, a resin capable of decomposing by the action of an acid to increase the dissolution rate in an alkaline aqueous solution, a conventional type photo-acid generator, an organic solvent, a surfactant, an acid dissolution-inhibiting compound, a dye, a plasticizer, a photosensitizer, a dissolution-accelerating compound against a developer, a compound having a proton-accepting functional group and the like.

<Basic Compound>

For the purpose of reducing changes in performances to be caused with a lapse of time from exposure to heating or controlling the diffusibility of an acid generator by exposure in the film, the positive working resist composition of the invention may contain a basic compound.

Examples of the basic compound which is preferable include basic compounds having structures represented by the following general formulae (A) to (E).

 (A)

 (B)

 (C)

 (D)

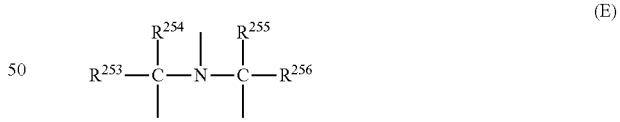 (E)

In the foregoing general formula (A), each of $R^{250}$, $R^{251}$ and $R^{252}$ independently represents a hydrogen atom, an alkyl group (preferably an alkyl group having from 1 to 20 carbon atoms), a cycloalkyl group (preferably a cycloalkyl group having from 3 to 20 carbon atoms) or an aryl group (preferably an aryl group having from 6 to 20 carbon atoms), and $R^{250}$ and $R^{251}$ may be bonded to each other to form a ring.

Each of these groups may have a substituent. Examples of the alkyl group or cycloalkyl group having a substituent, which is preferable, include an aminoalkyl group having from 1 to 20 carbon atoms, an aminocycloalkyl group having from 3 to 20 carbon atoms, a hydroxyalkyl group having from 1 to 20 carbon atoms and a hydroxycycloalkyl group having from 3 to 20 carbon atoms.

Also, these groups may contain an oxygen atom, a sulfur atom or a nitrogen atom in an alkyl chain thereof.

In the foregoing general formula (E), each of $R^{253}$, $R^{254}$, $R^{255}$ and $R^{256}$ independently represents an alkyl group (preferably an alkyl group having from 1 to 6 carbon atoms) or a cycloalkyl group (preferably a cycloalkyl group having from 3 to 6 carbon atoms).

Examples of the basic compound which is preferable include guanidines, aminopyrrolidines, pyrazoles, pyrazolines, piperazines, aminomorpholine, aminoalkylmorpholines and piperidines, each of which may have a substituent. Examples of the basic compound which is more preferable include a compound having an imidazole structure, a diazabicyclo structure, an onium hydroxide structure, an onium carboxylate structure, a trialkylamine structure, an aniline structure or a pyridine structure, an alkylamine derivative having a hydroxyl group and/or an ether bond and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, phenacyl sulfonium hydroxide and a 2-oxoalkyl group-containing sulfonium hydroxide, and specific examples thereof include triphenylsulfonium hydroxide, tris(t-butylphenyl)sulfonium hydroxide, bis(t-butylphenyl)iodonium hydroxide, phenacyl thiophenium hydroxide and 2-oxopropyl thiophenium hydroxide. Examples of the compound having an onium carboxylate structure include a compound wherein an anion segment of the compound having an onium hydroxide structure is replaced by a carboxylate, for example, acetate, adamantane-1-carboxylate and a perfluoroalkyl carboxylate. Examples of the compound having a trialkylamine structure include tri(n-butyl)amine and tri(n-octyl)amine. Examples of the compound having an aniline structure include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

Furthermore, there can be exemplified at least one nitrogen-containing compound selected from a phenoxy group-containing amine compound, a phenoxy group-containing ammonium salt compound, an sulfonic acid ester group-containing amine compound and a sulfonic acid ester group-containing ammonium salt compound.

As the amine compound, primary, secondary and tertiary amine compounds can be used, and of these, amine compounds wherein at least one alkyl group is bonded to the nitrogen atom are preferable. The amine compound is more preferably a tertiary amine compound. In the amine compound, so far as at least one alkyl group (preferably an alkyl group having from 1 to 20 carbon atoms) is bonded to the nitrogen atom, in addition to the alkyl group, a cycloalkyl group (preferably a cycloalkyl group having from 3 to 20 carbon atoms) or an aryl group (preferably an aryl group having from 6 to 12 carbon atoms) may be bonded to the nitrogen atom.

Also, it is preferable that the amine compound contains an oxygen atom in an alkyl chain thereof to form an oxyalkylene group. A number of the oxyalkylene group is one or more, preferably from 3 to 9, and more preferably from 4 to 6 in a molecule thereof. Of the oxyalkylene groups, an oxyethylene group (—$CH_2CH_2O$—) and an oxypropylene group (—$CH(CH_3)CH_2O$— or —$CH_2CH_2CH_2O$—) are preferable, and an oxyethylene group is more preferable.

As the ammonium salt compound, primary, secondary, tertiary and quaternary ammonium salt compounds can be used, and of these, ammonium salt compounds wherein at least one alkyl group is bonded to the nitrogen atom are preferable. In the ammonium salt compound, so far as at least one alkyl group (preferably an alkyl group having from 1 to 20 carbon atoms) is bonded to the nitrogen atom, in addition to the alkyl group, a cycloalkyl group (preferably a cycloalkyl group having from 3 to 20 carbon atoms) or an aryl group (preferably an aryl group having from 6 to 12 carbon atoms) may be bonded to the nitrogen atom.

It is preferable that the ammonium salt compound contains an oxygen atom in an alkyl chain thereof to form an oxyalkylene group. A number of the oxyalkylene group is one or more, preferably from 3 to 9, and more preferably from 4 to 6 in a molecule thereof. Of the oxyalkylene groups, an oxyethylene group (—$CH_2CH_2O$—) and an oxypropylene group (—$CH(CH_3)CH_2O$— or —$CH_2CH_2CH_2O$—) are preferable, and an oxyethylene group is more preferable. Examples of an anion of the ammonium salt compound include a halogen atom, a hydroxide, a sulfonate, a borate and a phosphate. Of these, a halogen atom, a hydroxide and a sulfonate are preferable. As the halogen atom, a chlorine atom, a bromine atom and an iodine atom are especially preferable. As the sulfonate, an organic sulfonate having from 1 to 20 carbon atoms is especially preferable. Examples of the organic sulfonate include an alkyl sulfonate and an aryl sulfonate each having from 1 to 20 carbon atoms. The alkyl group of the alkyl sulfonate may have a substituent, and examples of the substituent include fluorine, chlorine, bromine, an alkoxy group, an acyl group and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate and nonafluorobutane sulfonate. Examples of the aryl group of the aryl sulfonate include a benzene ring, a naphthalene ring and an anthracene ring. Each of the benzene ring, the naphthalene ring and the anthracene ring may have a substituent. As the substituent, a linear or branched alkyl group having from 1 to 6 carbon atoms and a cycloalkyl group having from 3 to 6 carbon atoms are preferable. Specific examples of the linear or branched alkyl group and the cycloalkyl group include methyl, ethyl, n-propyl, isopropyl, n-butyl, isobutyl, t-butyl, n-hexyl and cyclohexyl. Examples of other substituent include an alkoxy group having from 1 to 6 carbon atoms, a halogen atom, cyano, nitro, an acyl group and an acyloxy group.

The "phenoxy group-containing amine compound" or the "phenoxy group-containing ammonium salt compound" as referred to herein means an amine compound or an ammonium salt compound each having a phenoxy group in an end on the opposite side to the nitrogen atom of the alkyl group. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of the 2- to 6-positions. A number of the substituent may be any number within the range of from 1 to 5.

It is preferable that at least one oxyalkylene group is present between the phenoxy group and the nitrogen atom. A number of the oxyalkylene group is one or more, preferably from 3 to 9, and more preferably from 4 to 6 in a molecule thereof. Of the oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferable, and an oxyethylene group is more preferable.

The sulfonic acid ester group in the sulfonic acid ester group-containing amine compound and the sulfonic acid ester group-containing ammonium salt compound may be any of an alkyl sulfonate, a cycloalkyl sulfonate and an aryl sulfonate. In case of an alkyl sulfonate, a carbon atom number of the alkyl group is preferably from 1 to 20; in case of a cycloalkyl sulfonate, a carbon atom number of the cycloalkyl group is preferably from 3 to 20; and in case of an aryl sulfonate, a carbon atom number of the aryl group is preferably from 6 to 12. Each of the alkyl sulfonate, the cycloalkyl sulfonate and the aryl sulfonate may have a substituent. Examples of the substituent which is preferable include a halogen atom, a cyano group, a nitro group, a carboxyl group, a carboxylic acid ester group and a sulfonic acid ester group.

It is preferable that at least one oxyalkylene group is present between the sulfonic acid ester group and the nitrogen atom. A number of the oxyalkylene group is one or more, preferably from 3 to 9, and more preferably from 4 to 6 in a molecule thereof. Of the oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferable, and an oxyethylene group is more preferable.

The phenoxy group-containing amine compound is obtainable by allowing a phenoxy group-containing primary or secondary amine and a haloalkyl ether to react with each other upon heating and then adding an aqueous solution of a strong base such as sodium hydroxide, potassium hydroxide and a tetraalkylammonium to the reaction mixture, followed by extraction with an organic solvent such as ethyl acetate and chloroform. Also, the phenoxy group-containing amine compound is obtainable by allowing a primary or secondary amine and a haloalkyl ether having a phenoxy group in an end thereof upon heating and then adding an aqueous solution of a strong base such as sodium hydroxide, potassium hydroxide and a tetraalkylammonium to the reaction mixture, followed by extraction with an organic solvent such as ethyl acetate and chloroform.

Also, a photosensitive base compound may be used as the basic compound. Though the photosensitive base compound is not particularly limited, compounds disclosed in, for example, JP-T-2003-524799 and *J. Photopolym. Sic & Tech*., Vol. 8, pages 543 to 553 (1995) are useful.

A molecular weight of the basic compound is preferably from 250 to 2,000, and more preferably from 400 to 1,000.

Such a basic compound is used singly or in admixture of two or more kinds thereof.

A content of the basic compound is preferably from 0 to 8.0% by mass, more preferably from 0 to 5.0% by mass, and especially preferably from 0 to 4.0% by mass relative to the total solids content of the positive working resist composition.

<Resin Capable of Decomposing by the Action of an Acid to Increase the Dissolution Rate in an Alkaline Aqueous Solution>

The positive working resist composition of the invention may contain, in addition to the resin (P), a resin capable of decomposing by the action of an acid to increase the dissolution rate in an alkaline aqueous solution.

The resin capable of decomposing by the action of an acid to increase the dissolution rate in an alkaline aqueous solution (hereinafter also referred to as "acid-decomposable resin") is a resin having a group capable of decomposing by the action of an acid to generate an alkali-soluble group (acid-decomposable group) in a principal chain or a side chain, or in both a principal chain and a side chain, of the resin. Of these, a resin having an acid-decomposable group in a side chain thereof is more preferable.

The acid-decomposable resin is obtainable by allowing a precursor of a group capable of decomposing by the action of an acid to react with an alkali-soluble resin, or copolymerizing an alkali-soluble resin monomer having a group capable of decomposing by the action of an acid bonded thereto with various monomers, as disclosed in European Patent No. 254, 853, JP-A-2-25850, JP-A-3-223860, JP-A-4-251259, etc.

As the acid-decomposable group, a group obtained by substituting a hydrogen atom of an alkali-soluble group in a resin having an alkali-soluble group, for example a —COOH group and an —OH group with a group capable of leaving by the action of an acid is preferable.

Specifically, the same group as the acid-decomposable group described above for the resin of the invention (for example, the acid-decomposable resin described as the repeating unit (B) in the resin (P)) can be exemplified as a preferred example as the acid-decomposable group.

Though the alkali-soluble group-containing resin is not particularly limited, examples thereof include poly(o-hydroxystyrene), poly(m-hydroxystyrene), poly(p-hydroxystyrene) and copolymers thereof; hydrogenated poly(hydroxystyrene); poly(hydroxystyrene)s having a substituent represented by any of structures described below; phenolic hydroxyl group-containing resins; a styrene-hydroxystyrene copolymer; an α-methylstyrene-hydroxystyrene copolymer; hydroxystyrene structural unit-containing alkali-soluble resins such as hydrogenated novolak resins; and alkali-soluble resins containing a carboxyl group-containing unit such as (meth)acrylic acid and norbornene carboxylic acid.

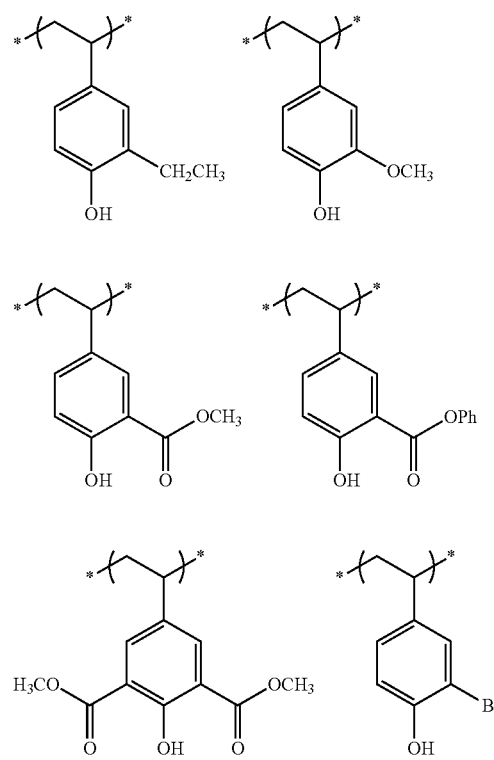

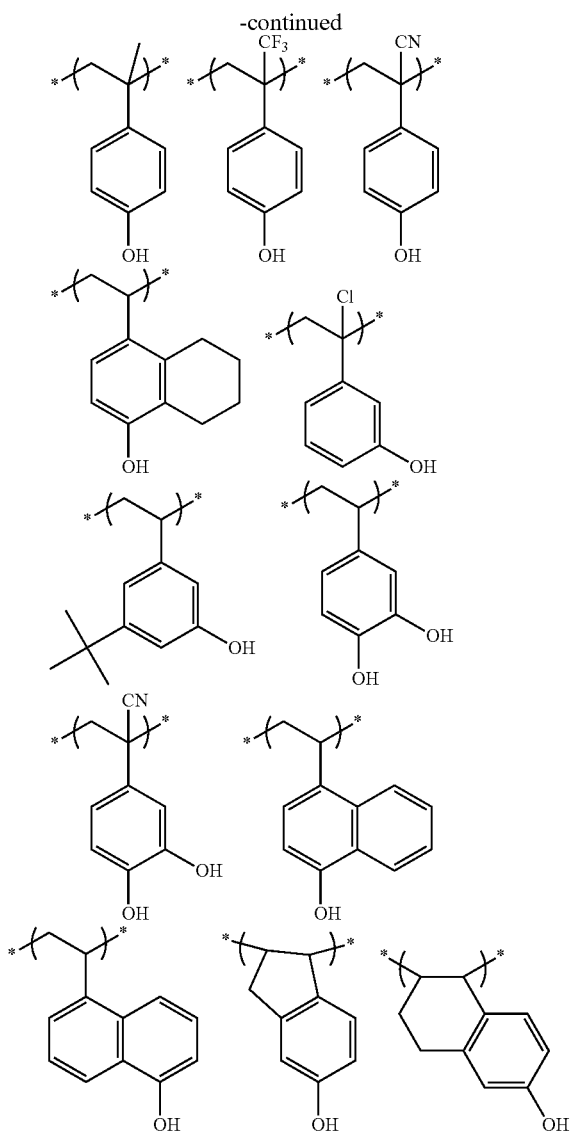

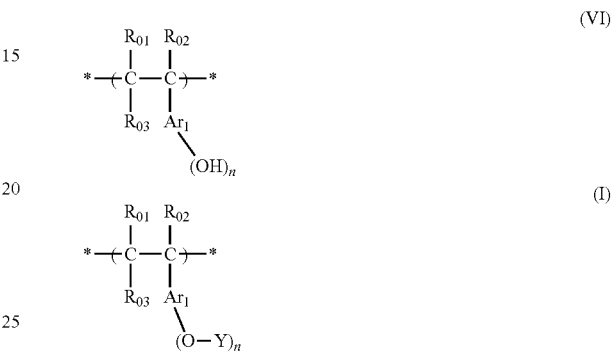

An alkali dissolution rate of such an alkali-soluble resin is preferably 170 angstroms per second or more, and especially preferably 330 angstroms per second or more as measured (at 23° C.) in 2.38% by mass tetramethylammonium hydroxide (TMAH).

Though the alkali-soluble resin monomer is not particularly limited, examples thereof include an alkyl carbonyloxystyrene (for example, t-butoxy carbonyloxystyrene), an alkoxystyrene (for example, a 1-alkoxyethoxystyrene and t-butoxystyrene) and a (meth)acrylic acid tertiary alkyl ester (for example, t-butyl (meth)acrylate, a 2-alkyl-2-adamantyl (meth)acrylate and a dialkyl(1-adamantyl)methyl (meth) acrylate).

A content of the group capable of decomposing by the action of an acid is expressed by a number (B) of a repeating unit having a group capable of decomposing by the action of an acid in the resin and a number (S) of a repeating unit having an alkali-soluble group which is not protected by a group capable of leaving by the action of an acid (B/(B+S)). The content is preferably from 0.01 to 0.7, more preferably from 0.05 to 0.50, and further preferably from 0.05 to 0.40.

Though the acid-decomposable resin is not particularly limited, it is preferably an acid-decomposable resin having an aromatic group-containing repeating unit, and more preferably an acid-decomposable resin having hydroxystyrene as a repeating unit (for example, poly(hydroxystyrene/acid-decomposable group-protected hydroxystyrene) and poly(hydroxystyrene/acid-decomposable group-protected (meth) acrylate)).

As the acid-decomposable resin, a resin having a repeating unit represented by the following general formula (VI) and a repeating unit represented by the following general formula (I) is especially preferable.

The general formula (VI) is the same as the foregoing general formula (VI), and the general formula (I) is the same as the foregoing general formula (I).

Also, the acid-decomposable resin may further have a repeating unit derived from other polymerizable monomer.

A content of the repeating unit derived from other polymerizable monomer in the resin is generally not more than 50% by mole, and preferably not more than 30% by mole relative to the whole of repeating units. As the repeating unit derived from other polymerizable monomer which can be used, the same repeating unit as the foregoing repeating unit derived from other polymerizable monomer can be exemplified.

A content of the repeating unit containing an alkali-soluble group such as a hydroxyl group, a carboxy group and a sulfonic acid group is preferably from 1 to 99% by mole, more preferably from 3 to 95% by mole, and especially preferably from 5 to 90% by mole in the whole of repeating units constituting the acid-decomposable resin.

A content of the acid-decomposable group-containing repeating unit is preferably from 3 to 95% by mole, more preferably from 5 to 90% by mole, and especially preferably from 10 to 85% by mole in the whole of repeating units constituting the acid-decomposable resin.

A weight average molecular weight of the acid-decomposable resin is preferably not more than 50,000, more preferably from 1,000 to 20,000, and especially preferably from 1,000 to 10,000 as a value converted into polystyrene by a GPC method.

A polydispersity (Mw/Mn) of the acid-decomposable resin is preferably from 1.0 to 3.0, more preferably from 1.05 to 2.0, and further preferably from 1.1 to 1.7.

Also, the acid-decomposable resin may be used in combinations of two or more kinds thereof.

Specific examples of the acid-decomposable resin which is preferable are given below, but it should not be construed that the invention is limited thereto.

107
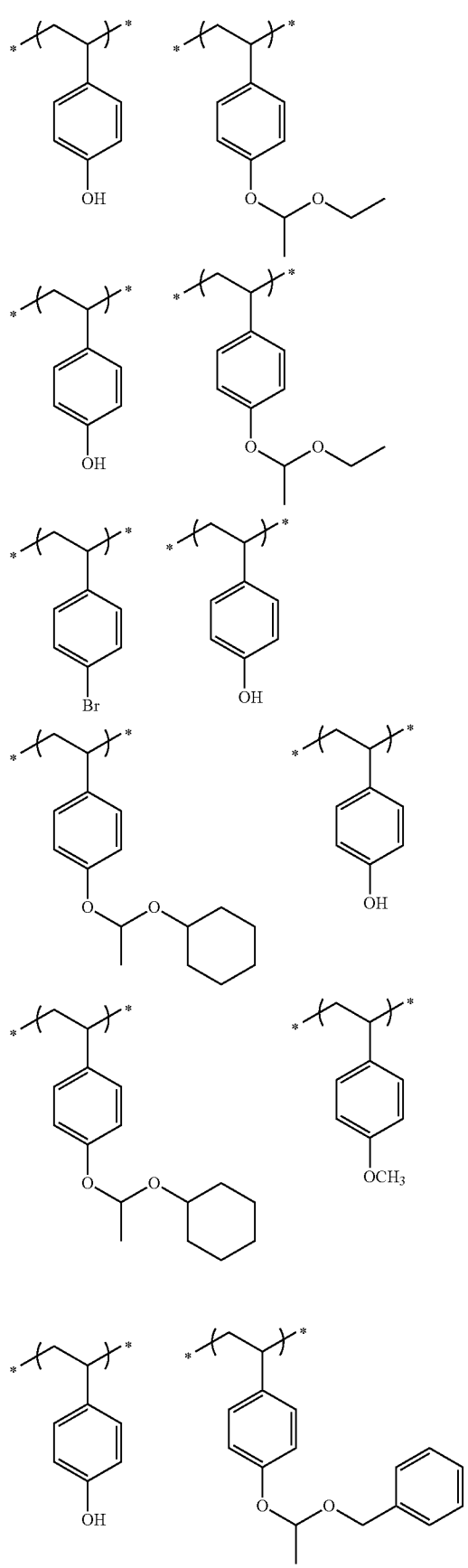
108
-continued
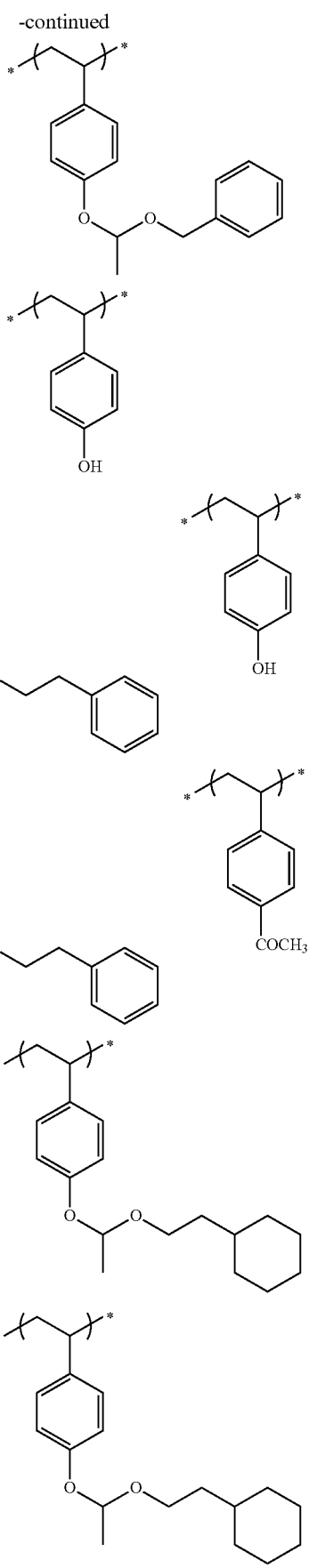

109
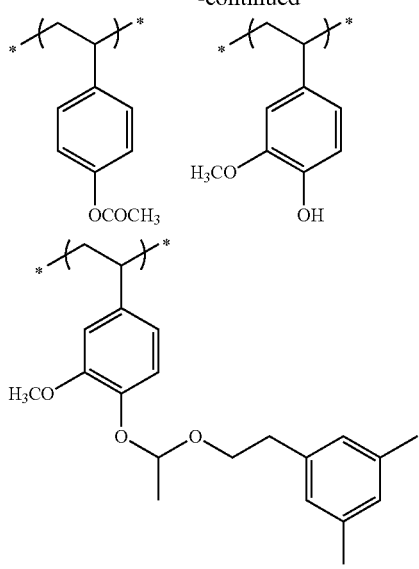
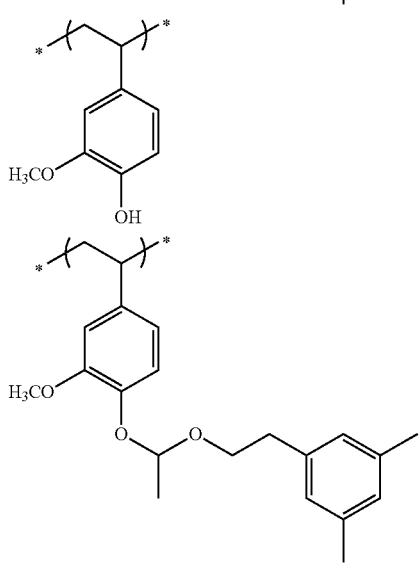
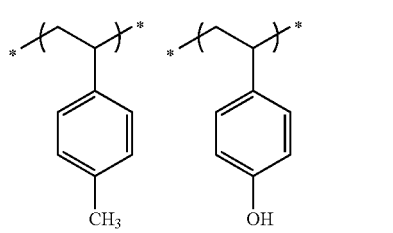
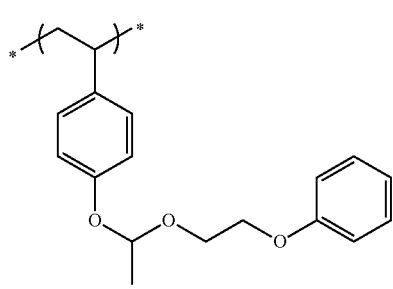
110
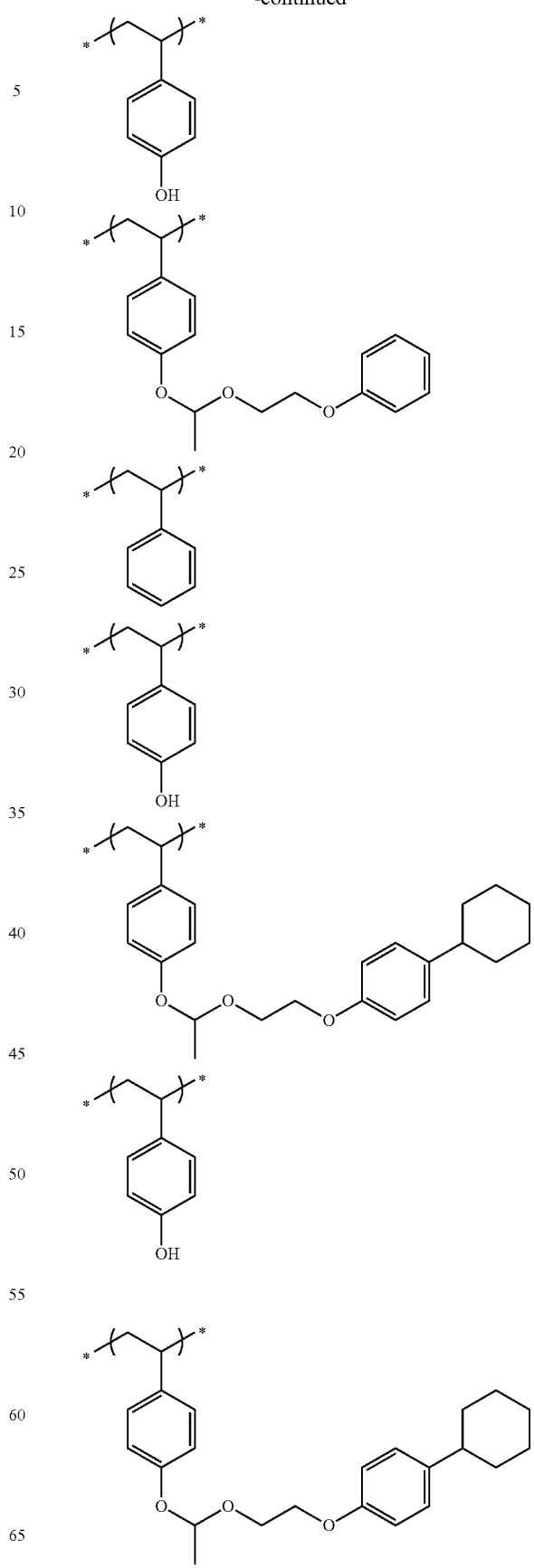

111
-continued
112
-continued
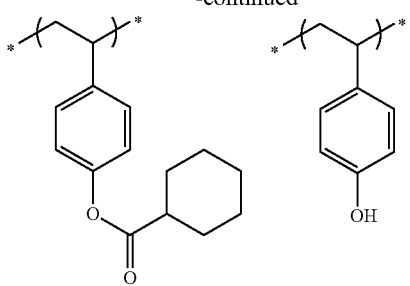
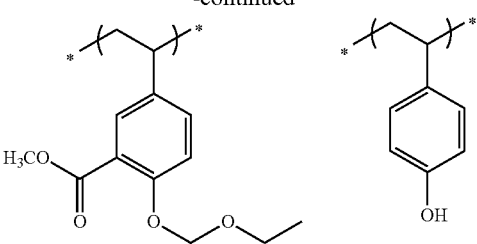
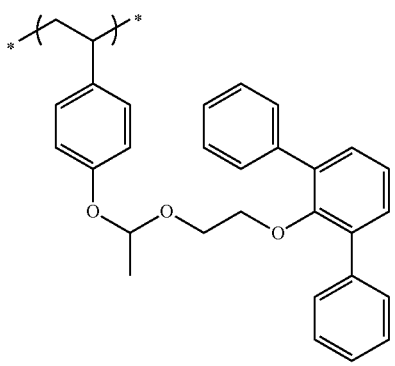
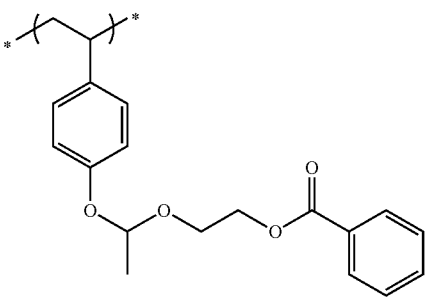
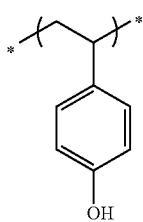
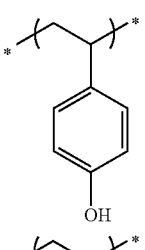
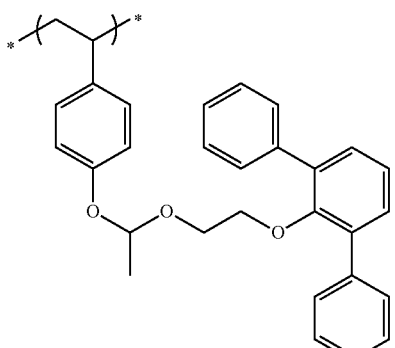
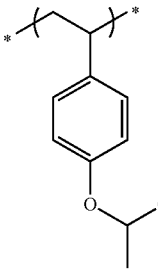
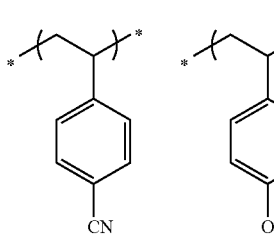
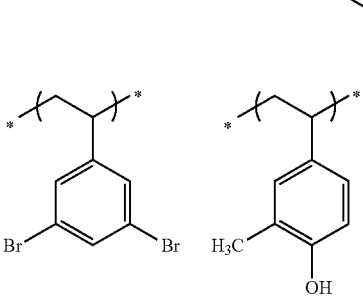
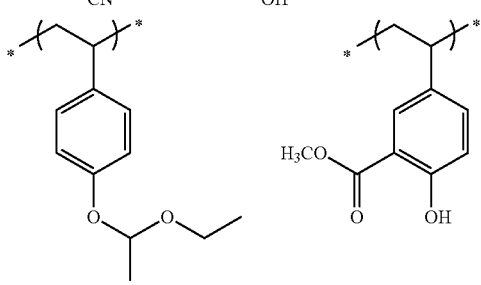
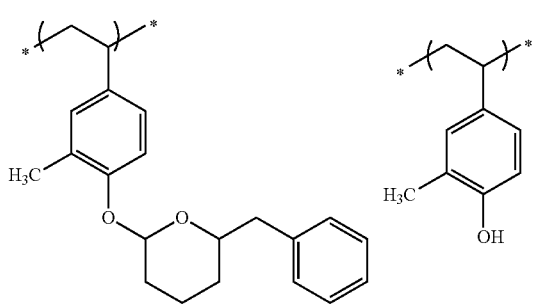

113
-continued
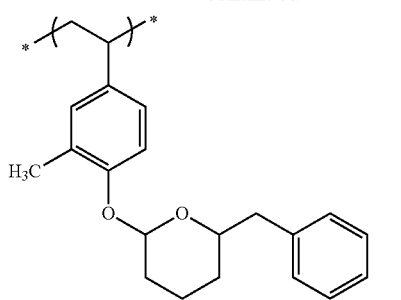
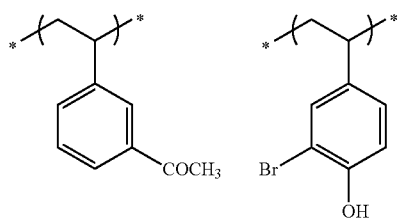
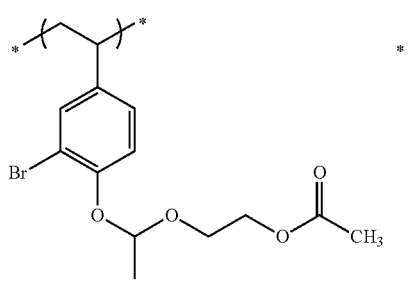
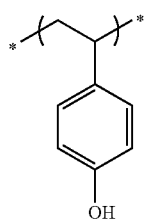
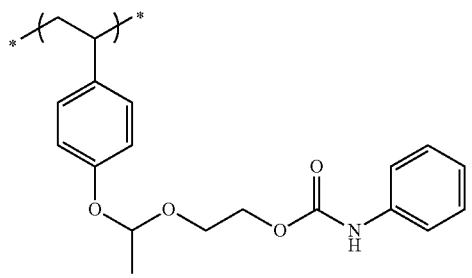
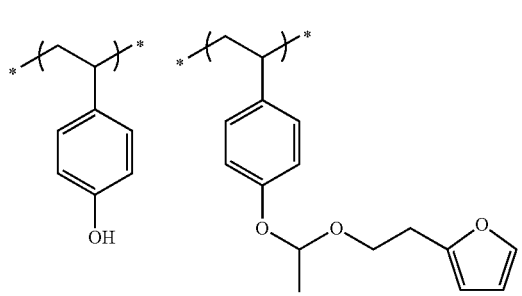
114
-continued
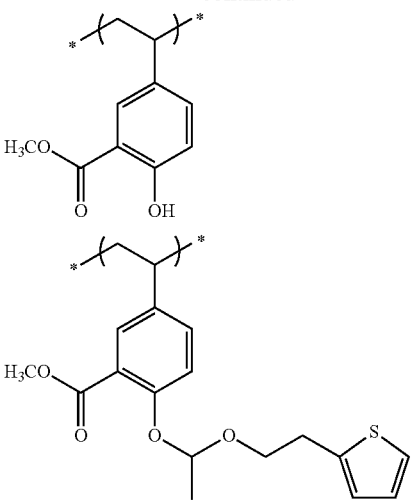
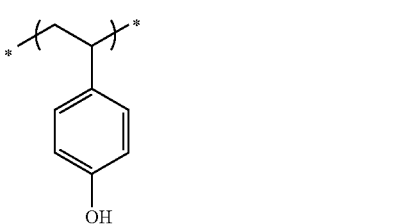
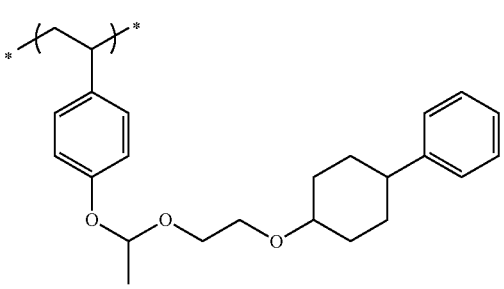
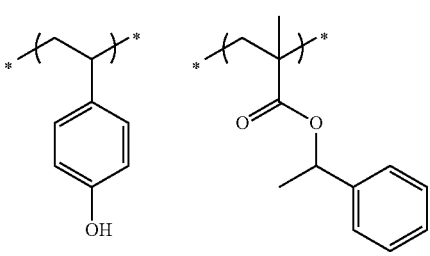
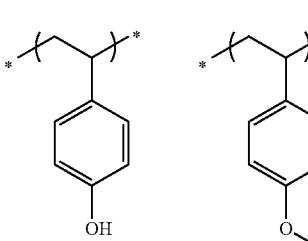

115
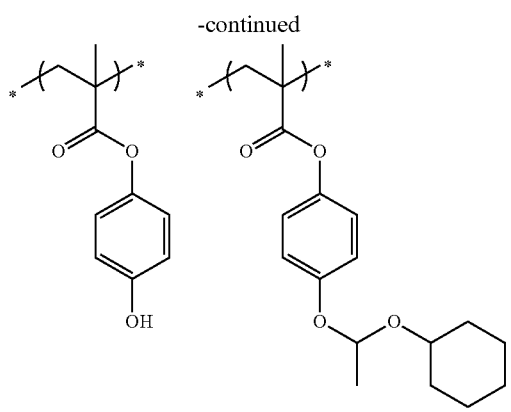
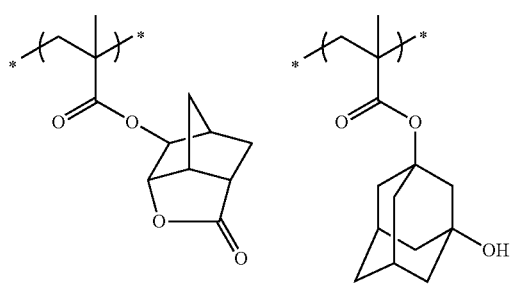
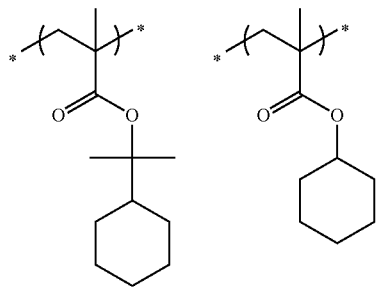
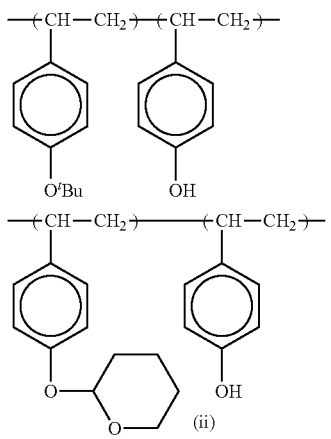
(ii)
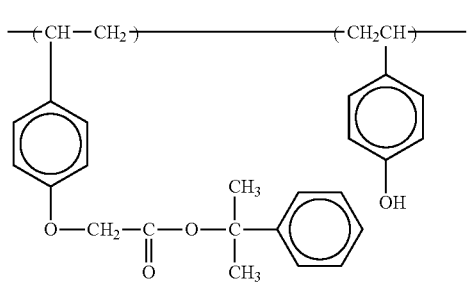
116
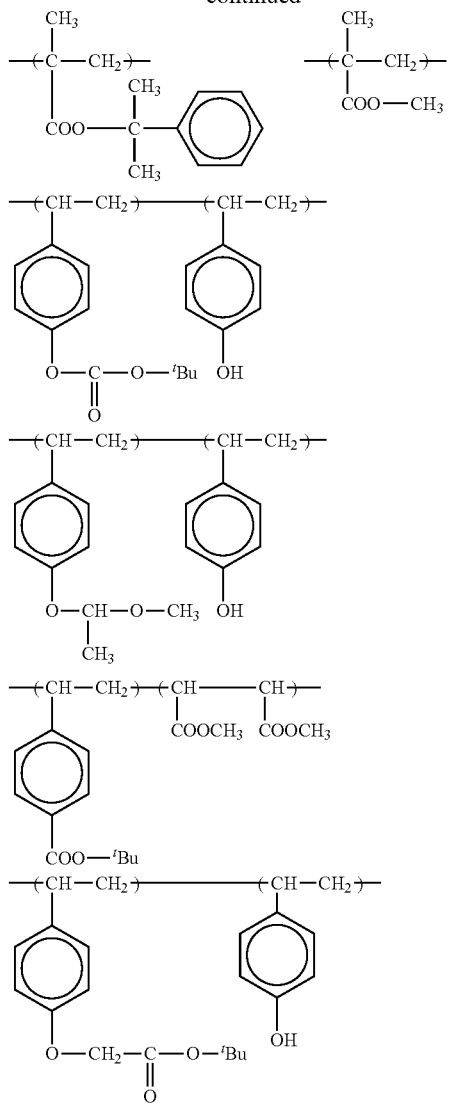
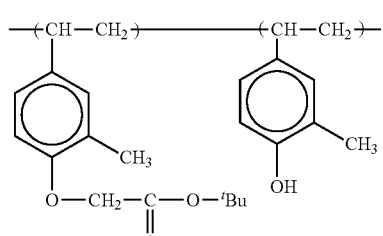
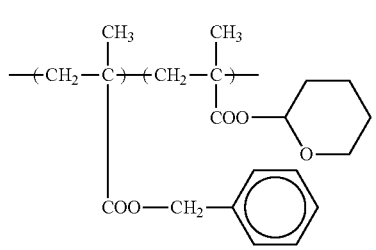

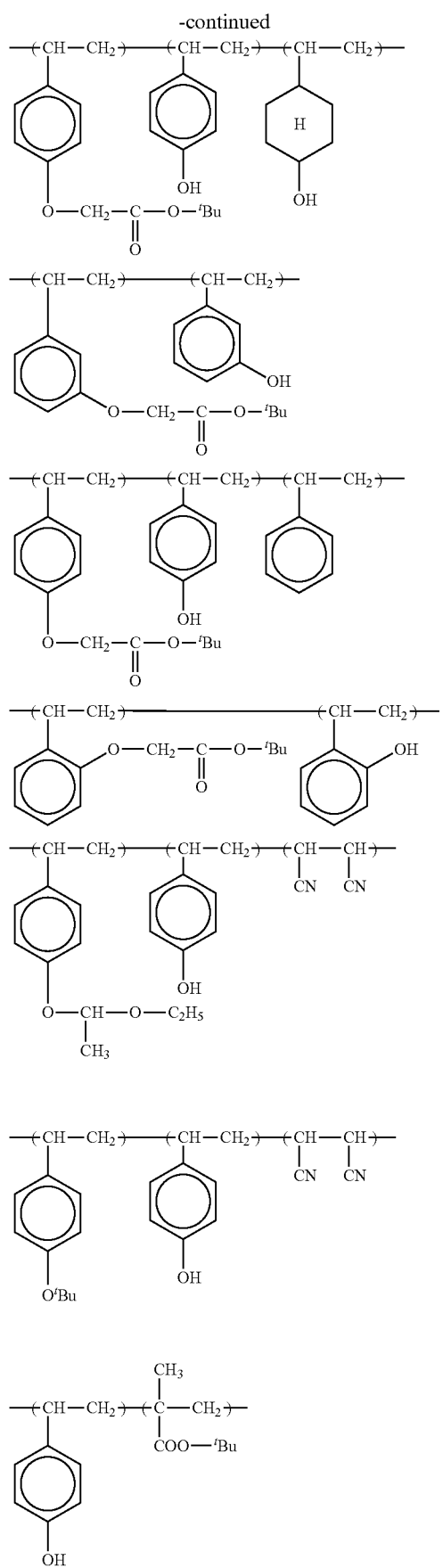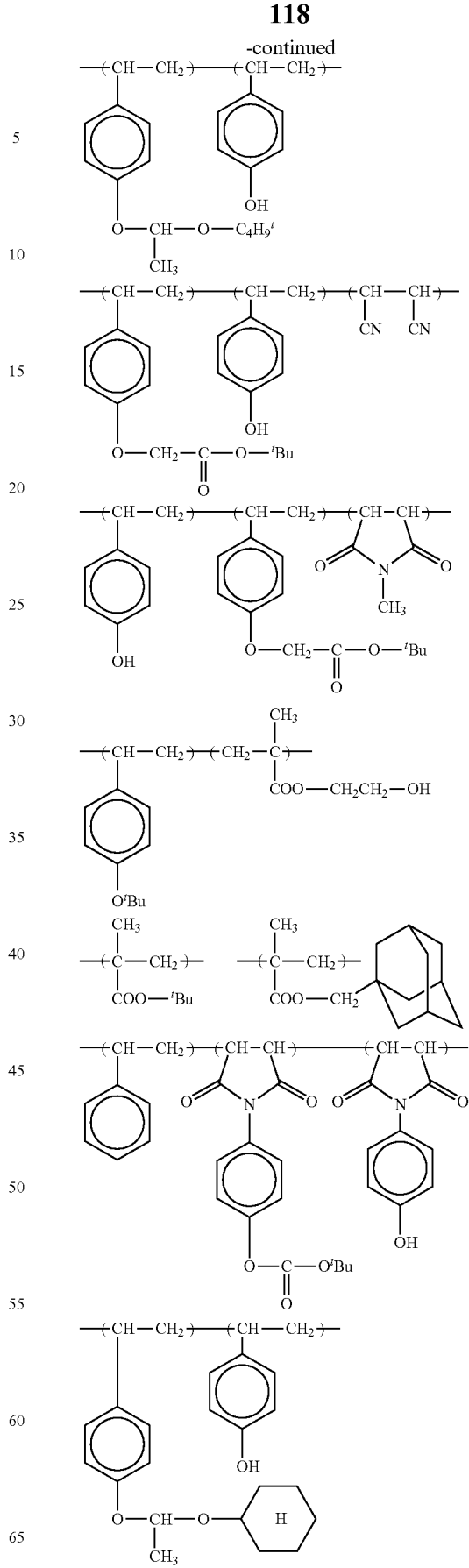

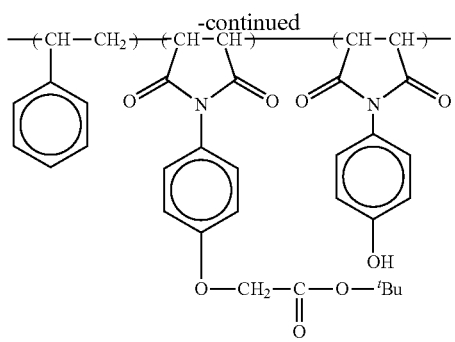

In the positive working resist composition of the invention, a blending amount of the acid-decomposable resin excluding the resin (P) in the composition is preferably from 0 to 70% by mass, more preferably from 0 to 50% by mass, and further preferably from 0 to 30% by mass in the total solids content of the composition.

<Acid Generator>

Though the positive working resist composition of the invention contains the resin (P) having a photo-acid generation structure, it may contain, in addition to the resin (P), a low molecular weight compound capable of generating an acid upon irradiation with an actinic ray or radiation (hereinafter also referred to as "acid generator").

As such an acid generator, known compounds capable of generating an acid upon irradiation with an actinic ray or radiation, which are used in photo-initiators for cationic photopolymerization, photo-initiators for radical photopolymerization, photodecoloring agents for dyes, photodiscoloring agents, micro resists and the like, and mixtures thereof can be properly chosen and used.

Examples of the acid generator include a diazonium salt, a phosphonium salt, a sulfonium salt, an iodonium salt, imide sulfonate, oxime sulfonate, diazo disulfone, disulfone and o-nitrobenzyl sulfonate.

Of the compounds capable of decomposing upon irradiation with an actinic ray or radiation to generate an acid, compounds represented by the following general formulae (ZI'), (ZII') and (ZIII') are preferable.

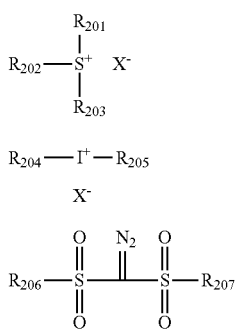

In the foregoing general formulae (ZI') and (ZII'), $R_{201}$ to $R_{205}$ are synonymous with $R_{201}$ to $R_{205}$ in the foregoing general formulae (ZI) and (ZII).

$X^-$ represents a non-nucleophilic anion. Examples of the non-nucleophilic anion which is preferable include a sulfonic acid anion, a carboxylic acid anion, a bis(alkylsulfonyl)amide anion, a tris(alkylsulfonyl)methide anion, $BF_4^-$, $PF_6^-$ and $SbF_6^-$. Of these, a carbon atom-containing organic anion is preferable.

Examples of the organic anion which is more preferable include organic anions represented by the following general formulae (AN1) to (AN4).

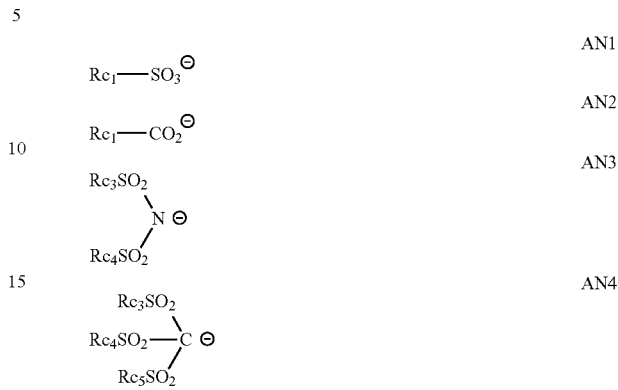

In the foregoing general formulae (AN1) and (AN2), $Rc_1$ represents an organic group.

Examples of the organic group represented by $Rc_1$ include an organic group having from 1 to 30 carbon atoms. Examples of the organic group which is preferable include an optionally substituted alkyl group or aryl group and a group obtained through connection of a plurality of these groups via a single bond or a linking group such as —O—, —$CO_2$—, —S—, —$SO_3$— and —$SO_2N(Rd_1)$—.

$Rd_1$ represents a hydrogen atom or an alkyl group and may form a ring structure together with the bonded alkyl group or aryl group.

The organic group represented by $Rc_1$ is more preferably an alkyl group substituted with a fluorine atom or a fluoroalkyl group at the 1-position thereof or a phenyl group substituted with a fluorine atom or a fluoroalkyl group. When the organic group contains a fluorine atom or a fluoroalkyl group, the acidity of an acid generated upon irradiation with light increases, and the sensitivity is enhanced. When $Rc_1$ has 5 or more carbon atoms, it is preferable that in at least one carbon atom, all of the hydrogen atoms are not substituted with a fluorine atom, but a part of the hydrogen atoms remain; and it is more preferable that a number of the hydrogen atom is larger than a number of the fluorine atom. When the organic group does not contain a perfluoroalkyl group having 5 or more carbon atoms, toxicity to the ecology is reduced.

The most preferred embodiment of $Rc_1$ is a group represented by the following general formula.

In the foregoing general formula, $Rc_6$ represents a perfluoroalkylene group having preferably not more than 4 carbon atoms, more preferably from 2 to 4 carbon atoms, and further preferably from 2 to 3 carbon atoms or a phenylene group substituted with from 1 to 4 fluorine atoms and/or from 1 to 3 fluoroalkyl group.

Ax represents a single bond or a linking group (preferably —O—, —$CO_2$—, —S—, —$SO_3$— or —$SO_2N(Rd_1)$—). $Rd_1$ represents a hydrogen atom or an alkyl group and may be bonded to $Rc_7$ to form a ring structure.

$Rc_7$ represents a hydrogen atom, a fluorine atom or an optionally substituted linear or branched alkyl group, monocyclic or polycyclic cycloalkyl group or aryl group. It is preferable that the optionally substituted alkyl group, cycloalkyl group or aryl group does not contain a fluorine atom as the substituent.

In the foregoing general formulae (AN3) and (AN4), each of $Rc_3$, $Rc_4$ and $Rc_5$ represents an organic group.

In the foregoing general formulae (AN3) and (AN4), examples of the organic group represented by $Rc_3$, $Rc_4$ and $Rc_5$ which is preferable include the same organic groups as those which are preferable in $Rc_1$.

$Rc_3$ and $Rc_4$ may be bonded to each other to form a ring.

Examples of the group which is formed through bonding of $Rc_3$ and $Rc_4$ include an alkylene group and arylene group. Of these, a perfluoroalkylene group having from 2 to 4 carbon atoms is preferable. What $Rc_3$ and $Rc_4$ are bonded to each other to form a ring is preferable because the acidity of an acid generated upon irradiation with light increases, and the sensitivity is enhanced.

The acid generator may be a compound having a plurality of the structure represented by the general formula (ZI'). For example, the acid generator may be a compound having a structure in which at least one of $R_{201}$ to $R_{203}$ of the compound represented by the general formula (ZI') is bonded to at least one of $R_{201}$ to $R_{203}$ of another compound represented by the general formula (ZI').

In the foregoing general formula (ZIII'), each of $R_{706}$ to $R_{207}$ independently represents an aryl group, an alkyl group or a cycloalkyl group.

The aryl group represented by $R_{206}$ to $R_{207}$ is preferably a phenyl group or a naphthyl group, and more preferably a phenyl group.

The alkyl group represented by $R_{206}$ to $R_{207}$ may be either linear or branched and is preferably a linear or branched alkyl group having from 1 to 10 carbon atoms (for example, a methyl group, an ethyl group, a propyl group, a butyl group and a pentyl group).

The cycloalkyl group represented by $R_{206}$ to $R_{207}$ is preferably a cycloalkyl group having from 3 to 10 carbon atoms (for example, a cyclopentyl group, a cyclohexyl group and a norbornyl group).

Examples of the substituent which each of $R_{206}$ to $R_{207}$ may have include an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxyl group and a phenylthio group.

Of the compounds capable of generating an acid upon irradiation with an actinic ray or radiation, compounds represented by the following general formulae (ZIV'), (ZV') and (ZVI') are preferable.

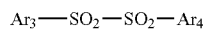

ZIV'

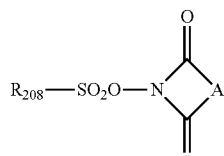

ZV'

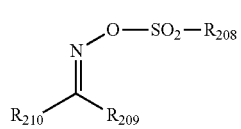

ZVI'

In the foregoing general formulae (ZIV') to (ZVI'), each of $Ar_3$ and $Ar_4$ independently represents an aryl group.

Each of $R_{208}$s independently represents an alkyl group, a cycloalkyl group or an aryl group.

Each of $R_{209}$ and $R_{210}$ represents an alkyl group, a cycloalkyl group, an aryl group or an electron withdrawing group. $R_{209}$ is preferably an aryl group. $R_{210}$ is preferably an electron withdrawing group, and more preferably a cyano group or a fluoroalkyl group.

A represents an alkylene group, an alkenylene group or an arylene group.

Each of these groups may have a substituent, and examples of the substituent include the same substituents as those which each of $R_{204}$ to $R_{207}$ may have.

Of the compounds capable of generating an acid upon irradiation with an actinic ray or radiation, the compounds represented by the general formulae (ZI'), (ZIII') and (ZVI') are preferable.

Of the compounds capable of generating an acid upon irradiation with an actinic ray or radiation, the following compounds are especially preferable.

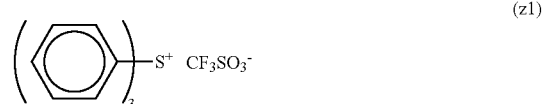

(z1)

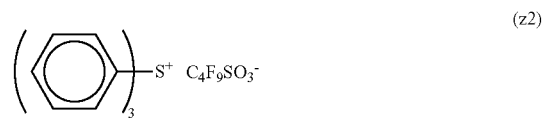

(z2)

(z3)

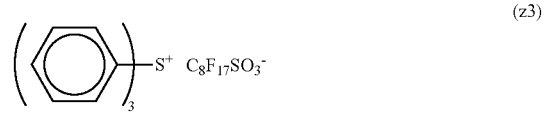

(z4)

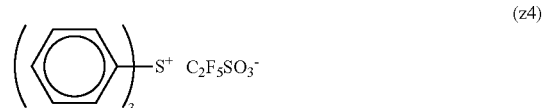

(z5)

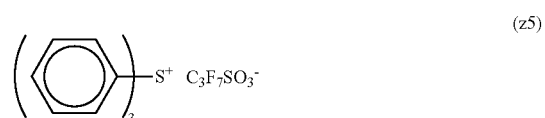

(z6)

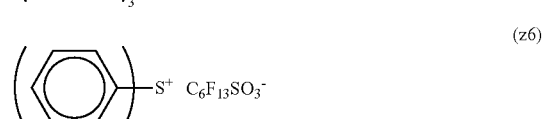

(z7)

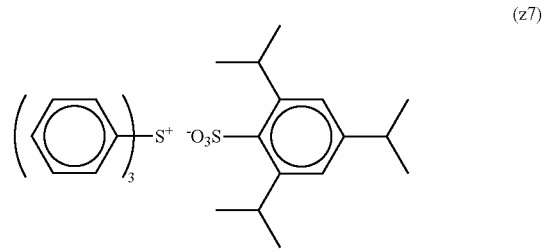

-continued
(z8)
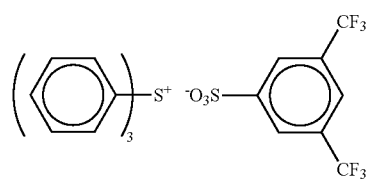
(z9)
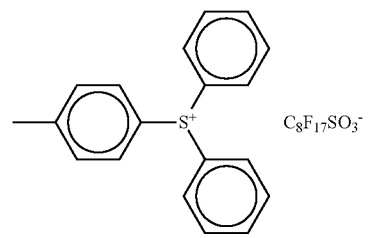
(z10)
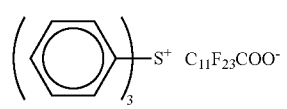
(z11)
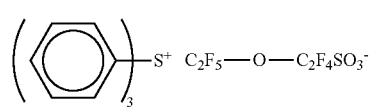
(z12)
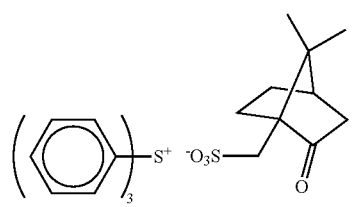
(z13)
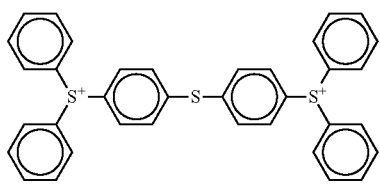
(z14)
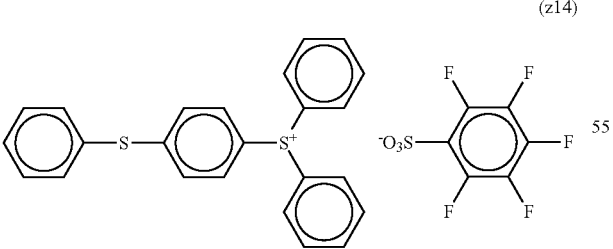
(z15)
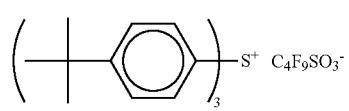
-continued
(z16)
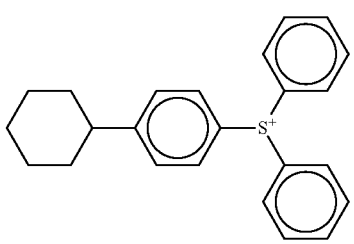
(z17)
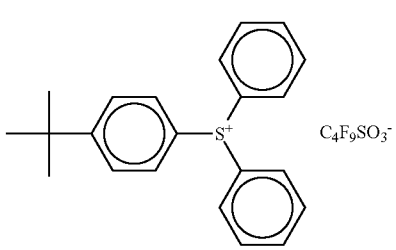
(z18)
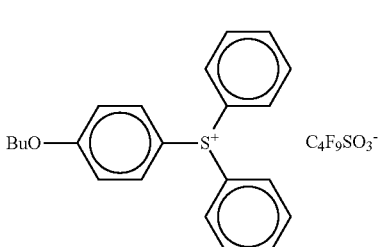
(z19)
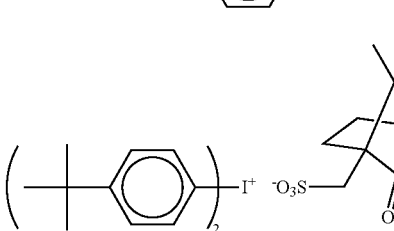
(z20)
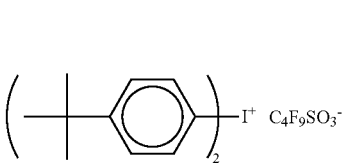
(z21)
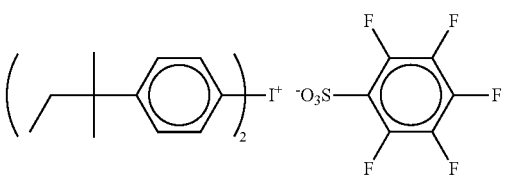
(z22)
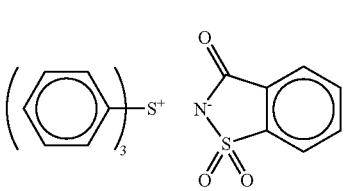

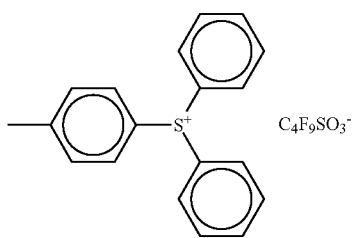
(z23)
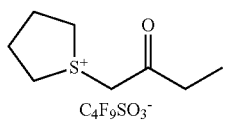
(z24)
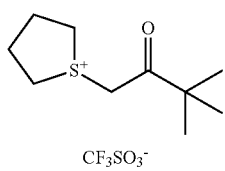
(z25)
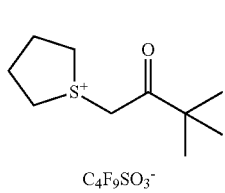
(z26)
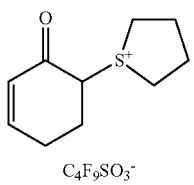
(z27)
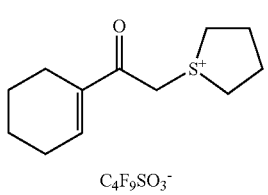
(z28)
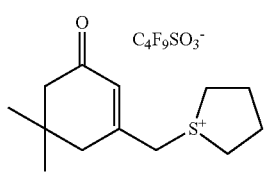
(z29)
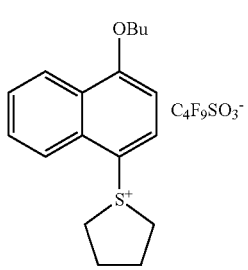
(z30)
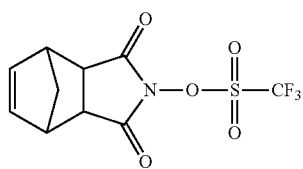
(z31)
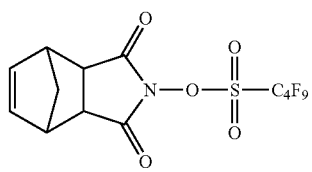
(z32)
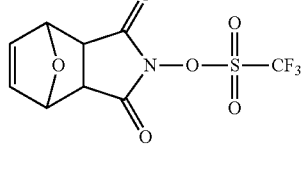
(z33)
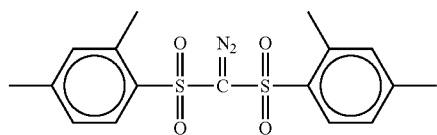
(z34)
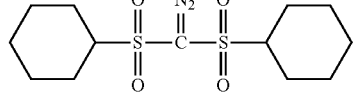
(z35)
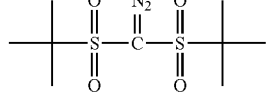
(z36)
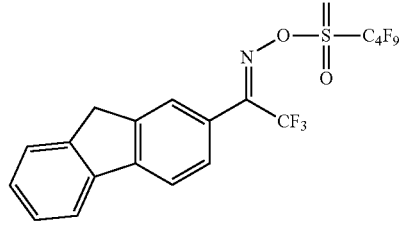
(z37)
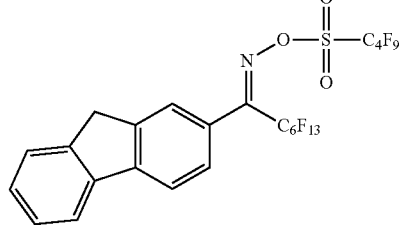
(z38)
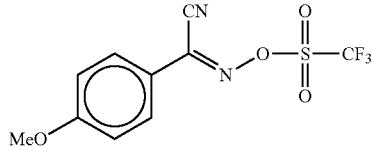
(z39)

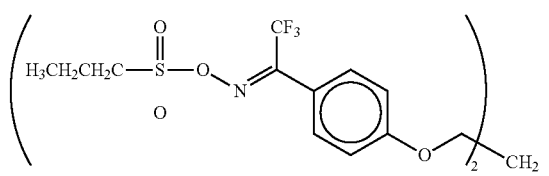
(z40)
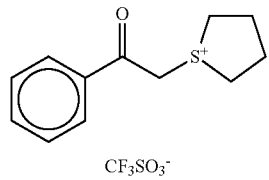
(z41)
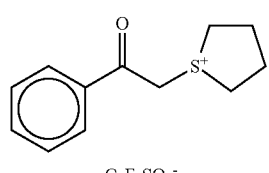
(z42)
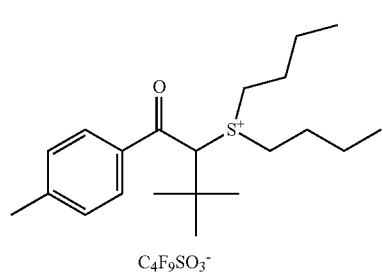
(z43)
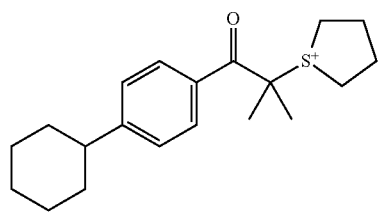
(z44)
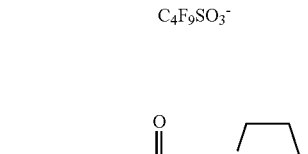
(z45)
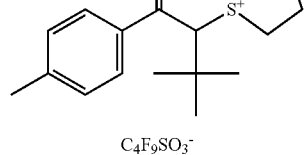
(z46)
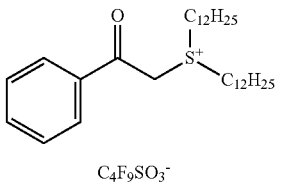
(z47)
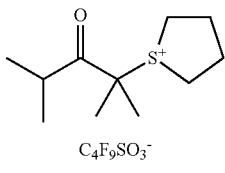
(z48)
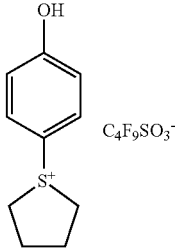
(z49)
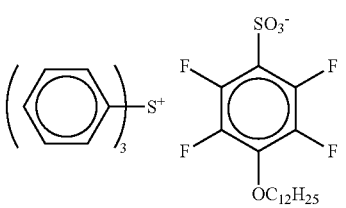
(z50)
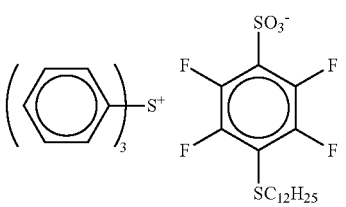
(z51)
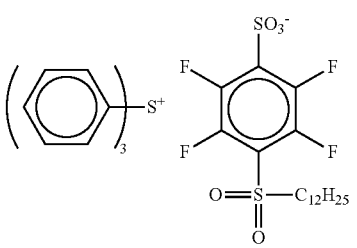
(z52)
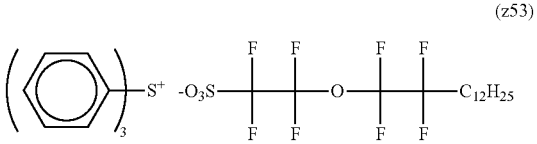
(z53)
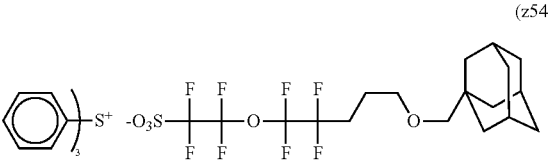
(z54)

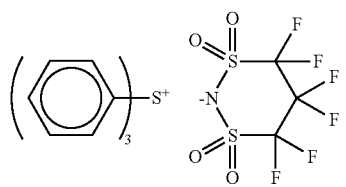 (z55)
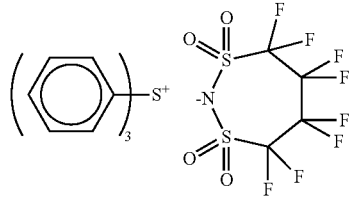 (z56)
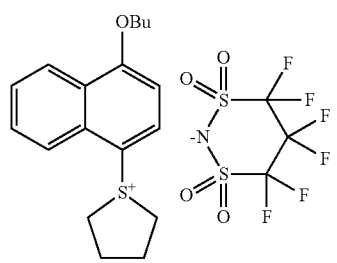 (z57)
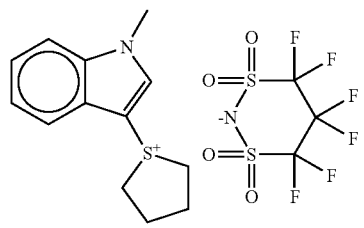 (z58)
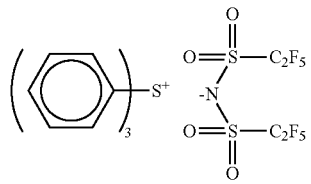 (z59)
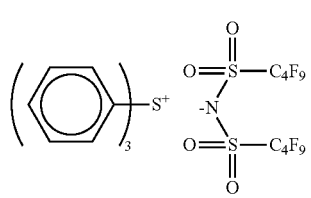 (z60)
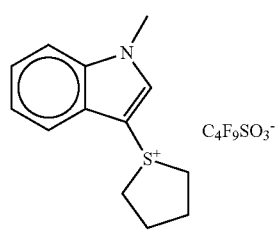 (z61)
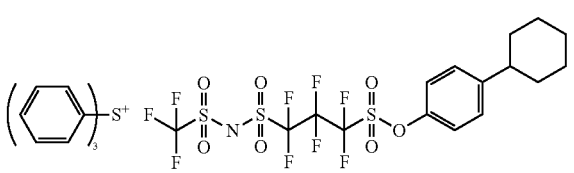 (z62)
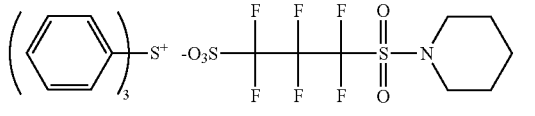 (z63)
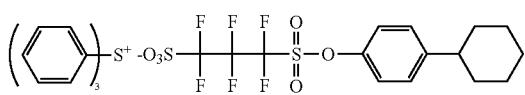 (z64)
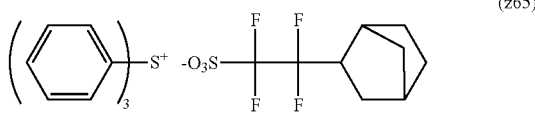 (z65)
 (z66)
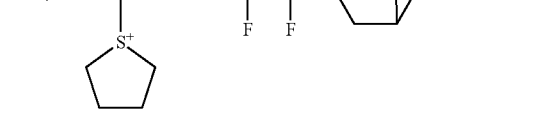 (z67)
 (z68)
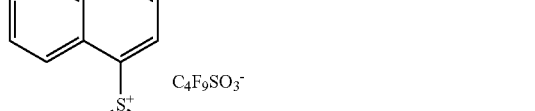 (z69)
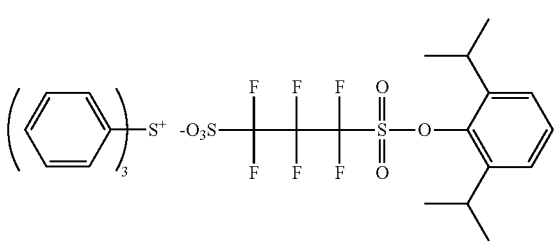
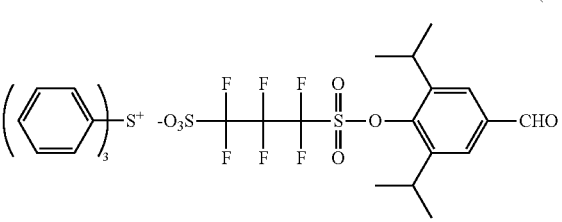

(z70) 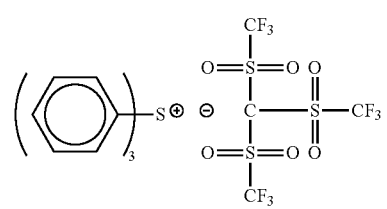
(z71) 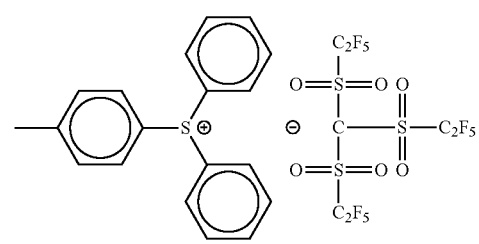
(z72) 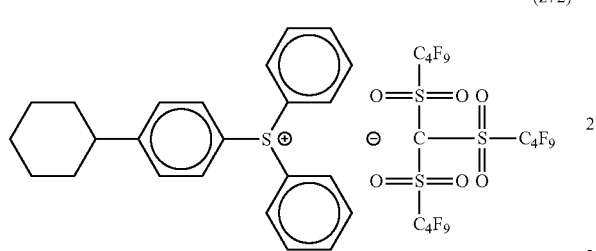
(z73) 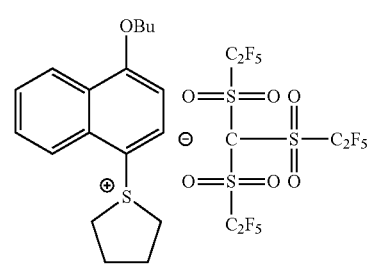
(z74) 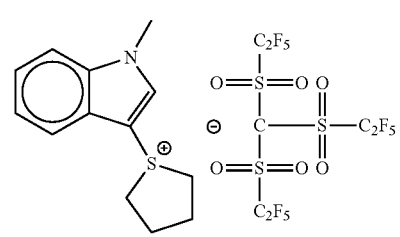
(z75) 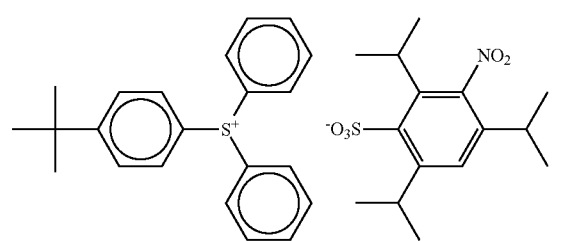
(z76) 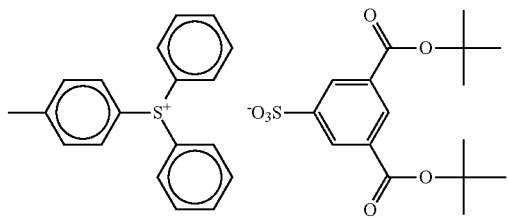
(z77) 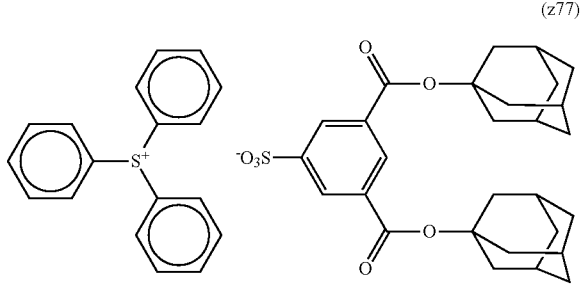
(z78) 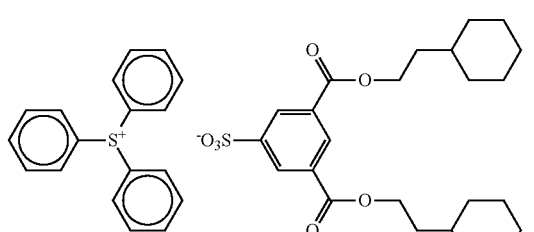
(z79) 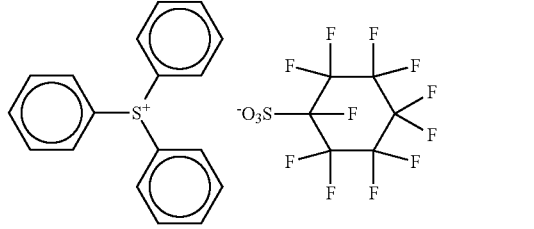
(z80) 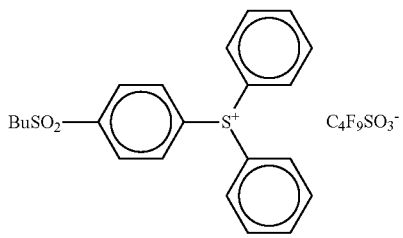
(z81) 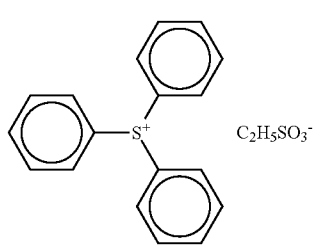

(z82) 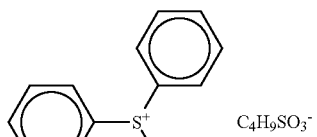 C₄H₉SO₃⁻

(z83) 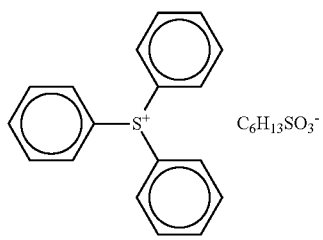 C₆H₁₃SO₃⁻

(z84) 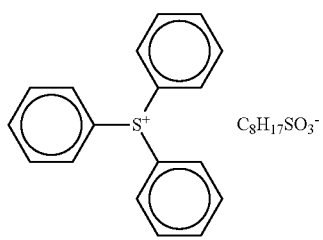 C₈H₁₇SO₃⁻

(z85) 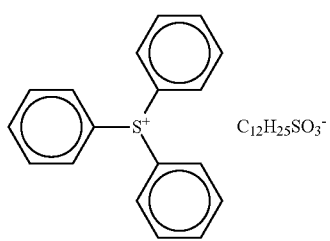 C₁₂H₂₅SO₃⁻

(z86) 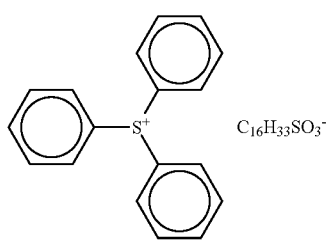 C₁₆H₃₃SO₃⁻

(z87) 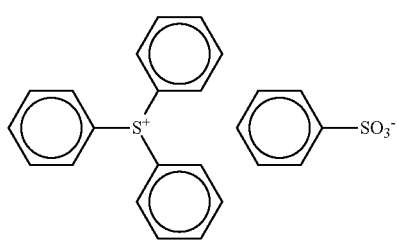

(z88) 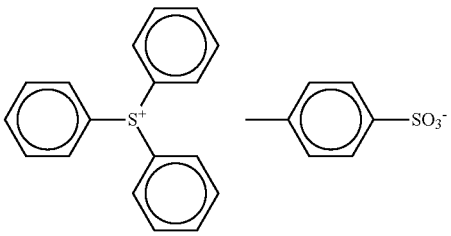

Also, example of the acid generator which is preferable include a compound represented by the following general formula (A1).

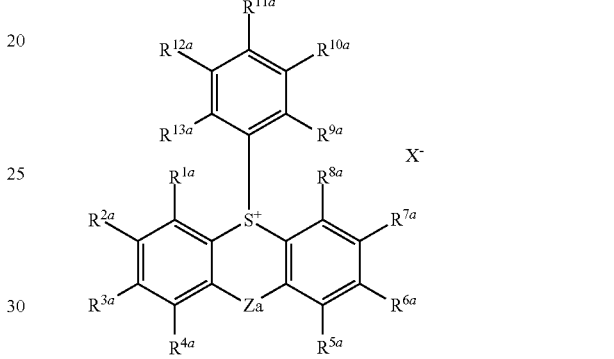

In the foregoing general formula (A1), each of $R^{1a}$ to $R^{13a}$ independently represents a hydrogen atom or a substituent, and at least one of $R^{1a}$ to $R^{13a}$ is an alcoholic hydroxyl group-containing substituent.

Za represents a single bond or a divalent linking group.

$X^-$ represents a counter anion.

The "alcoholic hydroxyl group" as referred to in the invention is a hydroxyl group bonded to a carbon atom of an alkyl group.

In the case where each of $R^{1a}$ to $R^{13a}$ is an alcoholic hydroxyl group-containing substituent, each of $R^{1a}$ to $R^{13a}$ is represented by —W—Y. Here, Y represents a hydroxyl group-substituted alkyl group, and W represents a single bond or a divalent linking group.

Examples of the alkyl group represented by Y include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group. Of these, an ethyl group, a propyl group, an isopropyl group, an n-butyl group, an isobutyl group and a sec-butyl group are preferable; and an ethyl group, a propyl group and an isopropyl group are more preferable. Y especially preferably contains a —CH₂CH₂OH structure.

Though the divalent linking group represented by W is not particularly limited, examples thereof include divalent groups obtained by substituting an arbitrary hydrogen atom in a monovalent group (for example, an alkoxy group, an acyloxy group, a carbamoyloxy group, an alkoxycarbonyloxy group, an aryloxycarbonyloxy group, an acylamino group, an aminocarbonylamino group, an alkoxycarbonylamino group, an aryloxycarbonylamino group, a sulfamoylamino group, an alkysulfonylamino group, an arylsulfonylamino group, an alkylthio group, an arylthio group, a sulfamoyl group, an alkylsulfinyl group, an arylsulfinyl group, an alkylsulfonyl group, an arylsulfonyl group, an acyl group, an aryloxycarbonyl group, an alkoxycarbonyl group and a carbamoyl group) with a single bond.

W is preferably a single bond or a divalent group obtained by substituting an arbitrary hydrogen atom in an alkoxy group, an acyloxy group, an acylamino group, an alkylsulfonylamino group, an arylsulfonylamino group, an alkylthio group, an alkylsulfonyl group, an acyl group, an alkoxycarbonyl group or a carbamoyl group with a single bond; and more preferably a single bond or a divalent group obtained by substituting an arbitrary hydrogen atom in an acyloxy group, an alkylsulfonyl group, an acyl group or an alkoxycarbonyl group with a single bond.

In the case where each of $R^{1a}$ to $R^{13a}$ is an alcoholic hydroxyl group-containing substituent, a carbon atom number to be contained is preferably from 2 to 10, more preferably from 2 to 6, and especially preferably from 2 to 4.

The alcoholic hydroxyl group-containing substituent represented by $R^{1a}$ to $R^{13a}$ may contain two or more alcoholic hydroxyl groups. A number of the alcoholic hydroxyl group which the alcoholic hydroxyl group-containing substituent represented by $R^{1a}$ to $R^{13a}$ contains is from 1 to 6, preferably from 1 to 3, and further preferably 1.

A number of the alcoholic hydroxyl group which the compound represented by the general formula (A1) has is from 1 to 10, preferably from 1 to 6, and more preferably from 1 to 3 in total of $R^{1a}$ to $R^{13a}$.

In the case where each of $R^{1a}$ to $R^{13a}$ does not contain an alcoholic hydroxyl group, each of $R^{1a}$ to $R^{13a}$ independently represents a hydrogen atom or a substituent. Any substituent is useful as the substituent without particular limitations. Examples thereof include a halogen atom, an alkyl group (inclusive of a cycloalkyl group, a bicycloalkyl group and a tricycloalkyl group), an alkenyl group (inclusive of a cyclokenyl group and a bicycloalkenyl group), an allynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (inclusive of an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an aryl azo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$) and other known substituents.

Also, two adjacent groups of $R^{1a}$ to $R^{13a}$ may jointly form a ring (an aromatic or non-aromatic hydrocarbon ring or a heterocyclic ring; these may be combined with each other to form a polycyclic fused ring; and examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring).

In the case where each of $R^{1a}$ to $R^{13a}$ does not contain an alcoholic hydroxyl group, each of $R^{1a}$ to $R^{13a}$ is preferably a hydrogen atom, a halogen atom, an alkyl group (inclusive of a cycloalkyl group, a bicycloalkyl group and a tricycloalkyl group), an alkenyl group (inclusive of a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfonyl group, an aryloxycarbonyl group, an alkoxycarbonyl group, a carbamoyl group, an imido group, a silyl group or a ureido group.

In the case where each of $R^{1a}$ to $R^{13a}$ does not contain an alcoholic hydroxyl group, each of $R^{1a}$ to $R^{13a}$ is more preferably a hydrogen atom, a halogen atom, an alkyl group (inclusive of a cycloalkyl group, a bicycloalkyl group and a tricycloalkyl group), a cyano group, an alkoxy group, an acyloxy group, an acylamino group, an aminocarbonylamino group, an alkoxycarbonylamino group, an alkylsulfonylamino group, an arylsulfonylamino group, an alkylthio group, a sulfamoyl group, an alkylsulfonyl group, an arylsulfonyl group, an alkoxycarbonyl group or a carbamoyl group.

Furthermore, in the case where each of $R^{1a}$ to $R^{13a}$ does not contain an alcoholic hydroxyl group, each of $R^{1a}$ to $R^{13a}$ is especially preferably a hydrogen atom, an alkyl group (inclusive of a cycloalkyl group, a bicycloalkyl group and a tricycloalkyl group), a halogen atom or an alkoxy group.

In the general formula (A1), at least one of $R^{1a}$ to $R^{13a}$ contains an alcoholic hydroxyl group, and preferably, at least one of $R^{9a}$ to $R^{13a}$ contains an alcoholic hydroxyl group.

Za represents a single bond or a divalent linking group. Examples of the divalent linking group include an alkylene group, an arylene group, a carbonyl group, a sulfonyl group, a carbonyloxy group, a carbonylamino group, a sulfonylamide group, an ether group, a thioether group, an amino group, a disulfide group, an acyl group, an alkylsulfonyl group, $—CH=CH—$, $—C\equiv C—$, an aminocarbonylamino group and an aminosulfonylamino group. Each of these groups may have a substituent. Examples of the substituent include the same substituents as those in the foregoing $R^{1a}$ to $R^{13a}$. Za is preferably a single bond or a substituent which does not have electron withdrawing properties, such as an alkylene group, an arylene group, an ether group, a thioether group, an amino group, $—CH=CH—$, $—C\equiv C—$, an aminocarbonylamino group and an aminosulfonylamino group. Za is more preferably a single bond, an ether group or a thioether group, and especially preferably a single bond.

Examples of the counter anion represented by $X^-$ in the general formula (A1) include the same non-nucleophilic anions as those in $X^-$ in the foregoing acid generators represented by the general formulae (ZI') and (ZII').

A molecular weight of the compound represented by the general formula (A1) is preferably from 200 to 2,000, and especially preferably from 400 to 1,000.
Specific examples of the compound represented by the general formula (A1) are given below, but it should not be construed that the invention is limited thereto.
(A1)
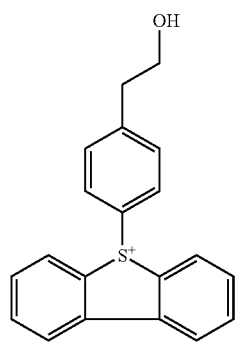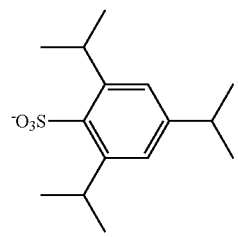
(A2)
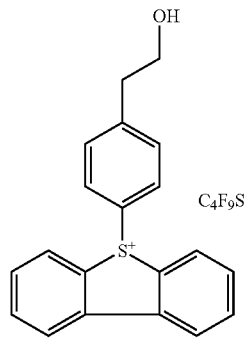
(A3)
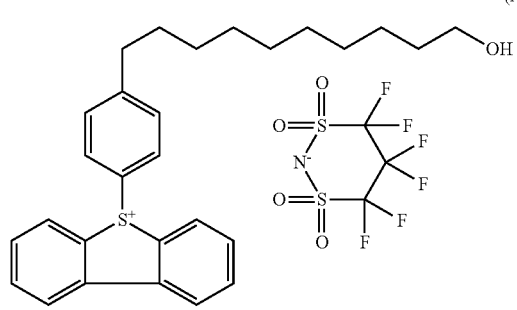
(A4)
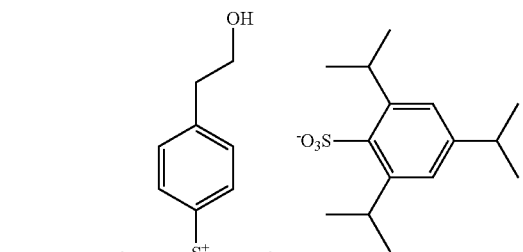
(A5)
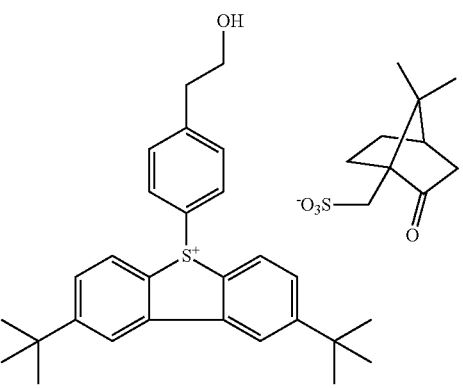
(A6)
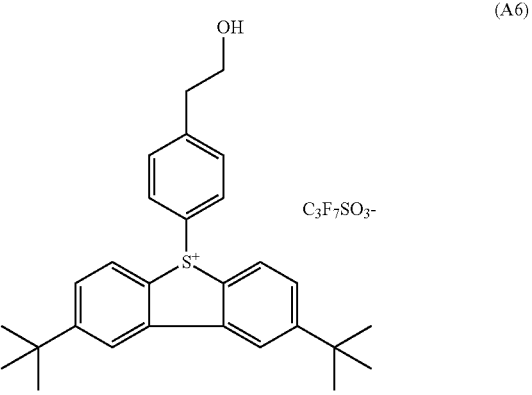
(A7)
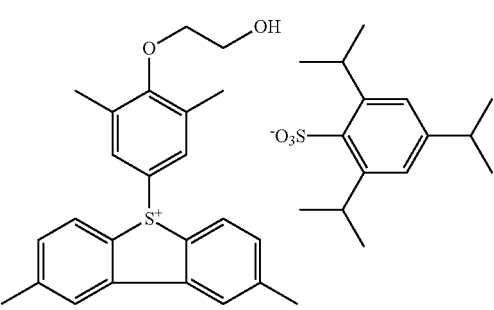
(A8)
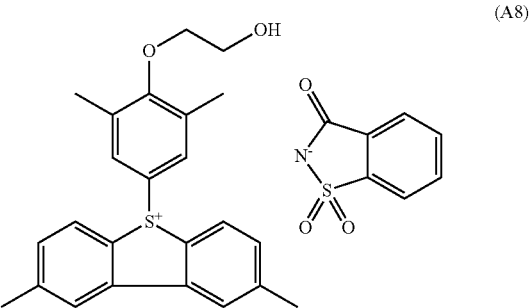

-continued
(A9)
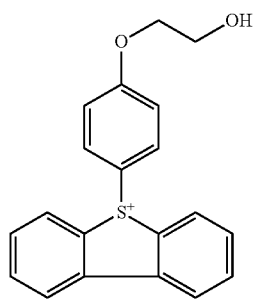 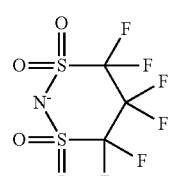
(A10)
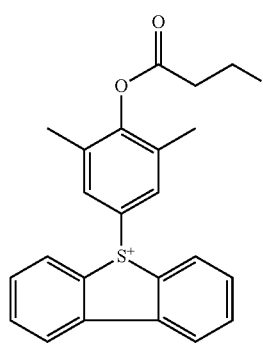 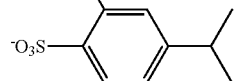
A(11)
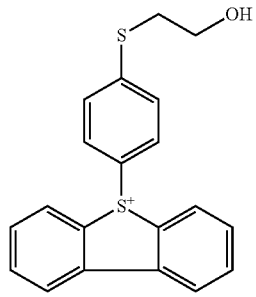 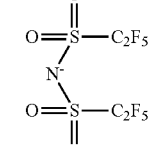
(A12)
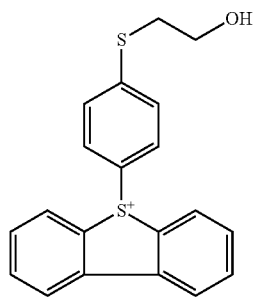 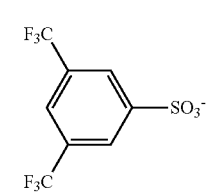
(A13)
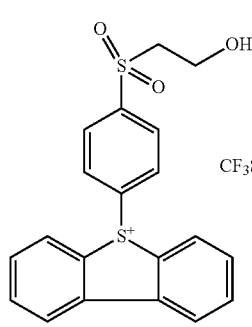
-continued
(A14)
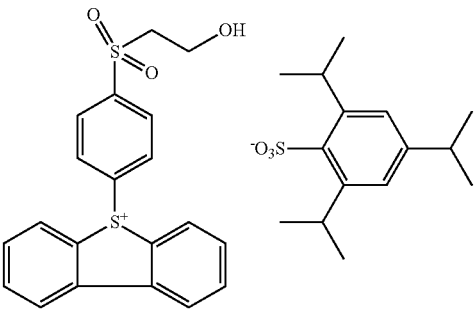 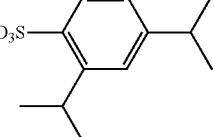
(A15)
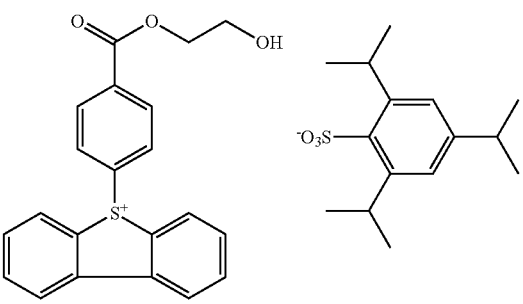 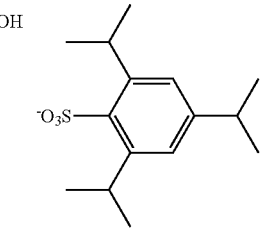
(A16)
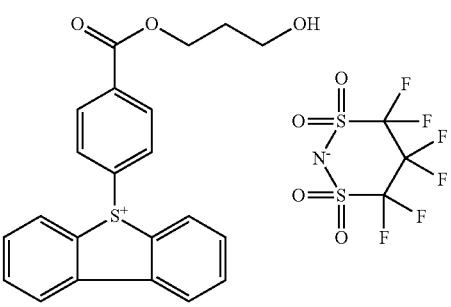 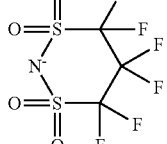
(A17)
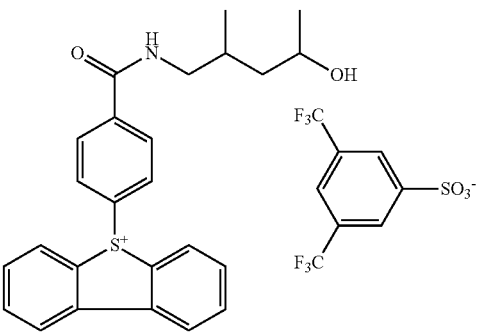 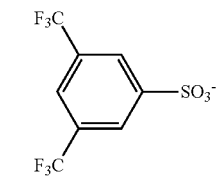
(A18)
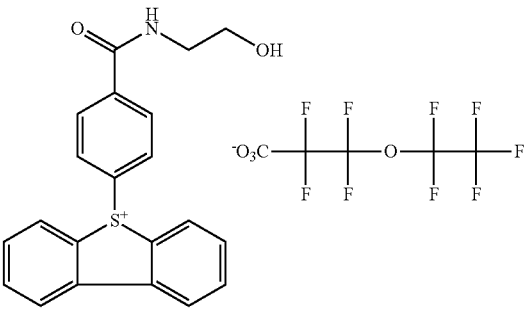 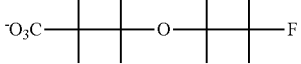

-continued
(A19) 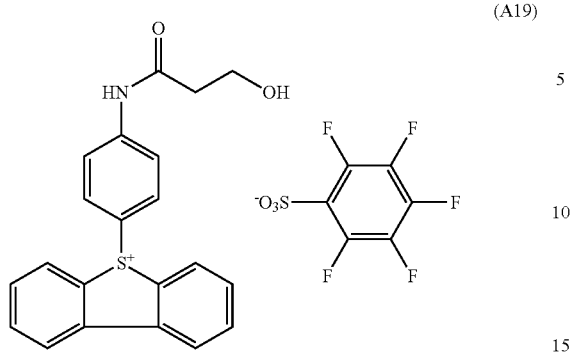
(A23) 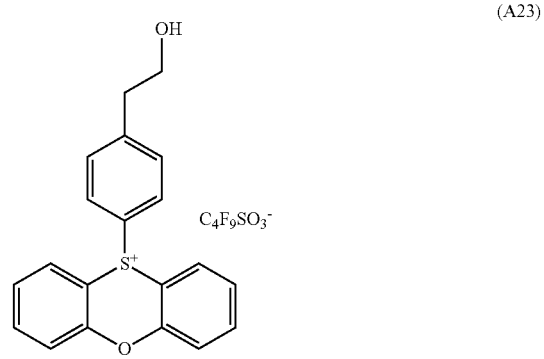
(A20) 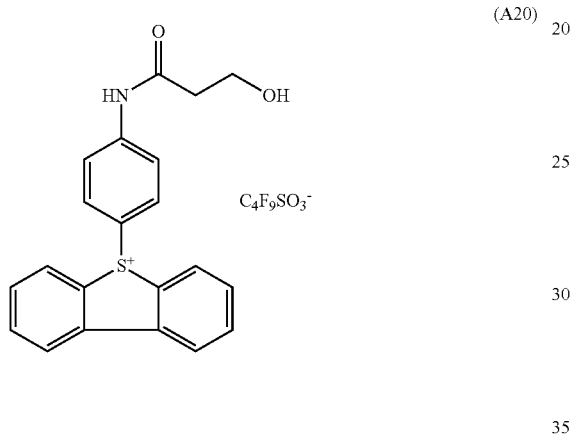
(A24) 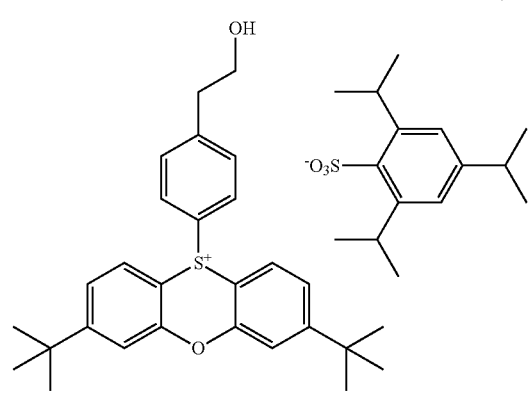
(A21) 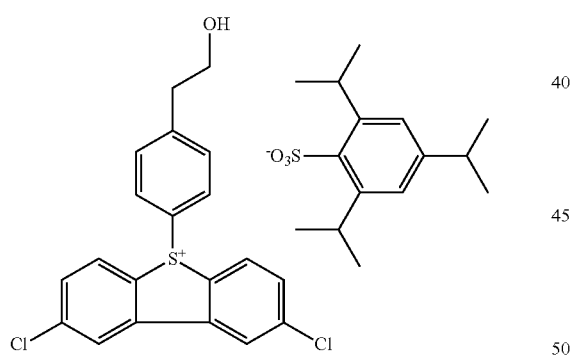
(A25) 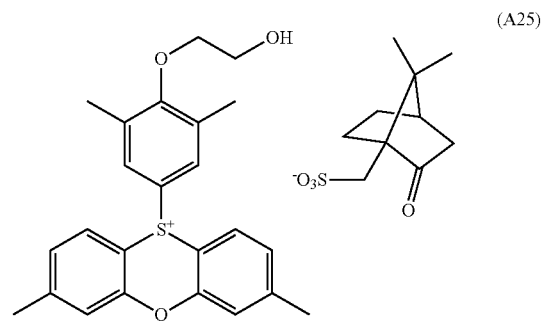
(A22) 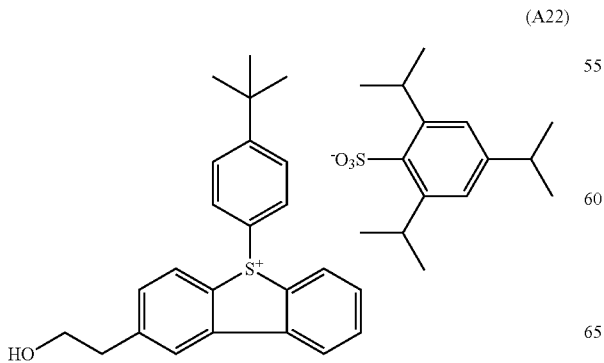
(A26) 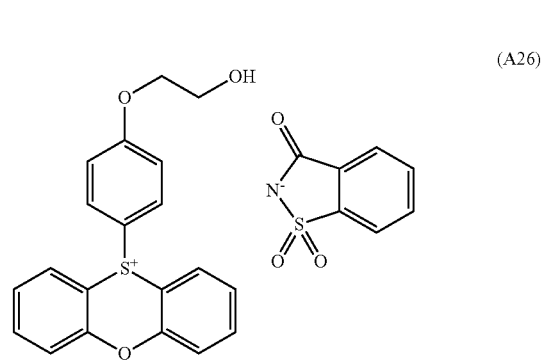

(A27) 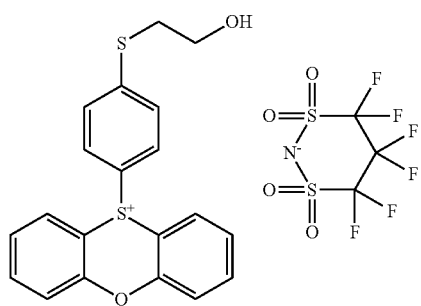 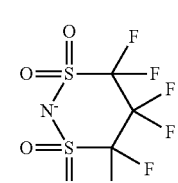
(A28) 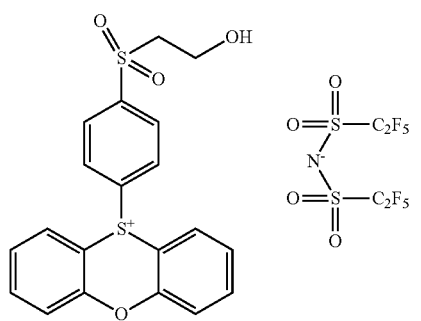 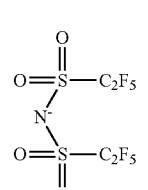
(A29) 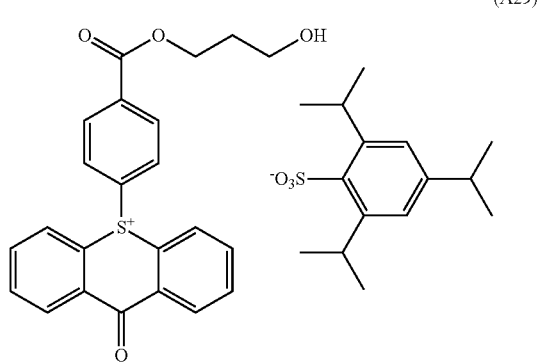
(A30) 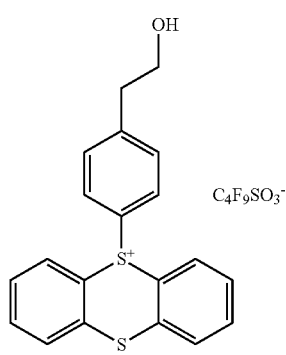
(A31) 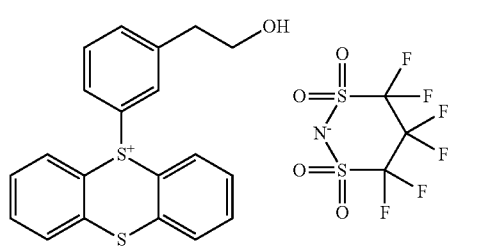
(A32) 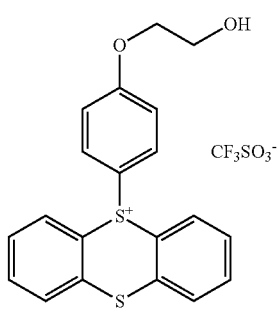 
(A33) 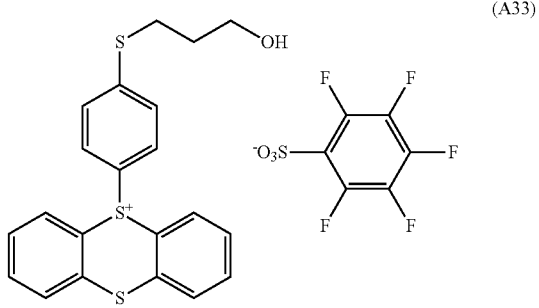
(A34) 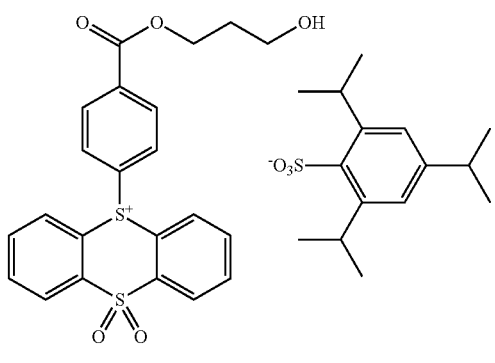
(A35) 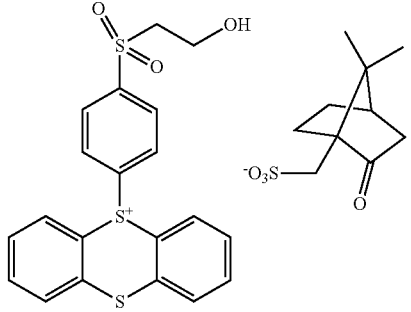
(A36) 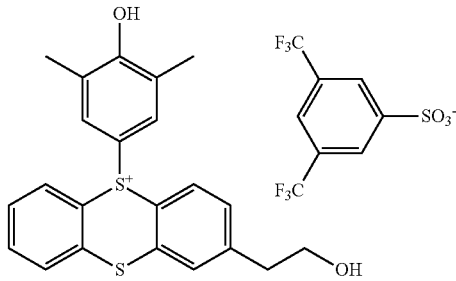

The acid generator represented by the general formula (A1) can be synthesized according to a method disclosed in, for example, JP-A-2007-210904.

In the positive working resist composition of the invention, in case of using an acid generator in addition to the resin (P) having a photo-acid generation structure, the acid generator may be used singly or in combinations of two or more kinds thereof. In using a combination of two or more kinds of acid generators, it is preferred to use a combination of compounds capable of generating two kinds of organic acids which are different in the total atom number exclusive of a hydrogen atom by 2 or more.

A content of the acid generator in the composition is preferably from 0 to 20% by mass, more preferably from 0 to 10% by mass, and further preferably from 0 to 7% by mass on the basis of the total solids content of the resist composition.

<Organic Solvent>

Examples of a solvent which can be used in dissolving the foregoing respective components therein to prepare a positive working resist composition include organic solvents such as an alkylene glycol monoalkyl ether carboxylate, an alkylene glycol monoalkyl ether, an alkyl lactate, an alkyl alkoxypropionate, a cyclic lactone (preferably a cyclic lactone having from 4 to 10 carbon atoms), a monoketone compound which may have a ring (preferably a monoketone having from 4 to 10 carbon atoms), an alkylene carbonate, an alkyl alkoxyacetate and an alkyl pyruvate.

Examples of the alkylene glycol monoalkyl ether carboxylate which is preferable include propylene glycol monomethyl ether acetate (PGMEA; 1-methoxy-2-acetoxy propane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Examples of the alkylene glycol monoalkyl ether which is preferable include propylene glycol monomethyl ether (PGME; 1-methoxy-2-propanol), propylene glycol monoethyl ether, propylene glycol monopropyl ether, propylene glycol monobutyl ether, ethylene glycol monomethyl ether and ethylene glycol monoethyl ether.

Examples of the alkyl lactate which is preferable include methyl lactate, ethyl lactate, propyl lactate and butyl lactate.

Examples of the alkyl alkoxypropionate which is preferable include ethyl 3-ethoxypropionate, methyl 3-methoxypropionate, methyl 3-ethoxypropionate and ethyl 3-methoxypropionate.

Examples of the cyclic lactone which is preferable include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Examples of the monoketone compound which may contain a ring and which is preferable include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptane and 3-methylcycloheptanone.

Examples of the alkylene carbonate which is preferable include propylene carbonate, vinylene carbonate, ethylene carbonate and butylene carbonate.

Examples of the alkyl alkoxyacetate which is preferable include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Examples of the alkyl pyruvate which is preferable include methyl pyruvate, ethyl pyruvate and propyl pyruvate.

Examples of the solvent which can be preferably used include 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, 2-ethoxyethyl acetate, 2-(2-ethoxyethoxy)ethyl acetate and propylene carbonate. Examples of the solvent which is especially preferable include propylene glycol monomethyl ether acetate and propylene glycol monomethyl ether.

In the invention, the solvent may be used singly or in combinations of two or more kinds thereof.

<Surfactant>

It is preferable that the positive working resist composition of the invention further contains a surfactant. It is more preferable that the positive working resist composition contains either one of a fluorine based and/or silicon based surfactant (for example, a fluorine based surfactant, a silicon based surfactant and a surfactant containing both of a fluorine atom and a silicon atom) or two or more kinds thereof.

When the positive working resist composition of the invention contains the foregoing surfactant, it is possible to give a resist pattern with good sensitivity and resolution and having good adhesion and less development defect at the time of using an exposure source of not more than 250 nm, and especially not more than 220 nm.

Examples of the fluorine based and/or silicon based surfactant include surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants can also be used as they are.

Examples of commercially available surfactants which can be used include fluorine based or silicon based surfactants, for example, EFTOP EF301 and EFTOP EF303 (all of which are manufactured by Shin-Akita Kasei Co., Ltd.); FLUORAD FC430, FLUORAD FC431 and FLUORAD FC4430 (all of which manufactured by Sumitomo 3M Limited); MEGAFAC F171, MEGAFAC F173, MEGAFAC F176, MEGAFAC F189, MEGAFAC F113, MEGAFAC F110, MEGAFAC F177, MEGAFAC F120 and MEGAFAC R08 (all of which are manufactured by DIC Corporation); SURFLON S-382, SURFLON SC101, SURFLON SC102, SURFLON SC103, SURFLON SC104, SURFLON SC105 and SURFLON SC106 (all of which manufactured by Asahi Glass Co., Ltd.); TROYSOL S-366 (manufactured by Troy Chemical Corporation); GF-300 and GF-150 (all of which are manufactured by Toagosei Co., Ltd.); SURFLON S-393 (manufactured by AGC Seimichemical Co., Ltd.); EFTOP EF121, EFTOP EF122A, EFTOP EF122B, EFTOP EF122C, EFTOP EF125M, EFTOP EF135M, EFTOP EF351, EFTOP EF352, EFTOP EF801, EFTOP EF802 and EFTOP EF601 (all of which are manufactured by Jemco Inc.); PF 636, PF 656, PF 6320 and PF 6520 (all of which are manufactured by OMNOVA Solutions Inc.); and FTX-204D, FTX-208G, FTX-218G, FTX-230G, FTX-204D, FTX-208D, FTX-212D, FTX-218 and FTX-222D (all of which are manufactured by NEOS Company Limited). Also, a polysiloxane polymer, KP-341 (manufactured by Shin-Etsu Chemical Co., Ltd.) can also be used as the silicon based surfactant.

Also, as the surfactant, in addition to the foregoing known surfactants, surfactants using a polymer having a fluoro aliphatic group derived from fluoro aliphatic compounds manufactured by a telomerization method (also called a telomer method) or an oligomerization method (also called an oligomer method) can be used. The fluoro aliphatic compound can be synthesized according to the method disclosed in JP-A-2002-90991.

As the polymer having a fluoro aliphatic group, copolymers of a fluoro aliphatic group-containing monomer and a (poly(oxyalkylene)) acrylate and/or a (poly(oxyalkylene)) methacrylate are preferable; and these monomers may be irregularly distributed or block copolymerized. Also, examples of the poly(oxyalkylene) group include a poly(oxyethylene) group, a poly(oxypropylene) group and a poly(oxybutylene) group. A unit containing alkylenes having a different chain length within the same chain length, such as poly(oxyethylene/oxypropylene/oxyethylene block connected body) and poly(oxyethylene/oxypropylene block connected body) may also be used. Furthermore, the copolymer of a fluoro aliphatic group-containing monomer and a (poly(oxyalkylene)) acrylate (or methacrylate) may be not only a binary copolymer but a ternary or multi-component copolymer obtainable by simultaneous copolymerization of two or more kinds of different fluoro aliphatic group-containing monomers or two or more kinds of different (poly(oxyalkylene)) acrylates (or methacrylates).

Examples of commercially available surfactants include MEGAFAC F178, MEGAFAC F-470, MEGAFAC F-473, MEGAFAC F-475, MEGAFAC F-476 and MEGAFAC F-472 (all of which are manufactured by DIC Corporation). Furthermore, examples of the surfactant include a copolymer of a $C_6F_{13}$ group-containing acrylate (or methacrylate) and a (poly(oxyalkylene)) acrylate (or methacrylate); and a copolymer of a $C_3F_7$ group-containing acrylate (or methacrylate), (poly(oxyethylene)) acrylate (or methacrylate) and (poly(oxypropylene)) acrylate (or methacrylate).

Also, in the invention, other surfactants than the fluorine based and/or silicon based surfactant can also be used. Specific examples thereof include nonionic surfactants such as polyoxyethylene alkyl ethers (for example, polyoxyethylene lauryl ether, polyoxyethylene stearyl ether, polyoxyethylene cetyl ether and polyoxyethylene oleyl ether), polyoxyethylene alkylaryl ethers (for example, polyoxyethylene octylphenyl ether and polyoxyethylene nonylphenyl ether), polyoxyethylene/polyoxypropylene block copolymers, sorbitan fatty acid esters (for example, sorbitan monolaurate, sorbitan monopalmitate, sorbitan monostearate, sorbitan monooleate, sorbitan trioleate and sorbitan tristearate) and polyoxyethylene sorbitan fatty acid esters (for example, polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate).

Such a surfactant may be used singly or may be used in combinations of several kinds thereof.

The use amount of the surfactant is preferably from 0.0001 to 2% by mass, and more preferably from 0.001 to 1% by mass relative to the whole amount (excluding the solvent) of the positive working resist composition.

<Acid-decomposable Dissolution-inhibiting Compound>

The positive working resist composition of the invention can contain a dissolution-inhibiting compound having a molecular weight of not more than 3,000, which is capable of decomposing by the action of an acid to increase its solubility in an alkali developer (this compound will also be referred to as "dissolution-inhibiting compound").

As the dissolution-inhibiting compound, an acid-decomposable group-containing alicyclic or aliphatic compound, such as acid-decomposable group-containing cholic acid derivatives described in *Processing of SPIE*, 2724, 355 (1996), is preferable. With respect to the acid-decomposable group and the alicyclic structure, the same as described above in the acid-decomposable resin can be referred to herein.

In case of irradiating the positive working resist composition of the invention with an electron beam, a compound containing a structure where a phenolic hydroxyl group of a phenol compound is substituted with an acid-decomposable group is preferable. The phenol compound is preferably a phenol compound containing from 1 to 9 phenol skeletons, and more preferably a phenol compound containing from 2 to 6 phenol skeletons.

In the invention, a molecular weight of the dissolution-inhibiting compound is not more than 3,000, preferably from 300 to 3,000, and more preferably from 500 to 2,500.

The addition amount of the dissolution-inhibiting compound is preferably from 0 to 50% by mass, and more preferably from 0 to 40% by mass relative to the total solids content of the positive working resist composition.

Specific examples of the dissolution-inhibiting compound are given below, but it should not be construed that the invention is limited thereto.

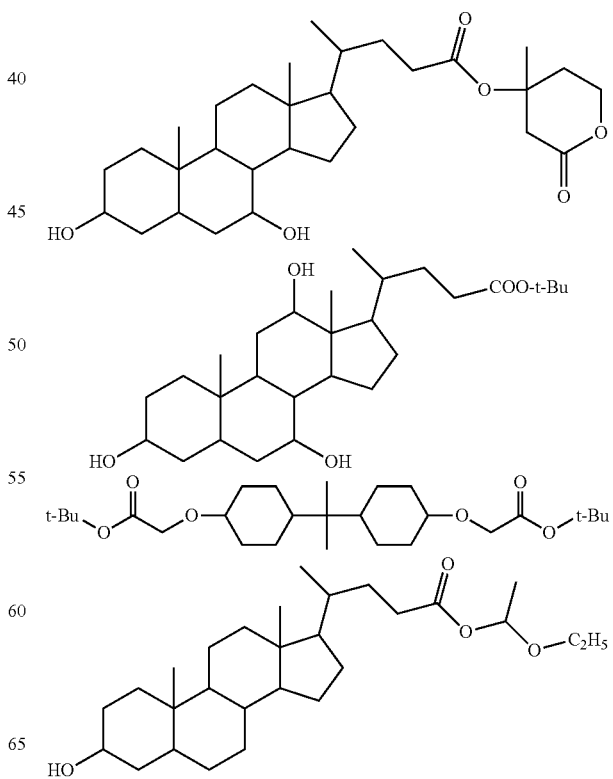

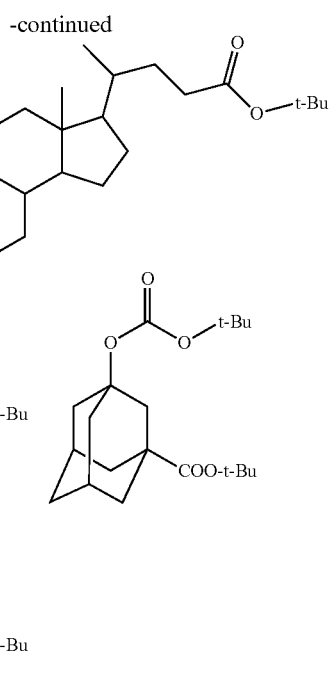

<Dyes>

Examples of the dye which is suitable include oil-soluble dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS and Oil Black T-505 (all of which are manufactured by Orient Chemical Industries, Ltd.), Crystal Violet (CI42555), Methyl Violet (CI42535), Rhodamine B (CI145170B), Malachite Green (CI42000) and Methylene Blue (CI52015).

For the purpose of enhancing the acid generation efficiency by exposure, a photosensitizer which is exemplified below can be added. Specific examples of the photosensitizer which is suitable include benzophenone, p,p'-tetramethyldiaminobenzophenone, p,p'-tetraethylaminobenzophenone, 2-chlorothioxanthone, anthrone, 9-ethoxyanthracene, anthracene, pyrene, perylene, phenothiazine, benzil, Acridine Orange, benzoflavin, Setoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, it should not be construed that the invention is limited to these compounds.

The dissolution-accelerating compound against a developer which can be used in the invention is a low molecular weight compound having two or more phenolic OH groups or one or more carboxy groups and having a molecular weight of not more than 1,000. In the case where the dissolution-accelerating compound contains a carboxy group, an alicyclic or aliphatic compound is preferable.

The addition amount of such a dissolution accelerating compound is preferably from 0 to 50% by mass, and more preferably from 0 to 30% by mass relative to the acid-decomposable resin. The addition amount of not more than 50% by mass is preferable in view of suppressing a development residue and preventing pattern deformation from occurring at the time of development.

Such a phenol compound having a molecular weight of not more than 1,000 can be easily synthesized by those skilled in the art by referring to a method disclosed in, for example, JP-A-4-122938, JP-A-2-28531, U.S. Pat. No. 4,916,210 and European Patent No. 219,294.

Specific examples of the carboxyl group-containing alicyclic or aliphatic compound include carboxylic acid derivatives having a steroid structure, such as cholic acid, deoxycholic acid and lithocholic acid, adamantanecarboxylic acid derivatives, adamantanedicarboxylic acid, cyclohexanecarboxylic acid and cyclohexanedicarboxylic acid. However, it should not be construed that the invention is limited thereto.

Also, a compound having a proton acceptor functional group disclosed in JP-A-2006-208781 and JP-A-2007-286574 can be suitably used in the composition of the invention.

<Pattern-forming Method>

The positive working resist composition of the invention is coated on a support such as a substrate to form a resist film. A thickness of this resist film is preferably from 0.02 to 0.1 μm.

As a method for coating on a substrate, spin coating is preferable, and its number of revolution is preferably from 1,000 to 3,000 rpm.

For example, the positive working resist composition is coated on a substrate which is used for the manufacture of large scale integrated circuit devices (for example, a silicon/silicon dioxide coating film) by an appropriate coating method using a spinner, a coater or the like and then dried to form a resist film. A known antireflection film may be provided in advance.

The resist film is usually irradiated with an electron beam (EB), an X-ray or an EUV beam through a mask, and preferably baked (heated), followed by development. A satisfactory pattern can be thus obtained.

In a development step, the alkali developer is used in the following manner. Examples of the alkali developer of the positive working resist composition which can be used include alkaline aqueous solutions of an inorganic alkali (for example, sodium hydroxide, potassium hydroxide, sodium carbonate, sodium silicate, sodium metasilicate and ammonia water), a primary amine (for example, ethylamine and n-propylamine), a secondary amine (for example, diethylamine and di-n-butylamine), a tertiary amine (for example, triethylamine and methyldiethylamine), an alcoholamine (for example, dimethylethanolamine and triethanolamine), a quaternary ammonium salt (for example, tetramethylammonium hydroxide and tetraethylammonium hydroxide) or a cyclic amine (for example, pyrrole and piperidine).

Furthermore, a suitable amount of an alcohol or a surfactant can be added and used in the foregoing alkali developer.

An alkali concentration of the alkali developer is usually from 0.1 to 20% by mass.

A pH of the alkali developer is usually from 10.0 to 15.0.

EXAMPLES

The invention is hereunder described in more detail with reference to the following Examples, but it should not be construed that the contents of the invention are limited thereto.

Synthesis Example 1

Synthesis of Monomer (M-1)

10 parts by mass of p-hydroxystyrene and 0.01 part by mass of a p-toluenesulfonic acid pyridine salt were dissolved in 80 parts by mass of ethyl acetate at room temperature. While stirring this solution, a mixed solution of 6.1 parts by mass ethyl vinyl ether and 20 parts by mass of ethyl acetate was added dropwise at room temperature. After the dropwise addition, the mixture was allowed to react for an additional 24 hours.

The reaction mixture was made basic by the addition of triethylamine and washed with ion exchanged water. An organic layer was then concentrated and purified by means of column chromatography with hexane/ethyl acetate, thereby obtaining 10.5 parts by mass of the following monomer (M-1).

Synthesis Example 2

Synthesis of Monomer (M-2)

A reaction was carried out in the same manner as in Synthesis Example 1, except that in Synthesis Example 1, 10.7 parts by mass of cyclohexyl vinyl ether was used in place of the ethyl vinyl ether, thereby obtaining 12.3 parts by mass of the following monomer (M-2).

Synthesis Example 3

Synthesis of Monomer (M-3)

A reaction was carried out in the same manner as in Synthesis Example 1, except that in Synthesis Example 1, 13.1 parts by mass of 2-cyclohexylethyl vinyl ether was used in place of the ethyl vinyl ether, thereby obtaining 14.7 parts by mass of the following monomer (M-3).

Synthesis Example 4

Synthesis of Monomer (M-4)

A reaction was carried out in the same manner as in Synthesis Example 1, except that in Synthesis Example 1, 20.9 parts by mass of 2-(4-cyclohexylphenoxy)ethyl vinyl ether was used in place of the ethyl vinyl ether, thereby obtaining 19.3 parts by mass of the following monomer (M-4).

Synthesis Example 5

Synthesis of Monomer (M-5)

50 parts by mass of a triphenylsulfonium Br salt was dissolved in 50 parts by mass of methanol. A mixed solution of 30 parts by mass of a 4-styrenesulfonic acid Na salt, 50 parts by mass of methanol and 130 parts by mass of ion exchanged water was added dropwise to this solution while stirring at room temperature.

The reaction mixture was subjected to extraction and washing by the addition of ion exchanged water and chloroform. An organic layer was concentrated, and a deposited solid was converted into a slurry in hexane/ethyl acetate and filtered, thereby obtaining 48 parts by mass of the following monomer (M-5).

Synthesis Example 6

Synthesis of Monomer (M-6)

65 parts by mass of the following monomer (M-6) was obtained in the same manner as in Synthesis Example 5, except that in Synthesis Example 5, 50 parts by mass of the triphenylsulfonium Br salt was changed to 61.3 parts by mass of a 4,4-bis(methoxyphenyl)iodonium Br salt.

Synthesis Example 7

Synthesis of Monomer (M-7)

34 parts by mass of a triphenylsulfonium Br salt was dissolved in a mixed solvent of 15 parts by mass of methanol and 15 parts by mass of ion exchanged water. A mixed solution of 24 parts by mass of potassium 3-sulfopropyl methacrylate, 15 parts by mass of methanol and 15 parts by mass of ion exchanged water was added dropwise to this solution while stirring at room temperature.

After reacting for 2 hours, the reaction mixture was subjected to extraction and washing by the addition of ion exchanged water and chloroform. An organic layer was concentrated, thereby obtaining 28 parts by mass of the following monomer (M-7).

Synthesis Example 8

Synthesis of Monomer (M-8)

19.5 parts by mass of sodium sulfanilate was dissolved in 75 parts by mass of pyridine, 9.8 parts by mass of maleic anhydride was added to this solution, and the mixture was stirred at room temperature for one hour. Thereafter, 10.2 parts by mass of acetic anhydride was further added, and the mixture was heated with stirring at 80° C. for 4 hours. The reaction mixture was thrown into ion exchanged water, and a large amount of sodium chloride was added, thereby depositing a solid. The obtained solid was collected by filtration and washed, thereby obtaining sodium 4-phenylmaleimidosulfonate.

The sodium 4-phenylmaleimidosulfonate was subjected to an anion exchange reaction with a triphenylsulfonium Br salt in the same manner as in Synthesis Example 7, thereby obtaining the following monomer (M-8).

Synthesis Example 9

Synthesis of Monomer (M-9)

9.8 parts by mass of maleic anhydride was dissolved in 200 parts by mass of tetrahydrofuran; after adding 23.8 parts by mass of pyridine, 19.6 parts by mass of sodium 4-hydroxybenzenesulfonate was added; and the mixture was refluxed under heating for 5 hours. After allowing the reaction mixture to stand for cooling, the resulting reaction mixture was thrown into ion exchanged water, and a large amount of sodium chloride, thereby depositing a solid. The obtained solid was collected by filtration and washed, followed by subjecting to an anion exchange reaction with a triphenylsulfonium Br salt in the same manner as in Synthesis Example 7, thereby obtaining the following monomer (M-9).

Synthesis Example 10A

Synthesis of Monomer (M-10)

The following monomer (M-10) was synthesized according to a method disclosed in Example 4 of WO 06/121096.

Synthesis Example 11A

Synthesis of Monomer (M-11)

The following monomer (M-11) was synthesized according to a method disclosed in Example 5 of US-A-2007/0117043.

Synthesis Example 12A

Synthesis of Monomer (M-12)

The following monomer (M-12) was synthesized according to a method disclosed in Example 3 of US-A-2007/0117043.

Synthesis Example 13A

Synthesis of Monomer (M-13)

The following monomer (M-13) was synthesized according to a method disclosed in Example 2 of WO 06/121096.

M-1

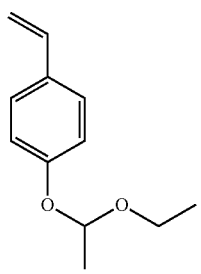

M-2

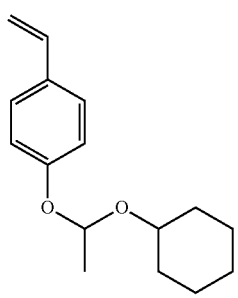

M-3

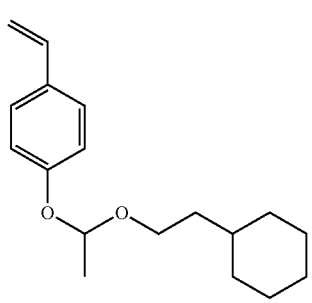

M-4

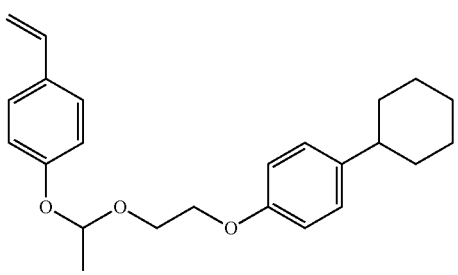

M-5

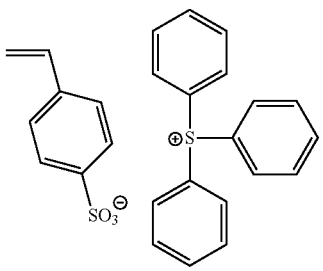

M-6

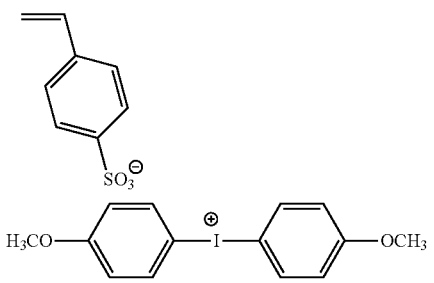

M-7

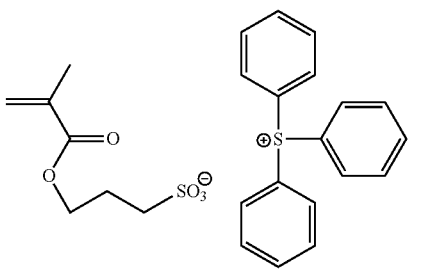

M-8

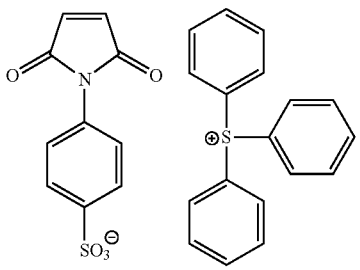

M-9

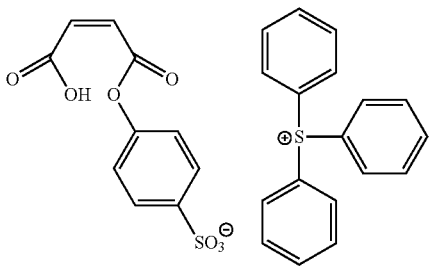

-continued

M-10
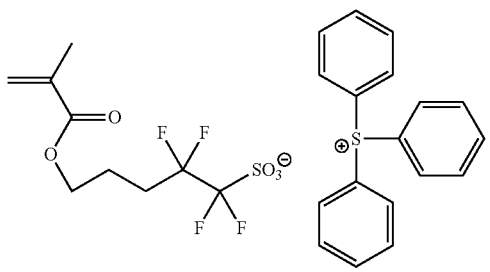

M-11
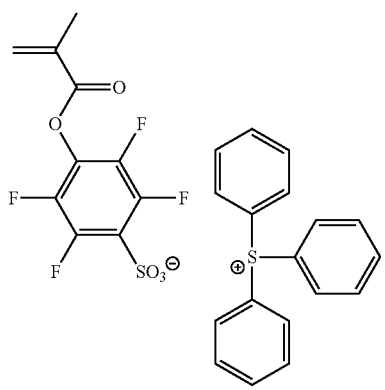

M-12
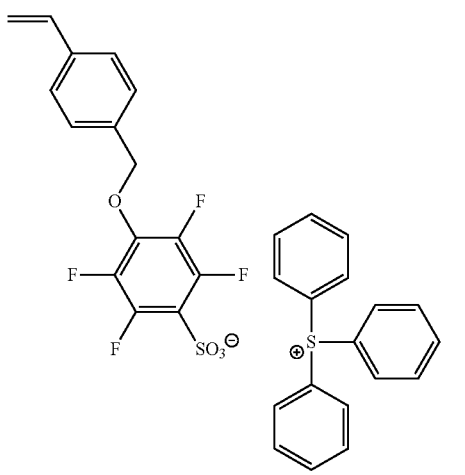

M-13
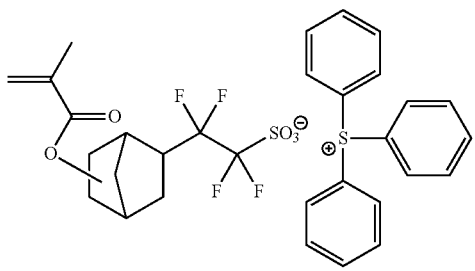

Synthesis Example 10

Synthesis of Resin (P-1)

4.66 parts by mass of 1-methoxy-2-propanol was heated at 80° C. under a nitrogen gas stream. While stirring this solution, a mixed solution of 2.98 parts by mass of 4-hydroxystyrene (hereinafter also referred to as "HOST"), 6.23 parts by mass of the monomer (M-1) obtained in the foregoing Synthesis Example 1, 0.79 part by mass of the monomer (M-5) obtained in the foregoing Synthesis Example 5, 18.6 parts by mass of 1-methoxy-2-propanol and 1.36 parts by mass of dimethyl 2,2'-azobisisobutyrate (V-601, manufactured by Wako Pure Chemical Industries, Ltd.) was added dropwise over 2 hours. After completion of the dropwise addition, the mixture was stirred at 80° C. for an additional 4 hours. After allowing the reaction mixture to stand for cooling, the resulting reaction mixture was reprecipitated with a large amount of hexane/ethyl acetate and dried in vacuo, thereby obtaining 5.9 parts by mass of a resin (P-1) of the invention.

As a result of measurement of the obtained resin by means of $^1$H-NMR, a peak which may be considered to be derived from an OH group of 4-hydroxystyrene in the vicinity of 9.0 ppm, a peak which may be considered to be derived from CH of an —O—CH(CH$_3$)—O— group of the monomer (M-1) in the vicinity of 5.3 ppm and a peak which may be considered to be derived from an aryl group of a triarylsulfonium cation of the monomer (M-5) in the vicinity of 7.8 ppm were observed as shown in FIG. 1, and it was confirmed that the resin (P-1) was a resin composed of the following structural units. Also, a composition ratio (molar ratio) of the resin was calculated from an area ratio of these peaks. Also, a weight average molecular weight (MW, as converted into polystyrene) was determined by means of GPC (carrier: N-methyl-2-pyrrolidone (NMP)). As a result, Mw was 15,100, and Mw/Mn (hereinafter also referred to as "MWD") was 1.72.

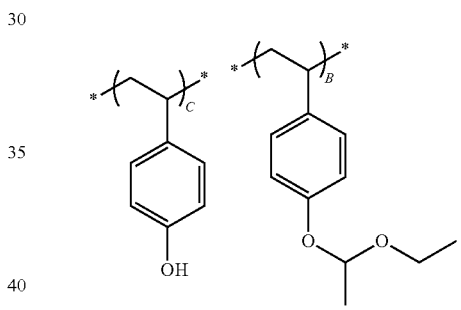

P-1
C/B/A = 41/54/5 mol %
Mw = 15100
Mw/Mn = 1.72

Synthesis Examples 11 to 21

Synthesis of Resins (P-2) to (P-13)

Resins (P-2) to (P-13) which are used in the invention were synthesized in the same manner as in Synthesis Example 10.

The following Table 1 shows used structural unit, its charge (part by mass), polymerization concentration (reaction mixture concentration: % by mass) and charge of polymerization initiator (part by mass) and composition ratio (molar ratio), weight average molecular weight, number average molecular weight and polydispersity (MWD) of produced resin.

TABLE 1

| | Charge composition (parts by mass) | | | | | V-601 | | Polymer composition (% by mole) | | | | | Molecular weight (NMP by GPC) | | |
|---|---|---|---|---|---|---|---|---|---|---|---|---|---|---|---|
| | Repeating unit C | | Repeating unit B | | Repeating unit A | Polymerization concentration | Parts by mass | Repeating unit C | | Repeating unit B | | Repeating unit A | | | |
| Resin | | | | | | | | | | | | | Mw | Mn | MWD |
| P-1 | HOST | 2.98 | M-1 | 6.23 | M-5 | 0.79 | 30 | 1.36 | HOST | 41 | M-1 | 54 | M-5 | 5 | 15100 | 8800 | 1.72 |
| P-2 | HOST | 2.89 | M-1 | 5.37 | M-5 | 1.75 | 30 | 1.28 | HOST | 41 | M-1 | 47 | M-5 | 12 | 20600 | 11600 | 1.78 |
| P-3 | HOST | 2.13 | M-1 | 6.19 | M-5 | 1.68 | 30 | 1.24 | HOST | 33 | M-1 | 54 | M-5 | 13 | 21100 | 12600 | 1.67 |
| P-4 | HOST | 4.28 | M-2 | 4.95 | M-5 | 0.77 | 30 | 1.32 | HOST | 61 | M-2 | 33 | M-5 | 6 | 15900 | 9200 | 1.73 |
| P-5 | HOST | 4.57 | M-3 | 4.67 | M-5 | 0.76 | 30 | 1.31 | HOST | 65 | M-3 | 29 | M-5 | 6 | 16100 | 9400 | 1.71 |
| P-6 | HOST | 3.54 | M-3 | 4.88 | M-5 | 1.59 | 30 | 1.17 | HOST | 57 | M-3 | 31 | M-5 | 12 | 23100 | 13300 | 1.74 |
| P-7 | HOST | 5.21 | M-4 | 3.05 | M-5 | 1.74 | 30 | 1.28 | HOST | 76 | M-4 | 12 | M-5 | 12 | 20800 | 11900 | 1.75 |
| P-8 | HOST | 2.57 | M-1 | 6.66 | M-5 | 0.77 | 20 | 3.99 | HOST | 36 | M-1 | 59 | M-5 | 5 | 3900 | 2300 | 1.70 |
| P-9 | HOST | 3.54 | M-3 | 4.88 | M-5 | 1.59 | 20 | 3.51 | HOST | 56 | M-3 | 32 | M-5 | 12 | 4800 | 2800 | 1.71 |
| P-10 | HOST | 2.80 | M-1 | 5.21 | M-6 | 1.99 | 30 | 1.25 | HOST | 41 | M-1 | 48 | M-6 | 11 | 22000 | 12400 | 1.77 |
| P-11 | HOST | 3.05 | M-1 | 6.12 | M-7 | 0.83 | 30 | 1.36 | HOST | 41 | M-1 | 54 | M-7 | 5 | 8900 | 5100 | 1.75 |
| P-12 | HOST | 3.17 | M-1 | 6.22 | M-8 | 0.62 | 30 | 1.38 | HOST | 42 | M-1 | 54 | M-8 | 4 | 14700 | 8500 | 1.73 |
| P-13 | HOST | 2.80 | M-1 | 6.88 | M-9 | 0.32 | 30 | 1.37 | HOST | 37 | M-1 | 60 | M-9 | 3 | 15300 | 8900 | 1.72 |

The structure, composition ratio, weight average molecular weight and polydispersity of each of the resins (P-1) to (P-13) and (P-19) to (P-23) of the invention are shown below.

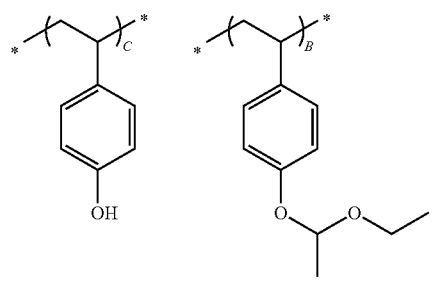

P-1
C/B/A = 41/54/5 mol %
Mw = 15100 (Mw/Mn = 1.72)
P-2
C/B/A = 41/47/12 mol %
Mw = 20600 (Mw/Mn = 1.78)
P-3
C/B/A = 33/54/13 mol %
Mw = 21100 (Mw/Mn = 1.67)
P-8
C/B/A = 36/59/5 mol %
Mw = 3900 (Mw/Mn = 1.70)

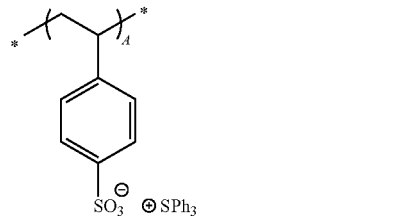

-continued

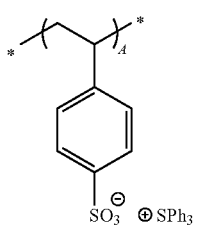

P-4
C/B/A = 61/33/6 mol %
Mw = 15900 (Mw/Mn = 1.73)

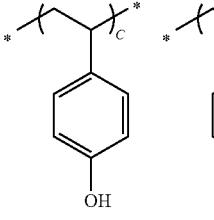

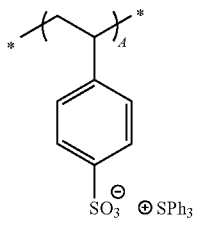

P-5
C/B/A = 65/29/6 mol %
Mw = 16100 (Mw/Mn = 1.71)
P-6
C/B/A = 57/31/12 mol %
Mw = 23100 (Mw/Mn = 1.74)
P-9
C/B/A = 56/32/12 mol %
Mw = 4800 (Mw/Mn = 1.71)

-continued
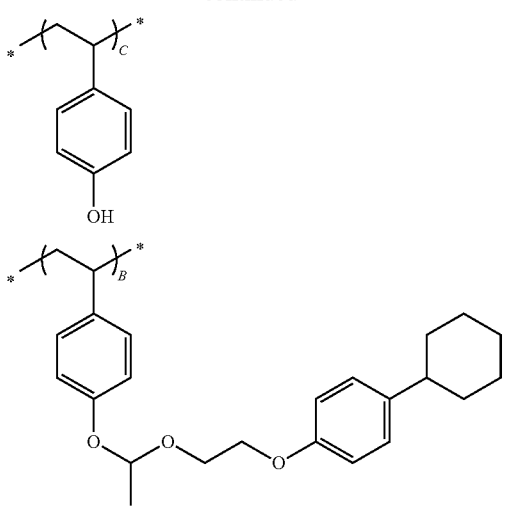
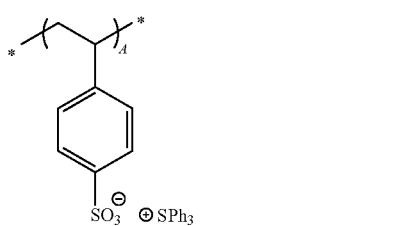
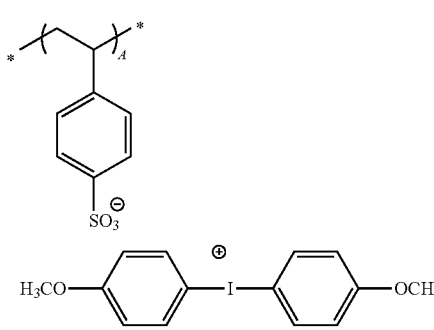
P-10
C/B/A = 41/48/11 mol %
Mw = 22000 (Mw/Mn = 1.77)
-continued
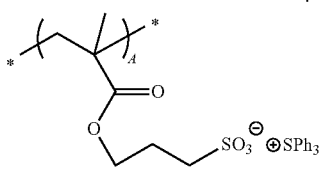
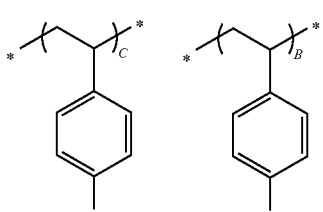
P-11
C/B/A = 41/54/5 mol %
Mw = 8900 (Mw/Mn = 1.75)
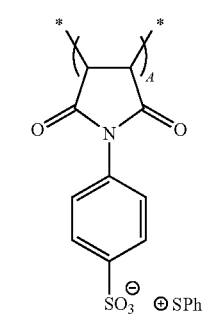
P-12
C/B/A = 42/54/4 mol %
Mw = 14700 (Mw/Mn = 1.73)
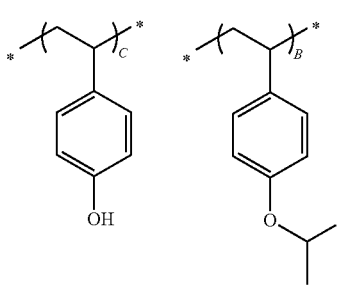

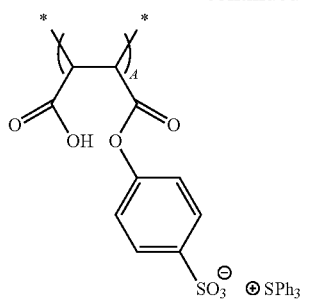
P-13
C/B/A = 37/60/3 mol %
Mw = 15300 (Mw/Mn = 1.72)
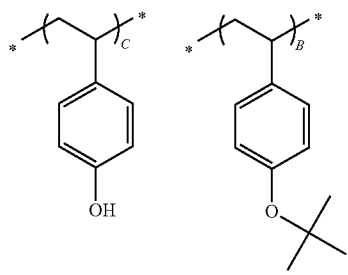
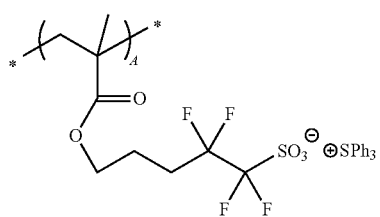
P-19
C/B/A = 65/32/3 mol %
Mw = 16500 (Mw/Mn = 1.70)
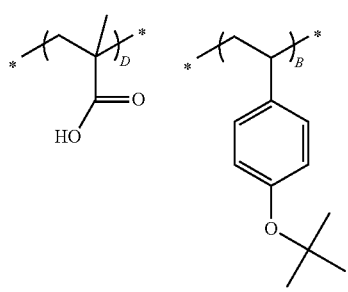
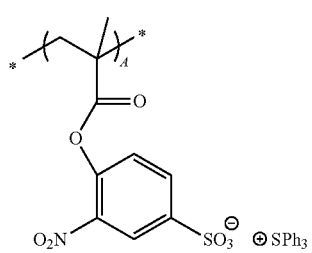
P-20
D/B/A = 10/86/4 mol %
Mw = 7200 (Mw/Mn = 1.68)
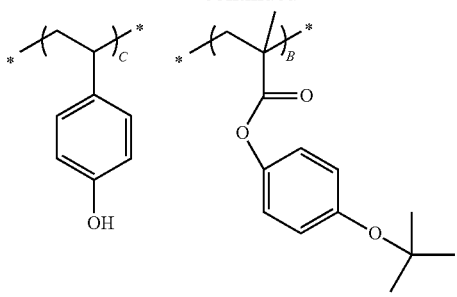
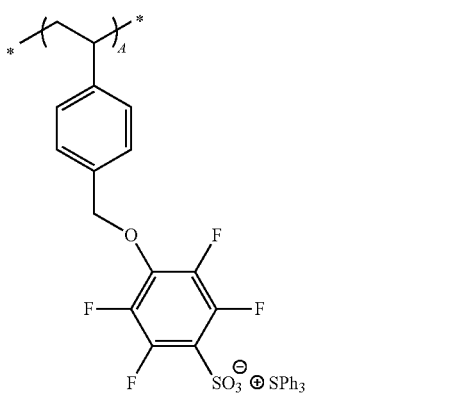
P-21
C/B/A = 60/35/5 mol %
Mw = 16300 (Mw/Mn = 1.73)
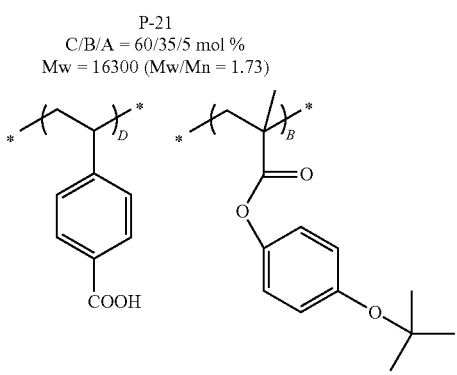
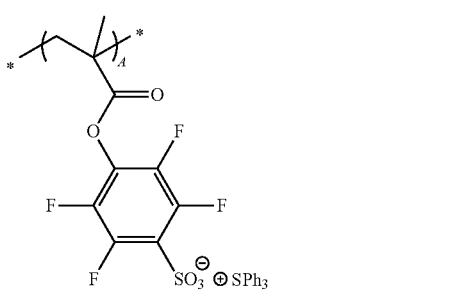
P-22
D/B/A = 10/85/5 mol %
Mw = 9500 (Mw/Mn = 1.71)
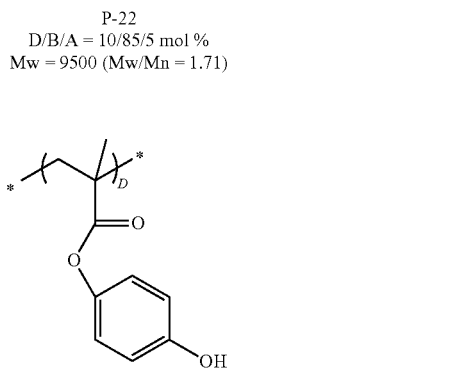

-continued

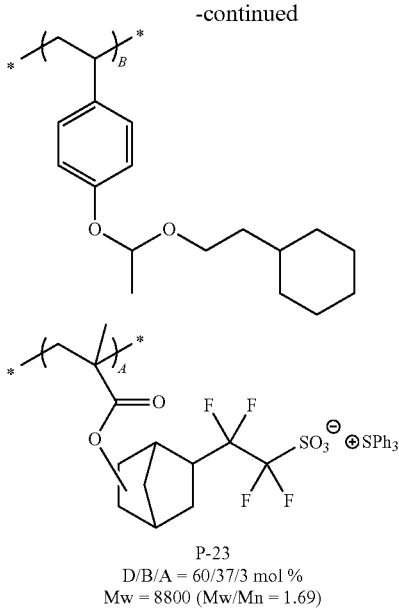

P-23
D/B/A = 60/37/3 mol %
Mw = 8800 (Mw/Mn = 1.69)

Examples 1 to 27 and Comparative Examples 1 to 5

<Resist Preparation>

Components shown in the following Table 2 were dissolved in a mixed solvent shown in Table 2, and the solution was filtered through a polytetrafluoroethylene filter having a pore size of 0.1 μm to prepare a positive working resist solution having a total solids concentration (% by mass) shown in Table 2, which was then evaluated in the following manners. A concentration (% by mass) of each of the components shown in Table 2 is on a basis of the total solids content.

<Resist Evaluation (EB)>

The prepared positive working resist solution was uniformly coated on a silicon substrate having been subjected to a treatment with hexamethyldisilazane using a spin coater and dried under heating on a hot plate at 120° C. for 90 seconds, thereby forming a resist film having a thickness of 100 nm.

This resist film was irradiated with an electron beam using an electron beam irradiation system (HL750, manufactured by Hitachi, Ltd., accelerating voltage: 50 keV). After the irradiation, the resulting resist film was immediately heated on a hot plate at 110° C. for 90 seconds. Furthermore, the film was developed with a tetramethylammonium hydroxide aqueous solution having a concentration of 2.38% by mass at 23° C. for 60 seconds, rinsed with pure water for 30 seconds and then dried, thereby forming a line-and-space pattern. The obtained pattern was evaluated by the following methods.

[Sensitivity]

A sectional shape of the obtained pattern was observed using a scanning electron microscope (S-9220, manufactured by Hitachi, Ltd.). Minimum exposure energy at the time of resolving a line pattern of 100 nm (line/space:1/1) was designated as the sensitivity.

[Resolution]

A limiting resolution (capable of separately resolving the line and space) in the irradiation amount for showing the foregoing sensitivity was designated as the resolution.

[Line Edge Roughness (LER)]

A distance from a standard line where an edge should be present was measured in arbitrary 30 points in an area of a length of 50 μm in the longitudinal direction of a line pattern of 100 nm in the irradiation amount for showing the foregoing sensitivity using a scanning electron microscope (S-9220, manufactured by Hitachi, Ltd.), from which was then determined a standard deviation, thereby calculating 3σ.

[Pattern Profile]

A sectional shape of a line pattern of 100 nm in the irradiation amount for showing the foregoing sensitivity was observed using a scanning electron microscope (S-4300, manufactured by Hitachi, Ltd.) and evaluated on three grades of "rectangular", "slightly taper" and "taper".

TABLE 2

| | Evaluation results in EB exposure | | | | | | | | |
|---|---|---|---|---|---|---|---|---|---|
| | Resin of the invention | Concentration | Other resin | Concentration | Conventional acid generator | Concentration | Basic compound | Concentration | Organic solvent (D) | Mass ratio |
| Ex. 1 | P-1 | 99.95 | Nil | | Nil | | Nil | | S1/S2 | 40/60 |
| Ex. 2 | P-2 | 99.95 | Nil | | Nil | | Nil | | S1/S2 | 40/60 |
| Ex. 3 | P-3 | 99.95 | Nil | | Nil | | Nil | | S1/S2 | 40/60 |
| Ex. 4 | P-4 | 99.95 | Nil | | Nil | | Nil | | S1/S2 | 40/60 |
| Ex. 5 | P-5 | 99.95 | Nil | | Nil | | Nil | | S1/S2 | 40/60 |
| Ex. 6 | P-6 | 99.95 | Nil | | Nil | | Nil | | S1/S2 | 40/60 |
| Ex. 7 | P-7 | 99.95 | Nil | | Nil | | Nil | | S1/S2 | 40/60 |
| Ex. 8 | P-8 | 99.95 | Nil | | Nil | | Nil | | S1/S2 | 40/60 |
| Ex. 9 | P-9 | 99.95 | Nil | | Nil | | Nil | | S1/S2 | 40/60 |
| Ex. 10 | P-10 | 99.95 | Nil | | Nil | | Nil | | S1/S2 | 40/60 |
| Ex. 11 | P-11 | 99.95 | Nil | | Nil | | Nil | | S1/S2 | 40/60 |
| Ex. 12 | P-12 | 99.95 | Nil | | Nil | | Nil | | S1/S2 | 40/60 |
| Ex. 13 | P-13 | 99.95 | Nil | | Nil | | Nil | | S1/S2 | 40/60 |
| Ex. 14 | P-2 | 84.95 | P-14 | 15 | Nil | | Nil | | S1/S2 | 40/60 |
| Ex. 15 | P-2 | 99.85 | Nil | | Nil | | TPI | 0.1 | S1/S2 | 40/60 |
| Ex. 16 | P-2 | 99.85 | Nil | | Nil | | TOA TBAH | 0.05 0.05 | S1/S2 | 40/60 |
| Ex. 17 | P-2 | 98.65 | Nil | | PAG-1 | 1 | TPI | 0.3 | S1/S2 | 40/60 |
| Ex. 18 | P-6 | 99.83 | Nil | | Nil | | TOA | 0.12 | S1/S2/S3 | 30/60/10 |
| Ex. 19 | P-6 | 69.95 | P-15 | 30 | Nil | | Nil | | S1/S2 | 40/60 |
| Ex. 20 | P-6 | 97.45 | Nil | | PAG-1 | 2 | TBAH | 0.5 | S1/S2 | 40/60 |
| Ex. 21 | P-6 | 49.85 | P-7 | 50 | Nil | | TOA | 0.1 | S1/S2 | 30/70 |
| Ex. 22 | P-8 | 29.85 | P-9 | 70 | Nil | | TOA | 0.1 | S1/S2/S3 | 30/60/10 |
| Ex. 23 | P-19 | 99.95 | Nil | | Nil | | Nil | | S1/S2 | 40/60 |

TABLE 2-continued

Evaluation results in EB exposure

| | | | | | | | | | | | |
|---|---|---|---|---|---|---|---|---|---|---|---|
| Ex. 24 | P-20 | 99.95 | Nil | | Nil | | Nil | | S1/S2 | 40/60 |
| Ex. 25 | P-21 | 99.95 | Nil | | Nil | | Nil | | S1/S2 | 40/60 |
| Ex. 26 | P-22 | 99.95 | Nil | | Nil | | Nil | | S1/S2 | 40/60 |
| Ex. 27 | P-23 | 99.95 | Nil | | Nil | | Nil | | S1/S2 | 40/60 |
| C. Ex. 1 | Nil | | P-14 | 91.95 | PAG-1 | 8 | Nil | | S1/S2 | 40/60 |
| C. Ex. 2 | Nil | | P-14 | 90.95 | PAG-1 | 8 | TPI | 1 | S1/S2 | 40/60 |
| C. Ex. 3 | Nil | | P-14 | 50 | Nil | | Nil | | S1/S2 | 40/60 |
| | | | P-16 | 49.95 | | | | | | |
| C. Ex. 4 | Nil | | P-17 | 99.95 | Nil | | Nil | | S1/S2 | 40/60 |
| C. Ex. 5 | Nil | | P-18 | 99.95 | Nil | | Nil | | S1/S2 | 40/60 |

| | Surfactant | Concentration | Total solids concentration | Sensitivity ($\mu C/cm^2$) | Resolution (nm) | Pattern profile | LER (nm) |
|---|---|---|---|---|---|---|---|
| Ex. 1 | W-1 | 0.05 | 4.0 | 25.0 | 65 | Rectangular | 4.8 |
| Ex. 2 | W-1 | 0.05 | 4.0 | 22.1 | 60 | Rectangular | 4.3 |
| Ex. 3 | W-2 | 0.05 | 4.0 | 24.5 | 60 | Rectangular | 4.2 |
| Ex. 4 | W-3 | 0.05 | 4.0 | 20.8 | 65 | Rectangular | 5.0 |
| Ex. 5 | W-1 | 0.05 | 4.0 | 19.5 | 60 | Rectangular | 4.0 |
| Ex. 6 | W-1 | 0.05 | 4.0 | 17.3 | 55 | Rectangular | 4.1 |
| Ex. 7 | W-1 | 0.05 | 4.0 | 20.1 | 60 | Rectangular | 4.6 |
| Ex. 8 | W-1 | 0.05 | 4.0 | 24.6 | 55 | Rectangular | 3.9 |
| Ex. 9 | W-1 | 0.05 | 4.0 | 17.0 | 55 | Rectangular | 3.7 |
| Ex. 10 | W-1 | 0.05 | 4.0 | 18.2 | 65 | Rectangular | 4.7 |
| Ex. 11 | W-1 | 0.05 | 4.0 | 23.2 | 65 | Rectangular | 4.8 |
| Ex. 12 | W-2 | 0.05 | 4.0 | 24.7 | 70 | Rectangular | 5.0 |
| Ex. 13 | W-3 | 0.05 | 4.0 | 24.4 | 70 | Rectangular | 5.1 |
| Ex. 14 | W-1 | 0.05 | 4.0 | 24.9 | 70 | Rectangular | 5.6 |
| Ex. 15 | W-3 | 0.05 | 4.0 | 26.8 | 55 | Rectangular | 3.8 |
| Ex. 16 | W-1 | 0.05 | 4.0 | 26.4 | 55 | Rectangular | 3.8 |
| Ex. 17 | W-2 | 0.05 | 4.0 | 29.7 | 65 | Rectangular | 5.3 |
| Ex. 18 | W-3 | 0.05 | 4.0 | 25.9 | 55 | Rectangular | 3.9 |
| Ex. 19 | W-1 | 0.05 | 4.0 | 18.0 | 65 | Rectangular | 5.1 |
| Ex. 20 | W-1 | 0.05 | 4.0 | 19.7 | 55 | Rectangular | 4.2 |
| Ex. 21 | W-2 | 0.05 | 4.0 | 26.6 | 55 | Rectangular | 4.0 |
| Ex. 22 | W-3 | 0.05 | 4.0 | 25.9 | 55 | Rectangular | 3.6 |
| Ex. 23 | W-2 | 0.05 | 4.0 | 23.1 | 65 | Rectangular | 5.3 |
| Ex. 24 | W-3 | 0.05 | 4.0 | 24.9 | 65 | Rectangular | 5.6 |
| Ex. 25 | W-1 | 0.05 | 4.0 | 25.0 | 70 | Rectangular | 5.8 |
| Ex. 26 | W-2 | 0.05 | 4.0 | 25.1 | 70 | Rectangular | 5.9 |
| Ex. 27 | W-2 | 0.05 | 4.0 | 22.7 | 65 | Rectangular | 5.2 |
| C. Ex. 1 | W-1 | 0.05 | 4.0 | A 100-nm L/S pattern could not be formed. | | | |
| C. Ex. 2 | W-1 | 0.05 | 4.0 | 32.8 | 90 | Taper | 12.6 |
| C. Ex. 3 | W-1 | 0.05 | 4.0 | 27.6 | 85 | Taper | 10.2 |
| C. Ex. 4 | W-1 | 0.05 | 4.0 | A 100-nm L/S pattern could not be formed. | | | |
| C. Ex. 5 | W-1 | 0.05 | 4.0 | 25.0 | 75 | Taper | 6.8 |

The concentration of each of the components expresses a concentration (% by mass) in the total solids concentration.

The resins P-7 and P-9 in the "Other resin" column in Table 2 are a resin of the invention.

Structures of the raw materials (and other resins, conventional acid generator and basic compounds) used in the Examples and Comparative Examples are shown below.

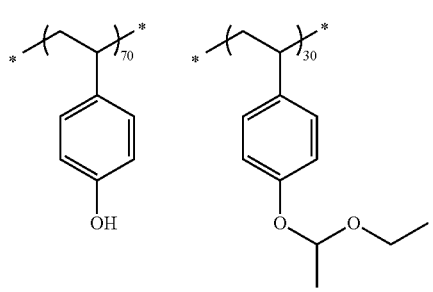

P-14
Mw = 19000 (Mw/Mn = 1.14)

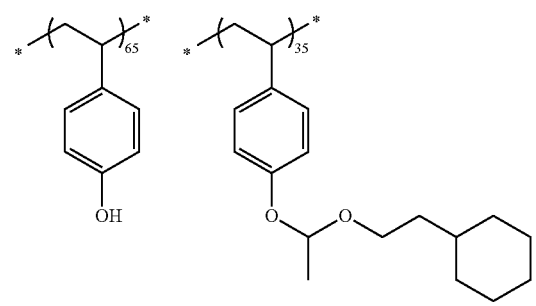

P-15
Mw = 20000 (Mw/Mn = 1.15)

-continued

-continued

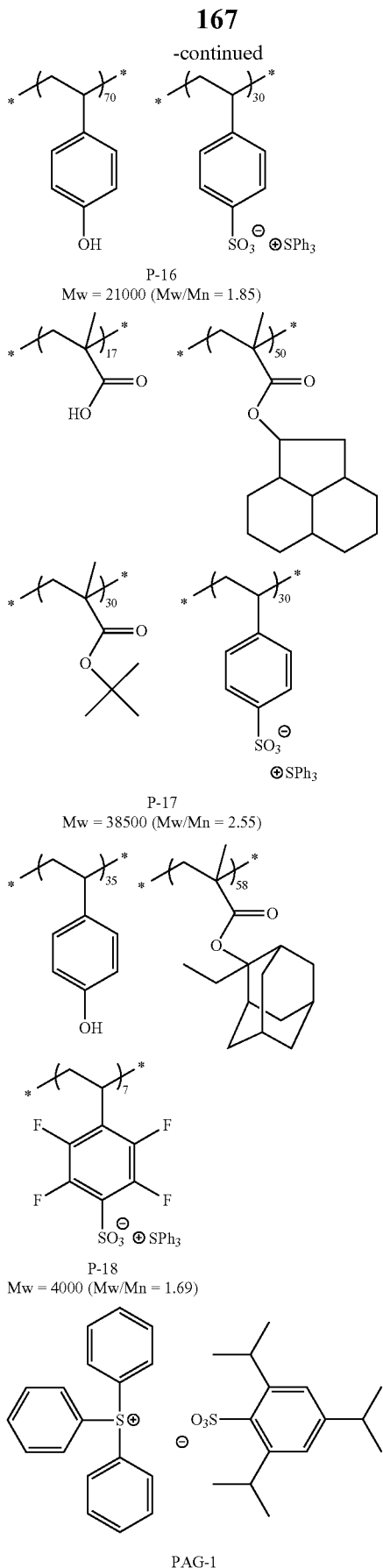

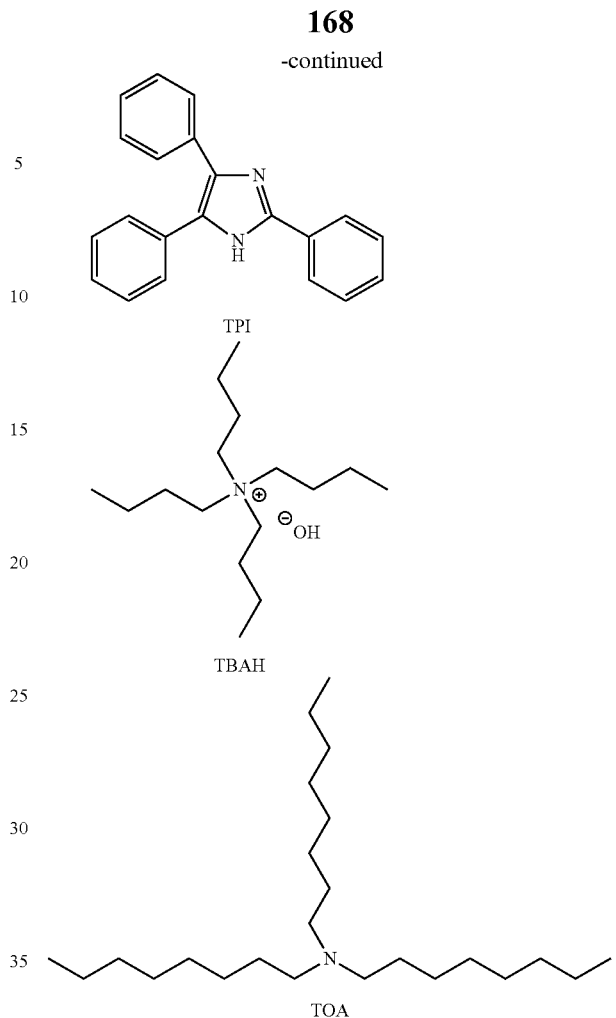

The surfactants and solvents used in the Examples and Comparative Examples are shown below.

W-1: MEGAFAC F176 (manufactured by DIC Corporation, fluorine \ based surfactant)

W-2: MEGAFAC R08 (manufactured by DIC Corporation, fluorine and silicon based surfactant)

W-3: Polysiloxane polymer (manufactured by Shin-Etsu Chemical co., Ltd., silicon based surfactant)

S1: Propylene glycol monomethyl ether acetate (PGMEA)
S2: Propylene glycol monoethyl ether (PGME)
S3: Ethyl lactate In Comparative Examples 1 and 4, a 100-nm line-and-space pattern (L/S:1/1) could not be formed.

It is evident from Table 2 that the positive working resist compositions of the invention are satisfied with high sensitivity, high resolution, good pattern profile and good line edge roughness at the same time.

Examples 28 to 30

<Resist Evaluation (EUV Beam)>

Components shown in the following Table 3 were dissolved in a mixed solvent shown in Table 3, and the solution was filtered through a polytetrafluoroethylene filter having a pore size of 0.1 μm to prepare a positive working resist solution having a total solids concentration (% by mass) shown in Table 3, which was then evaluated in the following manners. A concentration (% by mass) of each of the components shown in Table 3 is on a basis of the total solids content. Symbols of the compounds shown in Table 3 are the same as those in Table 2.

The prepared positive working resist solution was uniformly coated on a silicon substrate having been subjected to a treatment with hexamethyldisilazane using a spin coater and dried under heating on a hot plate at 120° C. for 90 seconds, thereby forming a resist film having a thickness of 100 nm.

The resist film was irradiated using an EUV exposure system (manufactured by Litho Tech Japan Corporation, wavelength: 13 nm). After the irradiation, the resulting resist film was immediately heated on a hot plate at 110° C. for 90 seconds. Furthermore, the film was developed with a tetramethylammonium hydroxide aqueous solution having a concentration of 2.38% by mass at 23° C. for 60 seconds, rinsed with pure water for 30 seconds and then dried, thereby forming a line-and-space pattern (line/space:1/1). The obtained pattern was evaluated by the following methods.

[Sensitivity]

A sectional shape of the obtained pattern was observed using a scanning electron microscope (S-9220, manufactured by Hitachi, Ltd.). Minimum exposure energy at the time of resolving a line pattern of 100 nm (line/space:1/1) was designated as the sensitivity.

[Pattern Profile]

A sectional shape of a line pattern of 100 nm in the irradiation amount for showing the foregoing sensitivity was observed using a scanning electron microscope (S-4300, manufactured by Hitachi, Ltd.) and evaluated on three grades of "rectangular", "slightly taper" and "taper".

TABLE 3

Evaluation results in EUV exposure

| | Resin of the invention | Concentration | Other resin | Concentration | Conventional acid generator | Concentration | Basic compound | Concentration |
|---|---|---|---|---|---|---|---|---|
| Ex. 28 | P-2 | 99.95 | Nil | | Nil | | Nil | |
| Ex. 29 | P-6 | 99.95 | Nil | | Nil | | Nil | |
| Ex. 30 | P-9 | 99.95 | Nil | | Nil | | Nil | |

| | Organic solvent (D) | Mass ratio | Surfactant | Concentration | Total solids concentration | Sensitivity (mJ/cm$^2$) | Pattern profile |
|---|---|---|---|---|---|---|---|
| Ex. 28 | S1/S2 | 40/60 | W-1 | 0.05 | 4.0 | 26.8 | Rectangular |
| Ex. 29 | S1/S2 | 40/60 | W-1 | 0.05 | 4.0 | 25.2 | Rectangular |
| Ex. 30 | S1/S2 | 40/60 | W-2 | 0.05 | 4.0 | 26.3 | Rectangular |

It is evident from Table 3 that the positive resist compositions of the invention are also satisfied with high sensitivity and good pattern profile at the same time in the EUV beam.

Industrial Applicability

According to the invention, it is possible to provide a positive working resist composition capable of satisfying high sensitivity, high resolution, good pattern profile and good line edge roughness at the same time in an ultra fine region, in particular in electron beam, X-ray or EUV beam lithography, a pattern-forming method using the composition and a resin which is suitable for the composition.

The entire disclosure of each and every foreign patent application from which the benefit of foreign priority has been claimed in the present application is incorporated herein by reference, as if fully set forth.

The invention claimed is:

1. A resin comprising:
   at least one repeating unit (A) selected from repeating units represented by any one of the following general formulae (III) to (V);
   a repeating unit (B) represented by the following general formula (I); and
   a repeating unit (C) represented by the following general formula (VI):

$$*-(CH_2-\underset{\underset{\underset{A}{|}}{\underset{X_1}{|}}}{\overset{\overset{R_{04}}{|}}{C}})-* \quad (III)$$

$$*-(\underset{\underset{R_{06}}{|}}{\overset{\overset{R_{05}}{|}}{C}}-\underset{\underset{A}{|}}{\underset{\underset{X_2}{|}}{\overset{\overset{R_{07}}{|}}{C}}})-* \quad (IV)$$

-continued $$*-(\overset{\overset{R_{08}}{|}}{C}-\overset{\overset{R_{09}}{|}}{C})-* \quad (V)$$
(with carbonyl groups bonded to N-X₃-A)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—OR$_{25}$ or —CO—N(R$_{26}$)(R$_{27}$), and R$_{26}$ and R$_{27}$ may be bonded to each other to form a ring together with a nitrogen atom;

each of $X_1$ to $X_3$ independently represents a single bond, an arylene group, an alkylene group, a cycloalkylene group, —O—, —SO$_2$—, —CO—, —N(R$_{33}$)— or a divalent linking group composed of a combination thereof;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents an ionic structural site capable of decomposing upon irradiation with an actinic ray or radiation to generate an acid in a side chain of the resin, wherein the repeating unit represented by the formula (III) is a repeating unit represented by the following general formula (III-1) or (III-4):

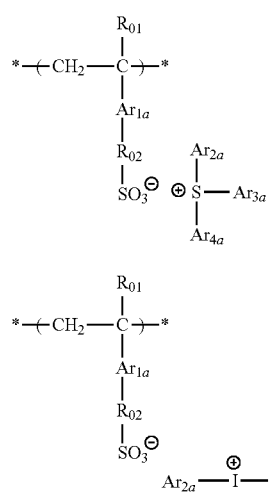

wherein in formulas (III-1) and (III-4)
$Ar_{1a}$ represents an arylene group,
$R_{0l}$ represents a hydrogen atom, a methyl group, a chloromethyl group, a trifluoromethyl group or a cyano group,
$R_{02}$ represents an alkylene group, a cycloalkylene group, —O—, —SO$_2$—, —CO—, —N(R$_{33}$)— or a divalent linking group composed of a combination thereof,
$R_{33}$ independently represents a hydrogen atom, an alkyl group, a cycloalkyl group, an alkenyl group, an aryl group or an aralkyl group, and each of $Ar_{2a}$ to $Ar_{4a}$ represents an aryl group;

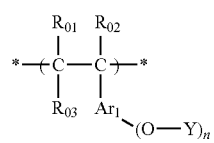

wherein in formula (I) each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group;

each of n Ys independently represents a hydrogen atom or a group capable of leaving by the action of an acid, provided that at least one of Ys represents a group capable of leaving by the action of an acid; and n represents an integer of from 1 to 4, wherein Y in the general formula (I) is represented by the following general formula (II):

wherein each of $L_1$ and $L_2$ independently represents a hydrogen atom, an alkyl group, a cycloalkyl group, an aryl group or an aralkyl group;

M represents a divalent linking group obtained by combining an alkylene group with —O—;

Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;

the group represented by -M-Q is a group constituted of from 5 to 20 carbon atoms; and at least two of Q, M and $L_1$ may be bonded to each other to form a 5-membered ring or a 6-membered ring, and further provided that the repeating unit represented by the general formula (I) is selected from the group consisting of the following repeating units:

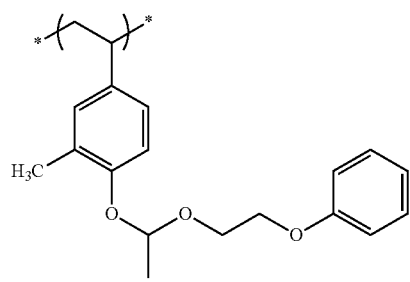

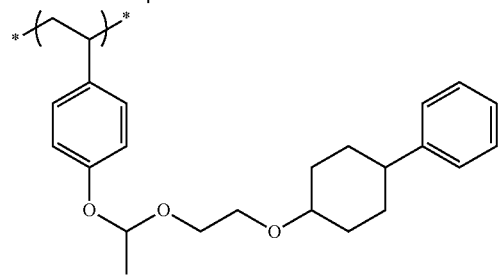

-continued

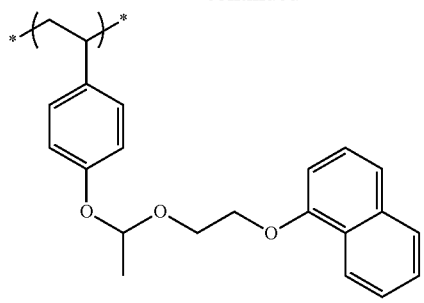

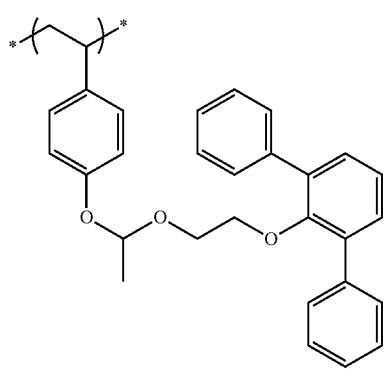

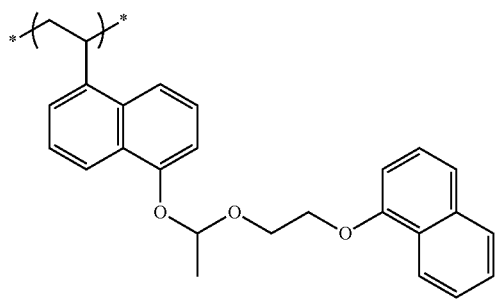

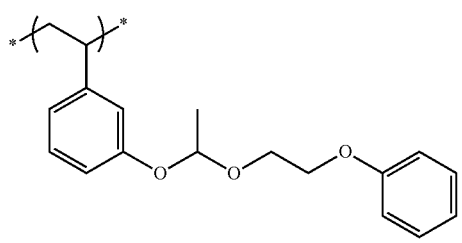

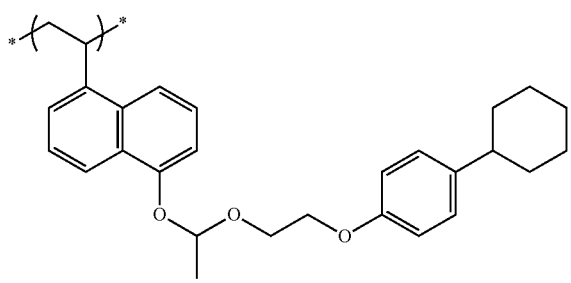

-continued

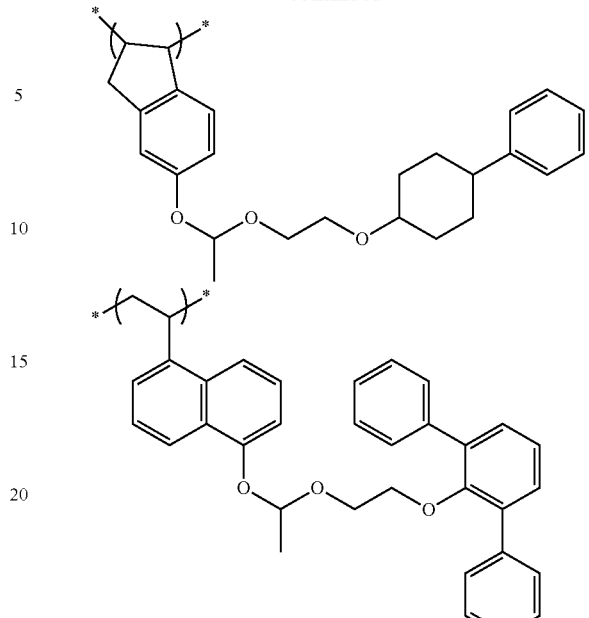

and

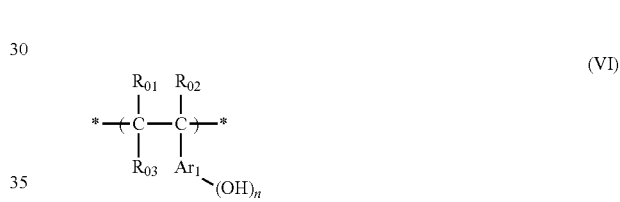

(VI)

wherein in formula (VI)
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group; and
n represents an integer of from 1 to 4;
wherein a content of a group capable of decomposing by the action of an acid is expressed by a number (B) of a repeating unit having a group capable of decomposing by the action of an acid in the resin and a number (S) of a repeating unit having an alkali-soluble group which is not protected by a group capable of leaving by the action of an acid (B/(B+S)), and the content is from 0.05 to 0.40.

2. The resin according to claim 1, wherein
A in the general formulae (III) to (V) is a structural site containing a sulfonium salt or an iodonium salt.

3. The resin according to claim 1, wherein:
the repeating unit (A) is a repeating unit represented by general formula (III-1) or (III-4).

4. The resin according to claim 1, wherein the resin contains a repeating unit represented by formula (III-1) or a repeating unit represented by formula (III-4), and at least one of $Ar_2a$ to $Ar_4a$ in formula (III-1) is an aryl group having an alkoxy group as a substituent, or at least one of $Ar_2a$ and $Ar_3a$ in formula (III-4) is an aryl group having an alkoxy group as a substituent.

5. The resin according to claim 1, wherein the repeating unit represented by the general formula (I) is selected from the group consisting of the following repeating units:

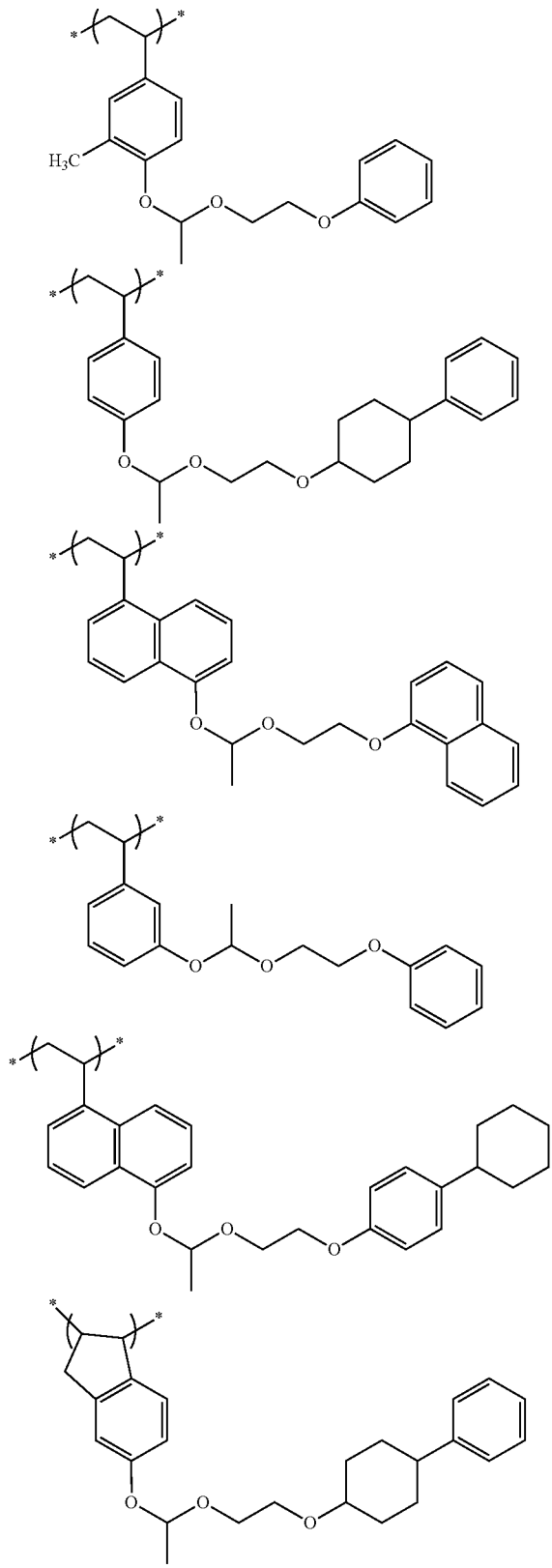

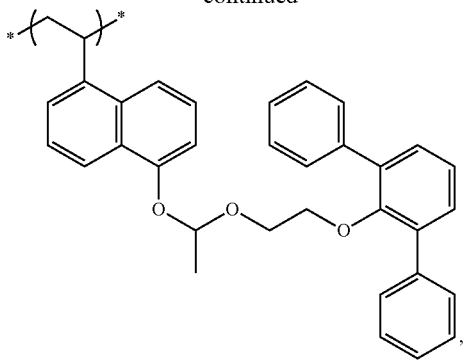

6. A radiation-sensitive composition comprising:
a resin (P) having
  a repeating unit (A) having an ionic structural site and capable of decomposing upon irradiation with an actinic ray or radiation to generate an acid; and
  a repeating unit (B) having at least one phenolic hydroxyl group, a part or all of hydrogen atoms of the hydroxyl group or groups each being protected by a group capable of leaving by the action of an acid,
wherein
the ionic structural site of the repeating unit (A) contained in the resin (P) is a structure capable of generating an acid in a side chain of the resin upon irradiation with an actinic ray or radiation;
the repeating unit (A) is a repeating unit represented by general formula (III-1) or (III-4):

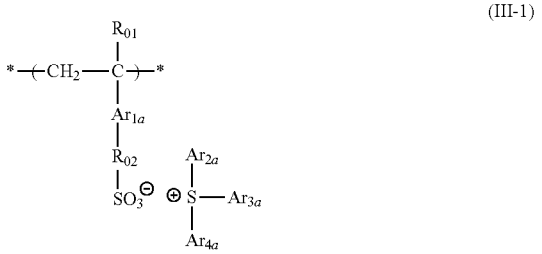

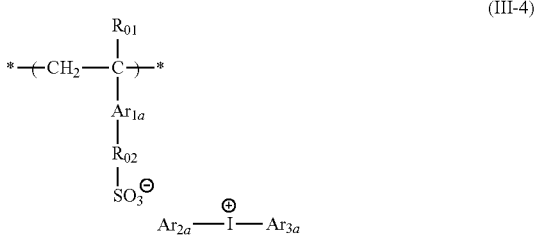

wherein in formulas (III-1) and (III-4)
$Ar_{1a}$ represents an arylene group,
$R_{01}$ represents a hydrogen atom, a methyl group, a chloromethyl group, a trifluoromethyl group or a cyano group,
$R_{02}$ represents an alkylene group, a cycloalkylene group, —O—, —SO$_2$—, —CO—, —N(R$_{33}$)— or a divalent linking group composed of a combination thereof,
$R_{33}$ independently represents a hydrogen atom, an alkyl group, a cycloalkyl group, an alkenyl group, an aryl group or an aralkyl group, and
each of $Ar_{2a}$ to $Ar_{4a}$ represents an aryl group; and the repeating unit (B) is a repeating unit represented by the following general formula (I):

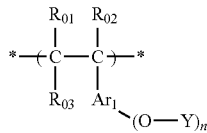
(I)

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group;
each of n Ys independently represents a hydrogen atom or a group capable of leaving by the action of an acid, provided that at least one of Ys represents a group capable of leaving by the action of an acid; and
n represents an integer of from 1 to 4;
wherein
Y in the general formula (I) is represented by the following general formula (II):

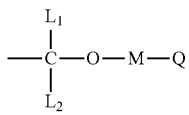
(II)

wherein
each of $L_1$ and $L_2$ independently represents a hydrogen atom, an alkyl group, a cycloalkyl group, an aryl group or an aralkyl group;
M represents a divalent linking group obtained by combining an alkylene group with —O—;
Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;
the group represented by -M-Q is a group constituted of from 5 to 20 carbon atoms; and
at least two of Q, M and $L_1$ may be bonded to each other to form a 5-membered ring or a 6-membered ring;
and further provided that the repeating unit represented by the general formula (I) is selected from the group consisting of the following repeating units:

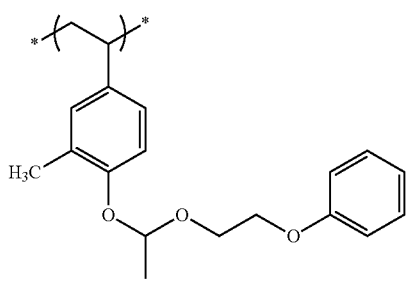

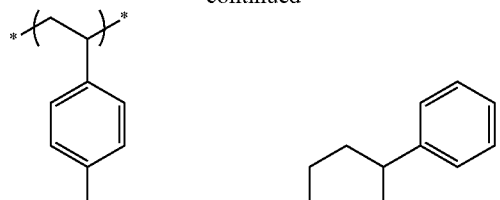

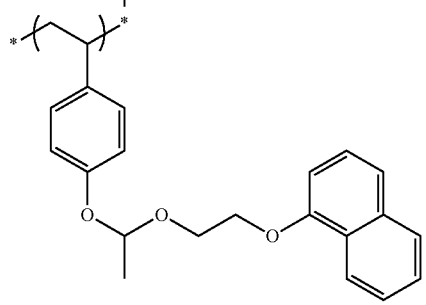

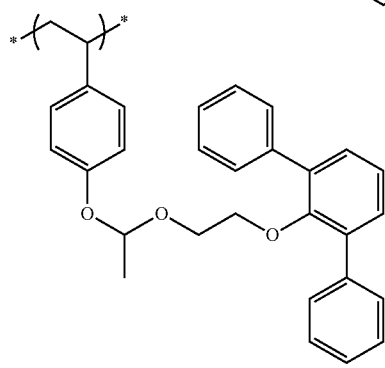

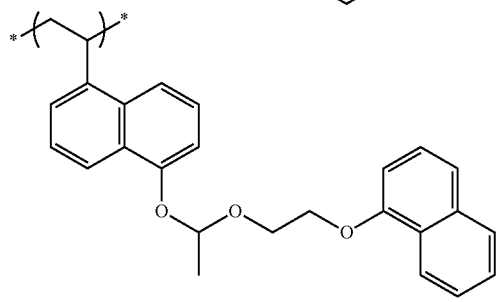

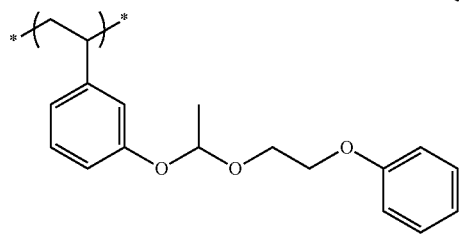

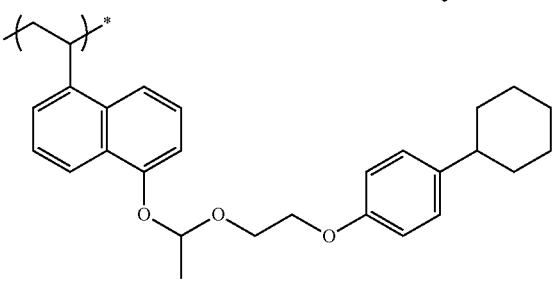

-continued

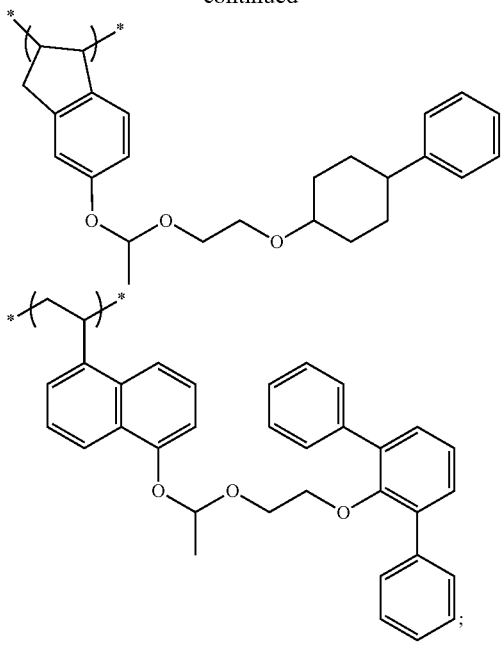

wherein a content of a group capable of decomposing by the action of an acid is expressed by a number (B) of a repeating unit having a group capable of decomposing by the action of an acid in the resin and a number (S) of a repeating unit having an alkali-soluble group which is not protected by a group capable of leaving by the action of an acid (B/(B +S)), and the content is from 0.05 to 0.40.

7. The radiation-sensitive composition according to claim 6, wherein
the resin (P) further has a repeating unit (C) represented by the following general formula (VI):

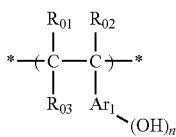
(VI)

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group; and
n represents an integer of from 1 to 4.

8. The radiation-sensitive composition according to claim 7, wherein
the resin (P) has from 0.5 to 80% by mole of the repeating unit (A), from 3 to 90% by mole of the repeating unit (B) and from 3 to 90% by mole of the repeating unit (C).

9. The radiation-sensitive composition according to claim 6, wherein
the resin (P) has a weight average molecular weight in a range of from 1,000 to 100,000.

10. The radiation-sensitive composition according to claim 6, further comprising a basic compound.

11. The radiation-sensitive composition according to claim 6, wherein
an electron beam, an X-ray or an EUV beam is used as an exposure light source.

12. A pattern-forming method comprising steps of forming a resist film using the radiation-sensitive composition according to claim 6, exposing and developing.

13. The radiation-sensitive composition according to claim 6, wherein at least one of $Ar_2a$ to $Ar_4a$ in formula (III-1) is an aryl group having an alkoxy group as a substituent, or at least one of $Ar_2a$ and $Ar_3a$ in formula (III-4) is an aryl group having an alkoxy group as a substituent.

14. The radiation-sensitive composition according to claim 6, wherein the repeating unit represented by the general formula (I) is selected from the group consisting of the following repeating units:

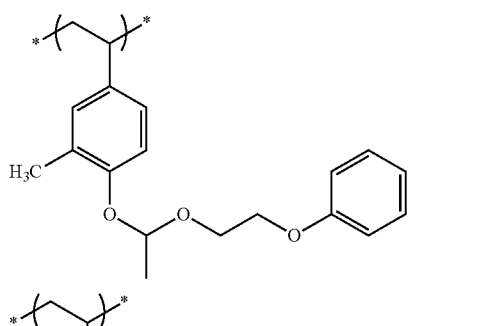

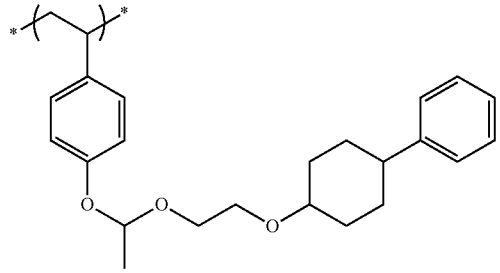

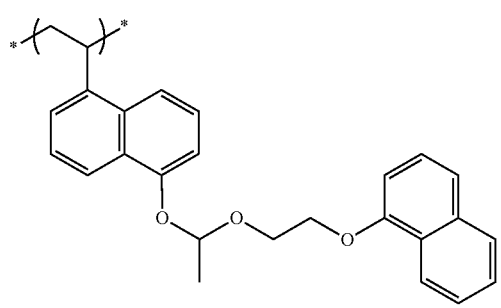

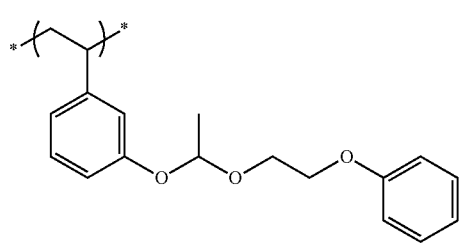

181
-continued

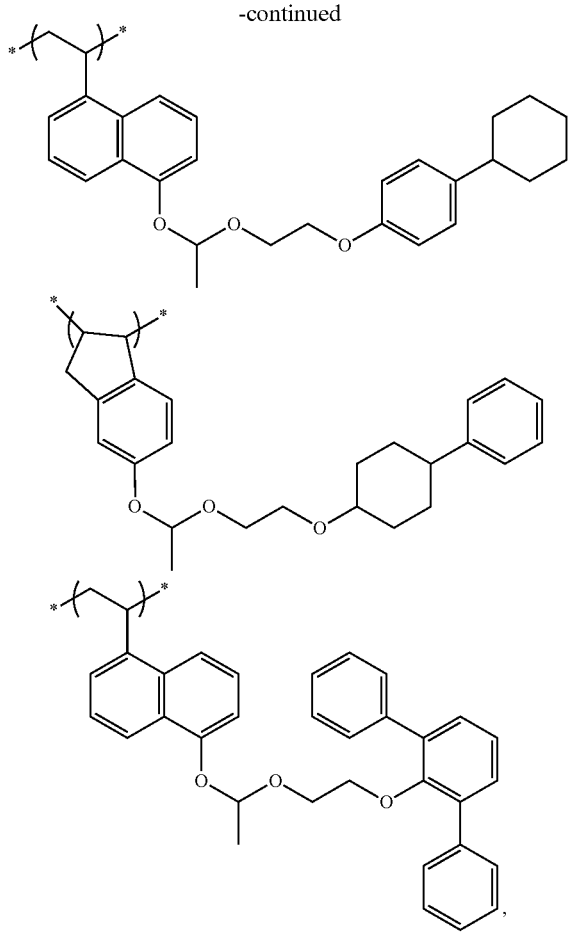

15. A radiation-sensitive composition comprising:
a resin (P) having
   a repeating unit (A) having an ionic structural site and capable of decomposing upon irradiation with an actinic ray or radiation to generate an acid; and
   a repeating unit (B) having at least one phenolic hydroxyl group, a part or all of hydrogen atoms of the hydroxyl group or groups each being protected by a group capable of leaving by the action of an acid,
wherein
the ionic structural site of the repeating unit (A) contained in the resin (P) is a structure capable of generating an acid in a side chain of the resin upon irradiation with an actinic ray or radiation;
the repeating unit (A) is a repeating unit represented by general formula (III-1) or (III-4):

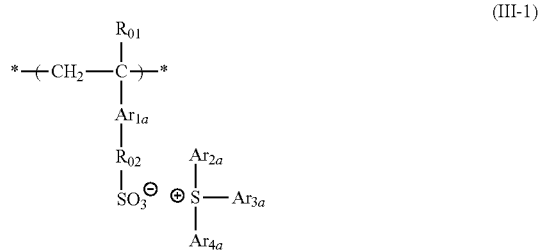

(III-1)

182
-continued

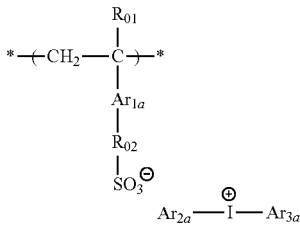

(III-4)

wherein in formulas (III-1) and (III-4)
$Ar_{1a}$ represents an arylene group,
$R_{01}$ represents a hydrogen atom, a methyl group, a chloromethyl group, a trifluoromethyl group or a cyano group,
$R_{02}$ represents an arylene group, an alkylene group, a cycloalkylene group, —O—, —$SO_2$—, —CO—, —N($R_{33}$)— or a divalent linking group composed of a combination thereof,
$R_{33}$ independently represents a hydrogen atom, an alkyl group, a cycloalkyl group, an alkenyl group, an aryl group or an aralkyl group, and each of $Ar_{2a}$ to $Ar_{4a}$ represents an aryl group;
the repeating unit (B) is a repeating unit represented by the following general formula (I):

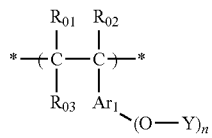

(I)

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group;
each of n Ys independently represents a hydrogen atom or a group capable of leaving by the action of an acid, provided that at least one of Ys represents a group capable of leaving by the action of an acid; and
n represents an integer of from 1 to 4;
wherein
Y in the general formula (I) is represented by the following general formula (II):

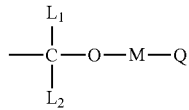

(II)

wherein
each of $L_1$ and $L_2$ independently represents a hydrogen atom, an alkyl group, a cycloalkyl group, an aryl group or an aralkyl group;
M represents a divalent linking group obtained by combining an alkylene group with —O—;

Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;

the group represented by -M-Q is a group constituted of from 5 to 20 carbon atoms; and at least two of Q, M and $L_1$ may be bonded to each other to form a 5-membered ring or a 6-membered ring;

further provided that the repeating unit represented by the general formula (I) is selected from the group consisting of the following repeating units:

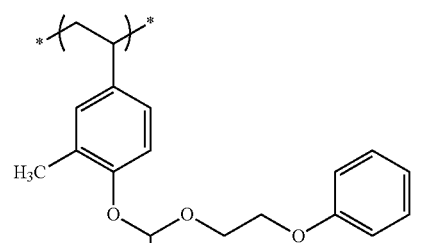

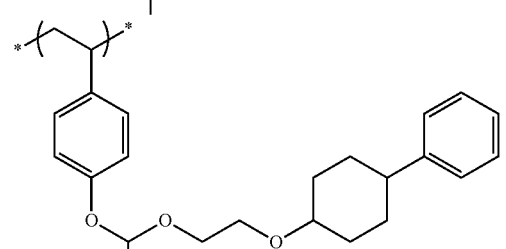

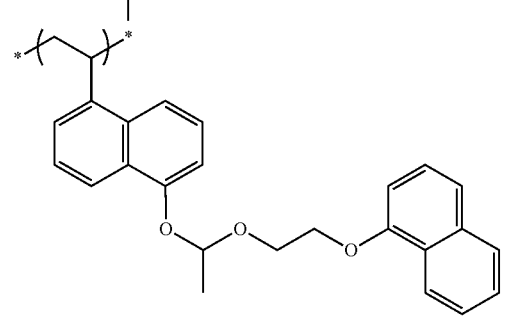

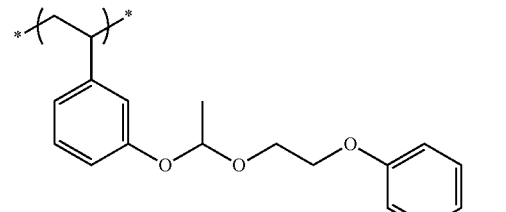

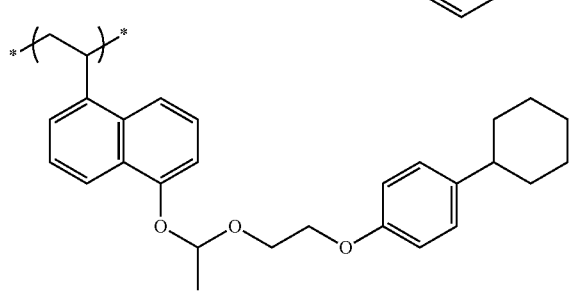

-continued

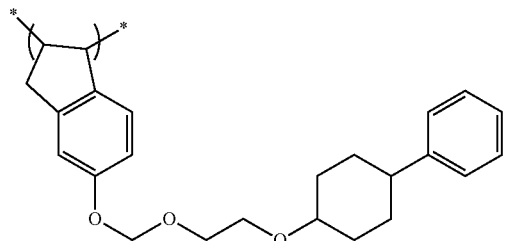

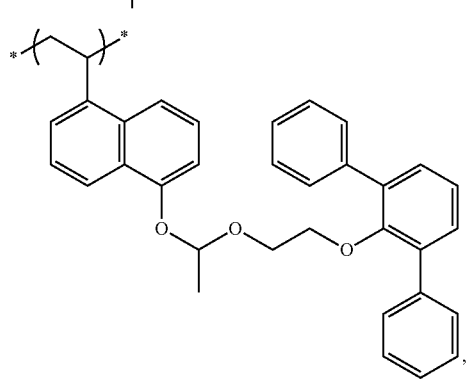

and the repeating unit represented by general formula (III-1) is selected from the group consisting of the following repeating units:

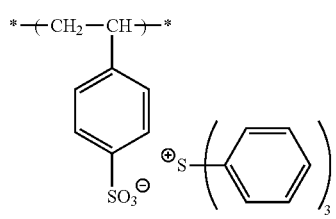

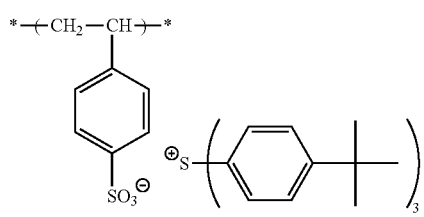

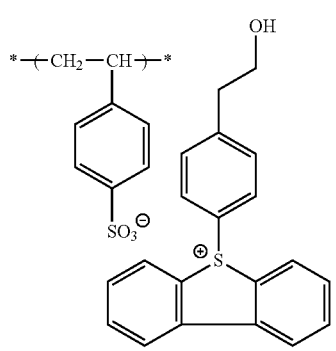

-continued

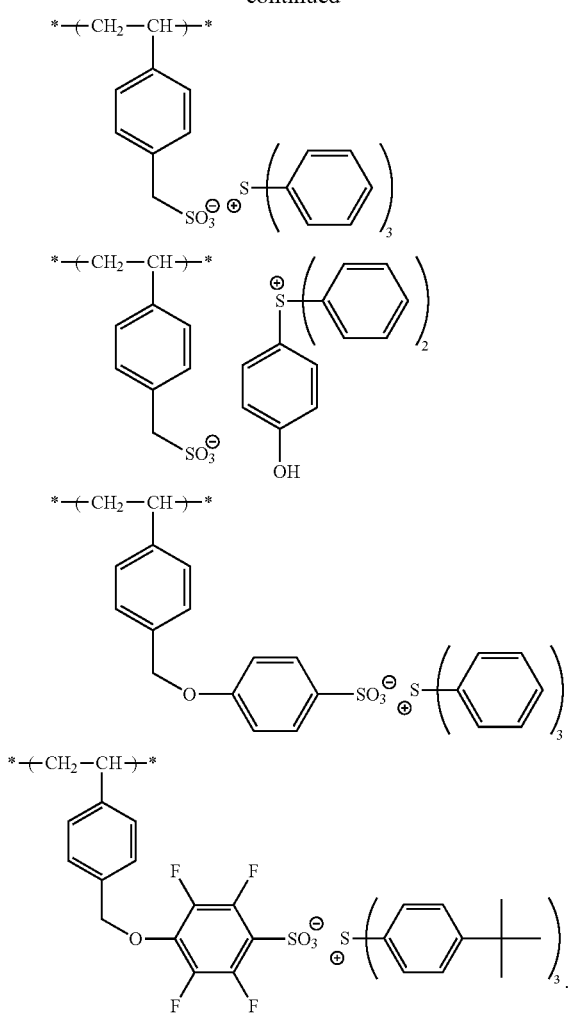

16. A resin comprising:

at least one repeating unit (A) selected from repeating units represented by any one of the following general formulae (III) to (V);

a repeating unit (B) represented by the following general formula (I); and a repeating unit (C) represented by the following general formula (VI):

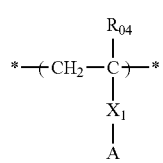
(III)

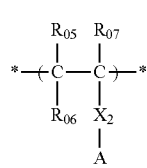
(IV)

-continued

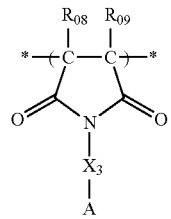
(V)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, and $R_{26}$ and $R_{27}$ may be bonded to each other to form a ring together with a nitrogen atom;

each of $X_1$ to $X_3$ independently represents a single bond, an arylene group, an alkylene group, a cycloalkylene group, —O—, —$SO_2$—, —CO—, —$N(R_{33})$— or a divalent linking group composed of a combination thereof;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents an ionic structural site capable of decomposing upon irradiation with an actinic ray or radiation to generate an acid in a side chain of the resin, wherein the repeating unit represented by the formula (III) is a repeating unit represented by the following general formula (III-1) or (III-4):

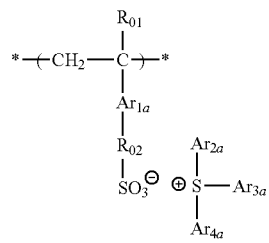
(III-1)

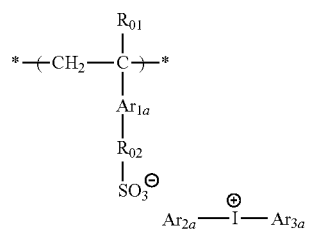
(III-4)

wherein in formulas (III-1) and (III-4)

$Ar_{1a}$ represents an arylene group, $R_{01}$ represents a hydrogen atom, a methyl group, a chloromethyl group, a trifluoromethyl group or a cyano group, $R_{02}$ represents an arylene group, an alkylene group, a cycloalkylene group, —O—, —$SO_2$—, —CO—, —$N(R_{33})$— or a divalent linking group composed of a combination thereof, $R_{33}$ independently represents a hydrogen atom, an alkyl group, a cycloalkyl group, an alkenyl group, an aryl group or an aralkyl group, and
each of $Ar_{2a}$ to $Ar_{4a}$ represents an aryl group;

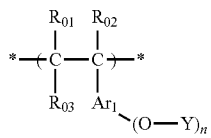
(I)

wherein in formula (I)
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group;
each of n Ys independently represents a hydrogen atom or a group capable of leaving by the action of an acid, provided that at least one of Ys represents a group capable of leaving by the action of an acid; and
n represents an integer of from 1 to 4,
wherein
Y in the general formula (I) is represented by the following general formula (II):

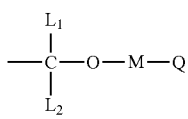
(II)

wherein
each of $L_1$ and $L_2$ independently represents a hydrogen atom, an alkyl group, a cycloalkyl group, an aryl group or an aralkyl group;
M represents a divalent linking group obtained by combining an alkylene group with —O—;
Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;
the group represented by -M-Q is a group constituted of from 5 to 20 carbon atoms; and
at least two of Q, M and $L_1$ may be bonded to each other to form a 5-membered ring or a 6-membered ring, further provided that the repeating unit represented by the general formula (I) is selected from the group consisting of the following repeating units:

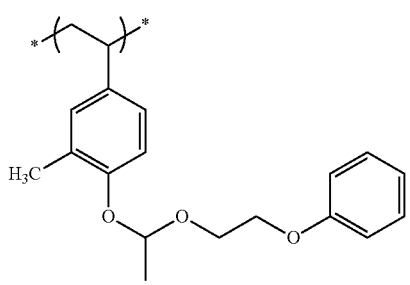

-continued

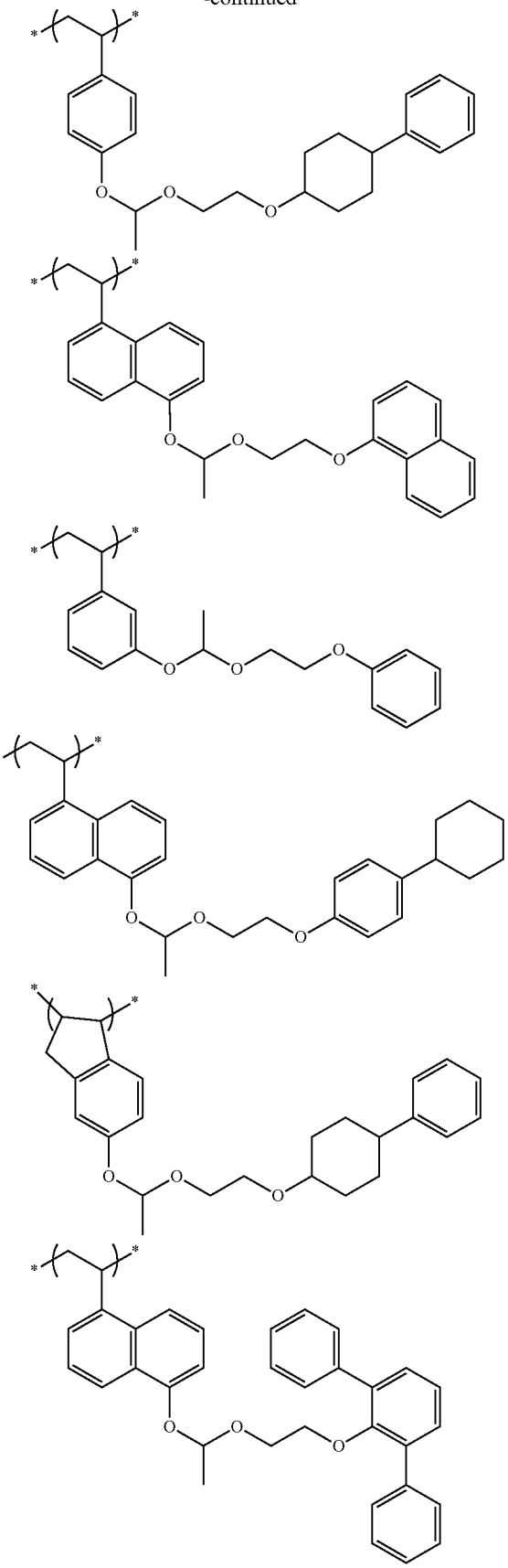

and

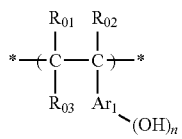
(VI)

wherein in formula (VI)

each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group; and n represents an integer of from 1 to 4;

and further wherein the repeating unit represented by general formula (III-1) is selected from the group consisting of the following repeating units:

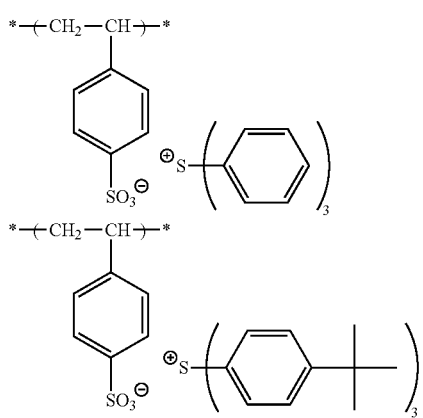

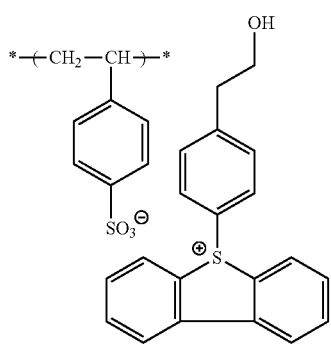

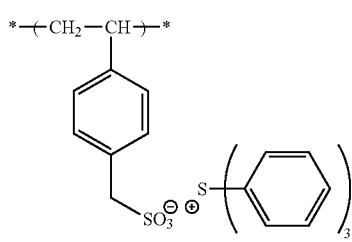

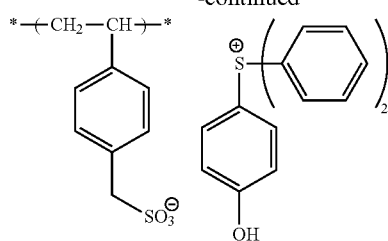

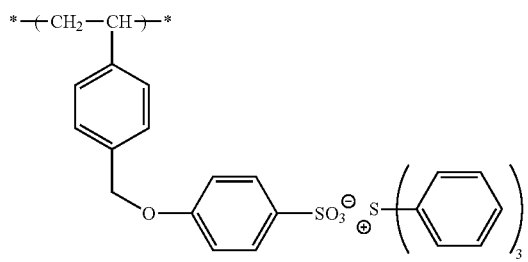

17. A radiation-sensitive composition comprising:

a resin (P) having a repeating unit (A) having an ionic structural site and capable of decomposing upon irradiation with an actinic ray or radiation to generate an acid; and a repeating unit (B) having at least one phenolic hydroxyl group, a part or all of hydrogen atoms of the hydroxyl group or groups each being protected by a group capable of leaving by the action of an acid, wherein the ionic structural site of the repeating unit (A) contained in the resin (P) is a structure capable of generating an acid in a side chain of the resin upon irradiation with an actinic ray or radiation;

the repeating unit (A) is a repeating unit represented by general formula (III-1) or (III-4):

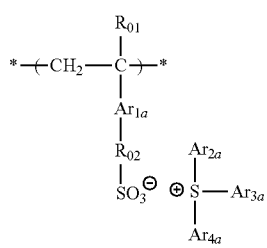
(III-1)

-continued

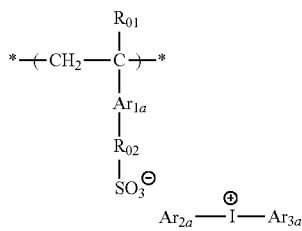
(III-4)

wherein in formulas (III-1) and (III-4)

$Ar_{1a}$ represents an arylene group, $R_{01}$ represents a hydrogen atom, a methyl group, a chloromethyl group, a trifluoromethyl group or a cyano group, $R_{02}$ represents an alkylene group, a cycloalkylene group, —O—, —$SO_2$—, —CO—, —N($R_{33}$)— or a divalent linking group composed of a combination thereof, $R_{33}$ independently represents a hydrogen atom, an alkyl group, a cycloalkyl group, an alkenyl group, an aryl group or an aralkyl group, and each of $Ar_{2a}$ to $Ar_{4a}$ represents an aryl group; and the repeating unit (B) is a repeating unit represented by the following general formula (I):

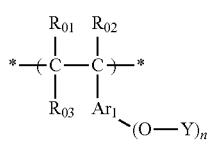
(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group;

each of n Ys independently represents a hydrogen atom or a group capable of leaving by the action of an acid, provided that at least one of Ys represents a group capable of leaving by the action of an acid; and n represents an integer of from 1 to 4;

wherein

Y in the general formula (I) is represented by the following general formula (II):

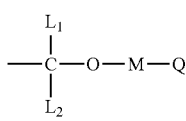
(II)

wherein each of $L_1$ and $L_2$ independently represents a hydrogen atom, an alkyl group, a cycloalkyl group, an aryl group or an aralkyl group;

M represents a divalent linking group obtained by combining an alkylene group with —O—;

Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;

the group represented by -M-Q is a group constituted of from 5 to 20 carbon atoms; and at least two of Q, M and $L_1$ may be bonded to each other to form a 5-membered ring or a 6-membered ring; and the resin further has a repeating unit (C) represented by the following general formula (VI):

(VI)

wherein in formula (VI)

each of $R_{01}$ and $R_{02}$ independently represents a hydrogen atom, an alkyl group, a cycloalkyl group, a halogen atom, a cyano group or an alkoxycarbonyl group, and $R_{03}$ represents an alkylene group and is bonded to $Ar_1$ to form a 5-membered ring or a 6-membered ring;

$Ar_1$ represents an aromatic ring group; and n represents an integer of from 1 to 4.

18. The radiation-sensitive composition according to claim 17, wherein the repeating unit represented by the general formula (I) is selected from the group consisting of the following repeating units:

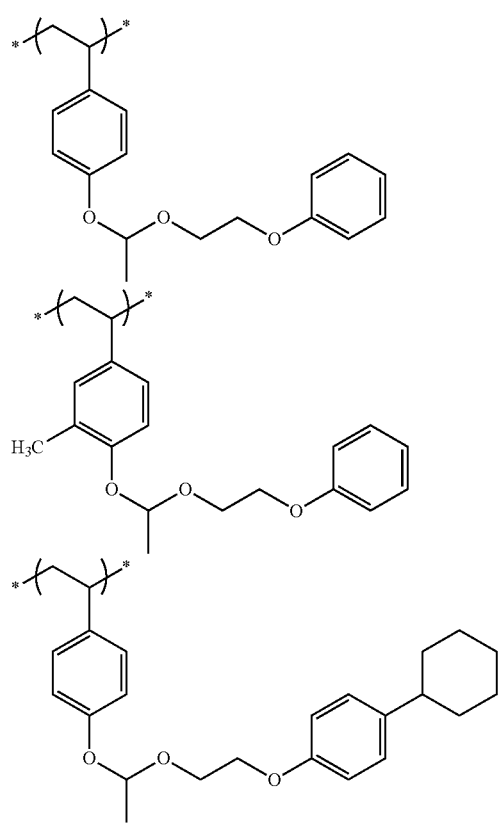

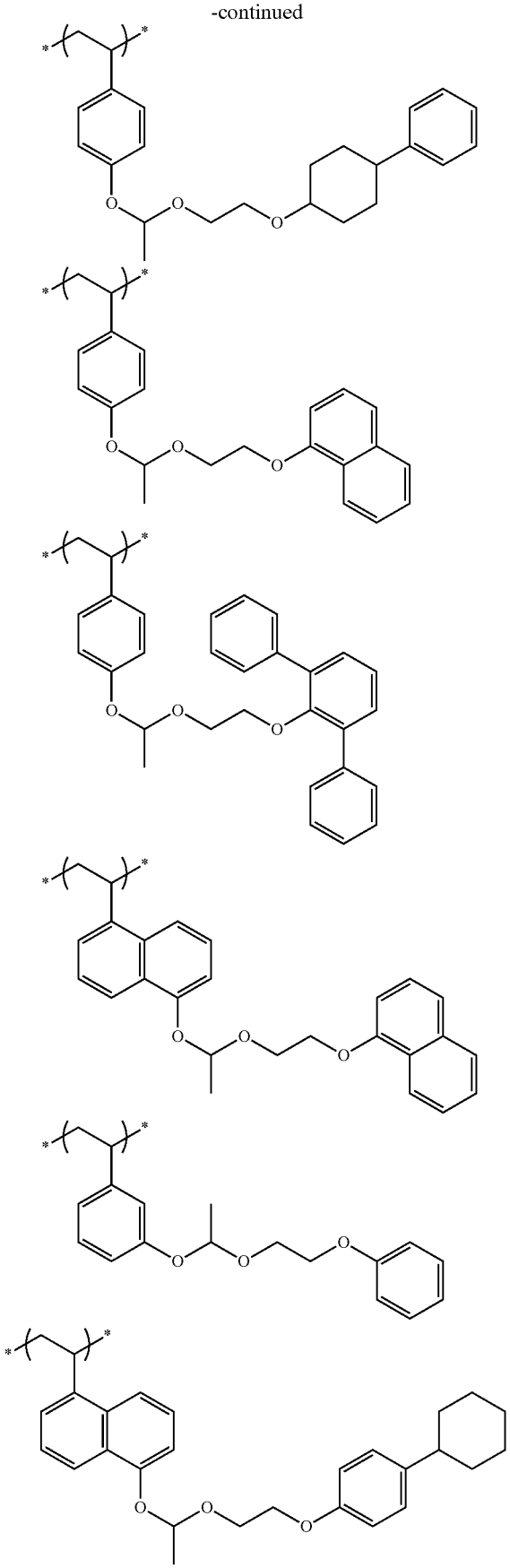

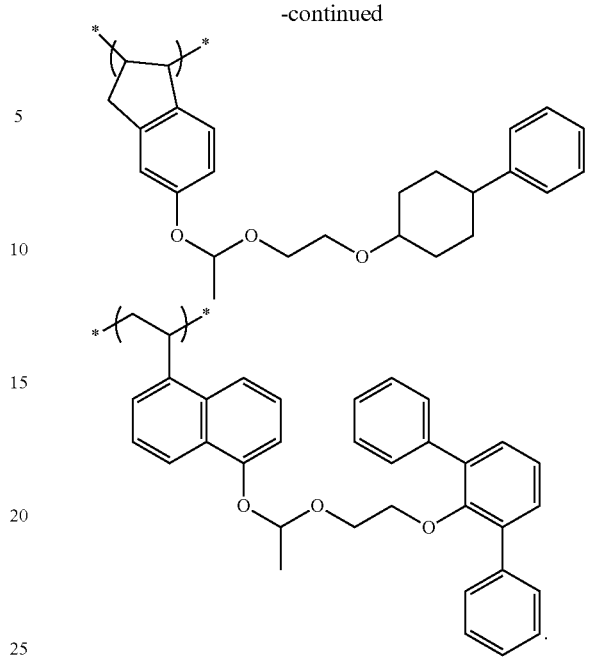

19. The radiation-sensitive composition according to claim 17, wherein the repeating unit (C) represented by the general formula (VI) is selected from the group consisting of the following repeating units:

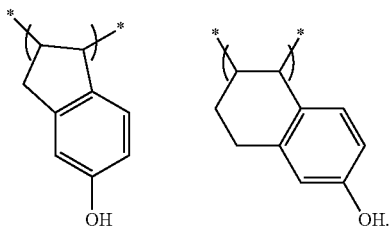

20. A radiation-sensitive composition comprising:
a resin (P) having
a repeating unit (A) having an ionic structural site and capable of decomposing upon irradiation with an actinic ray or radiation to generate an acid; and
a repeating unit (B) having at least one phenolic hydroxyl group, a part or all of hydrogen atoms of the hydroxyl group or groups each being protected by a group capable of leaving by the action of an acid,
wherein
the ionic structural site of the repeating unit (A) contained in the resin (P) is a structure capable of generating an acid in a side chain of the resin upon irradiation with an actinic ray or radiation;
the repeating unit (A) is a repeating unit represented by general formula (III-1) or (III-4):

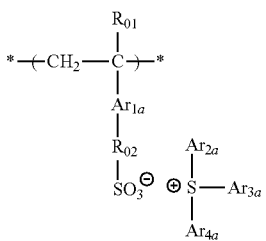

(III-1)

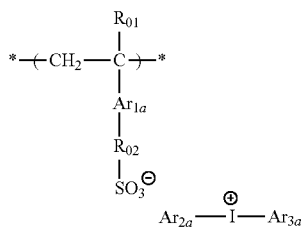
(III-4)

wherein in formulas (III-1) and (III-4)
$Ar_{1a}$ represents an arylene group,
$R_{01}$ represents a hydrogen atom, a methyl group, a chloromethyl group, a trifluoromethyl group or a cyano group,
$R_{02}$ represents an arylene group, an alkylene group, a cycloalkylene group, —O—, —$SO_2$—, —CO—, —N($R_{33}$)— or a divalent linking group composed of a combination thereof,
$R_{33}$ independently represents a hydrogen atom, an alkyl group, a cycloalkyl group, an alkenyl group, an aryl group or an aralkyl group, and each of $Ar_{2a}$ to $Ar_{4a}$ represents an aryl group;
the repeating unit (B) is a repeating unit represented by the following general formula (I):

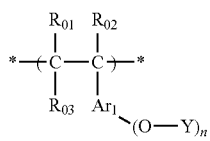
(I)

wherein
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group;
each of n Ys independently represents a hydrogen atom or a group capable of leaving by the action of an acid, provided that at least one of Ys represents a group capable of leaving by the action of an acid; and
n represents an integer of from 1 to 4;
wherein
Y in the general formula (I) is represented by the following general formula (II):

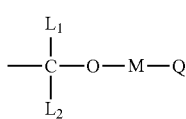
(II)

wherein
each of $L_1$ and $L_2$ independently represents a hydrogen atom, an alkyl group, a cycloalkyl group, an aryl group or an aralkyl group;
M represents a divalent linking group obtained by combining an alkylene group with —O—;
Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;
the group represented by -M-Q is a group constituted of from 5 to 20 carbon atoms; and
at least two of Q, M and $L_1$ may be bonded to each other to form a 5-membered ring or a 6-membered ring;
the repeating unit represented by general formula (III-1) is selected from the group consisting of the following repeating units:

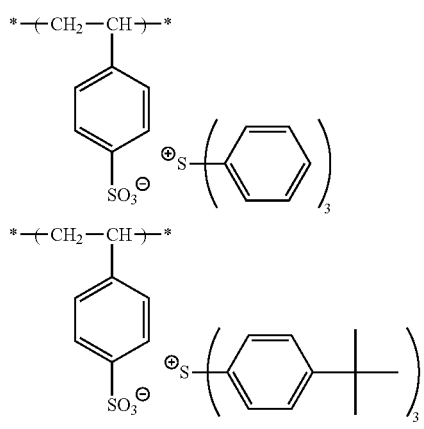

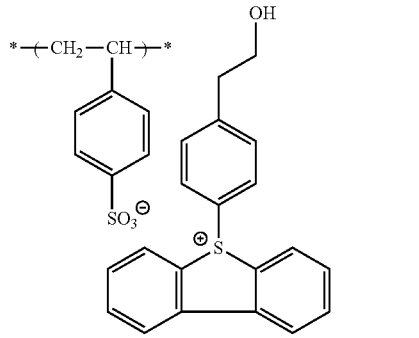

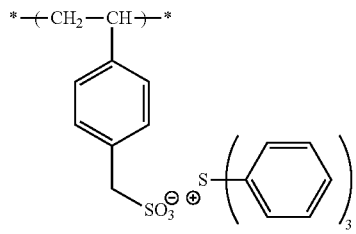

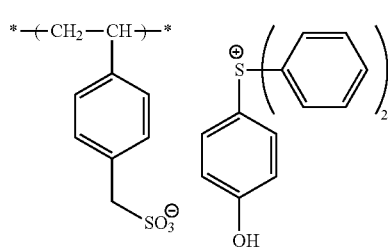

-continued

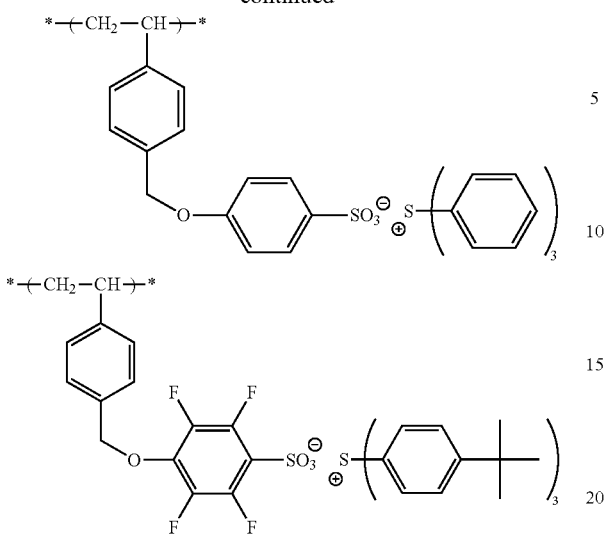

and the resin further has a repeating unit (C) represented by the following general formula (VI):

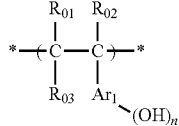 (VI)

wherein in formula (VI) each of $R_{01}$ and $R_{02}$ independently represents a hydrogen atom, an alkyl group, a cycloalkyl group, a halogen atom, a cyano group or an alkoxycarbonyl group, and $R_{03}$ represents an alkylene group and is bonded to $Ar_1$ to form a 5-membered ring or a 6-membered ring;

$Ar_1$ represents an aromatic ring group; and n represents an integer of from 1 to 4.

21. The radiation-sensitive composition according to claim 20, wherein the repeating unit (C) represented by the general formula (VI) is selected from the group consisting of the following repeating units:

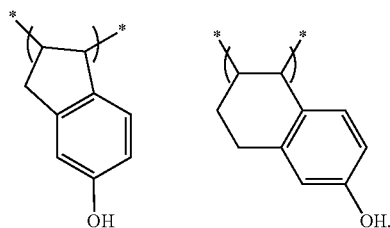

22. A resin comprising:

at least one repeating unit (A) selected from repeating units represented by any one of the following general formulae (III) to (V);

a repeating unit (B) represented by the following general formula (I); and a repeating unit (C) represented by the following general formula (VI):

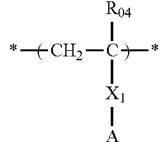 (III)

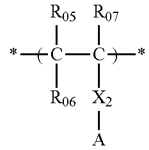 (IV)

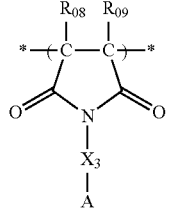 (V)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, and $R_{26}$ and $R_{27}$ may be bonded to each other to form a ring together with a nitrogen atom;

each of $X_1$ to $X_3$ independently represents a single bond, an arylene group, an alkylene group, a cycloalkylene group, —O—, —$SO_2$—, —CO—, —$N(R_{33})$— or a divalent linking group composed of a combination thereof;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents an ionic structural site capable of decomposing upon irradiation with an actinic ray or radiation to generate an acid in a side chain of the resin, wherein the repeating unit represented by the formula (III) is a repeating unit represented by the following general formula (III-1) or (III-4):

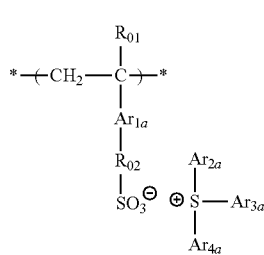 (III-1)

-continued

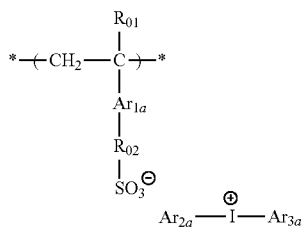
(III-4)

wherein in formulas (III-1) and (III-4)

$Ar_{1a}$ represents an arylene group, $R_{01}$ represents a hydrogen atom, a methyl group, a chloromethyl group, a trifluoromethyl group or a cyano group, $R_{02}$ represents an alkylene group, a cycloalkylene group, —O—, —SO$_2$—, —CO—, —N(R$_{33}$)— or a divalent linking group composed of a combination thereof, $R_{33}$ independently represents a hydrogen atom, an alkyl group, a cycloalkyl group, an alkenyl group, an aryl group or an aralkyl group, and each of $Ar_{ea}$ to $Ar_{4a}$ represents an aryl group;

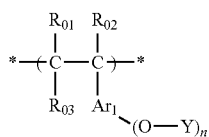
(I)

wherein in formula (I)

each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;

$Ar_1$ represents an aromatic ring group;

each of n Ys independently represents a hydrogen atom or a group capable of leaving by the action of an acid, provided that at least one of Ys represents a group capable of leaving by the action of an acid; and n represents an integer of from 1 to 4, wherein Y in the general formula (I) is represented by the following general formula (II):

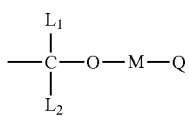
(II)

wherein each of $L_1$ and $L_2$ independently represents a hydrogen atom, an alkyl group, a cycloalkyl group, an aryl group or an aralkyl group;

M represents a divalent linking group obtained by combining an alkylene group with —O—;

Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;

the group represented by -M-Q is a group constituted of from 5 to 20 carbon atoms; and at least two of Q, M and $L_1$ may be bonded to each other to form a 5-membered ring or a 6-membered ring, and

(VI)

wherein in formula (VI)

each of $R_{01}$ and $R_{02}$ independently represents a hydrogen atom, an alkyl group, a cycloalkyl group, a halogen atom, a cyano group or an alkoxycarbonyl group, and $R_{03}$ represents an alkylene group and is bonded to $Ar_1$ to form a 5-membered ring or a 6-membered ring;

$Ar_1$ represents an aromatic ring group; and n represents an integer of from 1 to 4.

23. The radiation-sensitive composition according to claim 22, wherein the repeating unit represented by the general formula (I) is selected from the group consisting of the following repeating units:

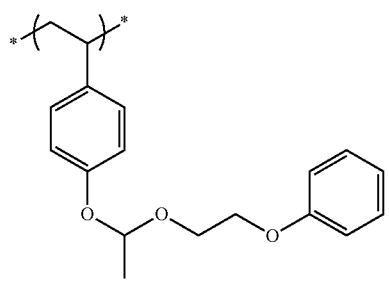

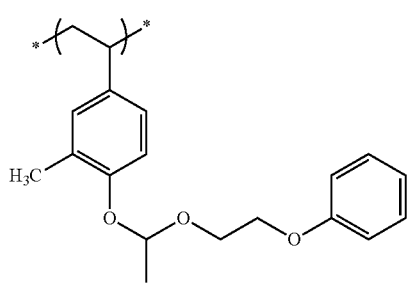

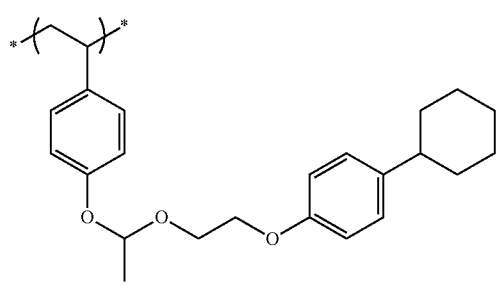

201

-continued

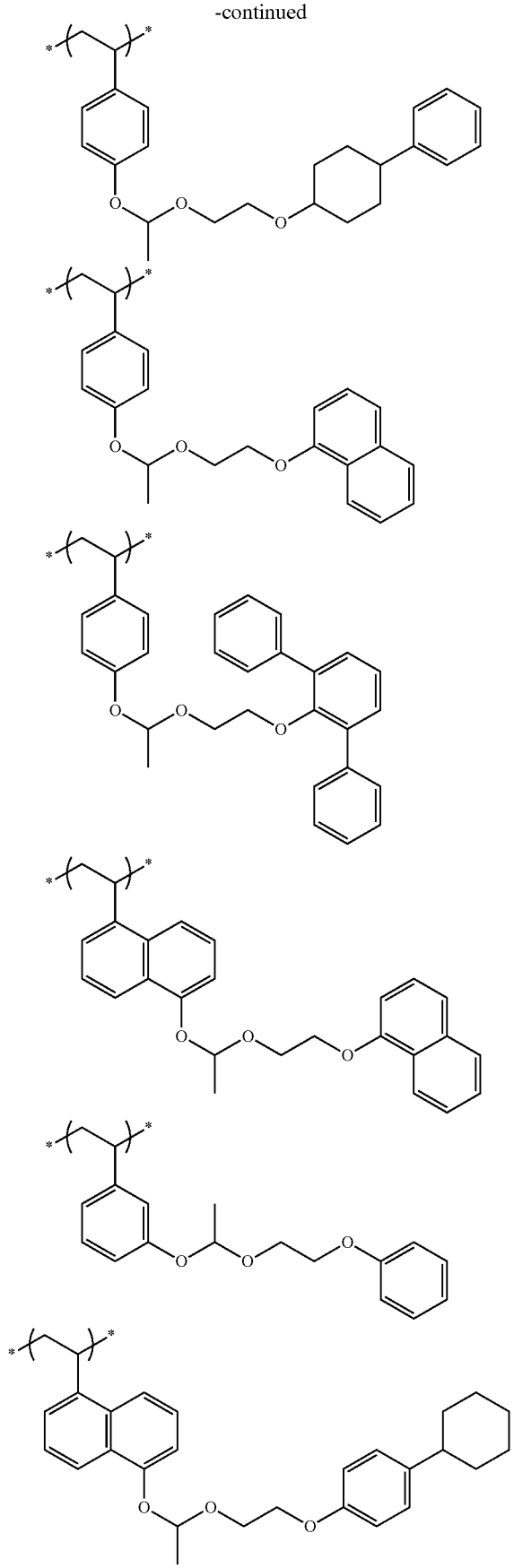

202

-continued

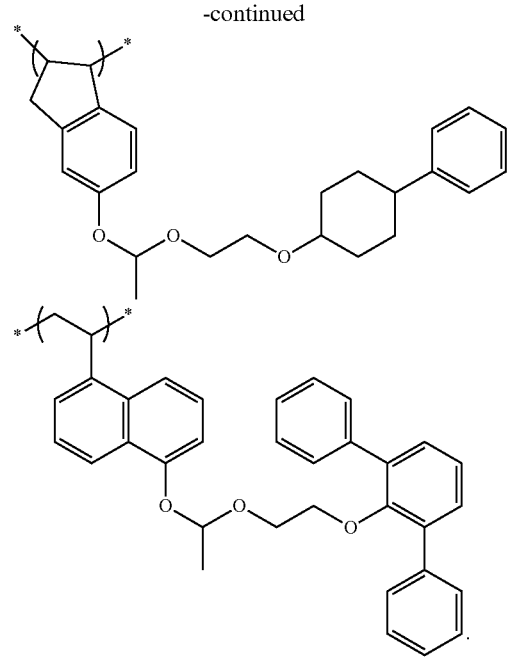

24. The resin according to claim 22, wherein the repeating unit (C) represented by the general formula (VI) is selected from the group consisting of the following repeating units:

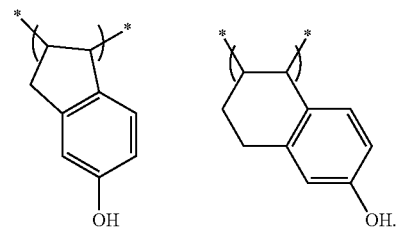

25. A resin comprising:
at least one repeating unit (A) selected from repeating units represented by any one of the following general formulae (III) to (V);
a repeating unit (B) represented by the following general formula (I); and
a repeating unit (C) represented by the following general formula (VI):

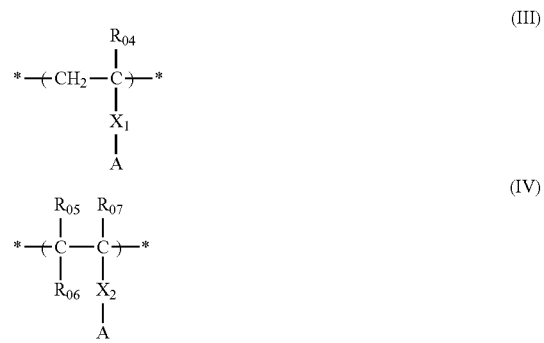

-continued

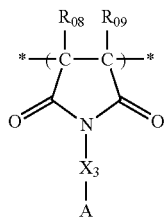
(V)

wherein
each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;
$R_{06}$ represents a cyano group, a carboxyl group, —CO—$OR_{25}$ or —CO—N $(R_{26})(R_{27})$ and $R_{26}$ and $R_{27}$ may be bonded to each other to form a ring together with a nitrogen atom;
each of $X_1$ to $X_3$ independently represents a single bond, an arylene group, an alkylene group, a cycloalkylene group, —O—, —SO$_2$—, —CO—, —N($R_{33}$)— or a divalent linking group composed of a combination thereof;
$R_{25}$ represents an alkyl group, a cycloalkyl group, an alkenyl group, an aryl group or an aralkyl group;
each of $R_{26}$, $R_{27}$ and $R_{33}$ independently represents a hydrogen atom, an alkyl group, a cycloalkyl group, an alkenyl group, an aryl group or an aralkyl group; and
A represents an ionic structural site capable of decomposing upon irradiation with an actinic ray or radiation to generate an acid in a side chain of the resin,
wherein the repeating unit represented by the formula (III) is a repeating unit represented by the following general formula (III-1) or (III-4):

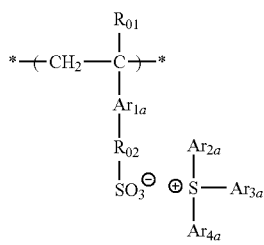
(III-1)

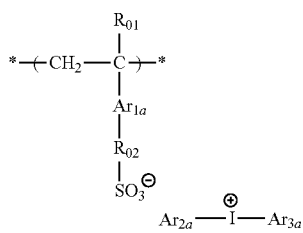
(III-4)

wherein in formulas (III-1) and (III-4)
$Ar_{1a}$ represents an arylene group,
$R_{01}$ represents a hydrogen atom, a methyl group, a chloromethyl group, a trifluoromethyl group or a cyano group,
$R_{02}$ represents an arylene group, an alkylene group, a cycloalkylene group, —O—, —SO$_2$—, —CO—, —N($R_{33}$)— or a divalent linking group composed of a combination thereof, $R_{33}$ independently represents a hydrogen atom, an alkyl group, a cycloalkyl group, an alkenyl group, an aryl group or an aralkyl group, and
each of $Ar_{2a}$ to $Ar_{4a}$ represents an aryl group;

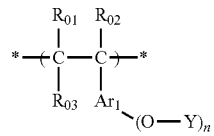
(I)

wherein in formula (I)
each of $R_{01}$, $R_{02}$ and $R_{03}$ independently represents a hydrogen atom, an alkyl group, a cycloalkyl group, a halogen atom, a cyano group or an alkoxycarbonyl group, and $R_{03}$ also may represent an alkylene group and be bonded to $Ar_1$ to form a 5-membered ring or a 6-membered ring;
$Ar_1$ represents an aromatic ring group;
each of n Ys independently represents a hydrogen atom or a group capable of leaving by the action of an acid, provided that at least one of Ys represents a group capable of leaving by the action of an acid; and
n represents an integer of from 1 to 4,
wherein
Y in the general formula (I) is represented by the following general formula (II):

$$\begin{array}{c} L_1 \\ | \\ -C-O-M-Q \\ | \\ L_2 \end{array} \quad (II)$$

wherein
each of $L_1$ and $L_2$ independently represents a hydrogen atom, an alkyl group, a cycloalkyl group, an aryl group or an aralkyl group;
M represents a divalent linking group obtained by combining an alkylene group with —O—;
Q represents an alkyl group, a cycloalkyl group, an alicyclic group which may contain a hetero atom, an aromatic ring group which may contain a hetero atom, an amino group, an ammonium group, a mercapto group, a cyano group or an aldehyde group;
the group represented by -M-Q is a group constituted of from 5 to 20 carbon atoms; and
at least two of Q, M and $L_1$ may be bonded to each other to form a 5-membered ring or a 6-membered ring, and

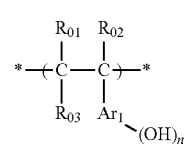
(VI)

wherein in formula (VI)
each of $R_{01}$ and $R_{02}$ independently represents a hydrogen atom, an alkyl group, a cycloalkyl group, a halogen atom, a cyano group or an alkoxycarbonyl group, and $R_{03}$ represents an alkylene group and is bonded to $Ar_1$ to form a 5-membered ring or a 6-membered ring;

$Ar_1$ represents an aromatic ring group; and n represents an integer of from 1 to 4;

and further wherein the repeating unit represented by general formula (III-1) is selected from the group consisting of the following repeating units:

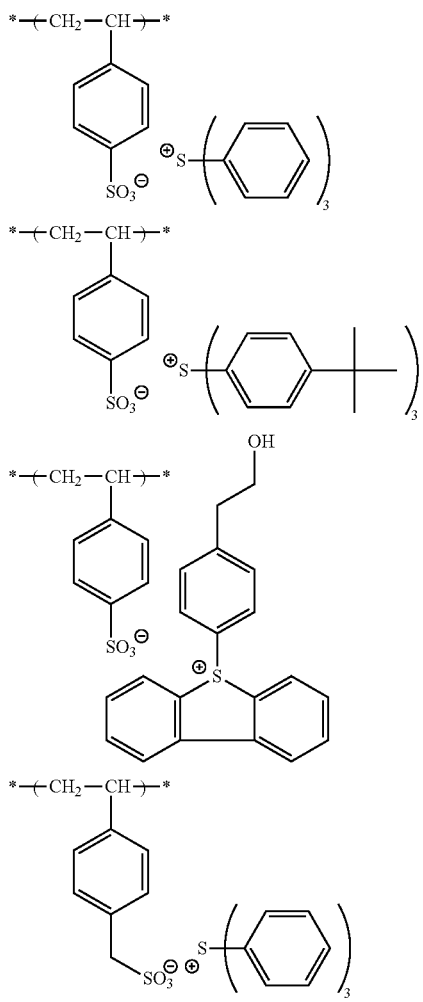

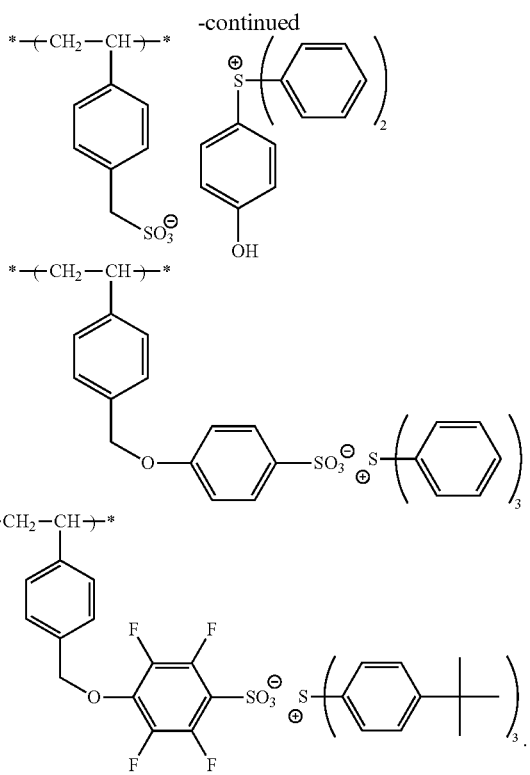

26. The resin according to claim 25, wherein the repeating unit (C) represented by the general formula (VI) is selected from the group consisting of the following repeating units:

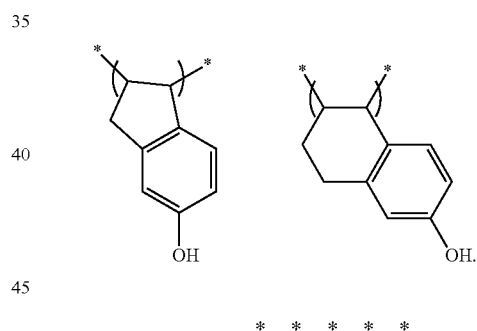

* * * * *